(12) United States Patent
Tsujio

(10) Patent No.: US 11,374,045 B2
(45) Date of Patent: Jun. 28, 2022

(54) STACKED LENS STRUCTURE WITH A LENS PORTION HAVING A BLACK RESIN COMPRISING A PLURALITY OF VOIDS

(71) Applicant: SONY SEMICONDUCTOR SOLUTIONS CORPORATION, Kanagawa (JP)

(72) Inventor: Shoichi Tsujio, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 295 days.

(21) Appl. No.: 16/488,725

(22) PCT Filed: Mar. 9, 2018

(86) PCT No.: PCT/JP2018/009151
§ 371 (c)(1),
(2) Date: Aug. 26, 2019

(87) PCT Pub. No.: WO2018/173794
PCT Pub. Date: Sep. 27, 2018

(65) Prior Publication Data
US 2021/0134868 A1 May 6, 2021

(30) Foreign Application Priority Data

Mar. 23, 2017 (JP) .............................. JP2017-057008

(51) Int. Cl.
*H01L 27/146* (2006.01)
*G02B 7/02* (2021.01)
(Continued)

(52) U.S. Cl.
CPC .......... *H01L 27/14623* (2013.01); *G02B 3/00* (2013.01); *G02B 5/00* (2013.01);
(Continued)

(58) Field of Classification Search
CPC ......... H01L 27/14627; H01L 27/14687; H01L 27/14685; H01L 27/14623;
(Continued)

(56) References Cited

U.S. PATENT DOCUMENTS

| 7,215,479 B1 | 5/2007 | Bakin |
| 2010/0283113 A1* | 11/2010 | Kang ................ H01L 27/14683 257/432 |
| 2015/0177533 A1 | 6/2015 | Ono |

FOREIGN PATENT DOCUMENTS

| CN | 101256256 A | 9/2008 |
| CN | 101379417 A | 3/2009 |

(Continued)

OTHER PUBLICATIONS

Office Action for CN Patent Application No. 201880018633.1, dated May 8, 2021, 11 pages of English Translation and 10 pages of Office Action.

(Continued)

*Primary Examiner* — Jennifer D Bennett
(74) *Attorney, Agent, or Firm* — Chip Law Group

(57) ABSTRACT

The present technology relates to, in a stacked lens structure formed by stacking wafer substrates, the stacked lens structure that enables implementation of a diaphragm function and a method of manufacturing the same, and an electronic device. In the stacked lens structure, substrates with lens each having a lens resin portion disposed inside a through hole formed in a substrate are directly bonded and stacked. The stacked lens structure includes a black resin having a transmittance distribution monotonously decreasing from a lens center toward a peripheral portion on an upper surface or a lower surface of the lens resin portion of at least one of the substrates with lens. The present technology can be (Continued)

applied to, for example, a camera module in which a plurality of lenses is stacked and the like.

10 Claims, 94 Drawing Sheets

(51) Int. Cl.
    *G02B 3/00*     (2006.01)
    *G02B 5/00*     (2006.01)

(52) U.S. Cl.
    CPC .......... *G02B 7/02* (2013.01); *H01L 27/14618* (2013.01); *H01L 27/14625* (2013.01); *H01L 27/14627* (2013.01); *H01L 27/14685* (2013.01); *H01L 27/14687* (2013.01)

(58) Field of Classification Search
    CPC ........ H01L 27/14625; H01L 27/14618; G02B 3/00; G02B 5/00; G02B 7/02
    See application file for complete search history.

(56) References Cited

FOREIGN PATENT DOCUMENTS

| | | | |
|---|---|---|---|
| CN | 101536488 | A | 9/2009 |
| CN | 102103242 | A | 6/2011 |
| CN | 104603645 | A | 5/2015 |
| CN | 204832660 | U | 12/2015 |
| CN | 106526808 | A | 3/2017 |
| CN | 107850758 | A | 3/2018 |
| CN | 111913281 | A | 11/2020 |
| EP | 1987379 | A2 | 11/2008 |
| JP | 2005-156936 | A | 6/2005 |
| JP | 2009-526268 | A | 7/2009 |
| JP | 2009-244531 | A | 10/2009 |
| JP | 2009-279790 | A | 12/2009 |
| JP | 2010-156765 | A | 7/2010 |
| JP | 2012-101834 | A | 5/2012 |
| JP | 2012-185240 | A | 9/2012 |
| JP | 2013-254154 | A | 12/2013 |
| JP | 2015-018178 | A | 1/2015 |
| JP | 2017-032797 | A | 2/2017 |
| KR | 10-2008-0094105 | A | 10/2008 |
| KR | 10-2010-0004894 | A | 1/2010 |
| TW | 201003151 | A | 1/2010 |
| WO | 2007/094956 | A2 | 8/2007 |
| WO | 2014/038435 | A1 | 3/2014 |
| WO | 2016/009734 | A1 | 1/2016 |
| WO | WO-2016009734 | A1 * | 1/2016 ............. G02B 1/118 |
| WO | 2017/022192 | A1 | 2/2017 |

OTHER PUBLICATIONS

International Search Report and Written Opinion of PCT Application No. PCT/JP2018/009151, dated Jun. 12, 2018, 09 pages of ISRWO.

* cited by examiner

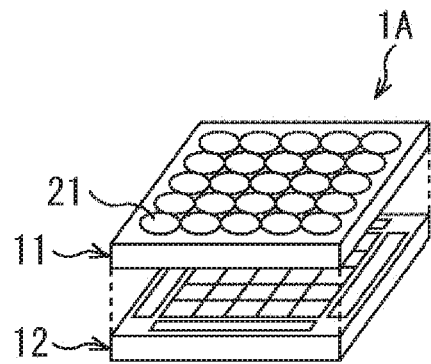 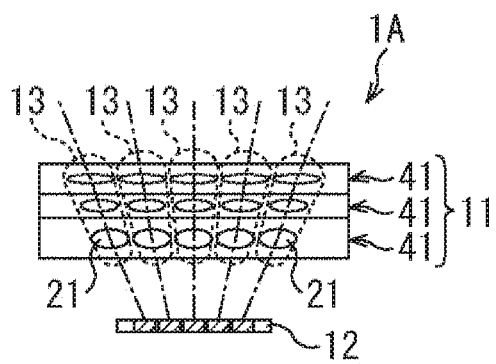
FIG. 8A  FIG. 8B
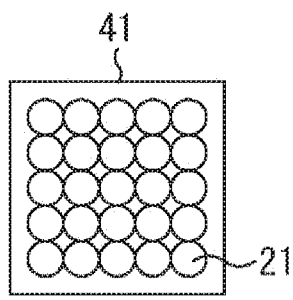 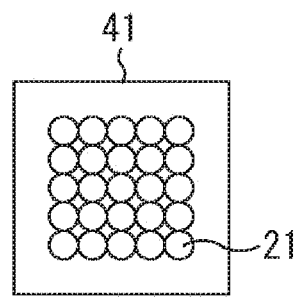 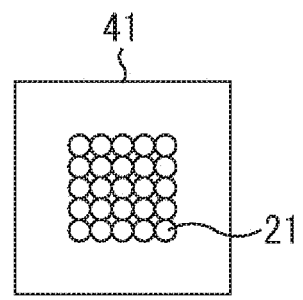
FIG. 8C  FIG. 8D  FIG. 8E
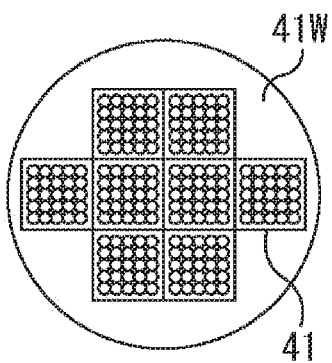 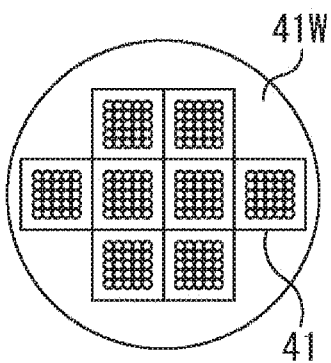 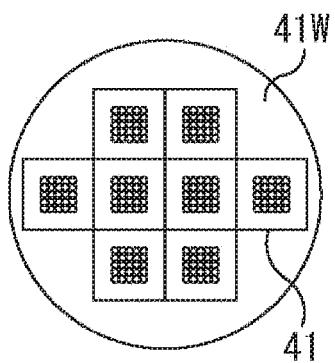
FIG. 8F  FIG. 8G  FIG. 8H

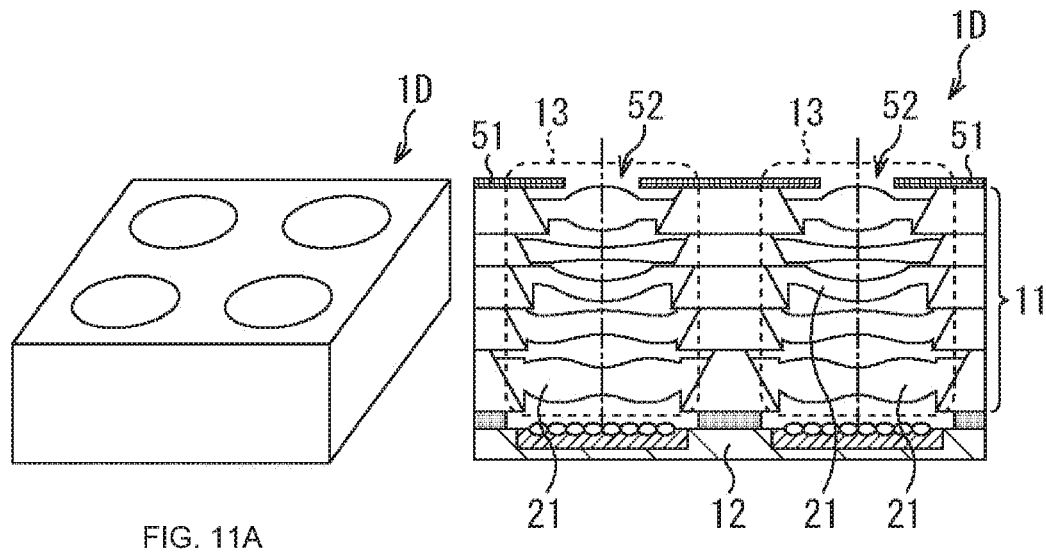
FIG. 11A
FIG. 11B
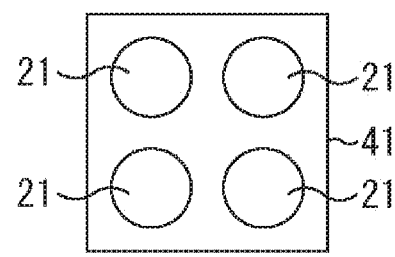
FIG. 11C
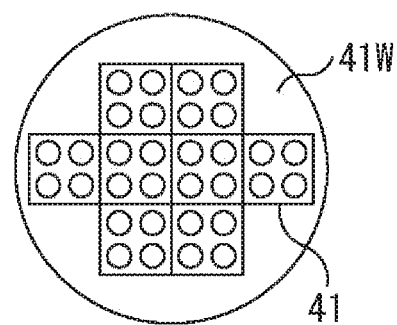
FIG. 11D

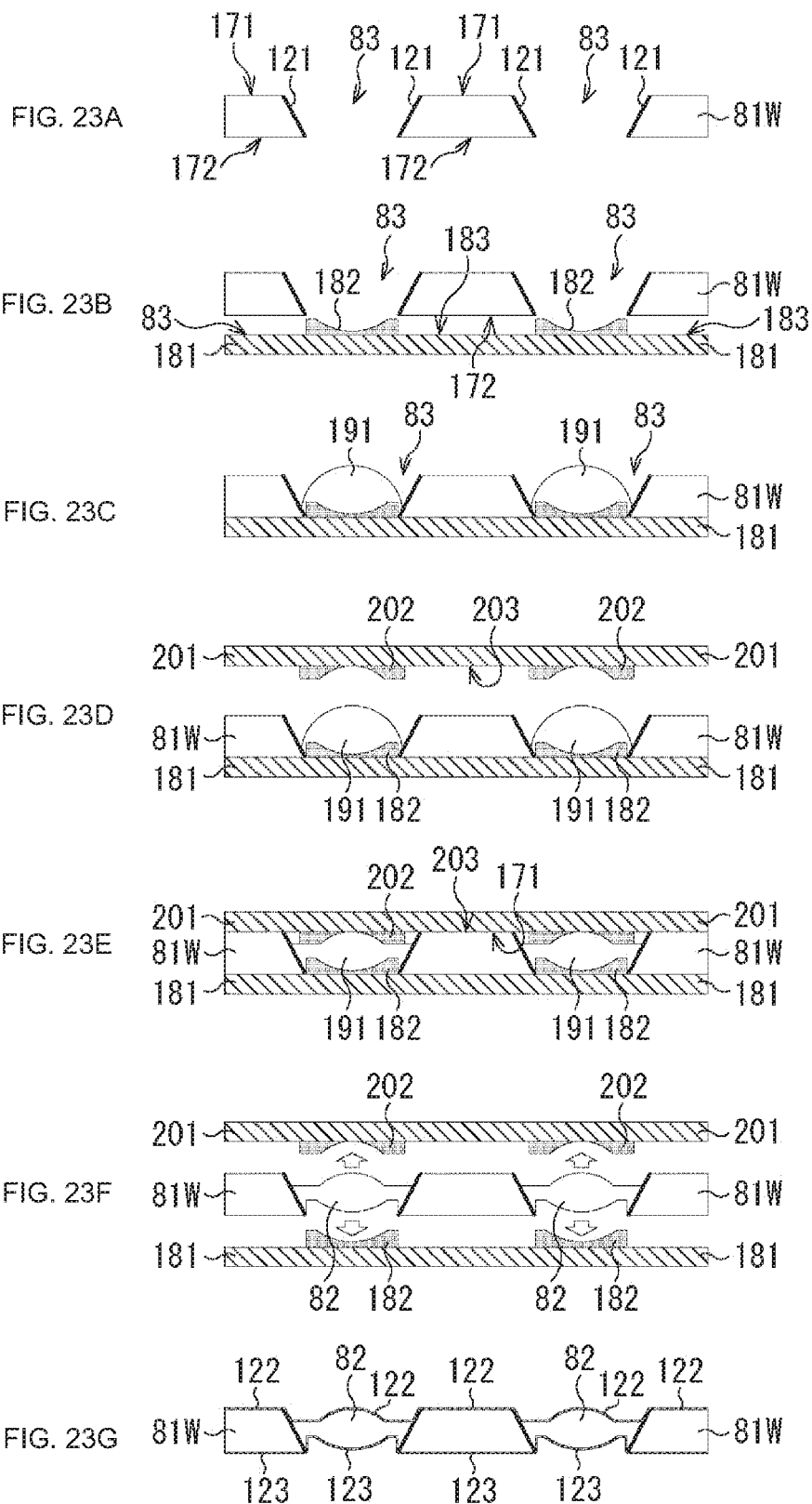

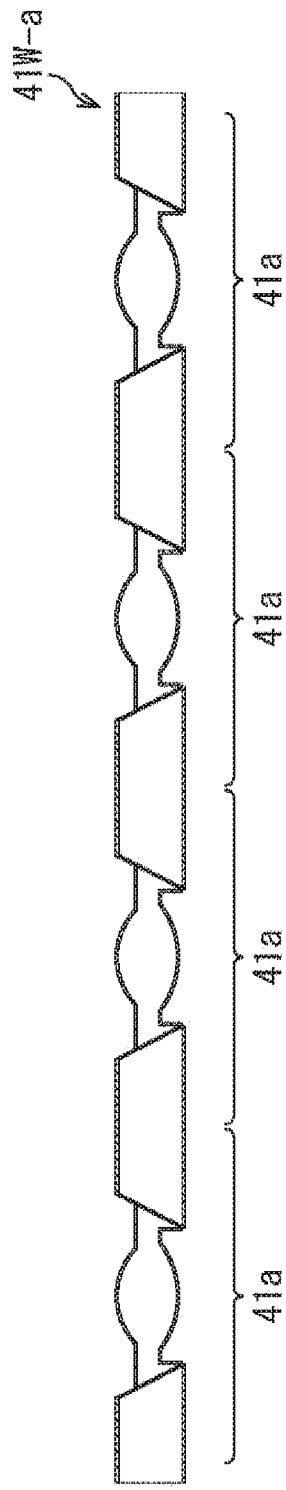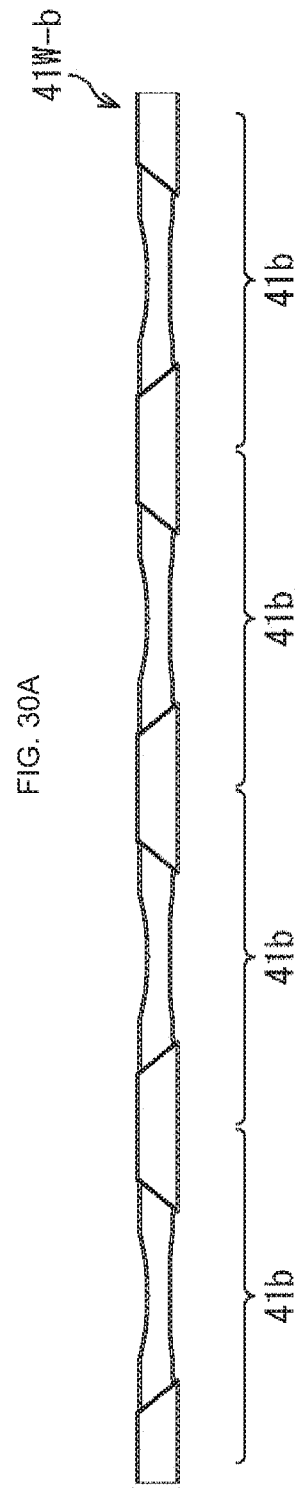

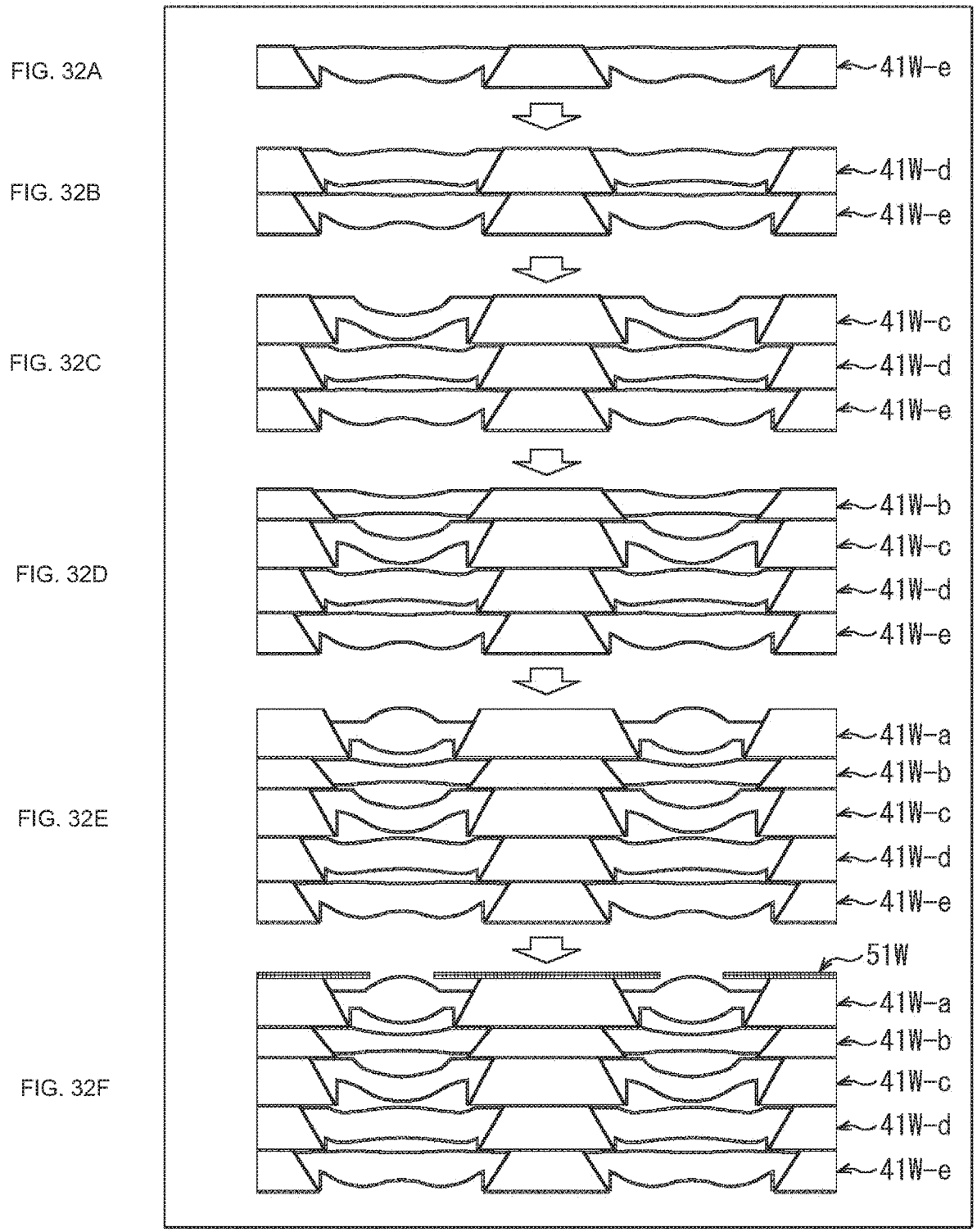

BEFORE UV LIGHT IRRADIATION

DURING UV LIGHT IRRADIATION

AFTER UV LIGHT IRRADIATION

BEFORE UV LIGHT IRRADIATION

DURING UV LIGHT IRRADIATION

AFTER UV LIGHT IRRADIATION

BEFORE UV LIGHT IRRADIATION

DURING UV LIGHT IRRADIATION

AFTER UV LIGHT IRRADIATION

BEFORE UV LIGHT IRRADIATION

DURING UV LIGHT IRRADIATION

AFTER UV LIGHT IRRADIATION

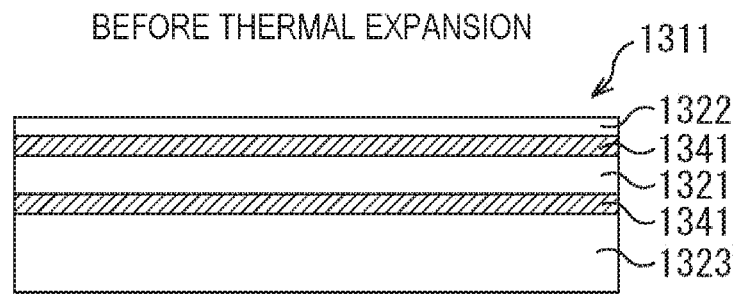
FIG. 52A BEFORE THERMAL EXPANSION
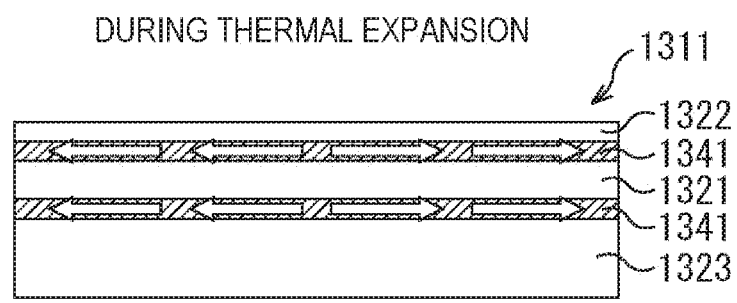
FIG. 52B DURING THERMAL EXPANSION
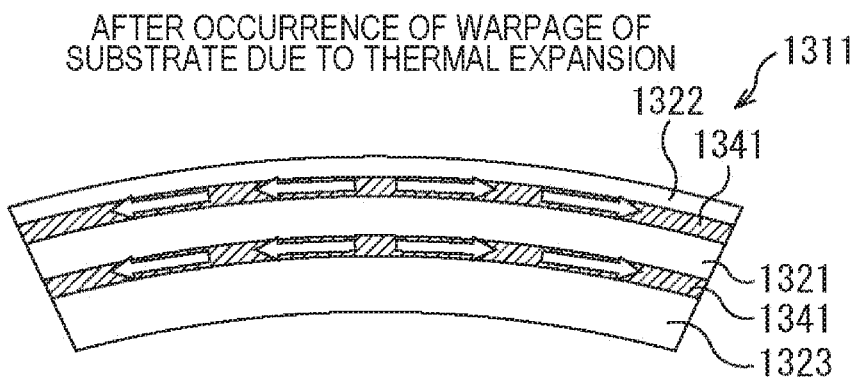
FIG. 52C AFTER OCCURRENCE OF WARPAGE OF SUBSTRATE DUE TO THERMAL EXPANSION
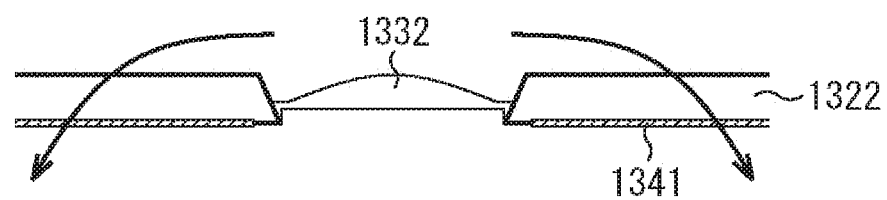
FIG. 52D

BEFORE SUBSTRATE BONDING

DURING SUBSTRATE BONDING

AFTER SUBSTRATE BONDING

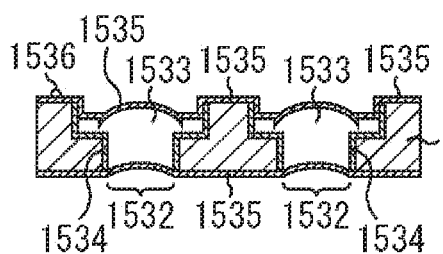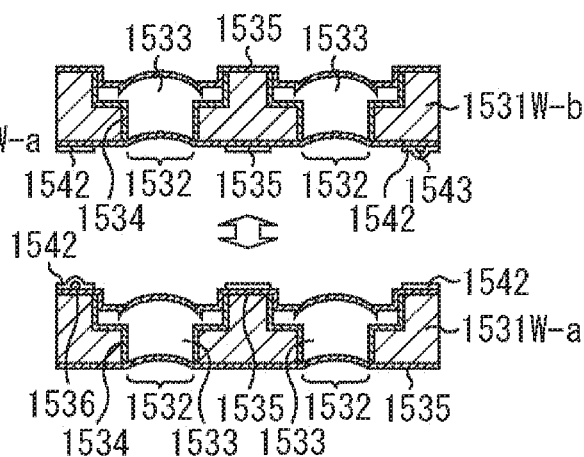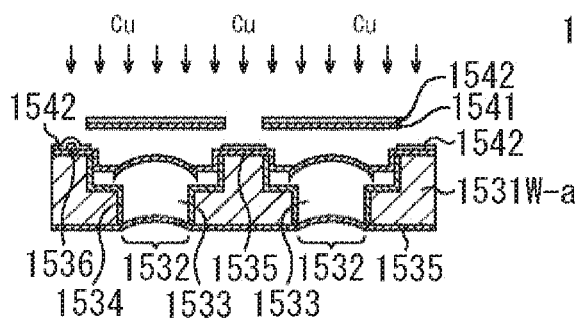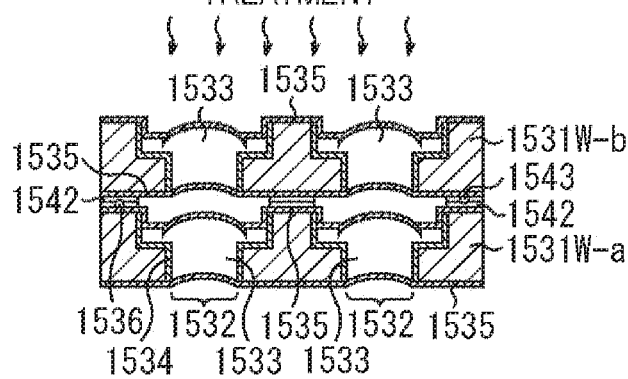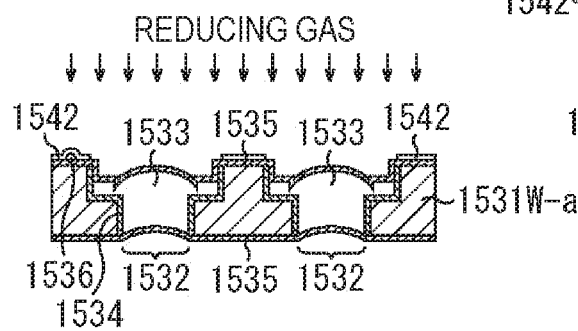

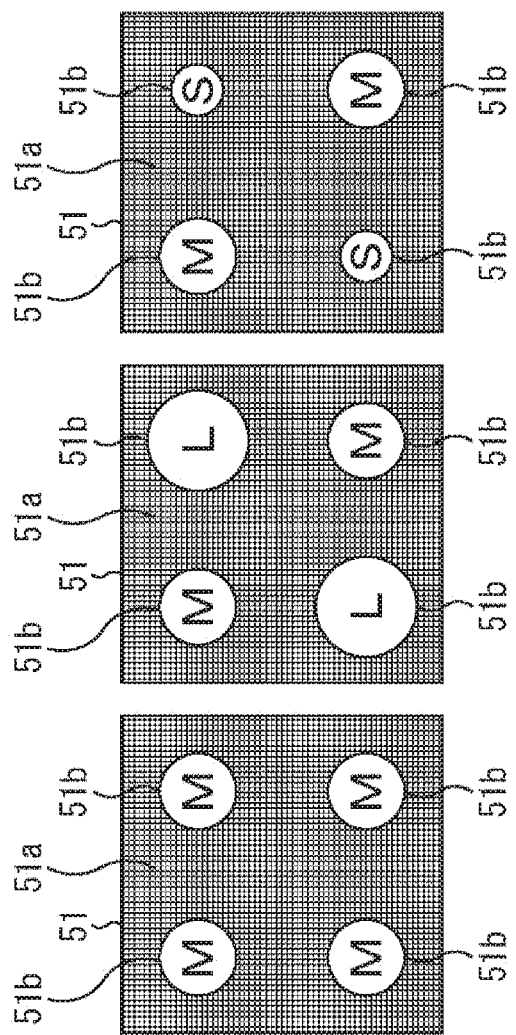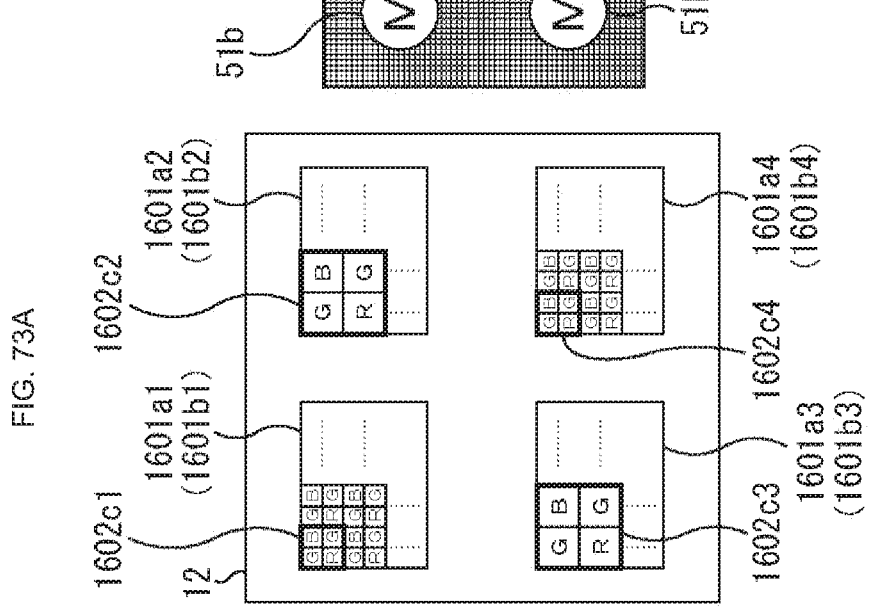

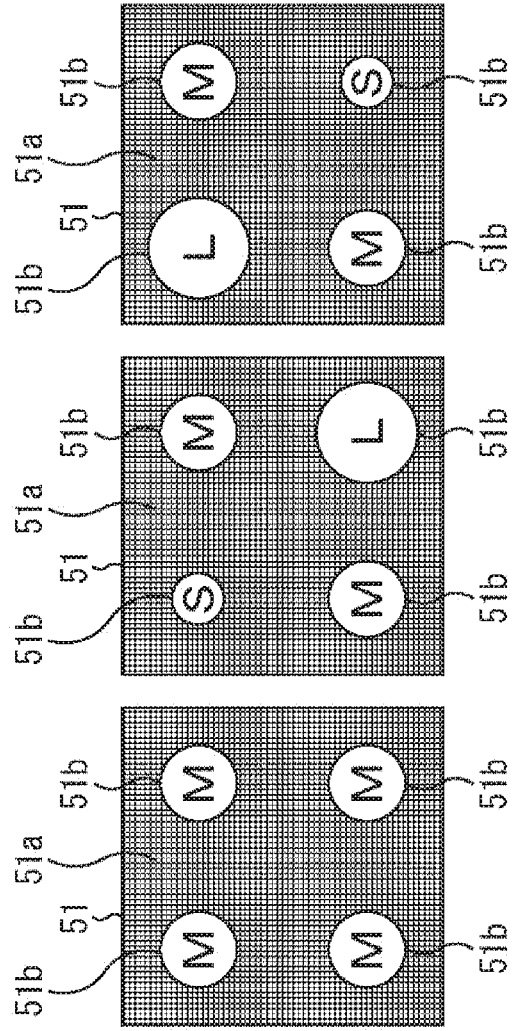
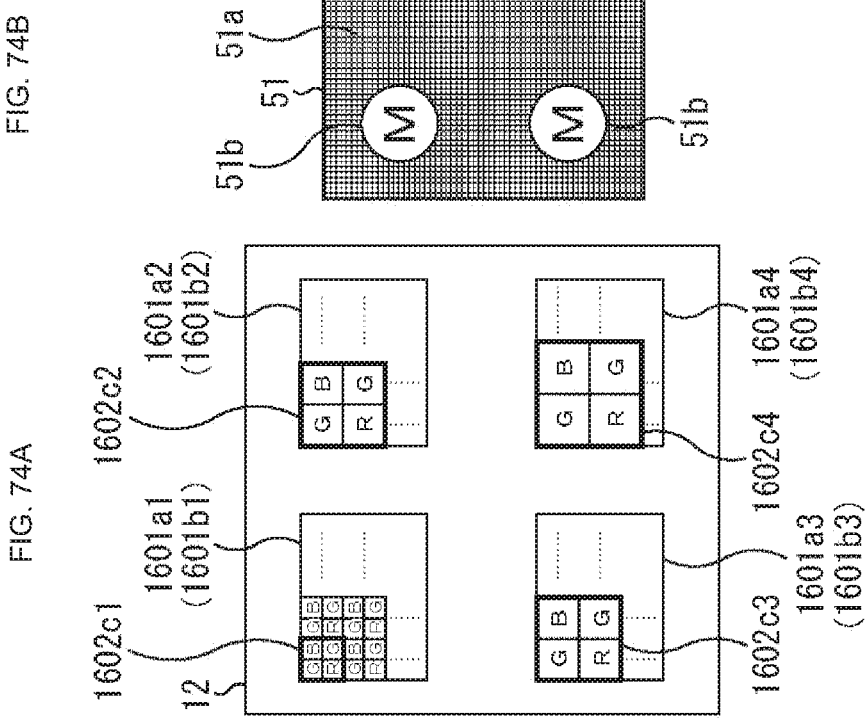
FIG. 74A  FIG. 74B  FIG. 74C  FIG. 74D

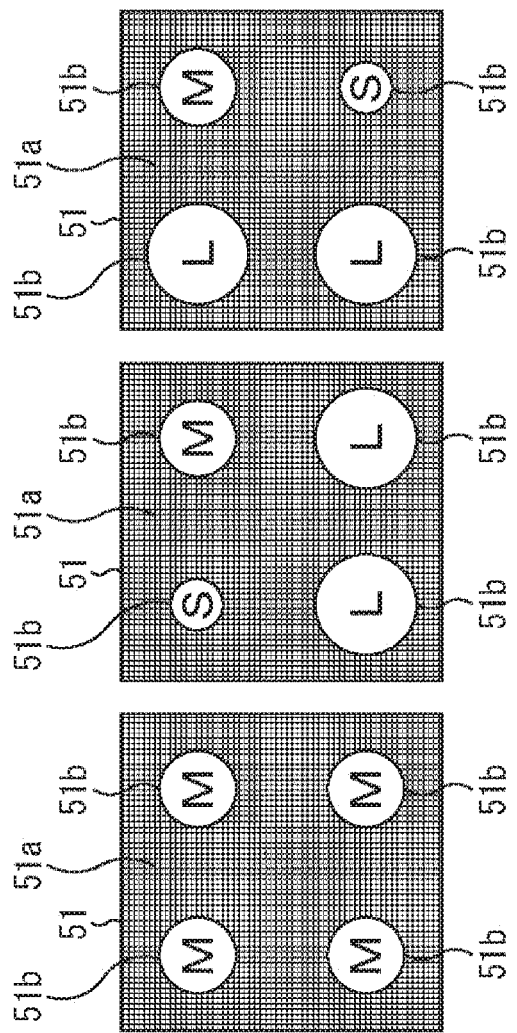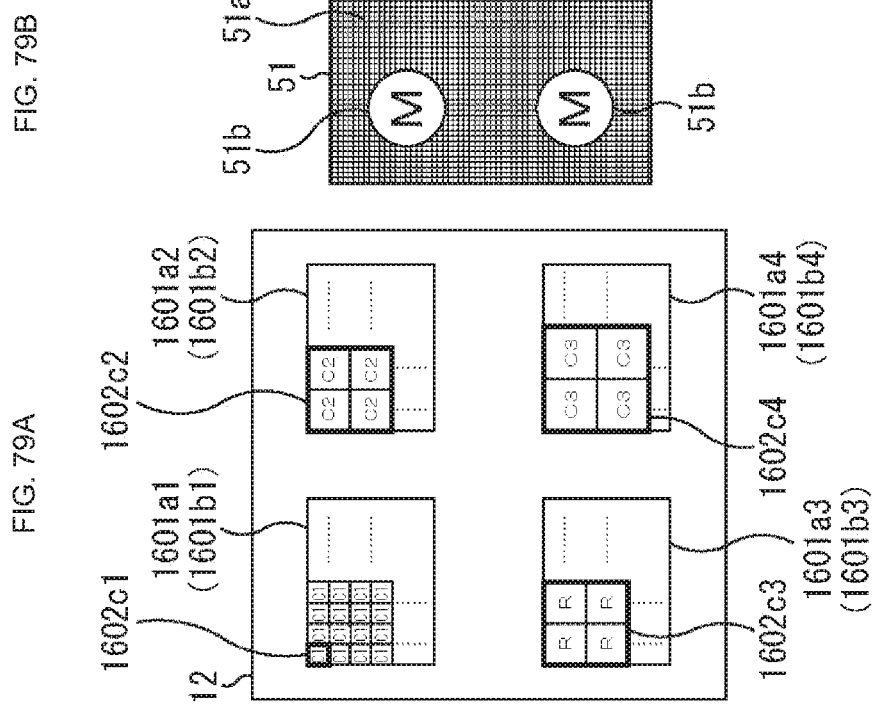

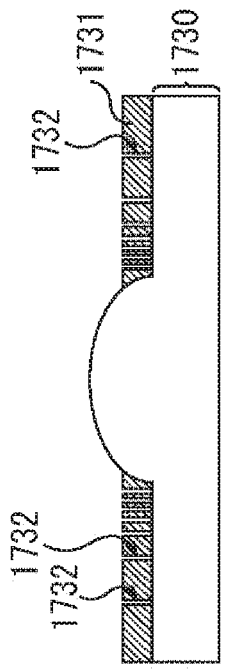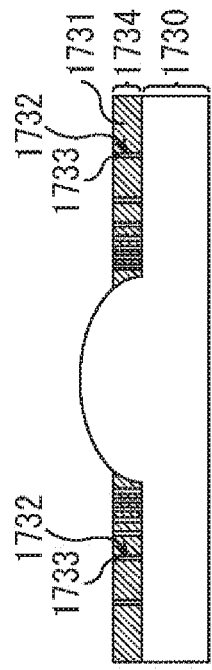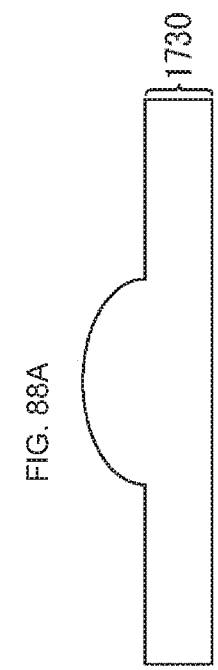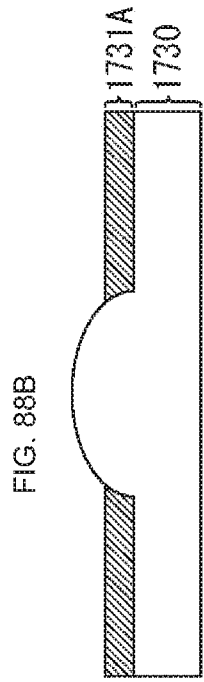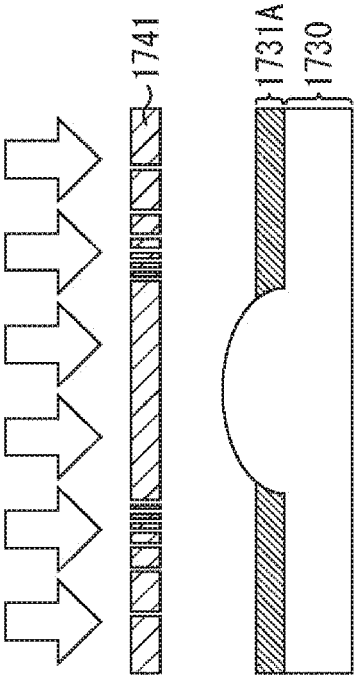

STACKED LENS STRUCTURE WITH A LENS PORTION HAVING A BLACK RESIN COMPRISING A PLURALITY OF VOIDS

CROSS REFERENCE TO RELATED APPLICATIONS

This application is a U.S. National Phase of International Patent Application No. PCT/JP2018/009151 filed on Mar. 9, 2018, which claims priority benefit of Japanese Patent Application No. JP 2017-057008 filed in the Japan Patent Office on Mar. 23, 2017. Each of the above-referenced applications is hereby incorporated herein by reference in its entirety.

TECHNICAL FIELD

The present technology relates to a stacked lens structure and a method of manufacturing the same, and an electronic device, and in particular to, in a stacked lens structure formed by stacking wafer substrates, the stacked lens structure that enables implementation of a diaphragm function and a method of manufacturing the same, and an electronic device.

BACKGROUND ART

Wafer level lens processes of arraying a plurality of lenses in a planar direction of a wafer substrate require severe shape accuracy and positional accuracy in forming the lenses. In particular, a process of stacking wafer substrates to produce a stacked lens structure is very difficult, and stacking three or more layers has not been implemented at mass production level.

Various technologies have been devised and proposed for the wafer level lens processes. For example, Patent Document 1 proposes a method of stacking wafer substrates by using a lens material as an adhesive as it is in filling the lens material in a through hole formed in a substrate to form a lens.

CITATION LIST

Patent Document

Patent Document 1: Japanese Patent Application Laid-Open No. 2009-279790

SUMMARY OF THE INVENTION

Problems to be Solved by the Invention

In general, a diaphragm mask for adjustment of an incident light amount and suppressing occurrence of flare due to stray light is inserted between lenses of a lens module. In the lens module formed by the wafer level lens processes, insertion of the diaphragm mask into an arbitrary position between lenses is difficult and an alternative method is required.

The present technology has been made in view of the foregoing, and enables implementation of a diaphragm function in a stacked lens structure formed by stacking wafer substrates.

Solutions to Problems

A stacked lens structure according to a first aspect of the present technology includes substrates with lens directly bonded and stacked, each substrate with lens having a lens resin portion disposed inside a through hole formed in a substrate, and a black resin on an upper surface or a lower surface of the lens resin portion of at least one of the substrates with lens, the black resin having a transmittance distribution monotonously decreasing from a lens center toward a peripheral portion.

A method of manufacturing a stacked lens structure according to a second aspect of the present technology includes forming a black resin having a transmittance distribution monotonously decreasing from a lens center toward a peripheral portion on an upper surface or a lower surface of a lens resin portion of a substrate with lens having the lens resin portion disposed inside a through hole formed in a substrate, and directly bonding and stacking substrates with lens including at least the substrate with lens in which the black resin has been formed.

An electronic device according to a third aspect of the present technology includes a camera module including a stacked lens structure including substrates with lens directly bonded and stacked, each substrate with lens having a lens resin portion disposed inside a through hole formed in a substrate, and a black resin on an upper surface or a lower surface of the lens resin portion of at least one of the substrates with lens, the black resin having a transmittance distribution monotonously decreasing from a lens center toward a peripheral portion.

In the first to third aspects of the present technology, substrates with lens are directly bonded and stacked, each substrate with lens having a lens resin portion disposed inside a through hole formed in a substrate, and a black resin having a transmittance distribution monotonously decreasing from a lens center toward a peripheral portion is provided on an upper surface or a lower surface of the lens resin portion of at least one of the substrates with lens.

The stacked lens structure and the electronic device may be independent devices or may be incorporated in other devices.

Effects of the Invention

According to the first to third aspects of the present technology, a diaphragm function can be implemented in a stacked lens structure formed by stacking wafer substrates.

Note that the effects described here are not necessarily limited, and any of effects described in the present disclosure may be exhibited.

BRIEF DESCRIPTION OF DRAWINGS

FIGS. 8A, 8B, 8C, 8D, 8E, 8F, 8G, and 8H are views for describing a configuration of a substrate with lens.

FIGS. 11A, 11B, 11C, and 11D are views illustrating a fourth embodiment of a camera module using a stacked lens structure to which the present technology is applied.

FIGS. 23A, 23B, 23C, 23D, 23E, 23F, and 23G are views for describing the method of manufacturing the substrate with lens.

FIG. 30 is a view for describing bonding of substrates with lens in a substrate state.

FIGS. 32A, 32B, 32C, 32D, 32E, and 32F are views for describing a first stacking method of stacking five substrates with lens in a substrate state.

FIGS. 52A, 52B, 52C, and 52D are views for describing a function brought by the stacked lens structure in FIG. 51.

FIGS. 60A, 60B, 60C, 60D, and 60E are views for describing bonding at wafer level using metal bonding.

FIGS. 73A, 73B, 73C, and 873D are views illustrating a fifth example of the pixel array in the light receiving region of the camera module.

FIGS. 74A, 74B, 74C, and 74D are views illustrating a sixth example of the pixel array in the light receiving region of the camera module.

FIGS. 79A, 79B, 79C, and 79D are views illustrating an eleventh example of the pixel array in the light receiving region of the camera module.

FIGS. 88A, 88B, 88C, 88D, and 88E are views for describing a method of manufacturing the third configuration example of the optical diaphragm.

MODE FOR CARRYING OUT THE INVENTION

Hereinafter, modes for implementing the present technology (hereinafter referred to as embodiments) will be described. Note that the description will be given in the following order.

1. First Embodiment of Camera Module
2. Second Embodiment of Camera Module
3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Substrate with Lens
10. Method of Manufacturing Substrate with Lens
11. Direct Bonding of Substrates with Lens
12. Eighth and Ninth Embodiments of Camera Module
13. Tenth Embodiment of Camera Module
14. Eleventh Embodiment of Camera Module
15. Effect of Present Structure Compared with Another Structure
16. Various Modifications
17. Pixel Array of Light Receiving Element, Structure of Diaphragm Plate, and Application
18. Configuration Example of Optical Diaphragm
19. Application Examples to Electronic Devices
20. Usage Example of Image Sensor
21. Application Example to In-vivo Information Acquisition System
22. Application Example to Endoscope Surgery System
23. Application Example to Moving Bodies 1. First Embodiment of Camera Module FIGS. 1A and 1B are views illustrating a first embodiment of a camera module using a stacked lens structure to which the present technology is applied.

Figure 1A:
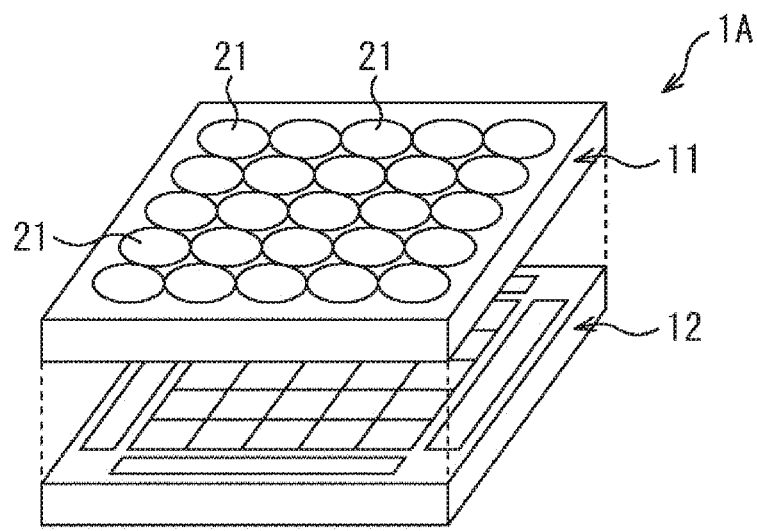
FIGS. 1A and 1B are views illustrating a first embodiment of a camera module using a stacked lens structure to which the present technology is applied.
Figure 1B:
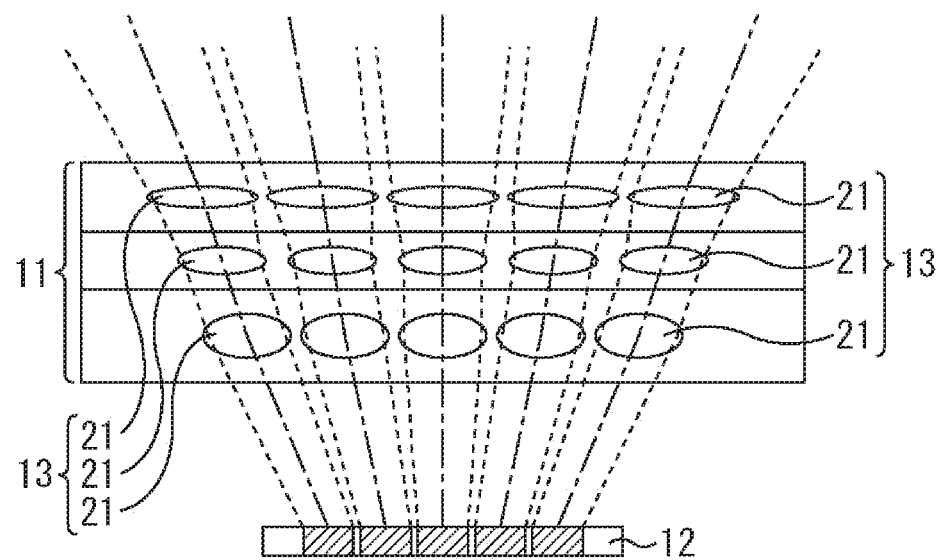

FIG. 1A is a schematic view illustrating a configuration of a camera module 1A as a first embodiment of a camera module 1. FIG. 1B is a schematic cross-sectional view of the camera module 1A.

The camera module 1A includes a stacked lens structure 11 and a light receiving element 12. The stacked lens structure 11 includes a total of twenty five optical units 13, five each in vertical and cross directions. The optical unit 13 includes a plurality of lenses 21 in one optical axis direction.

The camera module 1A is a compound eye camera module including a plurality of optical units 13.

The optical axes of the plurality of optical units 13 included in the camera module 1A are arranged to spread toward the outside of the module as illustrated in FIG. 1B, which enables capture of a wide-angle image.

Note that, in FIG. 1B, the stacked lens structure 11 has a structure in which only three layers of the lenses 21 are stacked for the sake of simplicity, but it goes without saying that more lenses 21 may be stacked.

The camera module 1A in FIGS. 1A and 1B can connect a plurality of images captured through the plurality of optical units 13 to create one wide-angle image. To connect the plurality of images, high accuracy is required for the formation and arrangement of the optical units 13 that capture the images. Furthermore, in particular, since a wide-angle-side optical unit 13 has a small light incident angle on the lens 21, high accuracy is also required for the positional relationship and arrangement of the lenses 21 in the optical unit 13.

Figure 2:
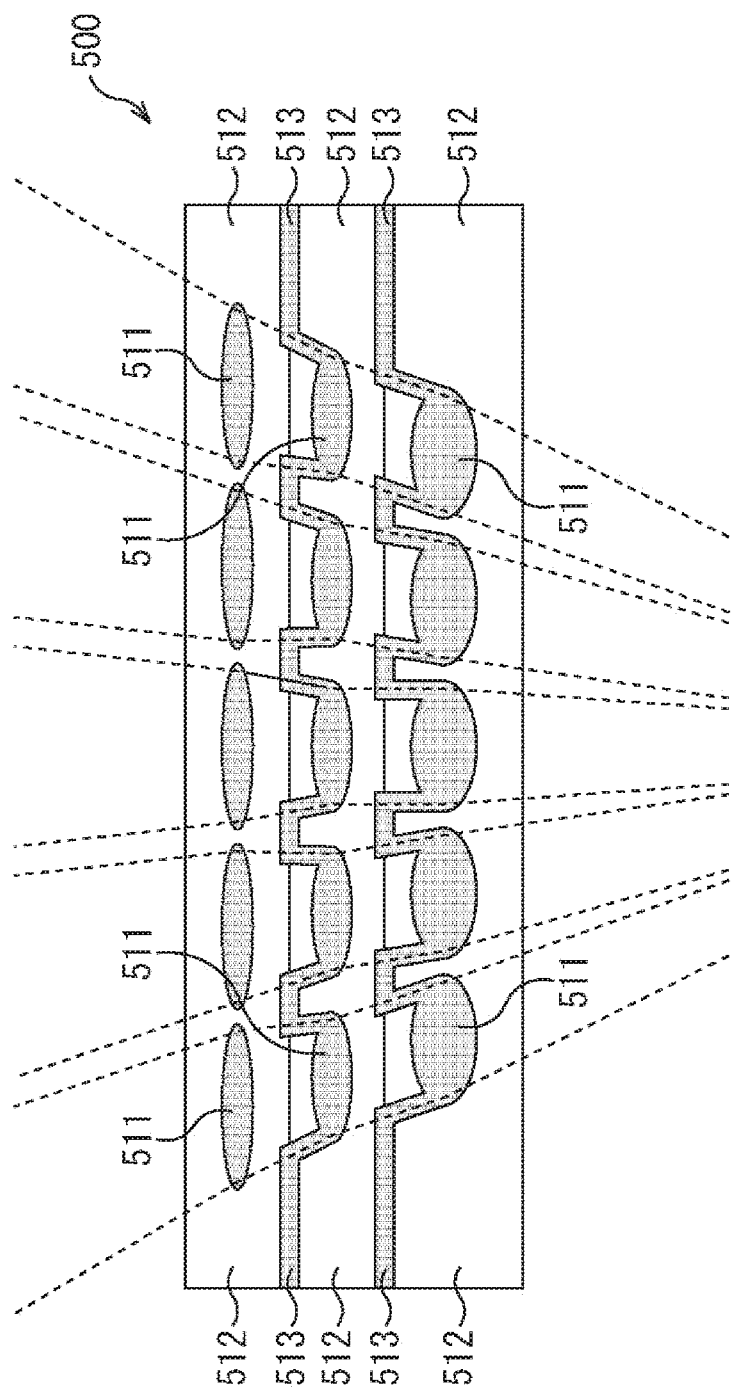
FIG. 2 is a cross-sectional structural view of a stacked lens structure disclosed in Patent Document 1.

FIG. 2 is a cross-sectional structural view of a stacked lens structure using a fixing technology using a resin disclosed in Patent Document 1.

In a stacked lens structure 500 illustrated in FIG. 2, a resin 513 is used as means for fixing substrates 512 provided with lenses 511. The resin 513 is an energy curable resin such as a UV curable resin.

Before bonding the substrates 512 to each other, a layer of the resin 513 is formed on an entire surface of the substrate 512. Thereafter, the substrates 512 are bonded to each other, and the resin 513 is further cured. Thereby, the bonded substrates 512 are fixed to each other.

However, when curing the resin 513, the resin 513 is cured and shrunk. In the case of the structure illustrated in FIG. 2, after the layer of the resin 513 is formed on the entire substrate 512, the resin 513 is cured, so a displacement amount of the resin 513 becomes large.

Furthermore, even after the stacked lens structure 500 formed by bonding the substrates 512 is separated into pieces, and imaging elements are combined to form a camera module, the resin 513 exists in entire regions between the substrates 512 including the lenses 511 in the stacked lens structure 500 provided in the camera module, as illustrated in FIG. 2. Therefore, there is a concern that the resin between the substrates of the stacked lens structure 500 is thermally expanded due to a temperature rise by heat generation of the device when the camera module is mounted in a housing of a camera and actually used.

Figure 3:
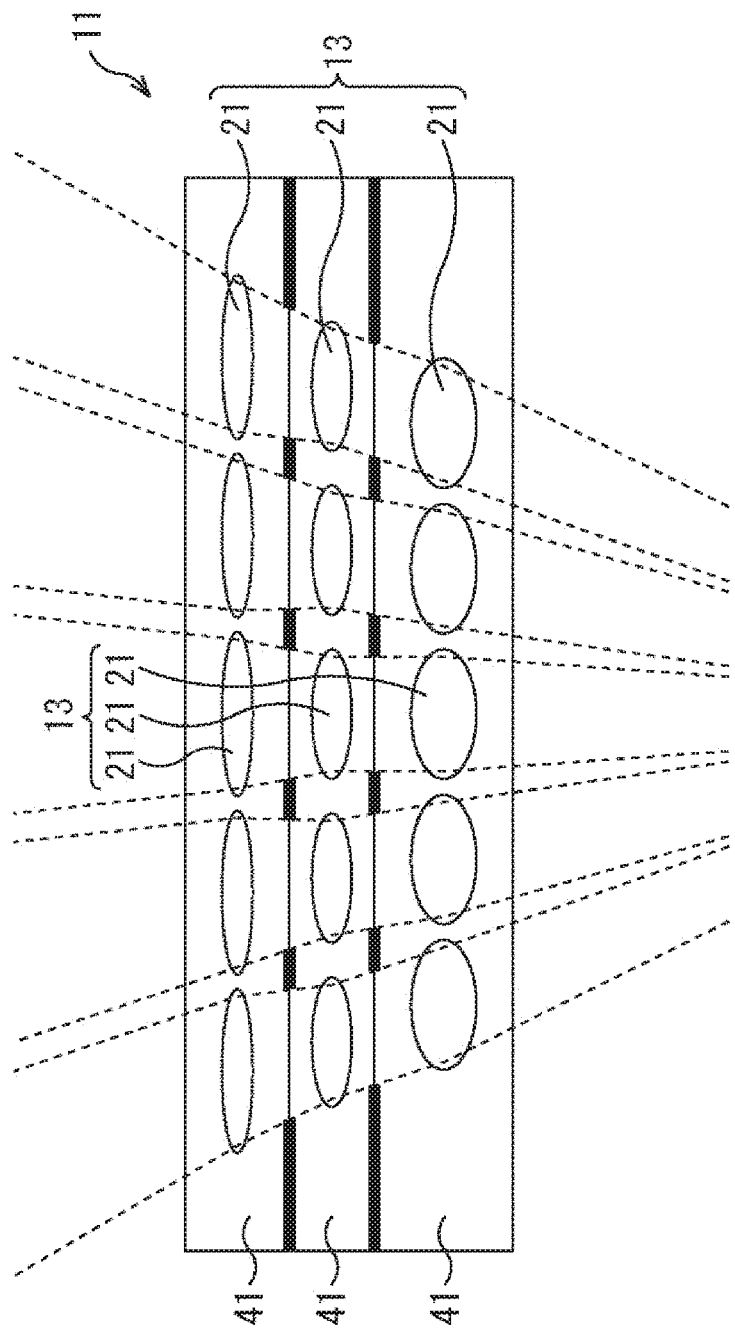
FIG. 3 is a cross-sectional structural view of the stacked lens structure of the camera module in FIGS. 1A and 1B.

FIG. 3 is a cross-sectional structural view illustrating only the stacked lens structure 11 of the camera module 1A in FIGS. 1A and 1B.

The stacked lens structure 11 of the camera module 1A is also formed by stacking a plurality of substrates with lens 41 provided with the lenses 21.

In the stacked lens structure 11 of the camera module 1A, a fixing means completely different from the means described in the stacked lens structure 500 in FIG. 2 and other conventional art documents, as a means for fixing the substrates with lens 41 provided with the lenses 21.

Figure 4:
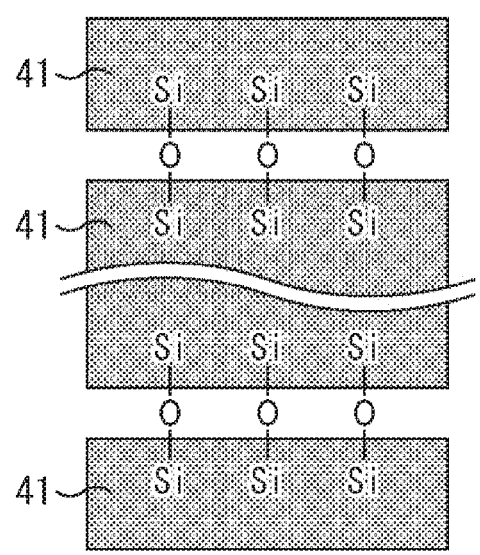
FIG. 4 is a view for describing direct bonding of a substrate with lens.

In other words, two substrates with lens 41 to be stacked are directly bonded by covalent bonding between a surface layer by an oxide or a nitride formed on one substrate surface and a surface layer by an oxide or a nitride formed on the other substrate surface. As a specific example, as illustrated in FIG. 4, a silicon oxide film or a silicon nitride film is formed as the surface layer on each surface of the two substrates with lens 41 to be stacked, and after hydroxyl groups are bonded to the surface layers, the two substrates with lens 41 are bonded to each other, heated, and dehydrated and condensed. As a result, a silicon-oxygen covalent bond is formed between the surface layers of the two substrates with lens 41. Thereby, the two substrates with lens 41 are directly bonded. Note that, as a result of condensation, direct formation of a covalent bond by elements contained in the two surface layers may occur.

In the present specification, fixing the two substrates with lens 41 through an inorganic layer disposed between the two substrates with lens 41, fixing the two substrates with lens 41 by chemically bonding inorganic layers respectively disposed on the surfaces of the two substrates with lens 41, fixing the two substrates with lens 41 by forming a bond by dehydration condensation between inorganic layers respectively disposed on the surfaces of the two substrates with lens 41, fixing the two substrates with lens 41 by forming a covalent bond via oxygen or a covalent bond of elements contained in respective inorganic layers between the inorganic layers respectively disposed on the surfaces of the two substrates with lens 41, or fixing the two substrates with lens 41 by forming a silicon-oxygen covalent bond or a silicon-silicon covalent bond between silicon oxide layers or silicon nitride layers respectively disposed on the surfaces of the two substrates with lens 41 is called direct bonding.

In the present embodiment, to perform the bonding and dehydration condensation by temperature rise, a lens is formed in a substrate state using a substrate used in the field of manufacturing semiconductor devices and flat display devices, the bonding and dehydration and condensation by temperature rise are performed in the substrate state, and bonding by covalent bonding is performed in the substrate state. The structure in which the inorganic layers formed on the surfaces of the two substrates with lens 41 are bonded by covalent bonding brings about a function or an effect to suppress the deformation of the resin 513 over the entire substrate due to curing and shrinkage, and the deformation of the resin 513 due to thermal expansion at an actual use, which are concerned in a case of using the technology described in FIG. 2 disclosed in Patent Document 1.

Figure 5:
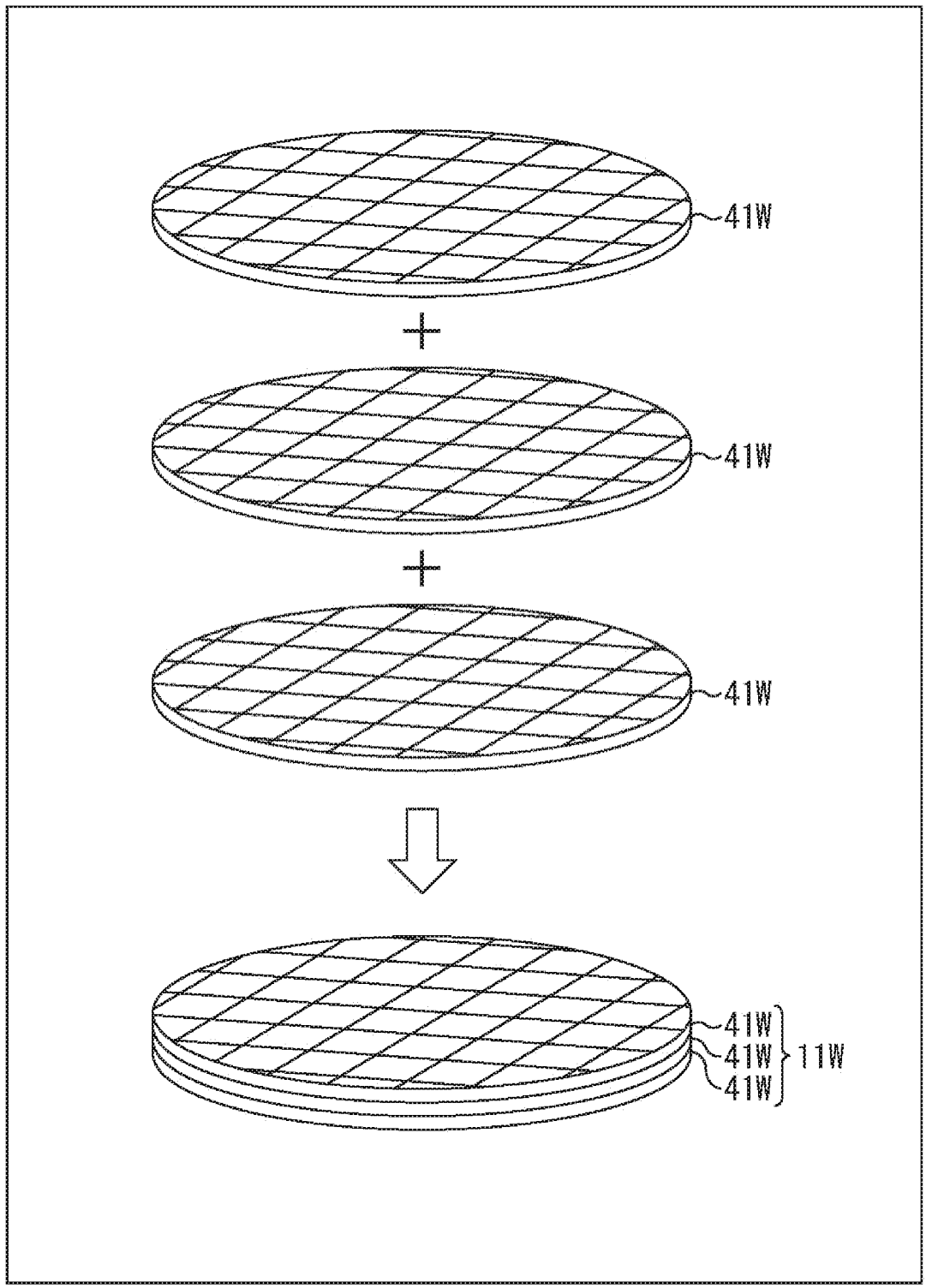
FIG. 5 is a view illustrating a process of forming the camera module in FIGS. 1A and 1B.
Figure 6:
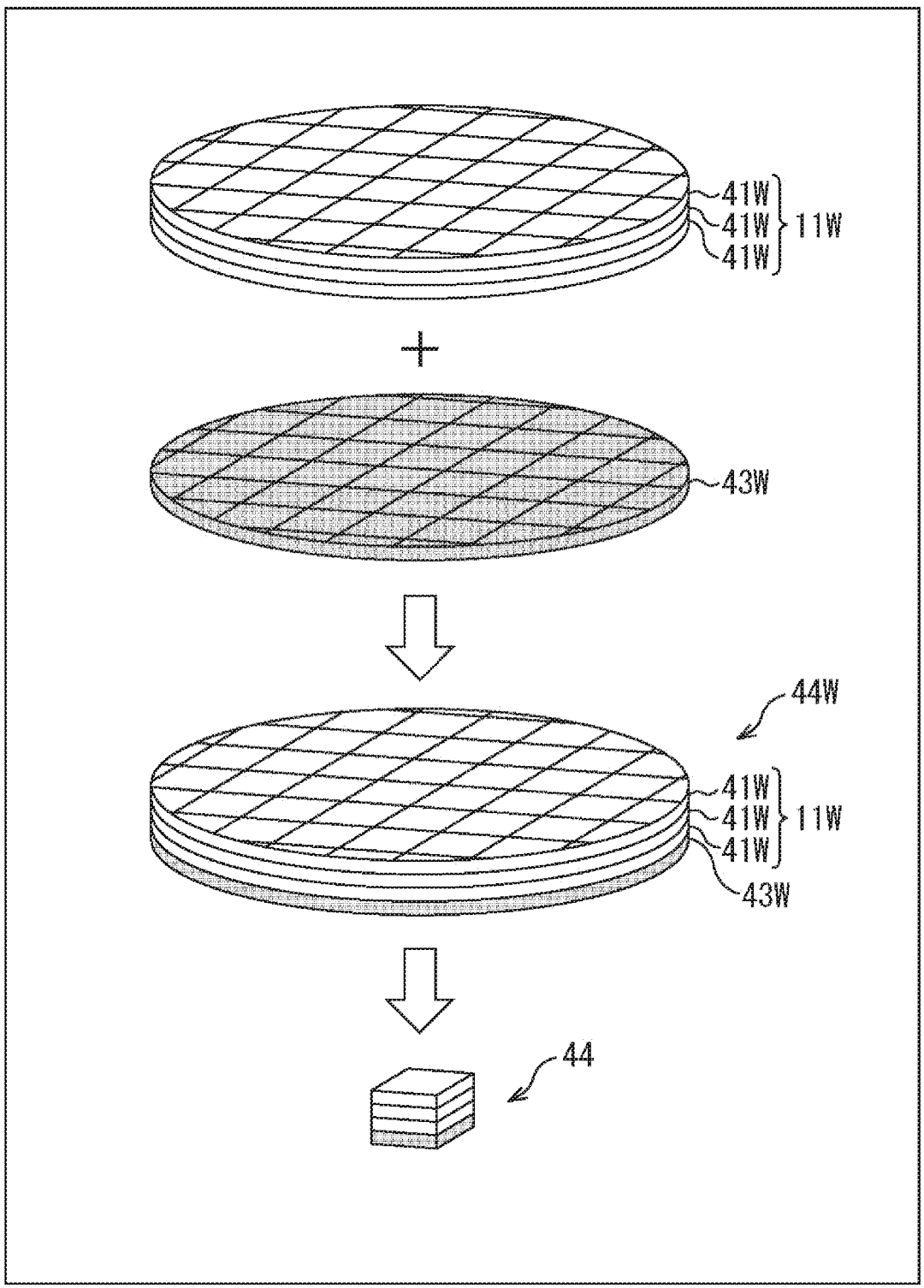
FIG. 6 is a view illustrating a process of forming the camera module in FIGS. 1A and 1B.

FIGS. 5 and 6 are views illustrating a process of forming the camera module 1A in FIGS. 1A and 1B in which the stacked lens structure 11 and the light receiving element 12 are combined.

First, as illustrated in FIG. 5, a plurality of substrates with lens 41W in which a plurality of lenses 21 (not illustrated) is formed in a planar direction is prepared and stacked. Thereby, a stacked lens structure 11W in a substrate state in which the plurality of substrates with lens 41W in a substrate state is stacked is obtained.

Next, as illustrated in FIG. 6, a sensor substrate 43W in a substrate state in which a plurality of light receiving elements 12 is formed in the planar direction is manufactured separately from the stacked lens structure 11W in the substrate state illustrated in FIG. 5.

Then, the sensor substrate 43W in the substrate state and the stacked lens structure 11W in the substrate state are stacked, and an external terminal is attached to each module of the bonded substrates, whereby a camera module 44W in a substrate state is obtained.

Finally, the camera module 44W in the substrate state is separated into pieces in module units or chip units. The individually separated camera module 44 is enclosed in a separately prepared housing (not illustrated), whereby a final camera module 44 is obtained.

Note that, in the present specification and drawings, for example, a component with "W" added to its code, such as the substrate with lens 41W, indicates that the component is in the substrate state (wafer state), and a component without "W", such as the substrate with lens 41, indicates that the product is in the separated state in module units or chip units. The rule similarly applies to the sensor substrate 43W, the camera module 44W, and the like.

Figure 7:
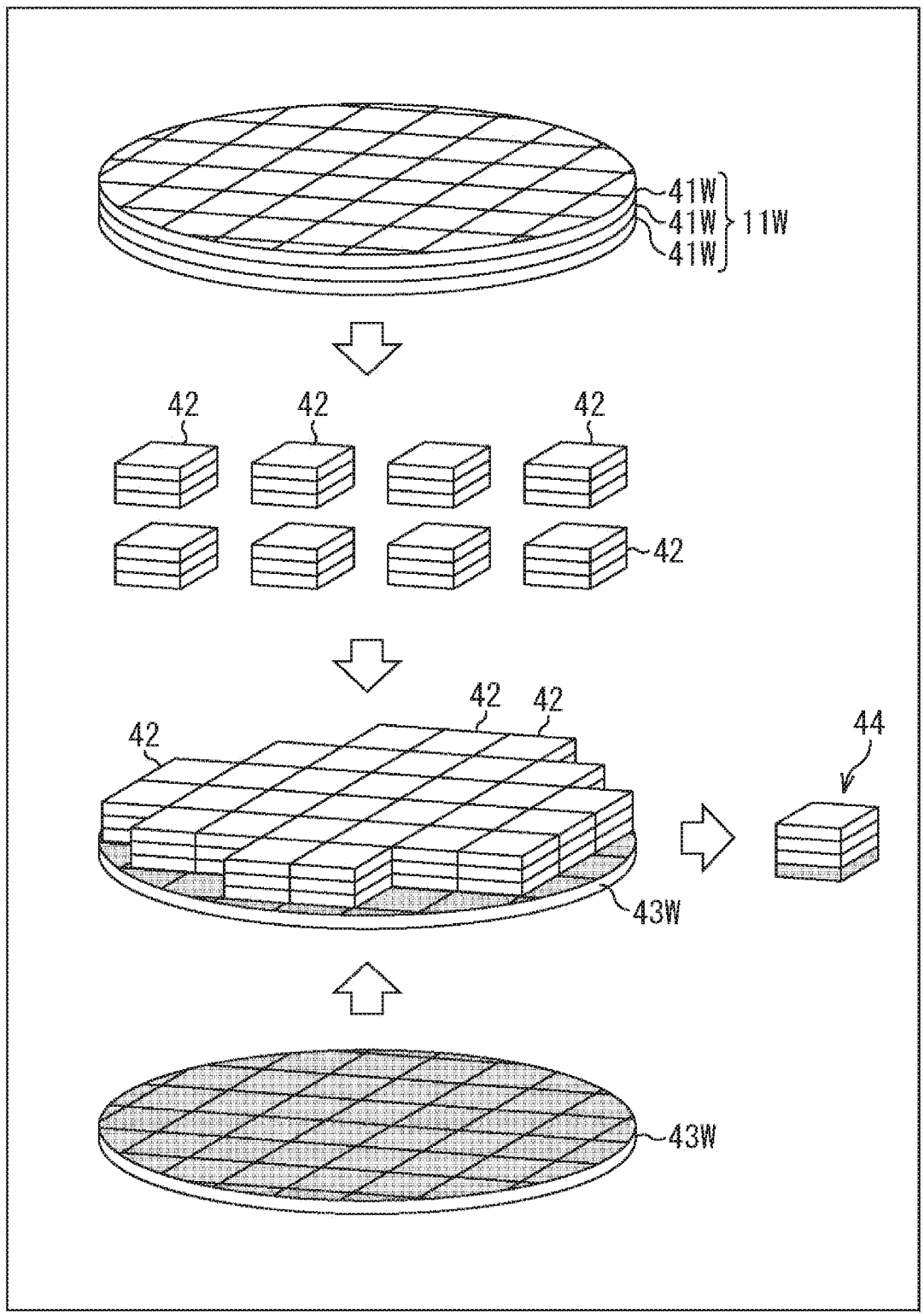
FIG. 7 is a view illustrating another process of forming the camera module in FIGS. 1A and 1B.

FIG. 7 is a view illustrating another process of forming the camera module 1A in FIGS. 1A and 1B in which the stacked lens structure 11 and the light receiving element 12 are combined.

First, similarly to the above-described process, the stacked lens structure 11W in the substrate state in which the plurality of substrates with lens 41W in the substrate state is stacked is manufactured.

Next, the stacked lens structure 11W in the substrate state is separated into pieces.

Furthermore, the sensor substrate 43W in the substrate state is produced and prepared separately from the stacked lens structure 11W in the substrate state.

Then, the individually separated stacked lens structures 11 are mounted one by one on the respective light receiving elements 12 of the sensor substrate 43W in the substrate state.

Finally, the sensor substrate 43W in the substrate state on which the individually separated stacked lens structures 11 are mounted is separated into pieces in module units or chip units. The sensor substrate 43 having the stacked lens structure 11 mounted and individually separated is enclosed in a separately prepared housing (not illustrated), and an external terminal is further attached, whereby the final camera module 44 is obtained.

Moreover, as an example of another process of forming the camera module 1A in FIGS. 1A and 1B in which the stacked lens structure 11 and the light receiving element 12 are combined, the sensor substrate 43W in the substrate state illustrated in FIG. 7 is separated into pieces, the individually separated stacked lens structures 11 are respectively mounted on the individual light receiving elements 12 obtained as a result of the individual separation, and the individually separated camera module 44 may be obtained.

FIGS. 8A, 8B, 8C, 8D, 8E, 8F, 8G, and 8H are views for describing the configuration of the substrate with lens 41 in the camera module 1A.

FIG. 8A is a schematic view illustrating the configuration of the camera module 1A, similar to FIG. 1A.

FIG. 8B is a schematic cross-sectional view of the camera module 1A, similar to FIG. 1B.

As illustrated in FIG. 8B, the camera module 1A is a compound eye camera module including the plurality of optical units 13 each formed by combining the plurality of lenses 21 and having one optical axis. The stacked lens structure 11 includes a total of twenty five optical units 13, five each in vertical and cross directions.

The optical axes of the plurality of optical units 13 included in the camera module 1A are arranged to spread toward the outside of the module, which enables capture of a wide-angle image. In FIG. 8B, the stacked lens structure 11 has the structure in which only three substrates with lens 41 are stacked for the sake of simplicity, but it goes without saying that more substrates with lens 41 may be stacked.

FIGS. 8C, 8D, and 8E are views illustrating respective planar shapes of the three substrates with lens 41 constituting the stacked lens structure 11.

FIG. 8C is a plan view of the uppermost substrate with lens 41, FIG. 8D is a plan view of the middle substrate with lens 41, and FIG. 8D is a plan view of the lowermost substrate with lens 41, among the three layers. Since the camera module 1 is a compound-eye wide-angle camera module, the diameter of the lens 21 becomes larger and the pitch between the lenses increases toward an upper layer.

FIGS. 8F, 8G, and 8H are plan views of the substrates with lens 41W in the substrate state, for obtaining the substrates with lens 41 illustrated in FIGS. 8C, 8D, and 8E.

The substrate with lens 41W illustrated in FIG. 8F indicates a substrate state corresponding to the substrate with lens 41 in FIG. 8C, the substrate with lens 41W illustrated in FIG. 8G indicates a substrate state corresponding to the substrate with lens 41 in FIG. 8D, and the substrate with lens 41W illustrated in FIG. 8H indicates a substrate state corresponding to the substrate with lens 41 in FIG. 8E.

The substrates with lens 41W in the substrate state illustrated in F to H in FIGS. 8F, 8G, and 8H have configurations to obtain eight camera modules 1A illustrated in FIG. 8A for each substrate.

Among the substrates with lens 41W in FIGS. 8F, 8G, and 8H, it is understood that the pitch between lenses in the substrate with lens 41 in module units is different between the upper substrate with lens 41W and the lower substrate with lens 41W, whereas in each substrate with lens 41W, the pitch of arranging the substrates with lens 41 in module units is constant from the upper substrate with lens 41W to the lower substrate with lens 41W.

2. Second Embodiment of Camera Module

FIGS. 9A, 9B, 9C, 9D, 9E, 9F, 9G, and 9H are views illustrating a second embodiment of a camera module using a stacked lens structure to which the present technology is applied.

Figure 9A:
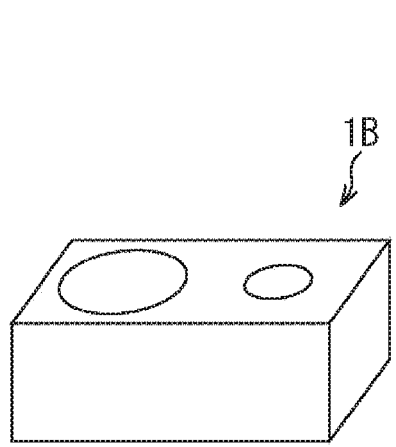
FIGS. 9A, 9B, 9C, 9D, 9E, 9F, 9G, and 9H are views illustrating a second embodiment of a camera module using a stacked lens structure to which the present technology is applied.
Figure 9B:
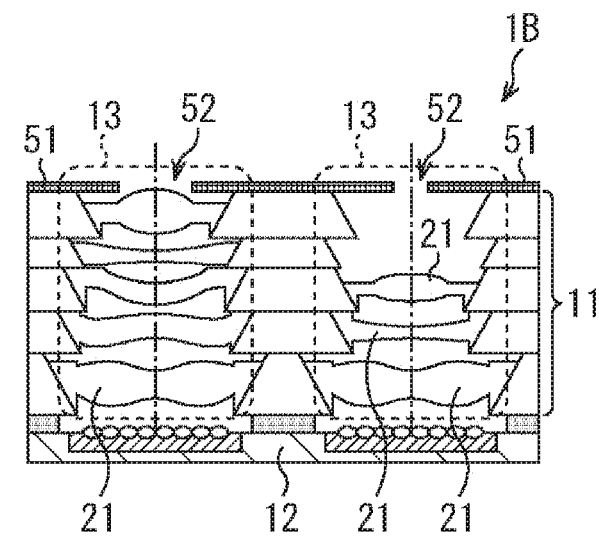

FIG. 9A is a schematic view illustrating an appearance of a camera module 1B as the second embodiment of the camera module 1. FIG. 9B is a schematic cross-sectional view of the camera module 1B.

The camera module 1B includes two optical units 13. The two optical units 13 are provided with a diaphragm plate 51 on an uppermost layer of a stacked lens structure 11. The diaphragm plate 51 is provided with an opening portion 52.

The camera module 1B includes the two optical units 13, but optical parameters of the two optical units 13 are different. In other words, the camera module 1B includes two types of optical units 13 having different optical performances. The two types of optical units 13 can be, for example, an optical unit 13 having a short focal length for capturing a near view and an optical unit 13 having a long focal length for capturing a distant view.

Since the optical parameters of the two optical units 13 are different in the camera module 1B, the number of lenses 21 of the two optical units 13 is different, as illustrated in FIG. 9B, for example. Furthermore, in the lenses 21 in the same layer of the stacked lens structures 11 provided in the two optical units 13, any of the diameter, the thickness, the surface shape, the volume, or the distance from an adjacent lens can be different. For this reason, the planar shape of the lenses 21 in the camera module 1B may have a configuration in which, for example, the two optical units 13 have the lenses 21 having the same diameter, as illustrated in FIG. 9C, the two optical units 13 have the lenses 21 having different shapes, as illustrated in FIG. 9D, or one of the two optical units 13 have a cavity 21X without the lens 21, as illustrated in FIG. 9E.

Figure 9C:
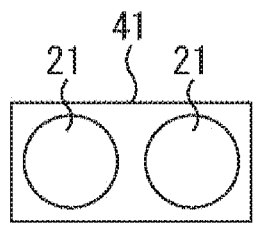
Figure 9D:
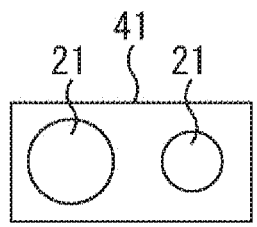
Figure 9E:
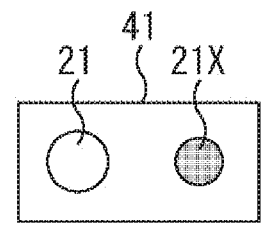
Figure 9F:
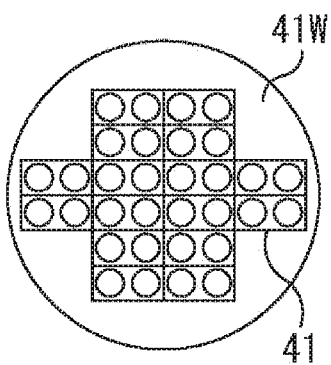
Figure 9G:
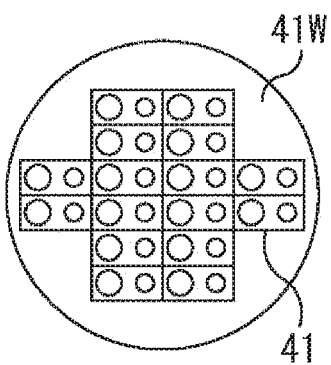
Figure 9H:
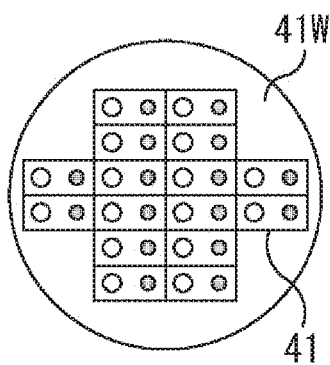

FIGS. 9F, 9G, and 9H are plan views of substrates with lens 41W in a substrate state, for obtaining substrates with lens 41 illustrated in FIGS. 9C 9D, and 9E.

The substrate with lens 41W illustrated in FIG. 9F indicates a substrate state corresponding to the substrate with lens 41 in FIG. 9C, the substrate with lens 41W illustrated in FIG. 9G indicates a substrate state corresponding to the substrate with lens 41 in FIG. 9D, and the substrate with lens 41W illustrated in FIG. 9H indicates a substrate state corresponding to the substrate with lens 41 in FIG. 9E.

The substrates with lens 41W in the substrate state illustrated in FIGS. 9F, 9G, and 9H have configurations to obtain sixteen camera modules 1B illustrated in FIG. 9A for each substrate.

As illustrated in FIGS. 9F, 9G, and 9H, to form the camera module 1B, it is possible to form the lenses having the same shape on the entire substrate of the substrate with lens 41W in the substrate state, it is possible to form the lenses having different shapes, or it is possible to form and not to form the lens.

3. Third Embodiment of Camera Module

FIGS. 10A, 10B, 10C, 10D, 10E, and 10F are views illustrating a third embodiment of a camera module using a stacked lens structure to which the present technology is applied.

Figure 10A:
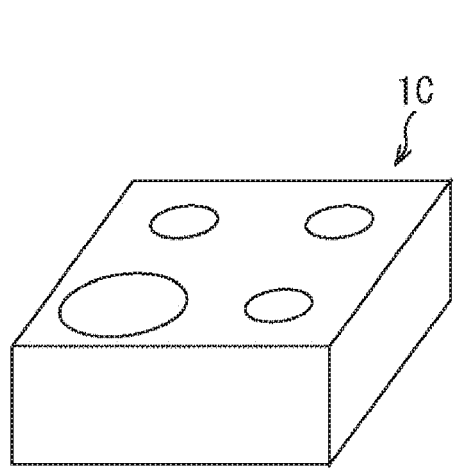
FIGS. 10A, 10B, 10C, 10D, 10E, and 10F are views illustrating a third embodiment of a camera module using a stacked lens structure to which the present technology is applied.
Figure 10B:
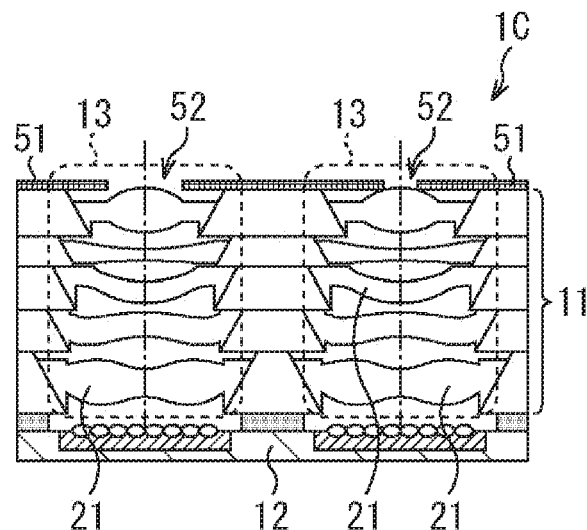

FIG. 10A is a schematic view illustrating an appearance of a camera module 1C as the third embodiment of the camera module 1. FIG. 10B is a schematic cross-sectional view of the camera module 1C.

The camera module 1C includes a total of four optical units 13 on a light incident surface, two each in vertical and cross directions. The shapes of lenses 21 of the four optical units 13 are the same.

The four optical units 13 include a diaphragm plate 51 in an uppermost layer of a stacked lens structure 11, but sizes of opening portions 52 of the diaphragm plate 51 are different among the four optical units 13. Thereby, the camera module 1C can implement, for example, the following camera module 1C. In other words, for example, in a surveillance camera for crime prevention, the camera module 1C using a light receiving element 12 including a light receiving pixel provided with three types of RGB color filters and which receives three types of RGB lights for daytime color image surveillance, and a light receiving pixel not provided with the RGB color filters for nighttime black-and-white image surveillance can make the size of an aperture of the diaphragm large for only the pixel for capturing a nighttime black-and-white image when the illuminance is low. For this reason, regarding the planar shapes of the lenses 21 in one camera module 1C, the diameters of the lenses 21 included in the four optical units 13 are the same, as illustrated in FIG. 10C, and the sizes of the opening portions 52 of the diaphragm plate 51 are different depending on the optical units 13, as illustrated in FIG. 10D, for example.

Figure 10C:
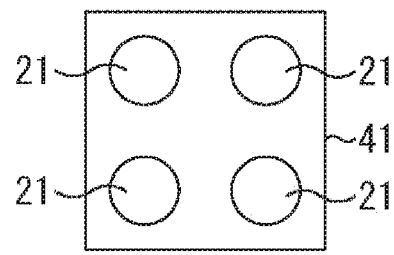
Figure 10D:
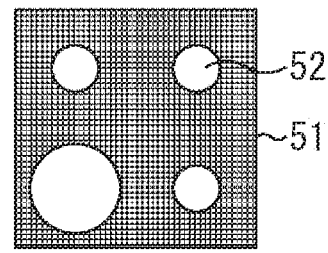
Figure 10E:
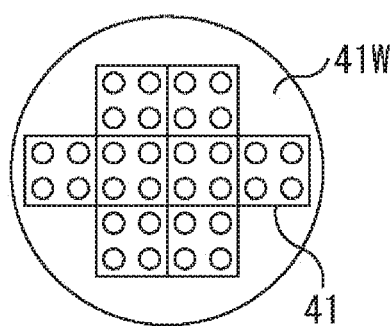
Figure 10F:
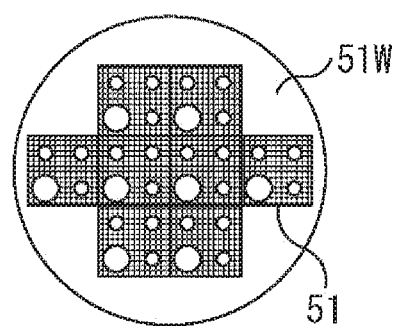

FIG. 10E is a plan view of a substrate with lens 41W in a substrate state, for obtaining a substrate with lens 41 illustrated in FIG. 10C. FIG. 10F is a plan view illustrating a diaphragm plate 51W in a substrate state, for obtaining the diaphragm plate 51 illustrated in FIG. 10D.

The substrate with lens 41W in the substrate state in FIG. 10E and the diaphragm plate 51W in the substrate state in FIG. 10F have configurations to obtain eight camera modules 1C illustrated in FIG. 10A for each substrate.

As illustrated in FIG. 10F, in the diaphragm plate 51W in the substrate state, the different sizes of the opening portions 52 can be set for each optical unit 13 included in the camera module 1C in order to form the camera module 1C.

4. Fourth Embodiment of Camera Module

FIGS. 11A, 11B, 11C, and 11D are views illustrating a fourth embodiment of a camera module using a stacked lens structure to which the present technology is applied.

FIG. 11A is a schematic view illustrating an appearance of a camera module 1D as the fourth embodiment of the camera module 1. FIG. 11B is a schematic cross-sectional view of the camera module 1D.

Similarly to the camera module 1C, the camera module 1D includes a total of four optical units 13 on a light incident surface, two each in vertical and cross directions. The shapes of lenses 21 and the sizes of opening portions 52 of a diaphragm plate 51 of the four optical units 13 are the same.

In the camera module 1D, optical axes provided in the optical units 13 disposed two each in the vertical and cross directions of a light incident surface extend in the same direction. An alternate long and short dash line illustrated in FIG. 11B represents the optical axis of each optical unit 13. The camera module 1D having such a structure is more suitable for capturing an image with high resolution than capturing an image with one optical unit 13 using a super resolution technology.

The camera module 1D captures images by a plurality of light receiving elements 12 disposed at different positions or capturing images by light receiving pixels in different regions in one light receiving element 12 while the optical axes are directed in the same direction in each of the vertical and cross directions, thereby obtaining a plurality of not necessarily the same images while the optical axes are directed in the same direction. By combining image data at locations of the plurality of non-identical images, an image with high resolution can be obtained. For this reason, as illustrated in FIG. 11C, the four optical units 13 desirably have the same planar shape in the lenses 21 in one camera module 1D.

FIG. 11D is a plan view of a substrate with lens 41W in a substrate state, for obtaining a substrate with lens 41 illustrated in FIG. 11C. The substrate with lens 41W in the substrate state has a configuration to obtain eight camera modules 1D illustrated in FIG. 11A for each substrate.

As illustrated in FIG. 11D, in the substrate with lens 41W in the substrate state, the camera module 1D includes the plurality of lenses 21, and a plurality of lens groups for one camera module is disposed at constant pitches on the substrate in order to form the camera module 1D.

5. Fifth Embodiment of Camera Module

FIGS. 12A, 12B, 12C, and 12D are views illustrating a fifth embodiment of a camera module using a stacked lens structure to which the present technology is applied.

Figures 12A, 12B:
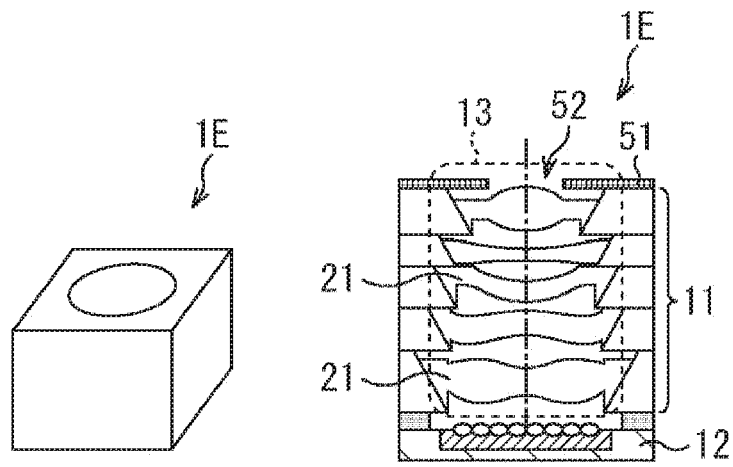
FIGS. 12A, 12B, 12C, and 12D are views illustrating a fifth embodiment of a camera module using a stacked lens structure to which the present technology is applied.

FIG. 12A is a schematic view illustrating an appearance of a camera module 1E as the fifth embodiment of the camera module 1. FIG. 12B is a schematic cross-sectional view of the camera module 1E.

The camera module 1E is a monocular camera module including one optical unit 13 having one optical axis in the camera module 1E.

Figure 12C:
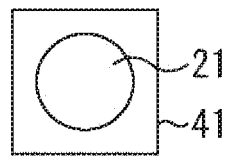

FIG. 12C is a plan view of a substrate with lens 41 illustrating a planar shape of lenses 21 in the camera module 1E. The camera module 1E includes one optical unit 13.

Figure 12D:
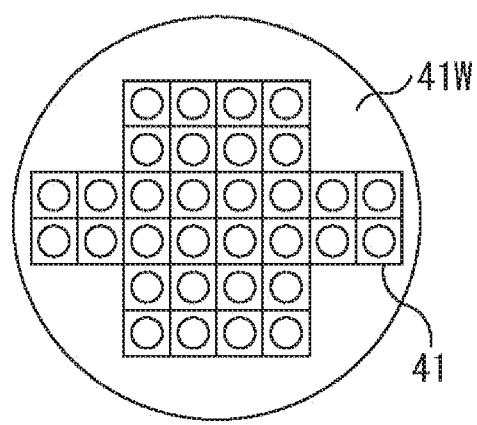

FIG. 12D is a plan view of a substrate with lens 41W in a substrate state, for obtaining the substrate with lens 41 illustrated in FIG. 12C. The substrate with lens 41W in the substrate state has a configuration to obtain thirty-two camera modules 1E illustrated in FIG. 12A for each substrate.

As illustrated in FIG. 12D, in the substrate with lens 41W in the substrate state, a plurality of lenses 21 for the camera module 1E is arranged on the substrate at constant pitches.

6. Detailed Configuration of Camera Module of Fourth Embodiment

Next, a detailed configuration of the camera module 1D according to the fourth embodiment illustrated in FIGS. 11A, 11B, 11C, and 11D will be described with reference to FIG. 13.

Figure 13:
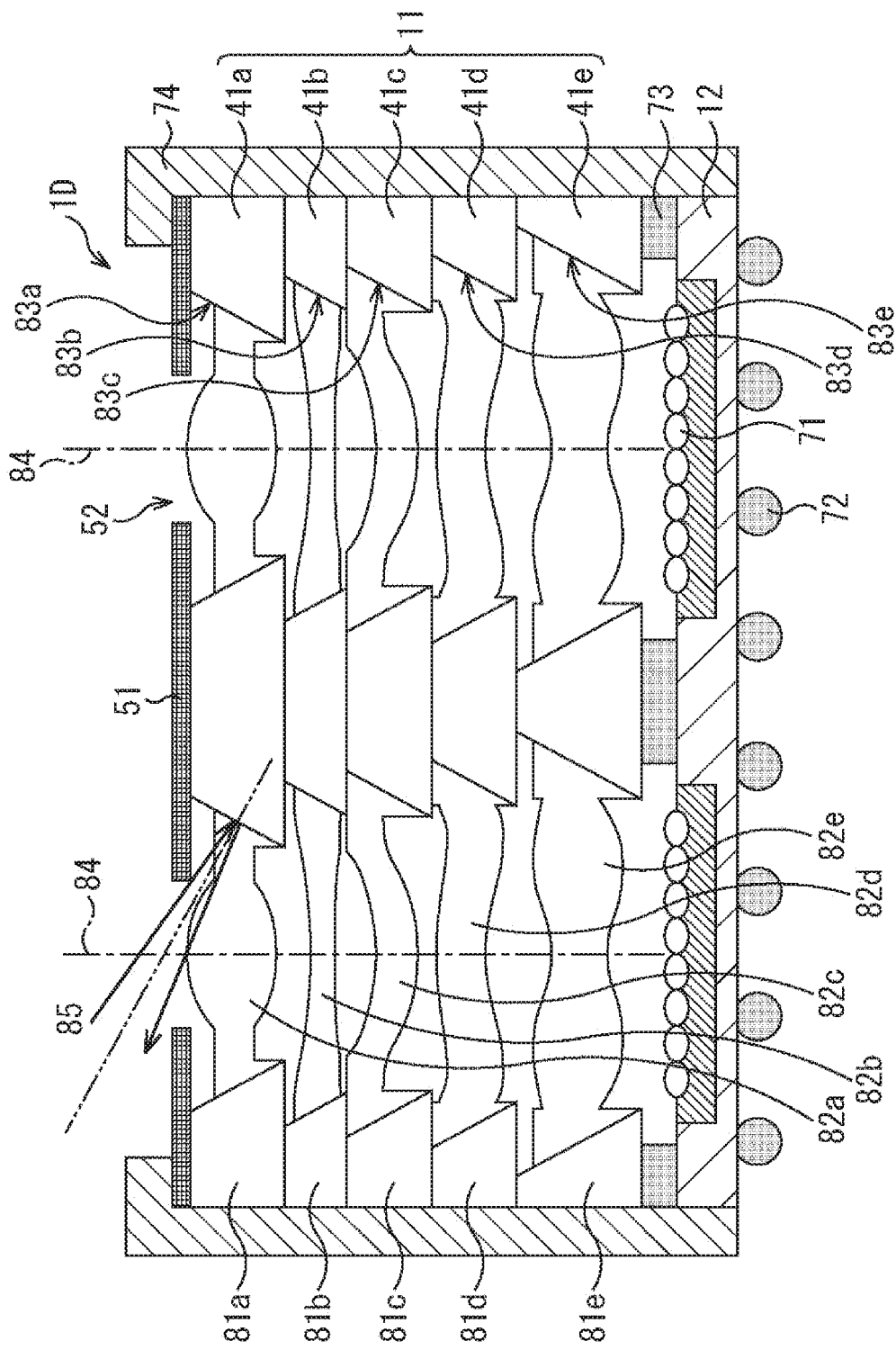
FIG. 13 is a view for describing a detailed configuration of the camera module according to the fourth embodiment.

FIG. 13 is a cross-sectional view of the camera module 1D illustrated in FIG. 11B.

The camera module 1D includes the stacked lens structure 11 in which a plurality of substrates with lens 41a to 41e is stacked, and the light receiving element 12. The stacked lens structure 11 includes the plurality of optical units 13. An alternate long and short dash line 84 represents an optical axis of each optical unit 13. The light receiving element 12 is disposed below the stacked lens structure 11. In the camera module 1D, light entering the camera module 1D from above is transmitted through the stacked lens structure 11 and is received by the light receiving element 12 disposed below the stacked lens structure 11.

The stacked lens structure 11 includes the five stacked substrates with lens 41a to 41e. In a case where the five substrates with lens 41a to 41e are not particularly distinguished, they will be simply described as substrates with lens 41.

The cross-sectional shape of a through holes 83 of each substrate with lens 41 constituting the stacked lens structure 11 has a so-called downward concave shape in which the opening width becomes smaller toward a lower side (a side where the light receiving element 12 is disposed).

A diaphragm plate 51 is disposed on the stacked lens structure 11. The diaphragm plate 51 includes, for example, a layer formed using light-absorbing or light-shielding material. The diaphragm plate 51 is provided with an opening portion 52.

The light receiving element 12 is configured as a front illumination or back illumination complementary metal oxide semiconductor (CMOS) image sensor, for example. An on-chip lens 71 is formed on an upper surface of the light receiving element 12 on the stacked lens structure 11 side, and an external terminal 72 for inputting and outputting signals is formed on a lower surface of the light receiving element 12.

The stacked lens structure 11, the light receiving element 12, the diaphragm plate 51, and the like are accommodated in a lens barrel 74.

A structural material 73 is disposed on the upper side of the light receiving element 12. The stacked lens structure 11 and the light receiving element 12 are fixed via the structural material 73. The structural material 73 is, for example, an epoxy resin.

In the present embodiment, the stacked lens structure 11 includes the five stacked substrates with lens 41a to 41e, but the number of stacked substrates with lenses 41 is not particularly limited as long as the number is two or more.

Each of the substrates with lens 41 constituting the stacked lens structure 11 has a configuration in which a lens resin portion 82 is added to a support substrate 81. The support substrate 81 has a through hole 83, and a lens resin portion 82 is formed inside the through hole 83. The lens resin portion 82 includes the above-described lenses 21, and indicates a portion integrated by the material configuring the lenses 21 together with a portion extending up to the support substrate 81 and supporting the lenses 21.

Note that, in a case of distinguishing the support substrates 81, the lens resin portions 82, or the through holes 83 of the substrates with lens 41a to 41e, they are respectively written and described as support substrates 81a to 81e, lens resin portions 82a to 82e, or the through holes 83a to 83e, corresponding to the substrates with lens 41a to 41e, as illustrated in FIG. 13.

Detailed Description of Lens Resin Portion

Next, the shape of the lens resin portion 82 will be described taking the lens resin portion 82a of the substrate with lens 41a as an example.

Figure 14:
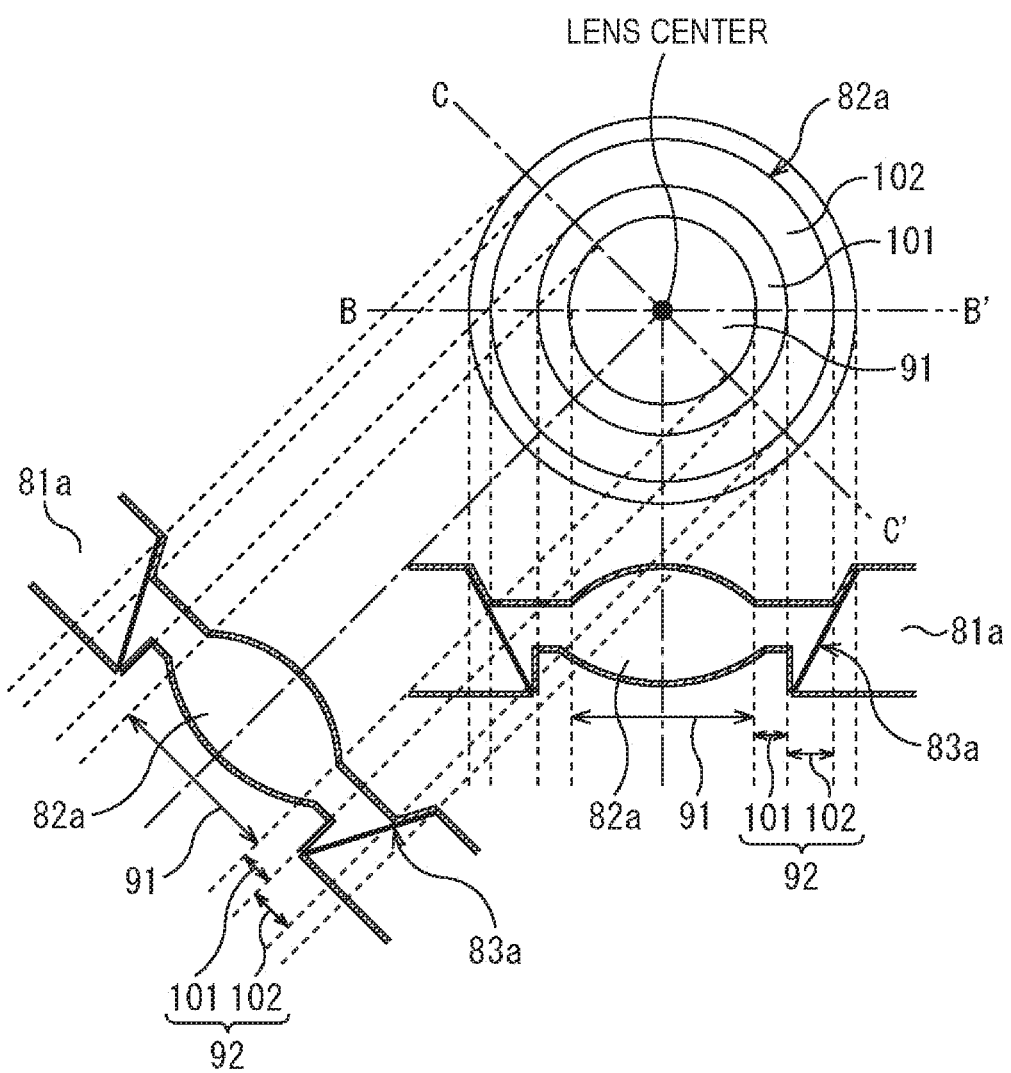
FIG. 14 illustrates a plan view and cross-sectional views of a support substrate and a lens resin portion.

FIG. 14 illustrates a plan view and cross-sectional views of the support substrate 81a and the lens resin portion 82a that constitute the substrate with lens 41a.

The cross-sectional views of the support substrate 81a and the lens resin portion 82a illustrated in FIG. 14 are cross-sectional views taken along lines B-B' and C-C' illustrated in the plan view.

The lens resin portion 82a is a portion integrally formed using the material configuring the lens 21, and includes a lens portion 91 and a support portion 92. In the above description, the lens 21 corresponds to the lens portion 91 or the entire lens resin portion 82a.

The lens portion 91 is a portion having performance as a lens, in other words, "a portion that refracts and focuses or diverges light", or "a portion provided with a curved surface such as a convex surface, a concave surface, or an aspheric surface, or a portion in which a plurality of polygons used in a Fresnel lens or a lens using a diffraction grating is continuously arranged".

The support portion 92 is a portion that extends from the lens portion 91 to the support substrate 81a and supports the lens portion 91. The support portion 92 is configured by an arm portion 101 and a leg portion 102 and is located on an outer periphery of the lens portion 91.

The arm portion 101 is a portion disposed on the outside of the lens portion 91 in contact with the lens portion 91 and extends from the lens portion 91 in an outer direction with a constant film thickness. The leg portion 102 is a portion other than the arm portion 101 in the support portion 92 and in contact with a side wall of the through hole 83a. The leg portion 102 is favorably thicker in resin film thickness than the arm portion 101.

The planar shape of the through hole 83a formed in the support substrate 81a is circular, and the cross-sectional shape is naturally the same regardless of the direction of the diameter. The shape of the lens resin portion 82a, which is a shape determined by shapes of an upper mold and a lower mold at the time of lens formation, is also formed such that the cross-sectional shape becomes the same regardless of the direction of the diameter.

Figure 15:
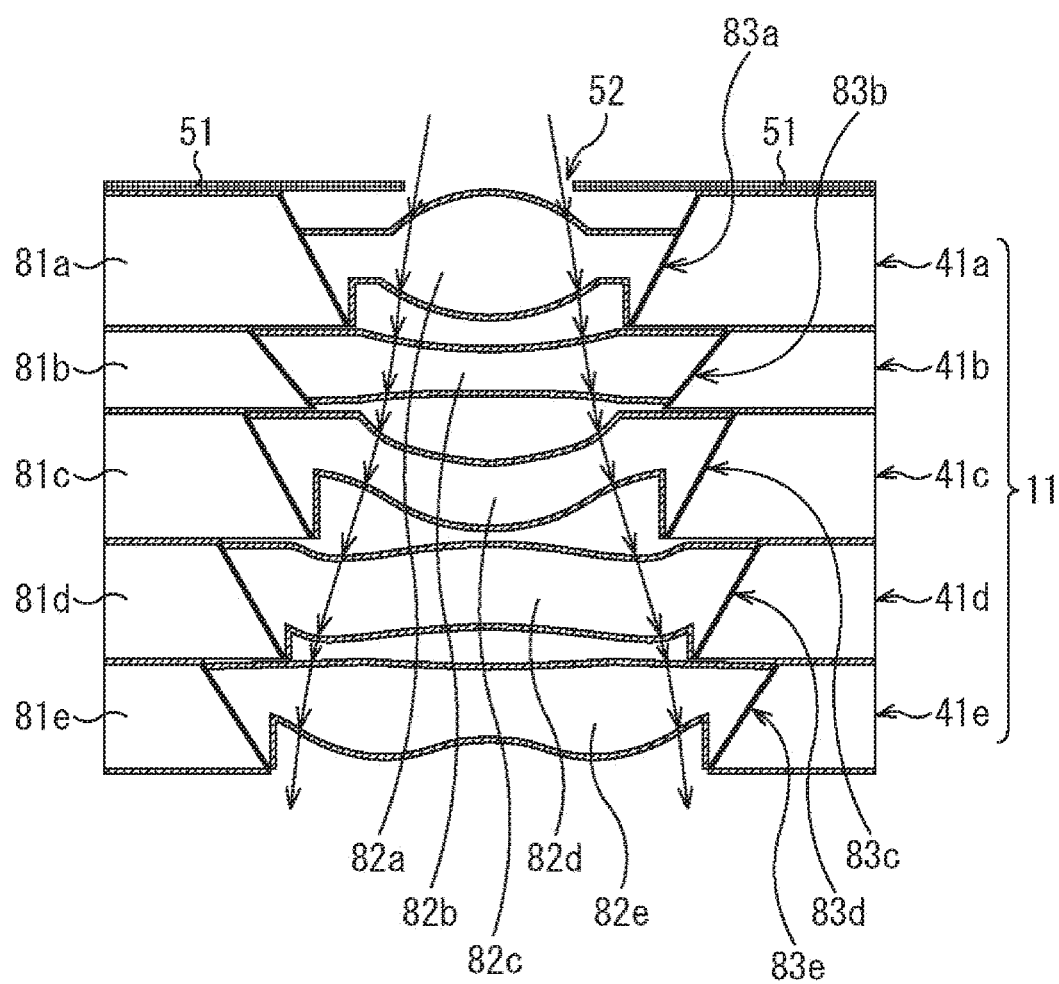
FIG. 15 is a cross-sectional view illustrating a stacked lens structure and a diaphragm plate.

FIG. 15 is a cross-sectional view illustrating the stacked lens structure 11 and the diaphragm plate 51, which are part of the camera module 1D in FIG. 13.

In the camera module 1D, the light entering the module is narrowed by the diaphragm plate 51, is then expanded inside the stacked lens structure 11, and enters the light receiving element 12 disposed below the stacked lens structure 11 (not illustrated in FIG. 15). In other words, when viewing the stacked lens structure 11 as a whole, the light having entered the module travels to spread out like an open fan from the opening portion 52 of the diaphragm plate 51 toward the lower side. Therefore, as an example of the size of the lens resin portion 82 provided in the stacked lens structure 11, the lens resin portion 82a provided in the substrate with lens 41a disposed immediately below the diaphragm plate 51 is the smallest, and the lens resin portion 82e provided in the substrate with lens 41e disposed in the lowermost layer of the stacked lens structure 11 is the largest in the stacked lens structure 11 in FIG. 15.

If the thickness of the lens resin portion 82 of the substrate with lens 41 is made constant, it is more difficult to make a larger lens than a smaller lens in size. This is because, for example, the lens is easily deformed due to a load applied to the lens when manufacturing the lens, and maintaining the strength is difficult due to the large size. Therefore, the larger lens in size is favorably made thicker in thickness than the smaller lens in size. Therefore, in the stacked lens structure 11 in FIG. 15, the lens resin portion 82e provided in the substrate with lens 41e disposed in the lowermost layer is the thickest in the thicknesses of the lens resin portions 82.

The stacked lens structure 11 in FIG. 15 further includes at least one of the following characteristics to enhance the degree of freedom in lens design.

(1) The thickness of the support substrate 81 is different among at least a plurality of substrates with lens 41 constituting the stacked lens structure 11. For example, the thickness of the support substrate 81 is thicker in a lower substrate with lens 41.

(2) The opening width of the through hole 83 provided in the substrate with lens 41 is different among at least a plurality of substrates with lens 41 constituting the stacked lens structure 11. For example, the opening width of the through hole 83 is larger in a lower substrate with lens 41.

(3) The diameter of the lens portion 91 provided in the substrate with lens 41 is different among at least a plurality of substrates with lens 41 constituting the stacked lens structure 11. For example, the diameter of the lens portion 91 is larger in the lens portion 91 of a lower substrate with lens 41.

(4) The thickness of the lens portion 91 provided in the substrate with lens 41 is different among at least a plurality of substrates with lens 41 constituting the stacked lens structure 11. For example, the thickness of the lens portion 91 is thicker in the lens portion 91 of a lower substrate with lens 41.

(5) The distance between lenses provided in the substrate with lens 41 is different among at least a plurality of substrates with lens 41 constituting the stacked lens structure 11.

(6) The volume of the lens resin portion 82 provided in the substrate with lens 41 is different among at least a plurality of substrates with lens 41 constituting the stacked lens structure 11. For example, the volume of the lens resin portion 82 is larger in the lens resin portion 82 of a lower substrate with lens 41.

(7) The material of the lens resin portion 82 provided in the substrate with lens 41 is different among at least a plurality of substrates with lens 41 constituting the stacked lens structure 11.

Generally, incident light entering the camera module includes vertical incident light and oblique incident light. Most of the oblique incident light hits against the diaphragm plate 51 and is absorbed by the diaphragm plate 51 or reflected to the outside of the camera module 1D. The oblique incident light, which has not been able to be narrowed by the diaphragm plate 51, hits against the side wall of the through hole 83 depending on an incident angle, and may be reflected by the side wall.

The traveling direction of reflected light of oblique incident light 85 is determined by the incident angle of oblique incident light 85 and an angle of the side wall of the through hole 83, as illustrated in FIG. 13. In a case where the opening width of the through hole 83 has a so-called open fan shape, which becomes larger from an incident side to the light receiving element 12 side, and when specific oblique incident light 85, which has not been able to be narrowed by the diaphragm plate 51, hits against the side wall of the through hole 83, the oblique incident light 85 is reflected in the direction of the light receiving element 12 and may become stray light or noise light.

However, in the stacked lens structure 11 illustrated in FIG. 13, the through hole 83 has a so-called downward concave shape in which the opening width becomes smaller toward the lower side (the side where the light receiving element 12 is disposed), as illustrated in FIG. 15. In the case of this shape, the oblique incident light 85 having hit against the side wall of the through hole 83 is reflected in an upward direction, that is, an incident side direction, rather than in a downward direction, that is, the direction of the light receiving element 12. Thereby, a function or an effect of suppressing occurrence of stray light or noise light can be obtained.

It is more favorable to dispose a light-absorbing material on the side wall of the through hole 83 of the substrate with lens 41 in order to decrease the light hitting against and reflected by the side wall.

As an example, in a case where light (for example, visible light) of a wavelength desired to be received when the camera module 1D is used as a camera is first light, and light (for example, UV light) having a different wavelength from the first light is second light, a layer of a material having a light-absorbing property for the first light (visible light) may be formed on the side wall of the through hole 83 by applying or jetting, on a surface of the support substrate 81, a material prepared by dispersing carbon particles as a first light (visible light) absorbing material into a resin curable by the second light (UV light), irradiating only the resin on a side wall portion of the through hole 83 with the second light (UV light) to cure the resin, and removing the resin in the other region.

The stacked lens structure 11 illustrated in FIG. 15 is an example of a structure in which the diaphragm plate 51 is disposed on the top of the plurality of stacked substrates with lens 41. The diaphragm plate 51 may be inserted into and disposed on any of middle substrates with lens 41, instead of on the top of the plurality of stacked substrates with lens 41.

As still another example, a layer of a material having a light-absorbing property may be formed on the surface of the substrate with lens 41 and used to function as a diaphragm, instead of including the plate-like diaphragm plate 51 separately from the substrate with lens 41. For example, a diaphragm may be formed on the surface of the substrate with lens 41 by applying or jetting, on the surface of the substrate with lens 41, a material prepared by dispersing the carbon particles as the first light (visible light) absorbing material into the resin curable by the second light (UV light), irradiating the resin on a region except a region desired to transmit light when functioning as a diaphragm with the second light (UV light) to cure and leave the resin, and removing the resin on the uncured region, that is, on the region desired to transmit the light when functioning as a diaphragm.

Note that the substrate with lens 41 having the diaphragm formed on the surface may be a substrate with lens 41 disposed on the uppermost layer of the stacked lens structure 11 or may be a substrate with lens 41 serving as an inner layer of the stacked lens structure 11.

The stacked lens structure 11 illustrated in FIG. 15 has the structure in which the substrates with lens 41 are stacked.

As another embodiment, the stacked lens structure 11 may have a structure including a plurality of substrates with lens 41 and at least one support substrate 81 without including the lens resin portion 82 In this structure, the support substrate 81 without including the lens resin portion 82 may be disposed on the lowermost layer or the uppermost layer of the stacked lens structure 11 or may be disposed as an inner layer in the stacked lens structure 11. This structure brings about a function or an effect of arbitrarily setting the distance between a plurality of lenses included in the stacked lens structure 11 or the distance between the lowermost lens resin portion 82 of the stacked lens structure 11 and the light receiving element 12 disposed below the stacked lens structure 11, for example.

Alternatively, this structure brings about a function or an effect of appropriately setting the opening width of the support substrate 81 not including the lens resin portion 82 and disposing the material having a light-absorbing property in a region excluding the opening portion, thereby causing the material to function as a diaphragm plate.

7. Sixth Embodiment of Camera Module

Figure 16:
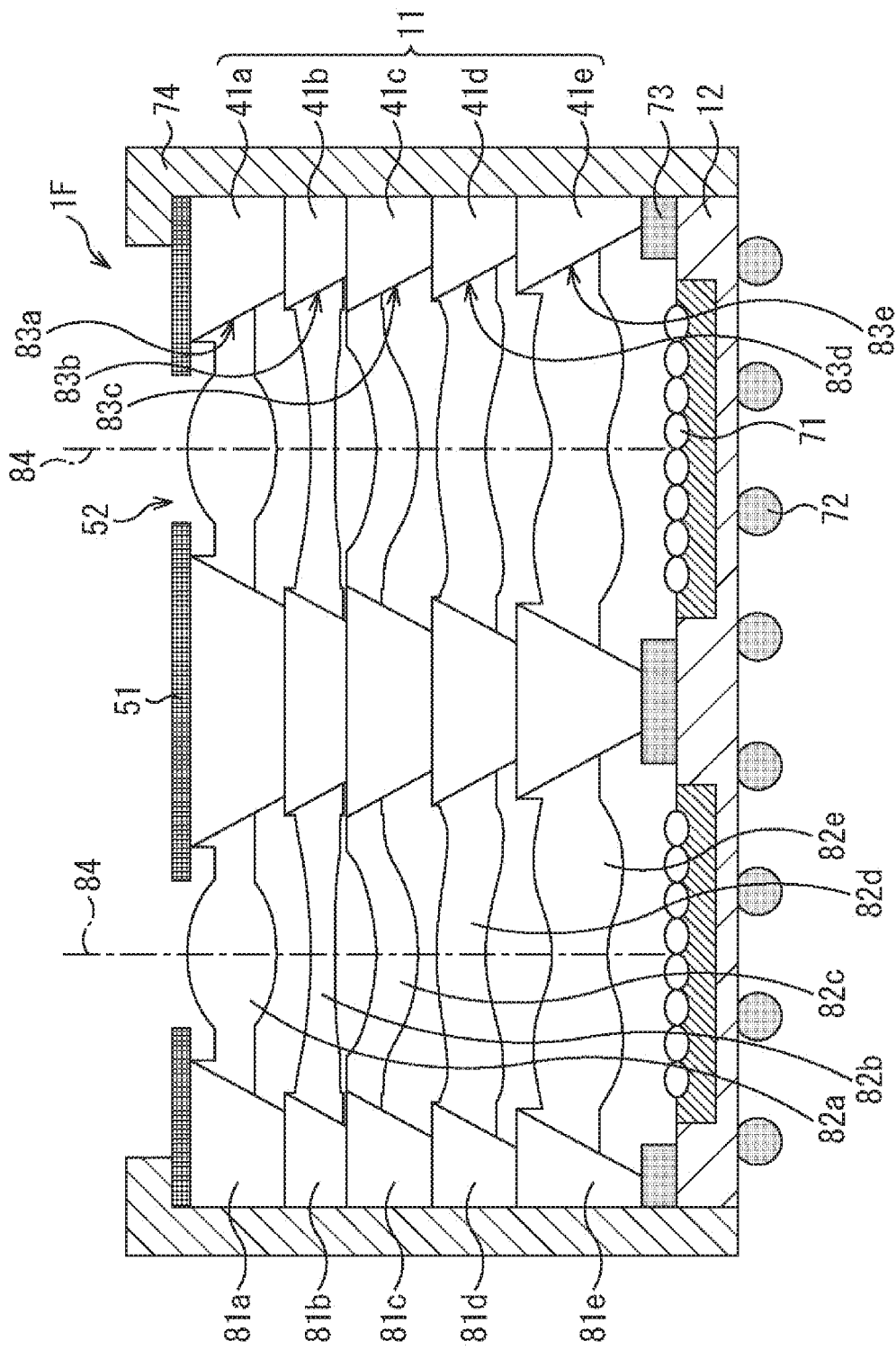
FIG. 16 is a view illustrating a sixth embodiment of a camera module using a stacked lens structure to which the present technology is applied.

FIG. 16 is a view illustrating a sixth embodiment of a camera module using a stacked lens structure to which the present technology is applied.

In FIG. 16, a portion corresponding to the portion in the fourth embodiment illustrated in FIG. 13 is denoted by the same reference numeral, and description will be given focusing on a portion different from the camera module 1D in FIG. 13.

In a camera module 1F illustrated in FIG. 16, incident light is narrowed by a diaphragm plate 51, then spreads inside a stacked lens structure 11, and enters a light receiving element 12 disposed below the stacked lens structure 11, similarly to the camera module 1D illustrated in FIG. 13. In other words, when viewing the stacked lens structure 11 as a whole, the light travels to spread out like an open fan from an opening portion 52 of the diaphragm plate 51 toward a lower side.

The camera module 1F in FIG. 16 is different from the camera module 1D in FIG. 13 in having a cross-sectional shape of a through hole 83 of a substrate with lens 41 constituting the stacked lens structure 11, which is a so-called open fan shape in which the opening width becomes larger toward the lower side (the side where the light receiving element 12 is disposed).

Since the stacked lens structure 11 of the camera module 1F has the structure in which incident light travels to spread out like an open fan from the opening portion 52 of the diaphragm plate 51 toward the lower side, for example, a support substrate 81 is less likely to interfere with an optical path in the open fan shape in which the opening width of the through hole 83 becomes larger toward the lower side than a downward concave shape in which the opening width of the through hole 83 becomes smaller toward the lower side. This brings about an effect of a high degree of freedom in lens design.

Furthermore, in the case of the downward concave shape in which the opening width of the through hole 83 becomes smaller toward the lower side, the cross sectional area in a substrate planar direction of a lens resin portion 82 including a support portion 92 becomes a specific size for transmitting light beams having entered a lens 21, in a lower surface of the lens resin portion 82, and the cross-sectional area becomes larger from the lower surface to an upper surface of the lens resin portion 82.

In contrast, in the case of the open fan shape in which the opening width of the through hole 83 becomes larger toward the lower side, the cross-sectional area in the lower surface of the lens resin portion 82 is substantially the same as the case of the downward concave shape but the cross-sectional area becomes smaller from the lower surface to the upper surface of the lens resin portion 82.

Thereby, the structure in which the opening width of the through hole 83 becomes larger toward the lower side brings about a function or an effect to suppressing the size of the lens resin portion 82 including the support portion 92. Furthermore, the structure brings about a function or an effect of decreasing the difficulty in lens formation caused in the above-described case where the lens is large.

8. Seventh Embodiment of Camera Module

Figure 17:
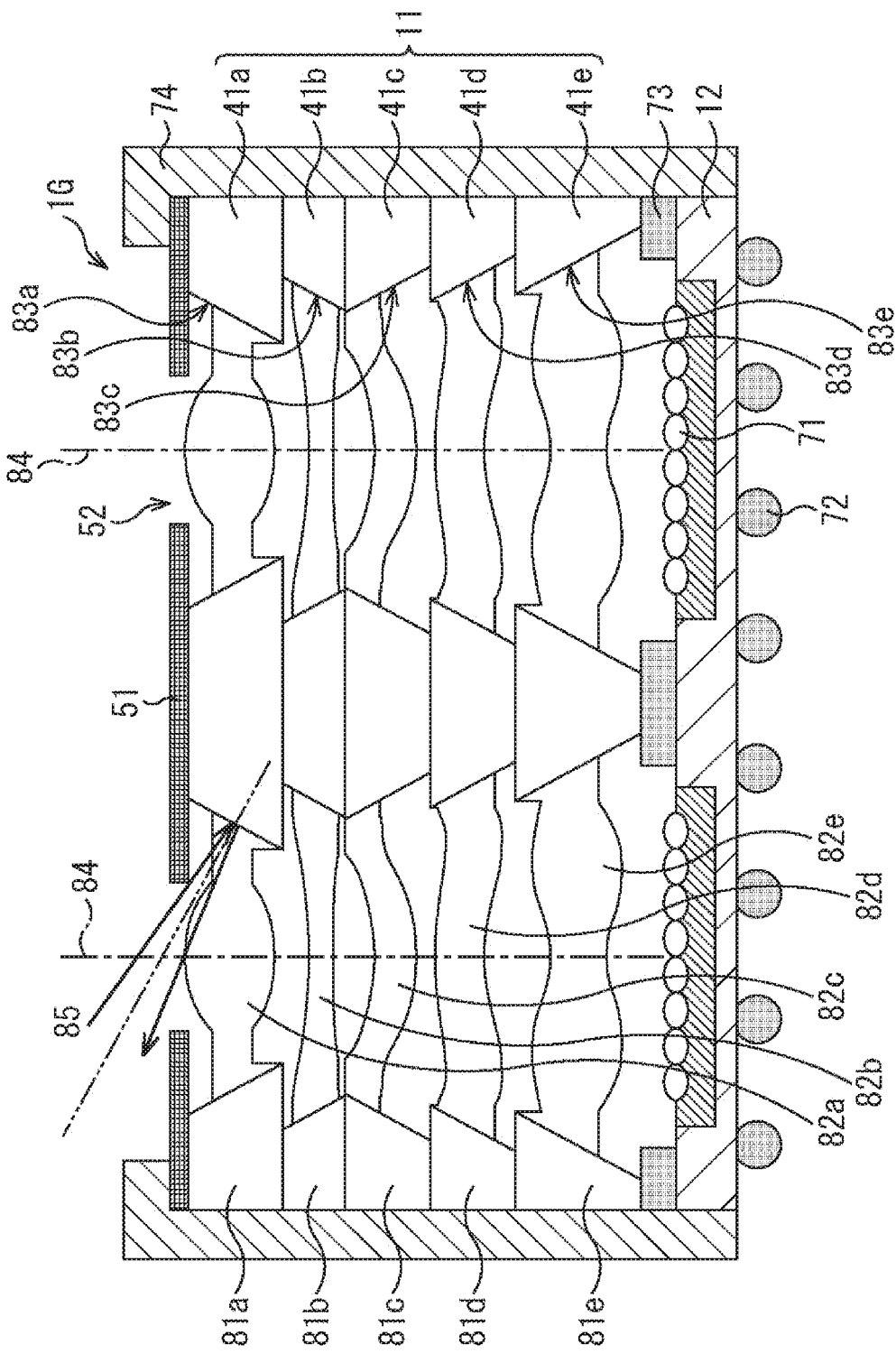
FIG. 17 is a view illustrating a seventh embodiment of a camera module using a stacked lens structure to which the present technology is applied.

FIG. 17 is a view illustrating a seventh embodiment of a camera module using a stacked lens structure to which the present technology is applied.

In FIG. 17, a portion corresponding to the portion in FIG. 13 is denoted by the same reference numeral, and description will be given focusing on a portion different from the camera module 1D in FIG. 13.

A camera module 1G in FIG. 17 is different from the camera module 1D in FIG. 13 in shapes of a lens resin portion 82 and a through hole 83 of each substrate with lens 41 constituting a stacked lens structure 11.

The stacked lens structure 11 of the camera module 1G includes both a substrate with lens 41 in which the shape of the through hole 83 has a so-called downward concave shape in which an opening width becomes smaller toward a lower side (a side where a light receiving element 12 is disposed), and a substrate with lens 41 in which the shape of the through hole 83 has a so-called open fan shape in which the opening width becomes larger toward the lower side.

As described above, the substrate with lens 41 in which the through hole 83 has the so-called downward concave shape in which the opening width becomes smaller toward the lower side brings about a function or an effect of reflecting oblique incident light 85, which has hit against a side wall of the through hole 83, in an upward direction, that is, a so-called incident side direction, thereby suppressing occurrence of stray light or noise light.

Therefore, in the stacked lens structure 11 in FIG. 17, the substrate with lens 41 in which the through hole 83 has the so-called downward concave shape where the opening width becomes smaller toward the lower side is used in a plurality of substrates with lens 41 especially on an upper side (incident side), of a plurality of substrates with lens 41 constituting the stacked lens structure 11.

As described above, in the substrate with lens 41 in which the through hole 83 has the so-called open fan shape in which the opening width becomes larger toward the lower side, a support substrate 81 provided in the substrate with lens 41 is less likely to interfere with an optical path. Therefore, the substrate with lens 41 brings about a function or an effect of increasing the degree of freedom in lens design or suppressing the size of a lens resin portion 82 including a support portion 92 provided in the substrate with lens 41.

In the stacked lens structure 11 in FIG. 17, the light travels to spread out like an open fan from a diaphragm toward the lower side. Therefore, the sizes of the lens resin portions 82 provided in some substrates with lens 41 disposed on a lower side, of a plurality of substrates with lens 41 constituting the stacked lens structure 11, are large. When the through hole 83 having the open fan shape is used in such a large lens resin portion 82, the effect of suppressing the size of the lens resin portion 82 is prominently exhibited.

Therefore, in the stacked lens structure 11 in FIG. 17, the substrate with lens 41 in which the through hole 83 has the so-called open fan shape where the opening width becomes larger toward the lower side is used in a plurality of substrates with lens 41 especially on a lower side, of the plurality of substrates with lens 41 constituting the stacked lens structure 11.

9. Detailed Configuration of Substrate with Lens

Next, a detailed configuration of the substrate with lens 41 will be described.

Figure 18A:
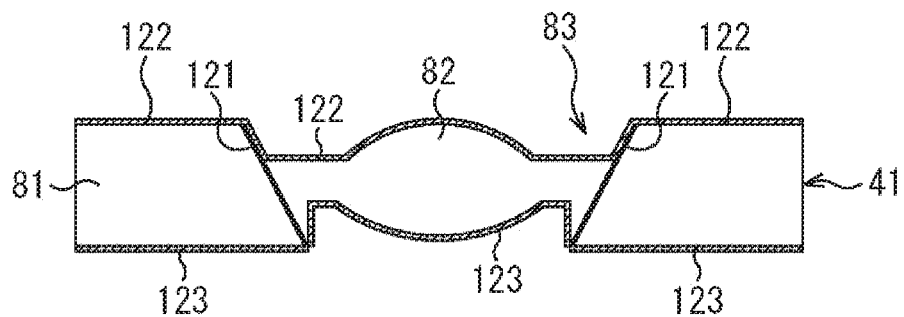
FIGS. 18A, 18B, and 18C are cross-sectional views illustrating a detailed configuration of the substrate with lens.
Figure 18B:
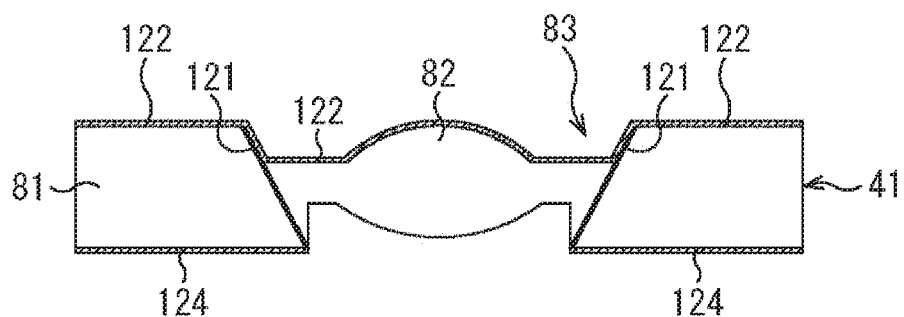
Figure 18C:
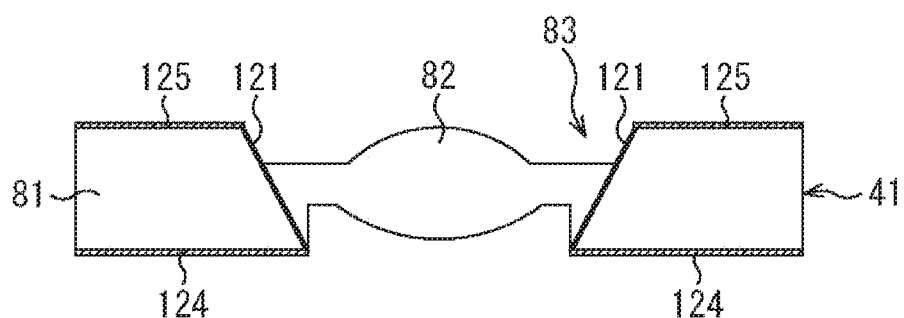

FIGS. 18A, 18B, and 18C are cross-sectional views illustrating a detailed configuration of the substrate with lens 41.

Note that FIGS. 18A, 18B, and 18C illustrate the uppermost substrate with lens 41a of the five substrates with lens 41a to 41e. However, the other substrates with lens 41 are similarly configured.

Any of configurations in FIGS. 18A, 18B, and 18C can be adopted as the configuration of the substrate with lens 41.

In the substrate with lens 41 illustrated in FIG. 18A, the lens resin portion 82 is formed to block the through hole 83 as viewed from an upper surface, in the through hole 83 provided in the support substrate 81. As described with reference to FIG. 14, the lens resin portion 82 includes the central lens portion 91 (not illustrated) and the peripheral support portion 92 (not illustrated).

A film 121 having a light-absorbing property or a light-shielding property is formed on the side wall of the substrate with lens 41, the side wall serving as the through hole 83, in order to prevent ghost and flare caused by light reflection. These films 121 are referred to as light-shielding films 121 for convenience.

An upper surface layer 122 containing an oxide, a nitride, or another insulator is formed on upper surfaces of the support substrate 81 and the lens resin portion 82, and a lower surface layer 123 containing an oxide, a nitride, or another insulator is formed on lower surfaces of the support substrate 81 and the lens resin portion 82.

The upper surface layer 122 constitutes, as an example, an antireflective film in which a plurality of low refractive films and high refractive films is alternately stacked. The antireflective film can be configured by, for example, alternately stacking a total of four layers of the low refractive films and the high refractive films. The low refractive film is, for example, an oxide film such as SiOx ($1 \leq x \leq 2$), SiOC, or SiOF, and the high refractive film is, for example, a metal oxide film such as TiO, TaO, or Nb2O5.

Note that the configuration of the upper surface layer 122 is not particularly limited in materials, film thicknesses, the number of stacked layers, and the like of the low refractive films and the high refractive films as long as the configuration is designed to obtain desired antireflection performance using optical simulation, for example. In the present embodiment, an outermost surface of the upper surface layer 122 is a low refractive film, and the film thickness is 20 to 1000 nm, for example, the density is 2.2 to 2.5 g/cm3, for example, and the flatness is root mean square roughness Rq (RMS) of about 1 nm or less, for example. Furthermore, although details will be described below, the upper surface layer 122 also serves as a bonding film when being bonded to another substrate with lens 41.

The upper surface layer 122 may be, as an example, an antireflective film in which a plurality of the low refractive films and the high refractive films is alternately stacked, and may be an inorganic antireflective film among the antireflective films. The upper surface layer 122 may be, as another example, a single layer film containing an oxide, a nitride, or another insulator, and may be an inorganic film among the single layer films.

The lower surface layer 123 may also be, as an example, an antireflective film in which a plurality of the low refractive films and the high refractive films is alternately stacked, and may be an inorganic antireflective film among the antireflective films. The lower surface layer 123 may also be, as another example, a single layer film containing an oxide, a nitride, or another insulator, and may be an inorganic film among the single layer films.

Regarding the substrates with lens 41 in FIGS. 18B and 18C, only portions different from the substrate with lens 41 illustrated in FIG. 18A will be described.

In the substrate with lens 41 illustrated in FIG. 18B is different from the substrate with lens 41 illustrated in FIG. 18A in films formed on lower surfaces of the support substrate 81 and the lens resin portion 82.

In the substrate with lens 41 in FIG. 18B, a lower surface layer 124 containing an oxide, a nitride, or another insulator is formed on the lower surface of the support substrate 81, whereas no lower surface layer 124 is formed on the lower surface of the lens resin portion 82. The lower surface layer 124 may include the same material as or a different material from the upper surface layer 122.

Such a structure can be formed by, for example, a manufacturing method of forming the lower surface layer 124 on the lower surface of the support substrate 81 before forming the lens resin portion 82 and thereafter forming the lens resin portion 82. Alternatively, the structure can be formed by forming a mask on the lens resin portion 82 after forming the lens resin portion 82, and depositing a film for configuring the lower surface layer 124 on the lower surface of the support substrate 81 by, for example, PVD, in a state where no mask is formed on the support substrate 81.

In the substrate with lens 41 in FIG. 18C, an upper surface layer 125 containing an oxide, a nitride, or another insulator is formed on the upper surface of the support substrate 81, whereas no upper surface layer 125 is formed on the upper surface of the lens resin portion 82.

Similarly, on the lower surface of the substrate with lens 41, the lower surface layer 124 containing an oxide, a nitride, or another insulator is formed on the lower surface of the support substrate 81, whereas no lower surface layer 124 is formed on the lower surface of the lens resin portion 82.

Such a structure can be formed by, for example, a manufacturing method of forming the upper surface layer 125 and the lower surface layer 124 on the support substrate 81 before forming the lens resin portion 82 and thereafter forming the lens resin portion 82. Alternatively, the structure can be formed by forming a mask on the lens resin portion 82 after forming the lens resin portion 82, and depositing films for configuring the upper surface layer 125 and the lower surface layer 124 on the lower surface of the support substrate 81 by, for example, PVD, in a state where no mask is formed on the support substrate 81. The lower surface layer 124 and the upper surface layer 125 may include the same material or different materials.

The substrate with lens 41 can be configured as described above.

10. Method of Manufacturing Substrate with Lens

Next, a method of manufacturing the substrate with lens 41 will be described with reference to FIGS. 19A, 19B, 20A, 20B, 20C, 21A, 21B, 21C, 21D, 21E, 21F, 22A, 22B, 23A, 23B, 23C, 23D, 23E, 23F, 23G, 24, 25, 26, 27A, 27B, 27C, 27D, 27E, 27F, 28, and 29.

Figure 19A:
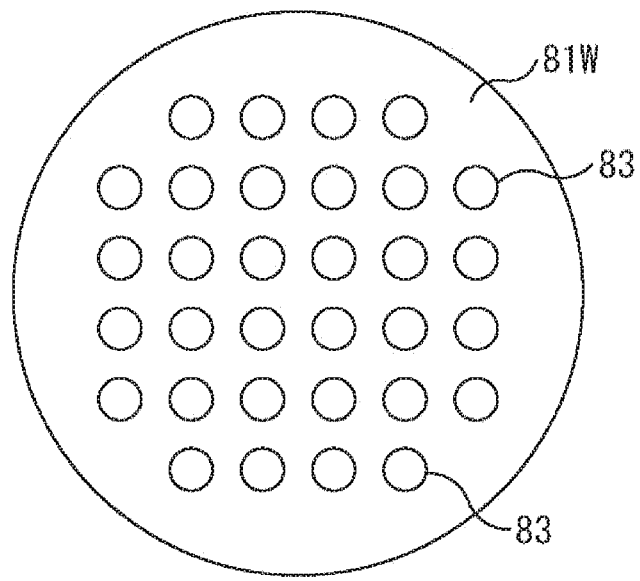
FIGS. 19A and 19B are views for describing a method of manufacturing the substrate with lens.

First, a support substrate 81W in a substrate state in which a plurality of through holes 83 is formed is prepared. As the support substrate 81W, for example, a silicon substrate used for a general semiconductor device can be used. The shape of the support substrate 81W is, for example, circular as illustrated in FIG. 19A and the diameter of the support substrate 81W is, for example, 200 mm, 300 mm, or the like. The support substrate 81W may be, for example, a glass substrate, a resin substrate, or a metal substrate, instead of the silicon substrate.

Figure 19B:
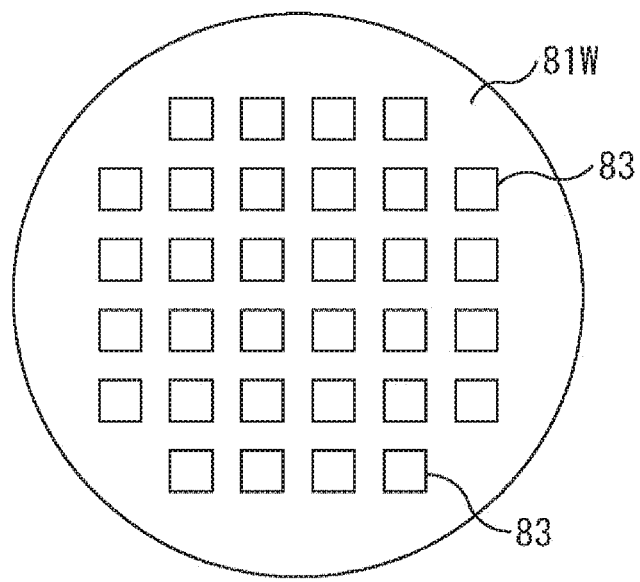

Furthermore, in the present embodiment, the planar shape of the through hole 83 is circular as illustrated in FIG. 19A. However, as illustrated in FIG. 19B, the planar shape of the through hole 83 may be, for example, a polygon such as a quadrangle.

The opening width of the through hole 83 can be about 100 μm to 20 mm, for example. In this case, for example, about 100 to 5,000,000 can be disposed on the support substrate 81W.

In the present specification, the size of the through hole 83 in the planar direction of the substrate with lens 41 is referred to as the opening width. The opening width means the length of one side in a case where the planar shape of the through hole 83 is a quadrangle, and means the diameter in a case where the planar shape of the through hole 83 is a circle, unless otherwise specified.

Figure 20A:
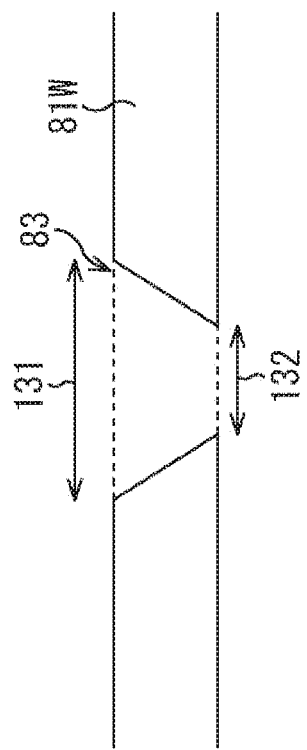
FIGS. 20A, 20B, and 20C are views for describing the method of manufacturing the substrate with lens.
Figure 20B:
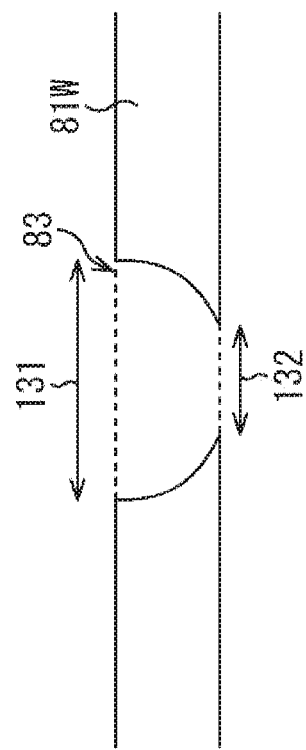
Figure 20C:
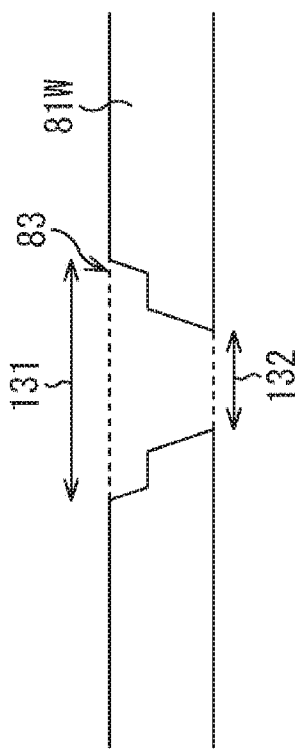

As illustrated in FIGS. 20A, 20B, and 20C, in the through hole 83, a second opening width 132 in a second surface is smaller than a first opening width 131 in a first surface, the second surface facing the first surface of the support substrate 81W.

As an example of the three-dimensional shape of the through hole 83 in which the second opening width 132 is smaller than the first opening width 131, the through hole 83 may have a truncated cone shape illustrated in FIG. 20A or may have a polygonal truncated pyramid shape. The cross-sectional shape of the side wall of the through hole 83 may be a straight line as illustrated in FIG. 20A or may be a curve as illustrated in FIG. 20B. Alternatively, there may be steps, as illustrated in FIG. 20C.

In the through hole 83 having the shape in which the second opening width 132 is smaller than the first opening width 131, when supplying a resin into the through hole 83 and pressing the resin in facing directions from the first and second surfaces with mold members to form the lens resin portion 82, the resin, which will be the lens resin portion 82, is pressed against the side wall of the through hole 83 by receiving force from the facing two mold members. Thereby, the method can bring about an effect of increasing adhesion strength between the resin to be the lens resin portion 82 and the support substrate.

Note that, as another embodiment of the through hole 83, a shape in which the first opening width 131 and the second opening width 132 have an equal shape, that is, a shape in which the cross-sectional shape of the side wall of the through hole 83 becomes a vertical shape may be adopted.

Method of Forming Through Hole Using Wet Etching

The through holes 83 of the support substrate 81W can be formed by etching the support substrate 81W by wet etching. Specifically, before etching the support substrate 81W, an etching mask for preventing a non-opening region of the support substrate 81W from being etched is formed on the surface of the support substrate 81W. As the material of the etching mask, for example, an insulating film such as a silicon oxide film or a silicon nitride film is used. The etching mask is formed by forming a layer of the etching mask material on the surface of the support substrate 81W and opening a pattern that will be a planar shape of the through holes 83 in the layer. After the etching mask is formed, the support substrate 81W is etched to form the through holes 83 in the support substrate 81W.

In a case of using single crystal silicon having a substrate surface orientation of (100) as the support substrate 81W, for example, crystal anisotropic wet etching using an alkaline solution such as KOH can be adopted to form the through holes 83.

When the crystal anisotropic wet etching using an alkaline solution such as KOH is performed on the support substrate 81W that is single crystal silicon with the substrate surface orientation of (100), the etching progresses such that a (111) plane appears on an opening side wall. As a result, even if the planar shape of the opening portion of the etching mask is circular or quadrangular, the through hole 83 having a quadrangle planar shape, having the smaller second opening width 132 than the first opening width 131 in the opening width, and having a truncated pyramid or similar shape in the three-dimensional shape can be obtained. The angle of the side wall of the through hole 83, which is a truncated pyramid, is about 55° with respect to a substrate plane.

The etching for forming the through hole may be performed by, as another implementation example, wet etching using a drug solution capable of etching silicon into an arbitrary shape without receiving restrictions of crystal orientation, which is disclosed in International Publication No. 2011/010739 and the like. As the drug solution, for example, a drug solution prepared by adding at least one of polyoxyethylene alkyl phenyl ether, polyoxyalkylene alkyl ether, or polyethylene glycol, which is a surfactant, to tetramethyl ammonium hydroxide (TMAH) aqueous solution, a drug solution prepared by adding isopropyl alcohol to KOH aqueous solution, or the like can be adopted.

When the etching for forming the through hole 83 is performed using any of the above-described drug solutions, for the support substrate 81W that is single crystal silicon with the substrate surface orientation of (100), the through hole 83 having a circular planar shape, having the smaller second opening width 132 than the first opening width 131, and having a truncated cone or similar shape in the three-dimensional shape can be obtained, in a case where the planar shape of the opening portion of the etching mask is circular.

In a case where the planar shape of the opening portion of the etching mask is quadrangular, the through hole 83 having a quadrangle planar shape, having the smaller second opening width 132 than the first opening width 131 in the opening width, and having a truncated pyramid or similar shape in the three-dimensional shape can be obtained. The angle of the side wall of the through hole 83, which is a truncated cone or a truncated pyramid, is about 45° with respect to the substrate plane.

Method of Forming Through Hole Using Dry Etching

Furthermore, dry etching can be used for etching for forming the through hole 83, instead of the above-described wet etching.

A method of forming the through holes 83 using dry etching will be described with reference to FIGS. 21A, 21B, 21C, 21D, 21E, and 21F.

Figure 21A:
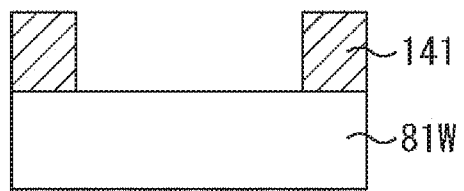
FIGS. 21A, 21B, 21C, 21D, 21E, and 21F are views for describing the method of manufacturing the substrate with lens.

As illustrated in FIG. 21A, an etching mask 141 is formed on one surface of the support substrate 81W. The etching mask 141 is a mask pattern in which a portion for forming the through hole 83 is opened.

Figure 21B:
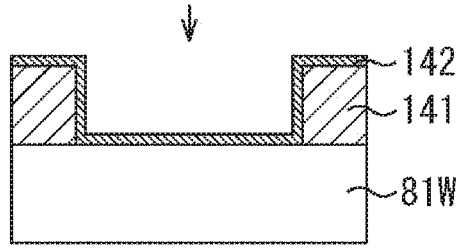
Figure 21C:
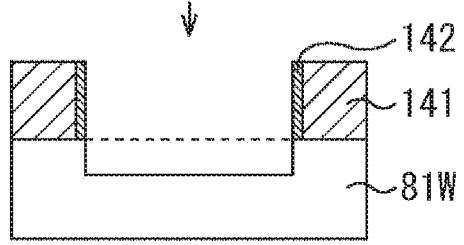

Next, after a protective film 142 for protecting a side wall of the etching mask 141 is formed, as illustrated in FIG. 21B, the support substrate 81W is etched at a predetermined depth by dry etching, as illustrated in FIG. 21C. Although the protective film 142 on the surface of the support substrate 81W and the surface of the etching mask 141 is removed by the dry etching process, the protective film 142 on the side surface of the etching mask 141 remains and the side wall of the etching mask 141 is protected. After the etching, as illustrated in FIG. 21D, the protective film 142 on the side wall is removed, and the etching mask 141 is retracted in a direction of increasing the pattern size of the opening pattern.

Figure 21D:
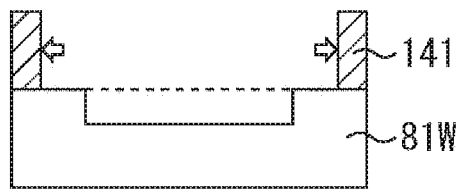
Figure 21E:
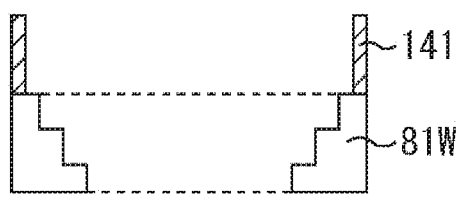

Then, again, the protective film forming process, the dry etching process, and the etching mask retraction process in FIGS. 21B, 21C, and 21D are repeatedly performed a plurality of times. Thereby, as illustrated in FIG. 21E, the support substrate 81W is etched to have a stair shape (uneven shape) having periodic steps.

Figure 21F:
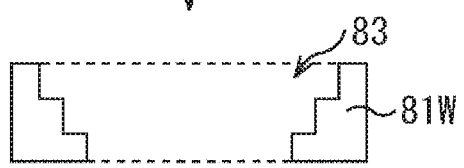

Finally, when the etching mask 141 is removed, the through holes 83 having the stair-shaped side wall is formed in the support substrate 81W, as illustrated in FIG. 21F. The width (one-step width) in the planar direction of the stair shape of the through hole 83 is, for example, about 400 nm to 1 μm.

In the case of forming the through hole 83 using the above dry etching, the protective film forming process, the dry etching process, and the etching mask retraction process are repeatedly executed.

Since the side wall of the through hole 83 has the periodic stair shape (uneven shape), reflection of incident light can be suppressed. Furthermore, if the side wall of the through hole 83 has a random uneven shape, a void occurs in an adhesion layer between a lens formed in the through hole 83 and the side wall, and an adhesion property with the lens may be reduced due to the void. However, according to the above-described forming method, the side wall of the through hole 83 has the periodic uneven shape. Therefore, the adhesion property is improved and change in optical characteristics due to lens displacement can be suppressed.

As an example of the material used in the processes, for example, the support substrate 81W can be single crystal silicon, the etching mask 141 can be photoresist, and the protective film 142 can be a fluorocarbon polymer formed by using a gas plasma such as C4F8 or CHF3. The etching processing can be plasma etching using a gas containing F such as SF6/O2, or C4F8/SF6, and the mask retraction process can be plasma etching including O2 such as a O2 gas or CF4/O2.

Alternatively, the support substrate 81W can be single crystal silicon, the etching mask 141 can be SiO2, the etching can be a plasma containing C12, the protective film 142 can be an oxide film obtained by oxidizing an etching target material using an O2 plasma, the etching processing can be plasma etching using a gas containing C12, and the mask retraction process can be plasma etching using a gas containing F such as CF4/O2.

As described above, a plurality of through holes 83 can be simultaneously formed in the support substrate 81W by the wet etching or dry etching. However, a through groove 151 may be formed in a region where the through hole 83 is not formed in the support substrate 81W, as illustrated in FIG. 22A.

Figure 22A:
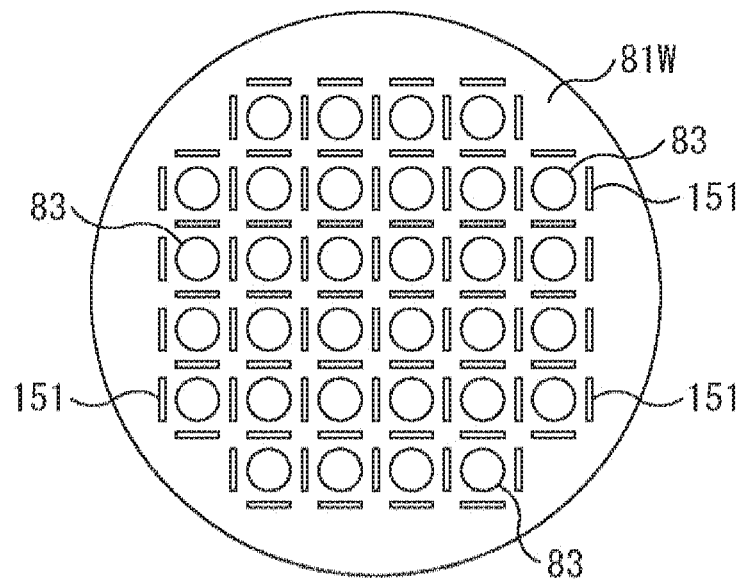
FIGS. 22A and 22B are views for describing the method of manufacturing the substrate with lens.

FIG. 22A is a plan view of the support substrate 81W in which the through groove 151 has been formed in addition to the through hole 83.

For example, as illustrated in FIG. 22A, the through grooves 151 are arranged in only part of regions between the through holes 83 in a row direction and a column direction, avoiding the plurality of through holes 83 arranged in a matrix manner.

Furthermore, the through grooves 151 of the support substrate 81W can be arranged at the same positions among the substrates with lens 41 constituting the stacked lens structure 11. In this case, in a state where a plurality of support substrates 81W is stacked as the stacked lens structure 11, the through groove 151 in the plurality of support substrates 81W penetrates the plurality of support substrates 81W, as illustrated in the cross-sectional view in FIG. 22B.

The through groove 151 of the support substrate 81W as a part of the substrate with lens 41 can bring about a function or an effect of reducing deformation of the substrate with lens 41 due to stress in a case where the stress that deforms the substrate with lens 41 works from the outside of the substrate with lens 41, for example.

Alternatively, the through groove 151 can bring about a function or an effect of reducing deformation of the substrate with lens 41 due to stress in a case where the stress that deforms the substrate with lens 41 works from the inside of the substrate with lens 41, for example.

<Method of Manufacturing Substrate with Lens>

Next, a method of manufacturing the substrate with lens 41W in the substrate state will be described with reference to FIGS. 23A, 23B, 23C, 23D, 23E, 23F, and 23G.

First, as illustrated in FIG. 23A, the support substrate 81W in which a plurality of through holes 83 is formed is prepared. The light-shielding film 121 is formed on the side wall of the through hole 83. Although only two through holes 83 are illustrated in FIGS. 23A, 23B, 23C, 23D, 23E, 23F, and 23G due to the restriction of the paper surface, in practice, a large number of through holes 83 are formed in the planar direction of the support substrate 81W, as illustrated in FIGS. 19A and 19B. Furthermore, an alignment mark (not illustrated) for positioning is formed in a region close to the outer periphery of the support substrate 81W.

A front flat portion 171 on the upper side of the support substrate 81W, and a back flat portion 172 on the lower side of the support substrate 81W are flat surfaces formed flat enough to enable plasma bonding performed in a later process. The thickness of the support substrate 81W is finally separated into pieces as the substrate with lens 41, and also plays a role as a spacer for determining the distance between lenses when stacked with another substrate with lens 41.

As the support substrate 81W, use of a base material with a low thermal expansion coefficient of 10 ppm/° C. or less is favorable.

Next, as illustrated in FIG. 23B, the support substrate 81W is disposed on a lower mold 181 in which a plurality of concave optical transfer surfaces 182 is arranged at regular intervals. More specifically, the back flat portion 172 of the support substrate 81W and a flat surface 183 of the lower mold 181 are stacked such that the concave optical transfer surface 182 is located inside the through hole 83 of the support substrate 81W. The optical transfer surfaces 182 of the lower mold 181 are formed in one-to-one correspondence with the through holes 83 of the support substrate 81W, and the positions in the planar direction of the support substrate 81W and the lower mold 181 are adjusted such that centers of the corresponding optical transfer surface 182 and through hole 83 coincide in the optical axis direction. The lower mold 181 is formed using a hard mold member, and includes, for example, metal, silicon, quartz, or glass.

Next, as illustrated in FIG. 23C, an energy curable resin 191 is filled (dropped) inside the through holes 83 of the stacked lower mold 181 and support substrate 81W. The lens resin portion 82 is formed using the energy curable resin 191. Therefore, it is favorable that the energy curable resin 191 be defoamed in advance so as not to contain bubbles. The defoaming processing is favorably vacuum defoaming processing or defoaming processing by centrifugal force. Furthermore, the vacuum defoaming processing is favorably performed after filling. By performing the defoaming processing, it is possible to form the lens resin portion 82 without holding bubbles.

Next, as illustrated in FIG. 23D, an upper mold 201 is disposed on the stacked lower mold 181 and support substrate 81W. A plurality of concave optical transfer surfaces 202 is disposed in the upper mold 201 at regular intervals, and the upper mold 201 is disposed after being positioned with high accuracy such that the center of the through hole 83 coincides with the center of the optical transfer surface 202 in the optical axis direction, similarly to the case of disposing the lower mold 181.

As for a height direction that is a vertical direction on the paper surface, the position of the upper mold 201 is fixed such that the interval between the upper mold 201 and the lower mold 181 becomes a predetermined distance by a control device for controlling the interval between the upper mold 201 and the lower mold 181. At this time, a space sandwiched by the optical transfer surface 202 of the upper mold 201 and the optical transfer surface 182 of the lower mold 181 becomes equal to the thickness of the lens resin portion 82 (lens 21) calculated by optical design.

Alternatively, as illustrated in FIG. 23E, a flat surface 203 of the upper mold 201 and the front flat portion 171 of the support substrate 81W may be stacked similarly to the case of disposing the lower mold 181. In this case, the distance between the upper mold 201 and the lower mold 181 becomes equal to the thickness of the support substrate 81W, and highly accurate positioning in the planar direction and in the height direction becomes possible.

When the distance between the upper mold 201 and the lower mold 181 has been controlled to be a preset distance, a filling amount of the energy curable resin 191 dropped into the through hole 83 of the support substrate 81W is controlled not to overflow from the space surrounded by the through holes 83 of the support substrate 81W, and the upper mold 201 and the lower mold 181 in the above-described process in FIG. 23C. As a result, the manufacturing cost can be reduced without wasting the material of the energy curable resin 191.

Next, in the state illustrated in FIG. 23E, curing processing for the energy curable resin 191 is performed. The energy curable resin 191 is cured, for example, by giving heat or UV light as energy and leaving the resin for a predetermined time. During curing, deformation due to shrinkage of the energy curable resin 191 can be minimized by pushing the upper mold 201 downward or performing alignment.

Instead of the energy curable resin 191, a thermoplastic resin may be used. In that case, in the state illustrated in FIG. 23E, the energy curable resin 191 is molded into a lens shape by raising the temperature of the upper mold 201 and the lower mold 181 and is cured by cooling.

Next, as illustrated in FIG. 23F, the control device for controlling the positions of the upper mold 201 and the lower mold 181 moves the upper mold 201 in the upward direction and the lower mold 181 in the downward direction to release the upper mold 201 and the lower mold 181 from the support substrate 81W. When the upper mold 201 and the lower mold 181 are released from the support substrate 81W, the lens resin portion 82 including the lens 21 is formed inside the through hole 83 of the support substrate 81W.

Note that the surfaces of the upper mold 201 and the lower mold 181 in contact with the support substrate 81W may be coated with a fluorine-based or silicon-based release agent, for example. By doing so, the support substrate 81W can be easily released from the upper mold 201 and the lower mold 181. Furthermore, as a method of easily releasing the upper mold 201 and the lower mold 181 from a contact surface with the support substrate 81W, various coatings such as fluorine-containing diamond like carbon (DLC) may be performed.

Next, as illustrated in FIG. 23G, the upper surface layer 122 is formed on the surfaces of the support substrate 81W and the lens resin portion 82, and the lower surface layer 123 is formed on the back surfaces of the support substrate 81W and the lens resin portion 82. The front flat portion 171 and the back flat portion 172 of the support substrate 81W may be planarized by performing chemical mechanical polishing (CMP) or the like as needed before and after the formation of the upper surface layer 122 and the lower surface layer 123.

As described above, the lens resin portion 82 is formed in the through holes 83 formed in the support substrate 81W by pressure molding (imprinting) the energy curable resin 191 using the upper mold 201 and the lower mold 181, whereby the substrate with lens 41 can be manufactured.

The shapes of the optical transfer surface 182 and the optical transfer surface 202 are not limited to the above-described concave shape and are appropriately determined in accordance with the shape of the lens resin portion 82. As illustrated in FIG. 15, the lens shapes of the substrates with lens 41a to 41e can be various shapes derived by optical system design, and can be, for example, a biconvex shape, a biconcave shape, a flat convex shape, a flat concave shape, a convex meniscus shape, a concave meniscus shape, or a high-order aspheric shape, or the like.

Furthermore, the shapes of the optical transfer surface 182 and the optical transfer surface 202 may be a shape in which the lens shape after formation has a moth-eye structure.

According to the above-described manufacturing method, since variation in the distance between the lens resin portions 82 in the planar direction due to the curing and shrinkage of the energy curable resin 191 can be cut off by the interposition of the support substrate 81W, lens distance accuracy can be controlled with high accuracy. Furthermore, there is an effect of reinforcing the weak energy curable resin 191 with the strong support substrate 81W. Thereby, a lens array substrate in which a plurality of lenses with good handling properties is arranged can be provided, and there is an effect of suppressing a warp of the lens array substrate.

<Example where Through Hole has Polygonal Shape>

As illustrated in FIG. 19B, the planar shape of the through hole 83 may be a polygon, such as a quadrangle, for example.

Figure 24:
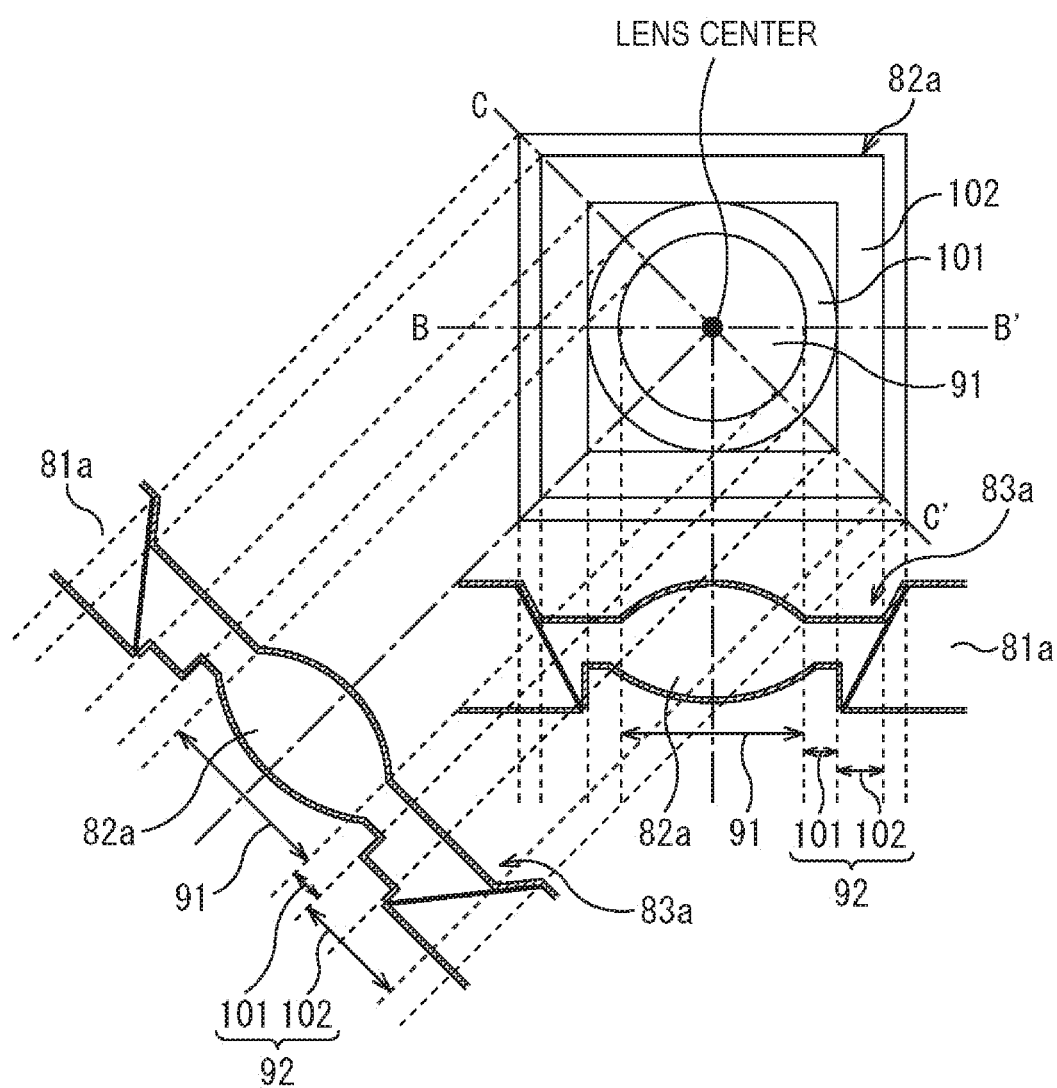
FIG. 24 is a view for describing the method of manufacturing the substrate with lens.

FIG. 24 illustrates a plan view and cross-sectional views of the support substrate 81a and the lens resin portion 82a of the substrate with lens 41a in a case where the planar shape of the through hole 83 is a quadrangle.

The cross-sectional views of the substrate with lens 41a in FIG. 24 are cross-sectional views taken along lines B-B' and C-C' in the plan view.

As can be seen by comparing the B-B' cross-sectional view and the C-C' cross-sectional view, in the case where the through hole 83a is a quadrangle, a distance from the center of the through hole 83a to an upper outer edge of the through hole 83a, and a distance from the center of the through hole 83a to a lower outer edge of the through hole 83a are different in a side direction and in a diagonal direction of the through hole 83a as a quadrangle, and the distances in the diagonal direction are larger. Therefore, in the case where the planar shape of the through hole 83a is a quadrangle, the distance from the outer periphery of the lens portion 91 to the side wall of the through hole 83a when the lens portion 91 is circular, in other words, the length of the support portion 92 needs to be a different length in the side direction and in the diagonal direction of the quadrangle.

Therefore, the lens resin portion 82a illustrated in FIG. 24 has the following structure.

(1) The length of the arm portion 101 disposed on the outer periphery of the lens portion 91 is the same in the side direction and in the diagonal direction of the quadrangle.

(2) The length of the leg portion 102 disposed outside the arm portion 101 and extending to the side wall of the through hole 83a is made longer in the diagonal direction of the quadrangle than in the side direction of the quadrangle.

As illustrated in FIG. 24, the leg portion 102 is not in direct contact with the lens portion 91, while the arm portion 101 is in direct contact with the lens portion 91.

In the lens resin portion 82a in FIG. 24, the length and thickness of the arm portion 101 in direct contact with the lens portion 91 are made constant over the entire outer periphery of the lens portion 91, whereby the lens resin portion 82a can bring about a function or an effect of supporting the entire lens portion 91 by constant force without bias.

Moreover, by supporting the entire lens portion 91 with a constant force without bias, in a case where stress is applied from the support substrate 81a surrounding the through hole 83a to the entire outer periphery of the through hole 83a, for example, the stress is transmitted to the entire lens portion 91 without bias, whereby a function or an effect of suppressing transmission of the stress to only a specific portion of the lens portion 91 with bias can be brought about.

Figure 25:
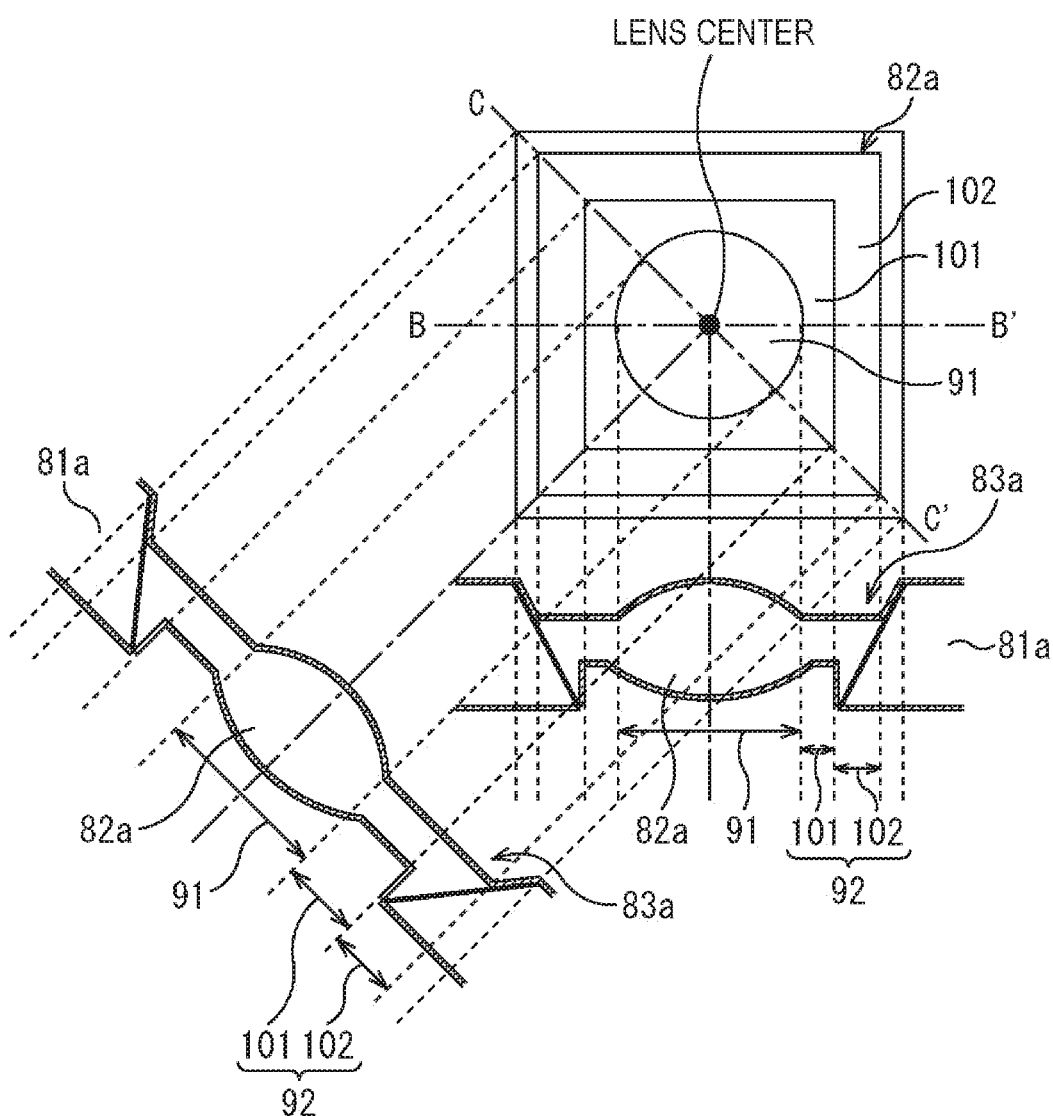
FIG. 25 is a view for describing the method of manufacturing the substrate with lens.

FIG. 25 illustrates a plan view and cross-sectional views of the support substrate 81a and the lens resin portion 82a of the substrate with lens 41a, illustrating another example of the through hole 83 where the planar shape is quadrangular.

The cross-sectional views of the substrate with lens 41a in FIG. 25 are cross-sectional views taken along lines B-B' and C-C' in the plan view.

Figure 22B:
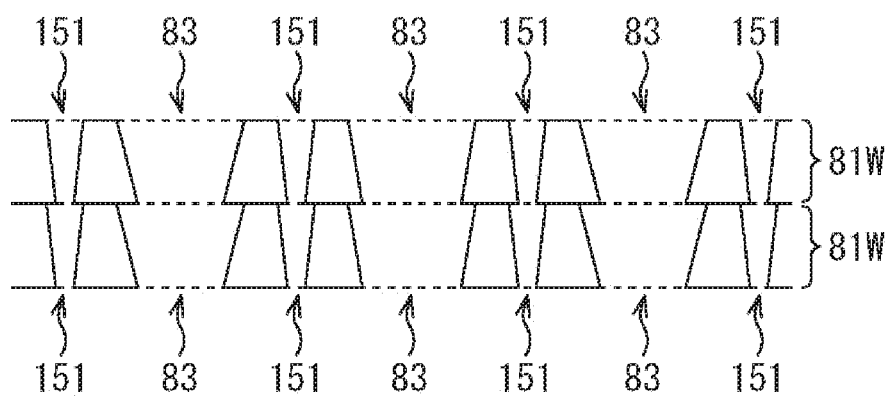

Even in FIG. 25, similarly to FIGS. 22A and 22B, the distance from the center of the through hole 83a to the upper outer edge of the through hole 83a, and the distance from the center of the through hole 83a to the lower outer edge of the through hole 83a are different in the side direction and in the diagonal direction of the through hole 83a as a quadrangle, and the distances in the diagonal direction are larger. Therefore, in the case where the planar shape of the through hole 83a is a quadrangle, the distance from the outer periphery of the lens portion 91 to the side wall of the through hole 83a when the lens portion 91 is circular, in other words, the length of the support portion 92 needs to be a different length in the side direction and in the diagonal direction of the quadrangle.

Therefore, the lens resin portion 82a illustrated in FIG. 25 has the following structure.

(1) The length of the leg portion 102 disposed on the outer periphery of the lens portion 91 is made constant along the four sides of the through hole 83a.

(2) To implement the structure of the above (1), the length of the arm portion 101 is made longer in the diagonal direction of the quadrangle than in the side direction of the quadrangle.

As illustrated in FIG. 25, the leg portion 102 is thicker than the arm portion 101 in the resin film thickness. For this reason, the leg portion 102 is also larger than the arm portion 101 in volume per unit area in the planar direction of the substrate with lens 41a.

In the embodiment in FIG. 25, by making the volume of the leg portion 102 as small as possible and making the volume constant along the four sides of the through hole 83a, for example, in a case where deformation such as swelling of resin occurs, a function or an effect of suppressing volume change due to the deformation as much as possible, and reducing bias of the volume change over the entire outer periphery of the lens portion 91 as much as possible can be brought about.

Figure 26:
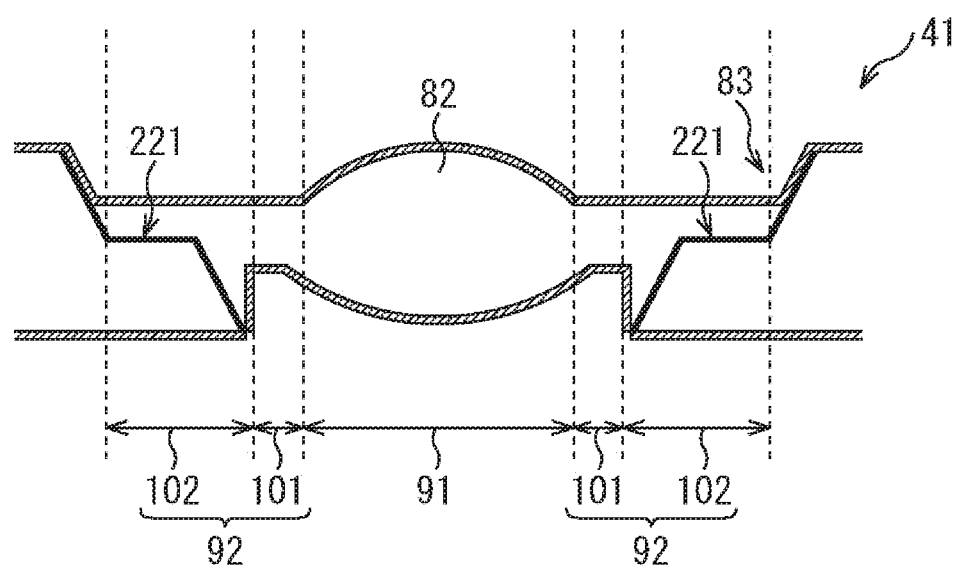
FIG. 26 is a view for describing the method of manufacturing the substrate with lens.

FIG. 26 is a cross-sectional view illustrating another embodiment of the lens resin portion 82 and the through hole 83 of the substrate with lens 41.

The lens resin portion 82 and the through hole 83 illustrated in FIG. 26 have the following structures.

(1) The side wall of the through hole 83 has a stepped shape including a stepped portion 221.

(2) The leg portion 102 of the support portion 92 of the lens resin portion 82 is not only disposed above the side wall of the through hole 83 but also extends on the stepped portion 221 provided in the through hole 83 in the planar direction of the substrate with lens 41.

A method of forming the stepped-shaped through hole 83 illustrated in FIG. 26 will be described with reference to FIGS. 27A, 27B, 27C, 27D, 27E, and 27F.

Figure 27:
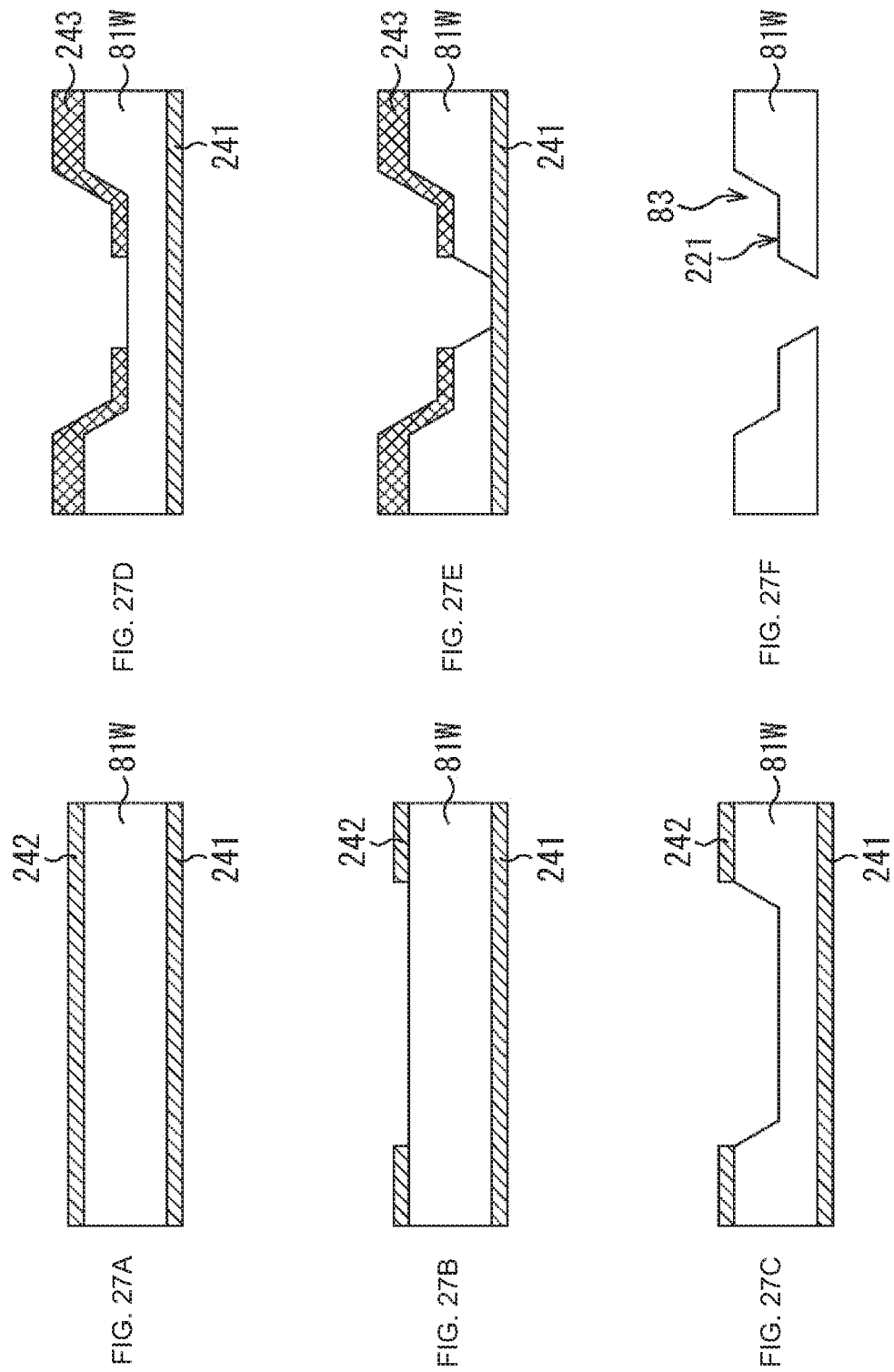
FIGS. 27A, 27B, 27C, 27D, 27E, 27F, and 27G are views for describing the method of manufacturing the substrate with lens.

First, as illustrated in FIG. 27A, an etching stop film 241 having resistance to wet etching at the time of opening a through hole is formed on one surface of the support substrate 81W. The etching stop film 241 can be, for example, a silicon nitride film.

Then, a hard mask 242 having resistance to wet etching at the time of opening a through hole is formed on the other surface of the support substrate 81W. The hard mask 242 can also be, for example, a silicon nitride film.

Next, as illustrated in FIG. 27B, a predetermined region of the hard mask 242 is opened for first etching. In the first etching, an upper portion of the stepped portion 221 of the through hole 83 is etched. Therefore, the opening portion of the hard mask 242 for the first etching is a region corresponding to the opening in the upper substrate surface of the substrate with lens 41 illustrated in FIG. 26.

Next, as illustrated in FIG. 27C, the support substrate 81W is etched by wet etching by a predetermined depth according to the opening portion of the hard mask 242.

Next, as illustrated in FIG. 27D, a hard mask 243 is formed again on the surface of the etched support substrate 81W, and the hard mask 243 is opened corresponding to a lower portion of the stepped portion 221 of the through hole 83. For the second hard mask 243, the silicon nitride film can also be adopted, for example.

Next, as illustrated in FIG. 27E, the support substrate 81W is etched by wet etching to reach the etching stop film 241 according to the opening portion of the hard mask 243.

Finally, as illustrated in FIG. 27F, the hard mask 243 on the upper surface of the support substrate 81W and the etching stop film 241 on the lower surface are removed.

As described above, the etching of the support substrate 81W for forming the through hole by wet etching is performed in two steps, whereby the stepped-shaped through hole 83 illustrated in FIG. 26 can be obtained.

Figure 28:
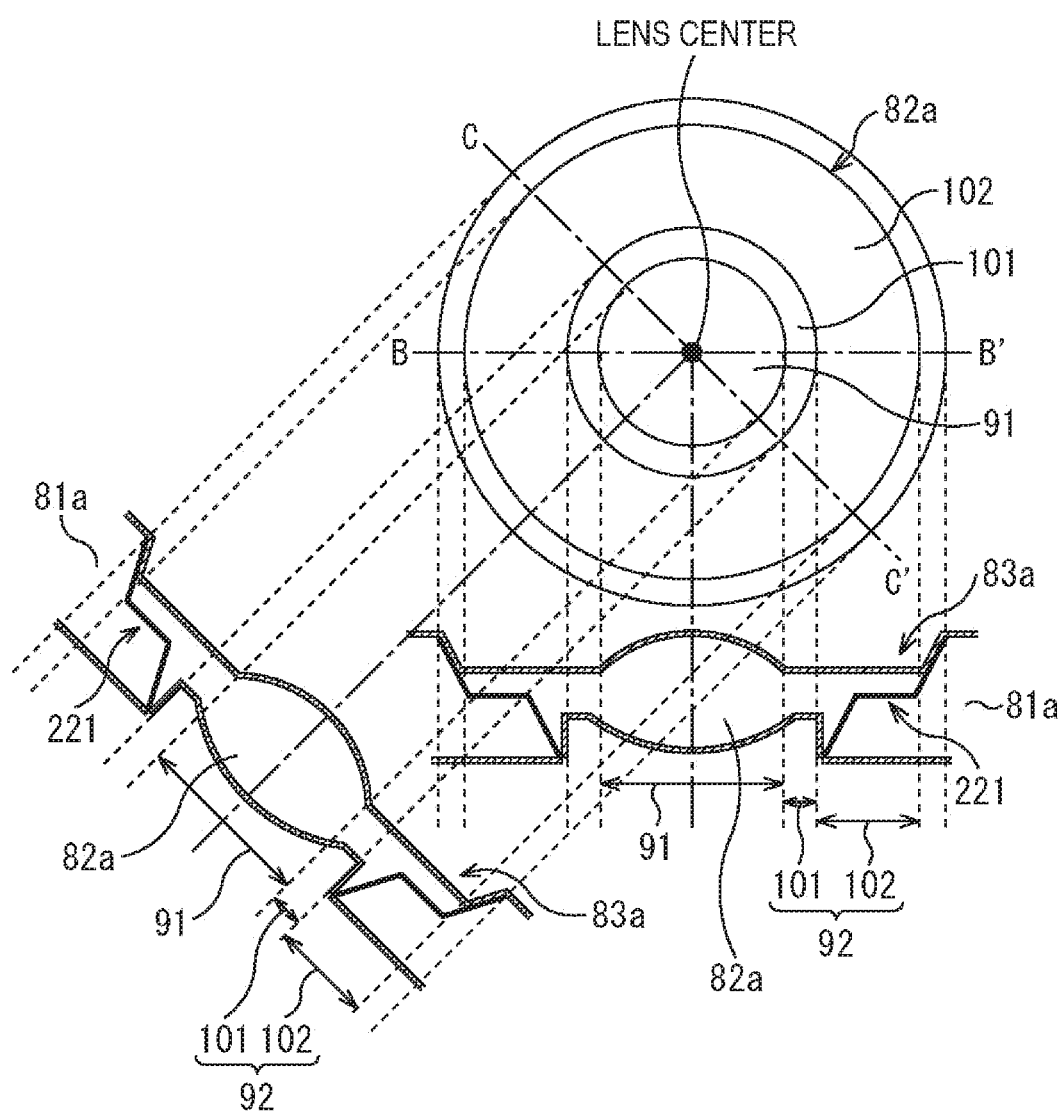
FIG. 28 is a view for describing the method of manufacturing the substrate with lens.

FIG. 28 illustrates a plan view and cross-sectional views of the support substrate 81a and the lens resin portion 82a of the substrate with lens 41a in a case where the through hole 83a has the stepped portion 221 and the planar shape of the through hole 83a is circular.

The cross-sectional views of the substrate with lens 41a in FIG. 28 are cross-sectional views taken along lines B-B' and C-C' in the plan view.

In a case where the planar shape of the through hole 83a is circular, and the cross-sectional shape of the through hole 83a is naturally the same regardless of the direction of the diameter. In addition, the cross-sectional shapes of the outer edge of the lens resin portion 82a, the arm portion 101, and the leg portion 102 are also formed to be the same regardless of the direction of the diameter.

The structure of the through hole 83a in FIG. 28 brings about a function or an effect of making the area of the leg portion 102 of the support portion 92 of the lens resin portion 82 in contact with the side wall of the through hole 83a larger than the through hole 83a in FIG. 14 without including the stepped portion 221 in the through hole 83a. Furthermore, a function or an effect of increasing the adhesion strength between the lens resin portion 82 and the side wall portion of the through hole 83a, in other words, the adhesion strength between the lens resin portion 82a and the support substrate 81W can be brought about.

Figure 29:
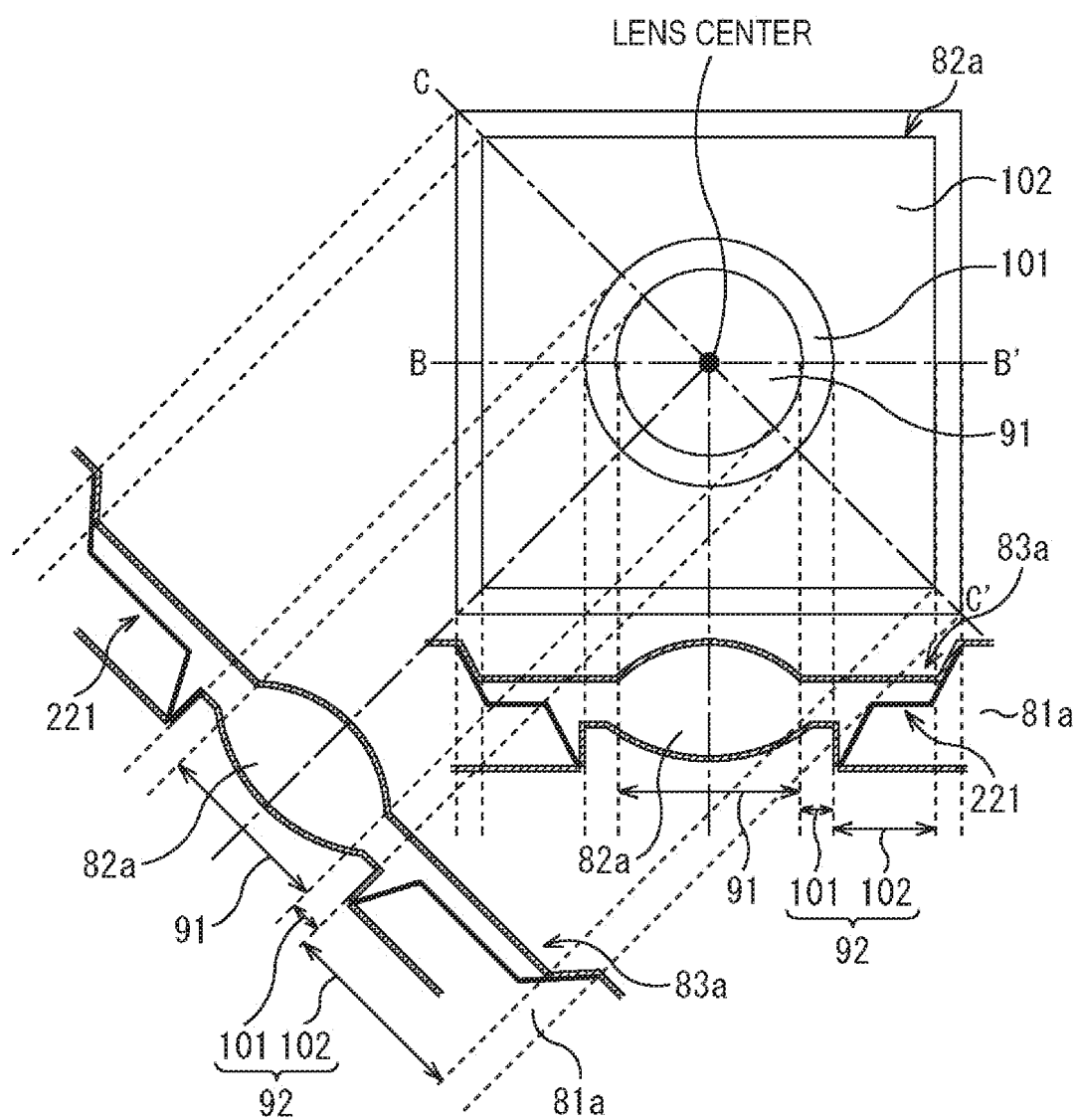
FIG. 29 is a view for describing the method of manufacturing the substrate with lens.

FIG. 29 illustrates a plan view and cross-sectional views of the support substrate 81a and the lens resin portion 82a of the substrate with lens 41a in a case where the through hole 83a has the stepped portion 221 and the planar shape of the through hole 83a is quadrangular.

The cross-sectional views of the substrate with lens 41a in FIG. 29 are cross-sectional views taken along lines B-B' and C-C' in the plan view.

The lens resin portion 82 and the through hole 83 illustrated in FIG. 29 have the following structures.

(1) The length of the arm portion 101 disposed on the outer periphery of the lens portion 91 is the same in the side direction and in the diagonal direction of the quadrangle.

(2) The length of the leg portion 102 disposed outside the arm portion 101 and extending to the side wall of the through hole 83a is made longer in the diagonal direction of the quadrangle than in the side direction of the quadrangle.

As illustrated in FIG. 29, the leg portion 102 is not in direct contact with the lens portion 91, while the arm portion 101 is in direct contact with the lens portion 91.

In the lens resin portion 82a in FIG. 29, the length and thickness of the arm portion 101 in direct contact with the lens portion 91 are made constant over the entire outer periphery of the lens portion 91, similarly to the lens resin portion 82a illustrated in FIG. 24, whereby the lens resin portion 82a can bring about a function or an effect of supporting the entire lens portion 91 by constant force without bias.

Moreover, by supporting the entire lens portion 91 with a constant force without bias, in a case where stress is applied from the support substrate 81a surrounding the through hole 83a to the entire outer periphery of the through hole 83a, for example, the stress is transmitted to the entire lens portion 91 without bias, whereby a function or an effect of suppressing transmission of the stress to only a specific portion of the lens portion 91 with bias can be brought about.

Moreover, the structure of the through hole 83a in FIG. 29 brings about a function or an effect of making the area of the leg portion 102 of the support portion 92 of the lens resin portion 82a in contact with the side wall of the through hole 83a larger than the through hole 83a in FIG. 24 or the like without including the stepped portion 221 in the through hole 83a. As a result, a function or an effect of increasing the adhesion strength between the lens resin portion 82a and the side wall portion of the through hole 83a, in other words, the adhesion strength between the lens resin portion 82a and the support substrate 81a can be brought about.

11. Direct Bonding of Substrates with Lens

Next, direct bonding of the substrates with lens 41W in the substrate state in which a plurality of substrates with lens 41 is formed will be described.

In the following description, as illustrated in FIGS. 30A and 30B, the substrate with lens 41W in the substrate state in which a plurality of substrates with lens 41a is formed is described as substrate with lens 41W-a, and the substrate with lens 41W in the substrate state in which a plurality of substrates with lens 41b is formed is described as substrate with lens 41W-b. The other substrates with lens 41c to 41e will be similarly described.

Direct bonding of the substrate with lens 41W-a in the substrate state and the substrate with lens 41W-b in the substrate state will be described with reference to FIGS. 31A and 31B.

Figure 31A:
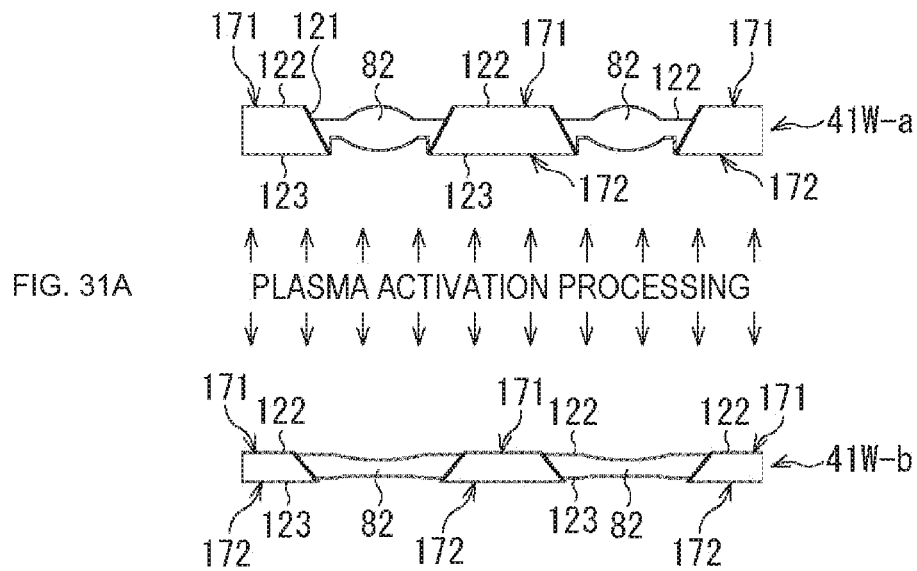
FIGS. 31A and 31B are views for describing bonding of substrates with lens in a substrate state.
Figure 31B:
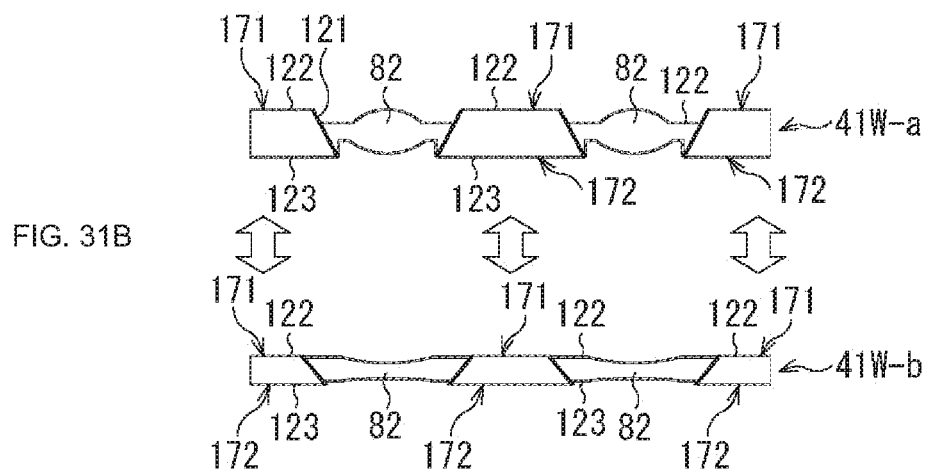

Note that, in FIGS. 31A and 31B, portions of the substrate with lens 41W-b corresponding to portions of the substrate with lens 41W-a are denoted by the same reference numerals as the substrate with lens 41W-a, and description is given, The upper surface layer 122 or 125 is formed on upper surfaces of the substrate with lens 41W-a and the substrate with lens 41W-b The lower surface layer 123 or 124 is formed on lower surfaces of the substrate with lens 41W-a and the substrate with lens 41W-b. Then, as illustrated in FIG. 31A, plasma activation processing is applied to the entire lower surface including the back flat portion 172 of the substrate with lens 41W-a and the entire upper surface including the front flat portion 171 of the substrate with lens 41W-b, the lower surface and the upper surface being surfaces to be bonded of the substrate with lens 41W-a and the substrate with lens 41W-a. A gas used for the plasma activation processing may be any gas capable of plasma processing, such as O2, N2, He, Ar, or H2. Note that, as the gas used for the plasma activation processing, use of a gas having the same constituent elements as the upper surface layer 122 and the lower surface layer 123 is favorable because deterioration of the films of the upper surface layer 122 and the lower surface layer 123 can be suppressed.

Then, as illustrated in FIG. 31B, the back flat portion 172 of the substrate with lens 41W-a and the front flat portion 171 of the substrate with lens 41W-b in an activated surface state are bonded.

By the processing of bonding the substrates with lens, a hydrogen bond occurs between hydrogen of an OH group on the surface of the lower surface layer 123 or 124 of the substrate with lens 41W-a and hydrogen of an OH group on the surface of the upper surface layer 122 or 125 of the substrate with lens 41W-b. Thereby, the substrate with lens 41W-a and the substrate with lens 41W-b are fixed. The processing of bonding the substrates with lens can be performed under an atmospheric pressure condition.

Annealing processing is applied to the substrate with lens 41W-a and the substrate with lens 41W-b for which the bonding processing has been performed. As a result, dehydration condensation occurs from the state of the hydrogen bond of the OH groups, and a covalent bond via oxygen is formed between the lower surface layer 123 or 124 of the substrate with lens 41W-a and the upper surface layer 122 or 125 of the substrate with lens 41W-b. Alternatively, the element contained in the lower surface layer 123 or 124 of the substrate with lens 41W-a and the element contained in the upper surface layer 122 or 125 of the substrate with lens 41W-b form a covalent bond. By these bonds, the two substrates with lens are firmly fixed. Forming the covalent bond between the lower surface layer 123 or 124 of the substrate with lens 41W disposed on the upper side and the upper surface layer 122 or 125 of the substrate with lens 41W disposed on the lower side, thereby fixing the two substrates with lens 41W, as described above, is called direct bonding in the present specification. The method, disclosed in Patent Document 1, of fixing a plurality of substrates with lens by a resin over the entire substrates has concerns of curing and shrinkage and thermal expansion of the resin and deformation of lenses due to the curing and shrinkage and the thermal expansion. In contrast, the direct bonding of the present technology does not use resin when fixing the plurality of substrates with lens 41W, and thus brings about a function or an effect of fixing the plurality of substrates with lens 41W without causing curing and shrinkage and thermal expansion.

The above-described annealing processing can also be performed under the atmospheric pressure condition. The annealing processing can be performed at 100° C. or higher, 150° C. or higher, or 200° C. or higher to perform dehydration condensation. Meanwhile, the annealing processing can be performed at 400° C. or lower, 350° C. or lower, or 300° C. or lower from the viewpoint of protecting the energy curing resin 191 for forming the lens resin portion 82 from heat, and from the viewpoint of suppressing degassing from the energy curing resin 191.

If the processing of bonding the substrates with lens 41W or the processing of directly bonding the substrates with lens 41W is performed under a condition other than the atmospheric pressure, a pressure difference occurs between a space between the bonded lens resin portion 82 and lens resin portion 82, and the outside of the lens resin portions 82 when the bonded substrate with lens 41W-a and substrate with lens 41W-b are returned to the atmospheric pressure environment. Due to the pressure difference, a pressure is applied to the lens resin portion 82, and there is a concern that the lens resin portion 82 is deformed.

Performing both the processing of bonding the substrate with lens 41W and the processing of directly bonding the substrates with lens under the atmospheric pressure condition brings about a function or an effect of avoiding the deformation of the lens resin portion 82, which is concerned in a case where the bonding is performed under a condition other than the atmospheric pressure.

By directly bonding substrates to which the plasma activation processing has been applied, in other words, by plasma-bonding the substrates, flowability and thermal expansion as in a case of using a resin as an adhesive, for example, can be suppressed. Therefore, the positional accuracy when bonding the substrate with lens 41W-a and the substrate with lens 41W-b can be improved.

As described above, the upper surface layer 122 or the lower surface layer 123 is formed on the back flat portion 172 of the substrate with lens 41W-a and the front flat portion 171 of the substrate with lens 41W-b. A dangling bond is more likely to be formed on the upper surface layer 122 and the lower surface layer 123 by the plasma activation processing performed earlier. In other words, the lower surface layer 123 formed on the back flat portion 172 of the substrate with lens 41W-a and the upper surface layer 122 formed on the front flat portion 171 of the substrate with lens 41W-b also plays a role of increasing the bonding strength.

Furthermore, in a case where the upper surface layer 122 or the lower surface layer 123 is configured by an oxide film, the upper surface layer 122 or the lower surface layer 123 is not affected by film quality change due to plasma (O2), and thus has an effect of suppressing corrosion due to plasma, for the lens resin portion 82.

As described above, the substrate with lens 41W-a in the substrate state in which the plurality of substrates with lens 41a is formed and the substrate with lens 41W-in the substrate state in which the plurality of substrates with lens 41b is formed are directly bonded after the surface activation processing with plasma has been applied, in other words, are bonded using plasma bonding.

FIGS. 32A, 32B, 32C, 32D, 32E, and 32F illustrate a first stacking method of stacking the five substrates with lens 41a to 41e in the substrate state corresponding to the stacked lens structure 11 in FIG. 13, using the method of bonding the substrates with lens 41W in the substrate state described with reference to FIGS. 31A and 31B.

First, as illustrated in FIG. 32A, the substrate with lens 41W-e in the substrate state located in the lowermost layer in the stacked lens structure 11 is prepared.

Next, as illustrated in FIG. 32B, the substrate with lens 41W-d in the substrate state located in the second layer from the bottom of the stacked lens structure 11 is bonded onto the substrate with lens 41W-e in the substrate state.

Next, as illustrated in FIG. 32C, the substrate with lens 41W-c in the substrate state located in the third layer from the bottom of the stacked lens structure 11 is bonded onto the substrate with lens 41W-d in the substrate state.

Next, as illustrated in FIG. 32D, the substrate with lens 41W-b in the substrate state located in the fourth layer from the bottom of the stacked lens structure 11 is bonded onto the substrate with lens 41W-c in the substrate state.

Next, as illustrated in FIG. 32E, the substrate with lens 41W-a in the substrate state located in the fifth layer from the bottom of the stacked lens structure 11 is bonded onto the substrate with lens 41W-b in the substrate state.

Finally, as illustrated in FIG. 32F, the diaphragm plate 51W located on the upper layer of the substrate with lens 41a in the stacked lens structure 11 is bonded onto the substrate with lens 41W-a in the substrate state.

As described above, the five substrates with lens 41W-a to 41W-e in the substrate state are sequentially stacked one by one from the lower substrate with lens 41W to the upper substrate with lens 41W in the stacked lens structure 11, whereby the stacked lens structure 11W in the substrate state can be obtained.

FIGS. 33A, 33B, 33C, 33D, 33E, and 33F illustrate a second stacking method of stacking the five substrates with lens 41a to 41e in the substrate state corresponding to the stacked lens structure 11 in FIG. 13, using the method of bonding the substrates with lens 41W in the substrate state described with reference to FIGS. 31A and 31B.

Figure 33A:
FIGS. 33A, 33B, 33C, 33D, 33E, and 33F are views for describing a second stacking method of stacking five substrates with lens in a substrate state.

First, as illustrated in FIG. 33A, the diaphragm plate 51W located on the upper layer of the substrate with lens 41a in the stacked lens structure 11 is prepared.

Figure 33B:
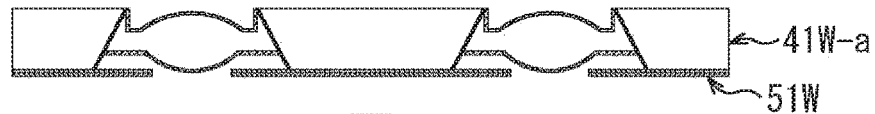

Next, as illustrated in FIG. 33B, the substrate with lens 41W-a in the substrate state located in the uppermost layer in the stacked lens structure 11 is flipped upside down and then bonded onto the diaphragm plate 51W.

Figure 33C:
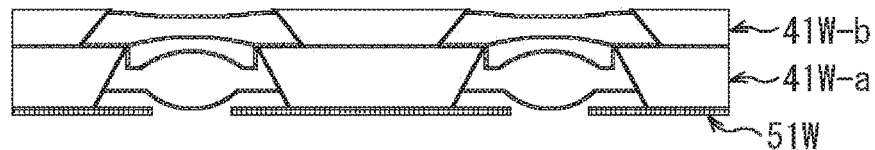

Next, as illustrated in FIG. 33C, the substrate with lens 41W-b in the substrate state located in the second layer from the top of the stacked lens structure 11 is flipped upside down and then bonded onto the substrate with lens 41W-a in the substrate state.

Figure 33D:
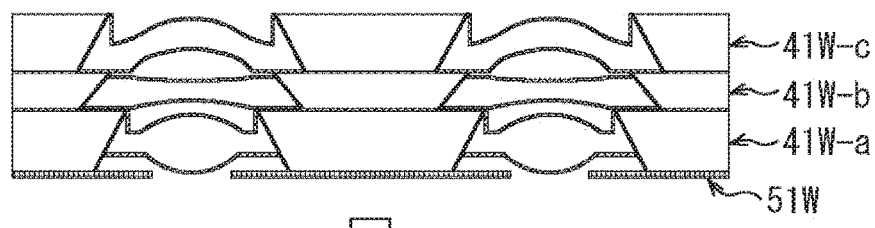

Next, as illustrated in FIG. 33D, the substrate with lens 41W-c in the substrate state located in the third layer from the top of the stacked lens structure 11 is flipped upside down and then bonded onto the substrate with lens 41W-b in the substrate state.

Figure 33E:
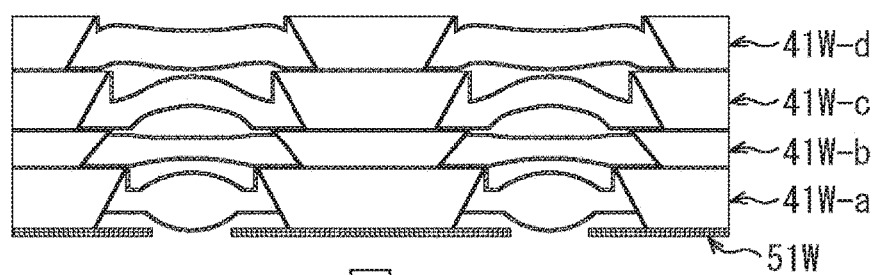

Next, as illustrated in FIG. 33E, the substrate with lens 41W-d in the substrate state located in the fourth layer from the top of the stacked lens structure 11 is flipped upside down and then bonded onto the substrate with lens 41W-c in the substrate state.

Figure 33F:
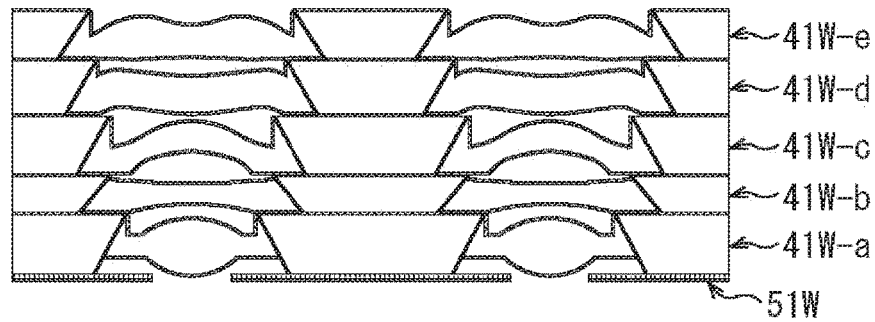

Next, as illustrated in FIG. 33F, the substrate with lens 41W-e in the substrate state located in the fifth layer from the top of the stacked lens structure 11 is flipped upside down and then bonded onto the substrate with lens 41W-d in the substrate state.

As described above, the five substrates with lens 41W-a to 41W-e in the substrate state are sequentially stacked one by one from the upper substrate with lens 41W to the lower substrate with lens 41W in the stacked lens structure 11, whereby the stacked lens structure 11W in the substrate state can be obtained.

The five substrates with lens 41W-a to 41W-e in the substrate state stacked by the stacking method described in FIGS. 32A, 32B, 32C, 32D, 32E, and 32F or 33A, 33B, 33C, 33D, 33E, and 33F are separated into pieces in module units or chip units using a blade, a laser, or the like, whereby the stacked lens structure 11 in which the five substrates with lens 41a to 41e are stacked is obtained.

12. Eighth and Ninth Embodiments of Camera Module

Figure 34:
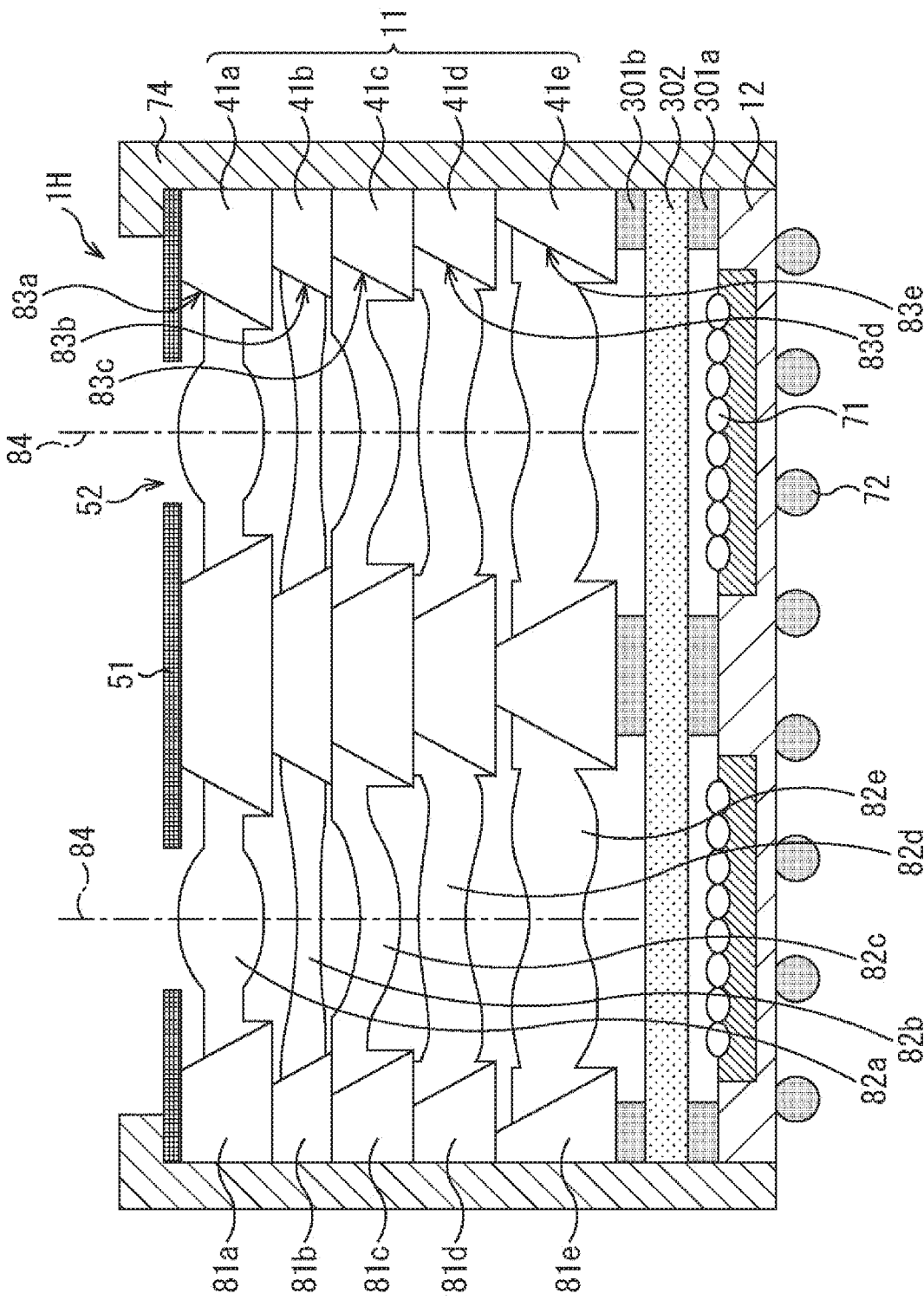
FIG. 34 is a view illustrating an eighth embodiment of a camera module using a stacked lens structure to which the present technology is applied.

FIG. 34 is a view illustrating an eighth embodiment of a camera module using a stacked lens structure to which the present technology is applied.

Figure 35:
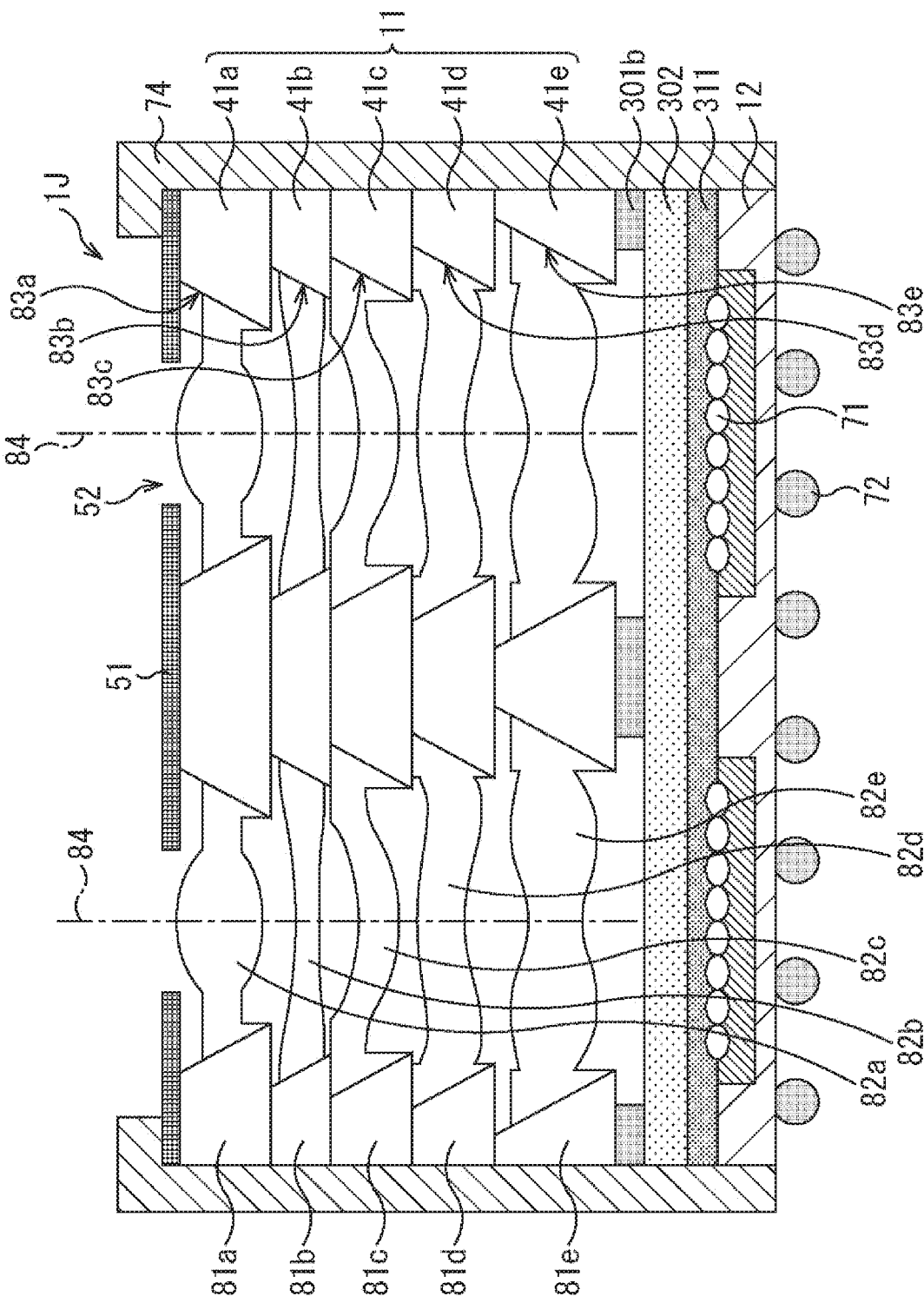
FIG. 35 is a view illustrating a ninth embodiment of a camera module using a stacked lens structure to which the present technology is applied.

FIG. 35 is a view illustrating a ninth embodiment of a camera module using a stacked lens structure to which the present technology is applied.

In the description of FIGS. 34 and 35, only portions different from the camera module E illustrated in FIG. 13 will be described.

In a camera module 1H in FIG. 34 and a camera module 1J in FIG. 35, the portion of the structural material 73 in the camera module E illustrated in FIG. 13 is replaced into a different structure.

In the camera module 1H in FIG. 34, the portion of the structural material 73 in the camera module 1J is replaced with structural materials 301a and 301b and a light transmissive substrate 302.

Specifically, the structural material 301a is disposed on a part of the upper side of the light receiving element 12. The light receiving element 12 and the light transmissive substrate 302 are fixed via the structural material 301a. The structural material 301a is, for example, an epoxy resin.

The structural material 301b is disposed on an upper side of the light transmissive substrate 302. The light transmissive substrate 302 and the stacked lens structure 11 are fixed via the structural material 301b. The structural material 301b is, for example, an epoxy resin.

In contrast, in the camera module 1J in FIG. 35, the portion of the structural material 301a in the camera module 1H in FIG. 34 is replaced with a resin layer 311 having a light transmissive property.

The resin layer 311 is disposed on the entire upper surface of the light receiving element 12. The light receiving element 12 and the light transmissive substrate 302 are fixed via the resin layer 311. The resin layer 311 disposed on the entire upper surface of the light receiving element 12 brings about a function or an effect of preventing application of a stress on a partial region of the light receiving element 12 and receiving the stress by dispersing the stress to the entire surface of the light receiving element 12 in a case where the stress is intensively applied to the light transmissive substrate 302 from above the light transmissive substrate 302

The structural material 301b is disposed on an upper side of the light transmissive substrate 302. The light transmissive substrate 302 and the stacked lens structure 11 are fixed via the structural material 301b.

The camera module 1H in FIG. 34 and the camera module 1J in FIG. 35 include the light transmissive substrate 302 on the upper side of the light receiving element 12. The light transmissive substrate 302 brings about a function or an effect of suppressing damage to the light receiving element 12 during manufacturing of the camera module 1H or 1J, for example.

13. Tenth Embodiment of Camera Module

Figure 36:
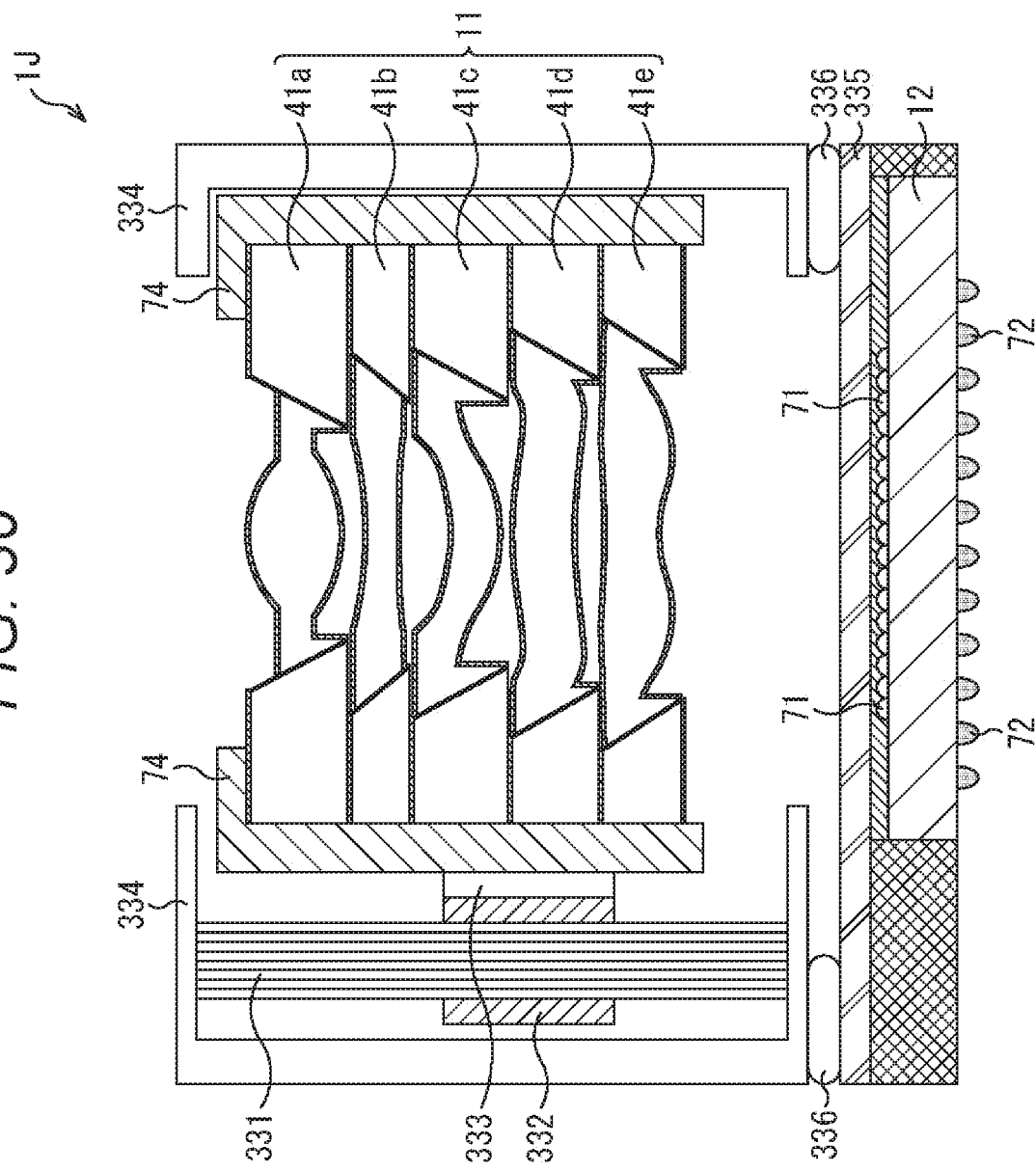
FIG. 36 is a view illustrating a tenth embodiment of a camera module using a stacked lens structure to which the present technology is applied.

FIG. 36 is a view illustrating a tenth embodiment of a camera module using a stacked lens structure to which the present technology is applied.

In a camera module 1J illustrated in FIG. 36, a stacked lens structure 11 is accommodated in a lens barrel 74. The lens barrel 74 is fixed by a moving member 332 that moves along a shaft 331 and a fixing member 333. When the lens barrel 74 is moved in an axial direction of the shaft 331 by a drive motor (not illustrated), the distance from the stacked lens structure 11 to an imaging surface of a light receiving element 12 is adjusted.

The lens barrel 74, the shaft 331, the moving member 332, and the fixing member 333 are accommodated in a housing 334. A protective substrate 335 is disposed on an upper portion of the light receiving element 12, and the protective substrate 335 and the housing 334 are connected by an adhesive 336.

The above-described mechanism of moving the stacked lens structure 11 brings about a function or an effect of enabling an autofocus operation when a camera using the camera module 1J captures an image.

14. Eleventh Embodiment of Camera Module

Figure 37:
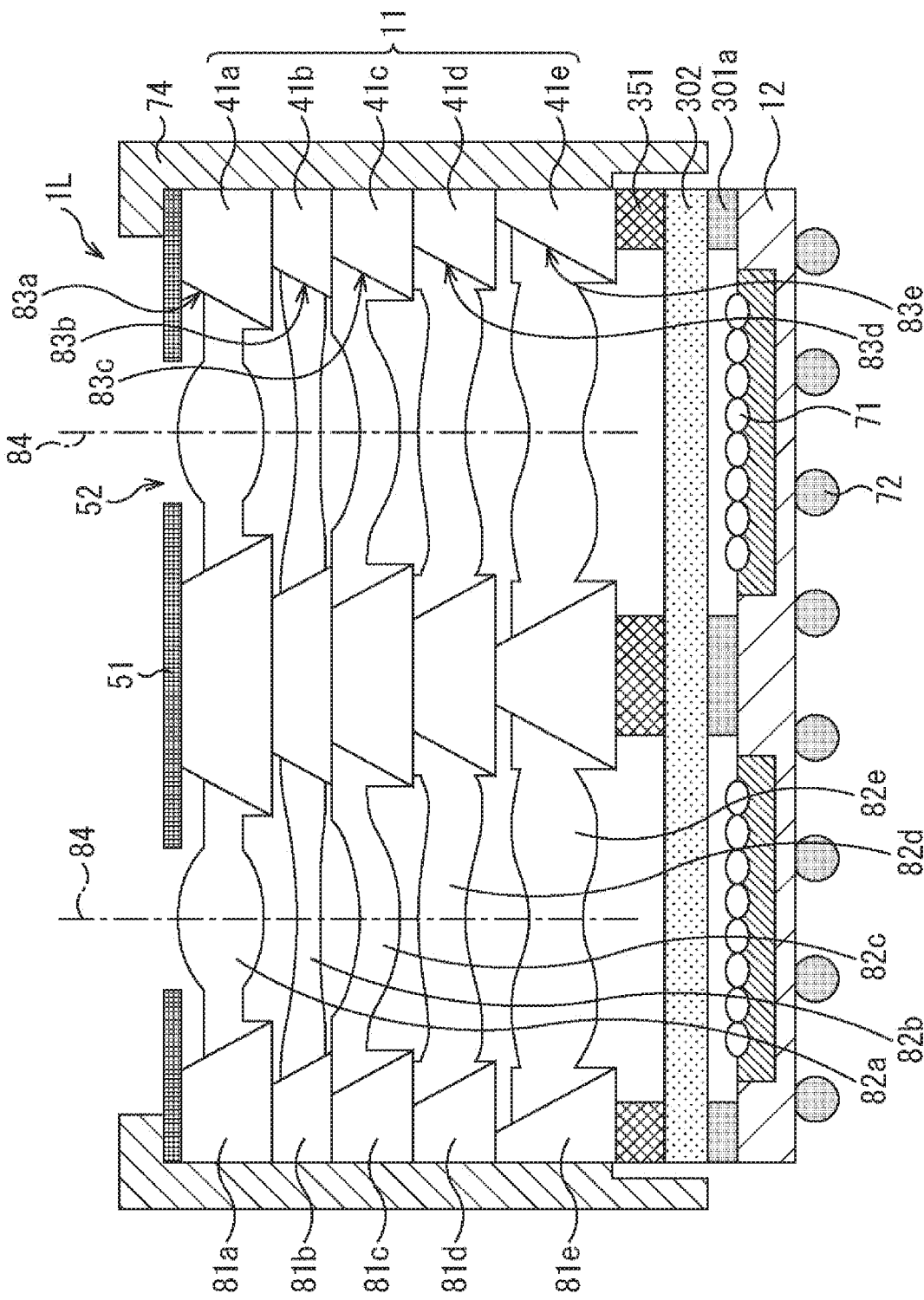
FIG. 37 is a view illustrating an eleventh embodiment of a camera module using a stacked lens structure to which the present technology is applied.

FIG. 37 is a view illustrating an eleventh embodiment of a camera module using a stacked lens structure to which the present technology is applied.

A camera module 1L in FIG. 37 is a camera module to which a focus adjustment mechanism by a piezoelectric element is added.

In other words, in the camera module 1L, as in the camera module 1H in FIG. 34, a structural material 301a is disposed on a part of an upper side of a light receiving element 12. The light receiving element 12 and a light transmissive substrate 302 are fixed via the structural material 301a. The structural material 301a is, for example, an epoxy resin.

A piezoelectric element 351 is disposed on an upper side of the light transmissive substrate 302. The light transmissive substrate 302 and a stacked lens structure 11 are fixed via the piezoelectric element 351.

In the camera module 1L, by applying and interrupting a voltage to the piezoelectric element 351 disposed below the stacked lens structure 11, the stacked lens structure 11 can be moved in an up-down direction. The means for moving the stacked lens structure 11 is not limited to the piezoelectric element 351, and other devices with shapes changeable by application and interruption of voltage can be used. For example, a MEMS device can be used.

The above-described mechanism of moving the stacked lens structure 11 brings about a function or an effect of enabling an autofocus operation when a camera using the camera module 1L captures an image.

15. Effect of Present Structure Compared with Another Structure

The stacked lens structure 11 has a structure (hereinafter referred to as present structure) in which the substrates with lens 41 are fixed by direct bonding. The functions and effects of the present structure will be described in comparison with other structures of substrates with lens in which lenses are formed.

Comparative Structural Example 1

Figure 38:
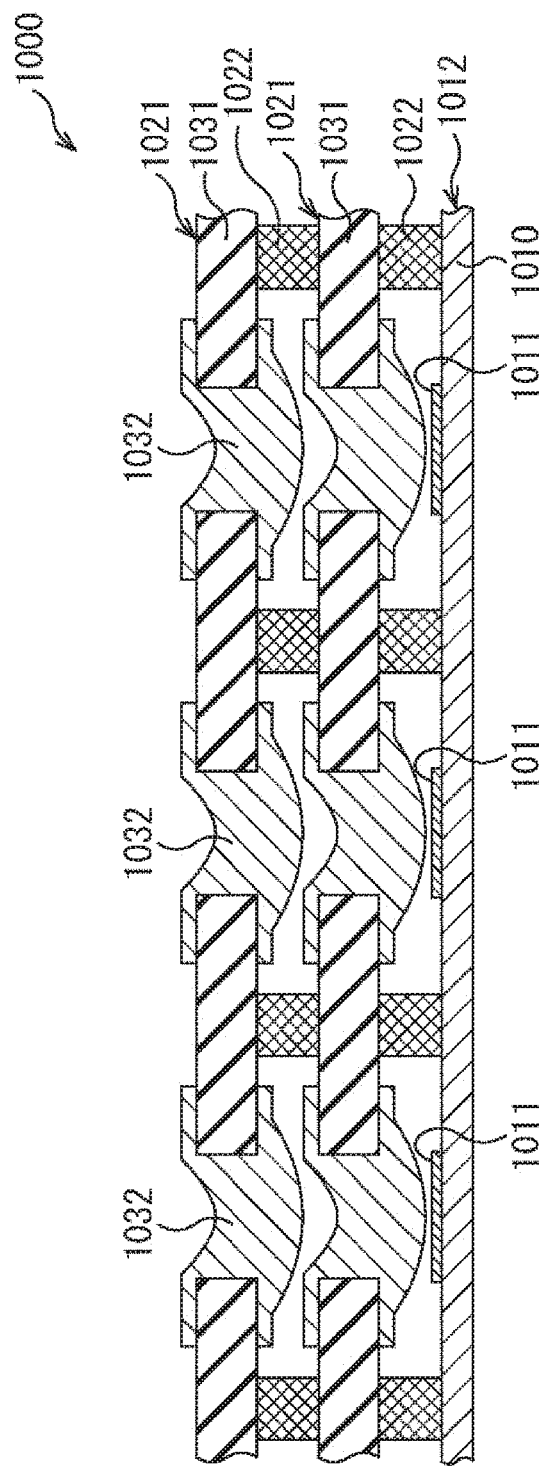
FIG. 38 is a cross-sectional view of a wafer level stacked structure as comparative structural example 1.

FIG. 38 illustrates a cross-sectional view of a first substrate structure (hereinafter referred to as comparative structural example 1) for comparison with the present structure, and of a wafer level stacked structure disclosed in FIG. 14(b) in Japanese Patent Application Laid-Open No. 2011-138089 (hereinafter referred to as Comparative Document 1).

A wafer level stacked structure 1000 illustrated in FIG. 38 has a structure in which two lens array substrates 1021 are stacked via a columnar spacer 1022 on a sensor array substrate 1012 having a plurality of image sensors 1011 arrayed on a wafer substrate 1010. Each lens array substrate 1021 includes a substrate with lens 1031, and lenses 1032 formed in a plurality of through hole portions formed in the substrate with lens 1031.

Comparative Structural Example 2

Figure 39:
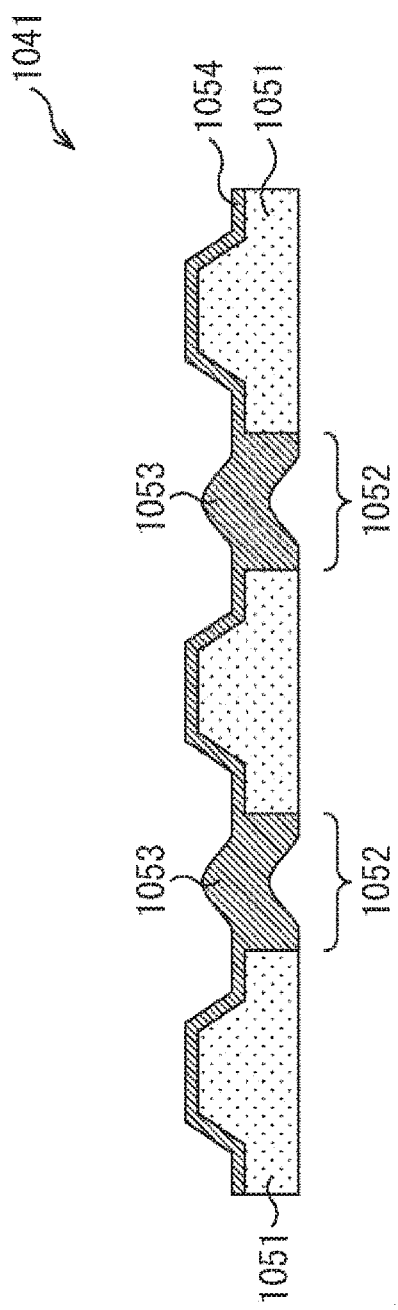
FIG. 39 is a cross-sectional view of a lens array substrate as a second comparative structural example.

FIG. 39 illustrates a cross-sectional view of a second substrate structure (hereinafter referred to as comparative structural example 2) for comparison with the present structure, and of a lens array substrate disclosed in FIG. 5(a) in Japanese Patent Application Laid-Open No. 2009-279790 (hereinafter referred to as Comparative Document 2).

In a lens array substrate 1041 illustrated in FIG. 39, lenses 1053 are respectively provided in a plurality of through holes 1052 provided in a plate-like substrate 1051. Each lens 1053 is formed using a resin (energy curable resin) 1054, and the resin 1054 is also formed on an upper surface of the substrate 1051.

A method of manufacturing the lens array substrate 1041 in FIG. 39 will be briefly described with reference to FIGS. 40A, 40B, and 40C.

Figure 40A:
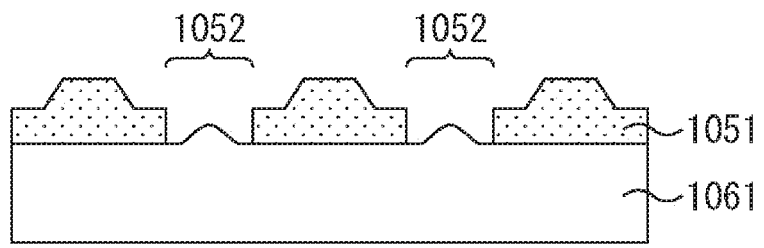
FIGS. 40A, 40B, and 40C are views for describing a method of manufacturing the lens array substrate in FIG. 39.

FIG. 40A illustrates a state in which the substrate 1051 in which the plurality of through holes 1052 is formed is placed on a lower mold 1061. The lower mold 1061 is a mold that pushes the resin 1054 upward from below in a later process.

Figure 40B:
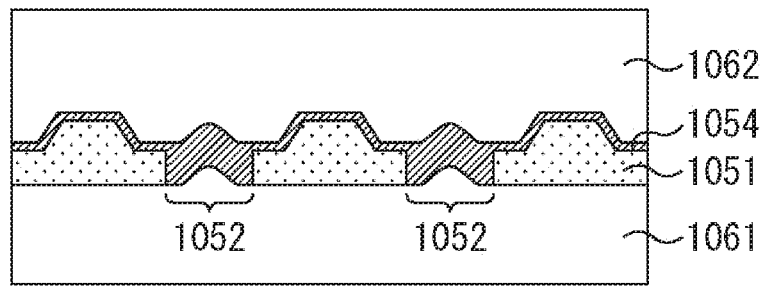

FIG. 40B illustrates a state in which the resin 1054 is applied on insides of the plurality of through holes 1052 and an upper surface of the substrate 1051, then an upper mold 1062 is arranged on the substrate 1051, and pressure molding is being performed by the upper mold 1062 and the lower mold 1061. The upper mold 1062 is a mold that pushes the resin 1054 downward from above. In the state illustrated in FIG. 40B, the resin 1054 is cured.

Figure 40C:
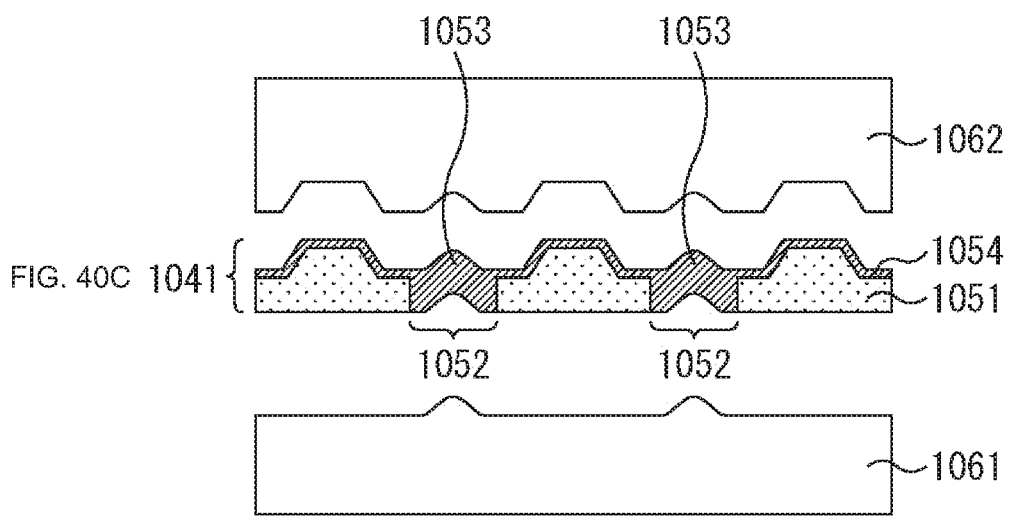

FIG. 40C illustrates a state in which the upper mold 1062 and the lower mold 1061 are released after the resin 1054 is cured, and the lens array substrate 1041 is completed.

The lens array substrate 1041 is characterized in that (1) the resin 1054 formed at the position of the through hole 1052 of the substrate 1051 becomes the lens 1053, and a plurality of the lenses 1053 is formed in the substrate 1051, and (2) a thin layer of the resin 1054 is formed on the entire upper surface of the substrate 1051 located between the plurality of lenses 1053.

In a case of forming a structure in which a plurality of the lens array substrates 1041 is stacked, the thin layer of the resin 1054 formed on the entire upper surface of the substrate 1051 brings about a function or an effect as an adhesive for gluing the substrates.

Furthermore, in the case of forming a structure in which a plurality of the lens array substrates 1041 is stacked, the area to glue the substrates can be made larger than the wafer level stacked structure 1000 in FIG. 38 illustrated as the comparative structural example 1. Therefore, the substrates can be glued by stronger force.

Function of Resin in Comparative Structural Example 2

In Comparative Document 2, which discloses the lens array substrate 1041 in FIG. 39 as the comparative structural example 2, discloses the following matters as functions of the resin 1054 serving as the lens 1053.

In the comparative structural example 2, an energy curable resin is used as the resin 1054. Then, as an example of the energy curable resin, a photocurable resin is used. In a case of using the photocurable resin as the energy curable resin, the resin 1054 is cured when the resin 1054 is irradiated with UV light. Due to this curing, curing and shrinkage occurs in the resin 1054.

However, according to the structure of the lens array substrate 1041 in FIG. 39, even if curing and shrinkage of the resin 1054 occurs, the substrate 1051 is interposed between the plurality of lenses 1053. Therefore, variation in the distance between the lenses 1053 due to curing and shrinkage of the resin 1054 can be cut off, whereby warp of the lens array substrate 1041 in which the plurality of lenses 1053 is disposed can be suppressed.

Comparative Structural Example 3

Figure 41:
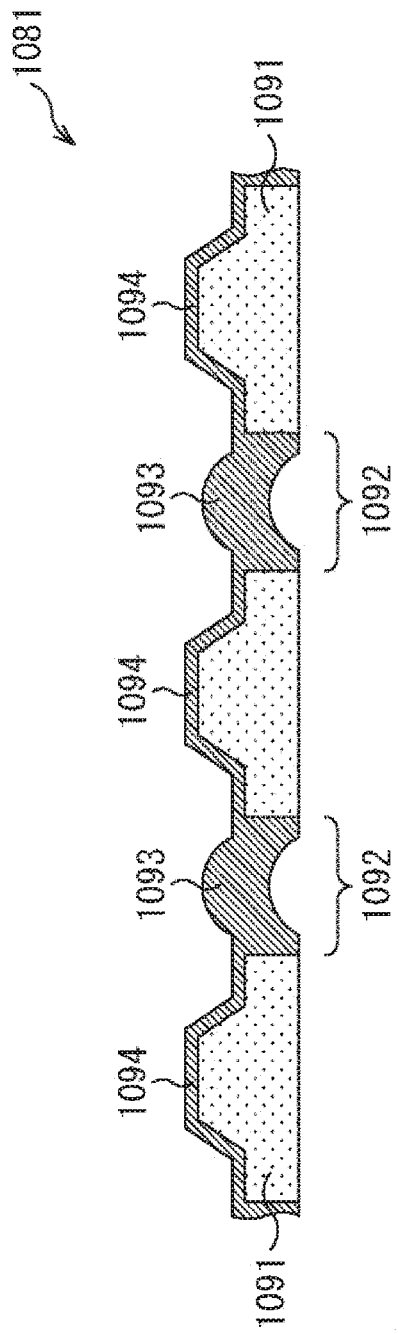
FIG. 41 is a cross-sectional view of a lens array substrate as a third comparative structural example.

FIG. 41 illustrates a cross-sectional view of a third substrate structure (hereinafter referred to as comparative structural example 3) for comparison with the present structure, and of a lens array substrate disclosed in FIG. 1 in Japanese Patent Application Laid-Open No. 2010-256563 (hereinafter referred to as Comparative Document 3).

In a lens array substrate 1081 illustrated in FIG. 41, lenses 1093 are respectively provided in a plurality of through holes 1092 provided in a plate-like substrate 1091. Each lens 1093 is formed using a resin (energy curable resin) 1094, and the resin 1094 is also formed on an upper surface of the substrate 1091 where no through holes 1092 are provided.

A method of manufacturing the lens array substrate 1081 in FIG. 41 will be briefly described with reference to FIGS. 42A, 42B, and 42C.

Figure 42A:
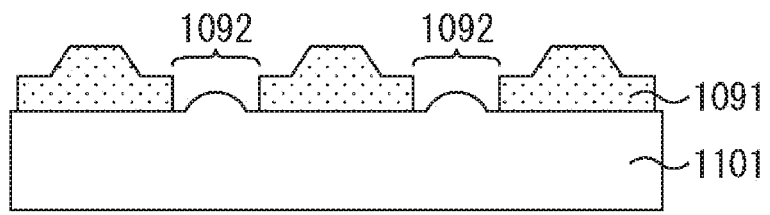
FIGS. 42A, 42B, and 42C are views for describing a method of manufacturing the lens array substrate in FIG. 41.

FIG. 42A illustrates a state in which the substrate 1091 in which the plurality of through holes 1092 is formed is placed on a lower mold 1101. The lower mold 1101 is a mold that pushes the resin 1094 upward from below in a later process.

Figure 42B:
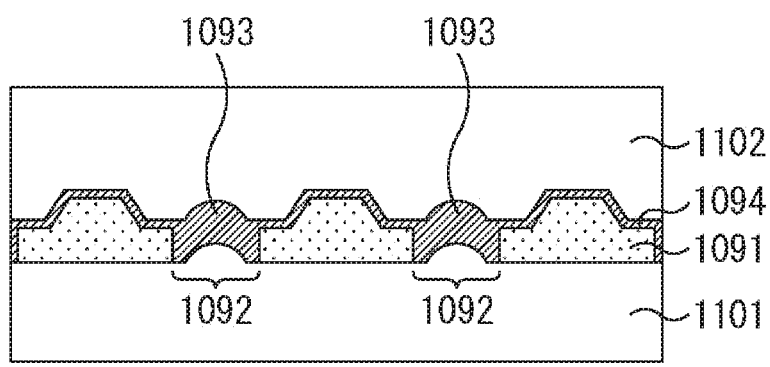

FIG. 42B illustrates a state in which the resin 1094 is applied on insides of the plurality of through holes 1092 and an upper surface of the substrate 1091, then an upper mold 1102 is arranged on the substrate 1091, and pressure molding is being performed by the upper mold 1102 and the lower mold 1101. The upper mold 1102 is a mold that pushes the resin 1094 downward from above. In the state illustrated in FIG. 42B, the resin 1094 is cured.

Figure 42C:
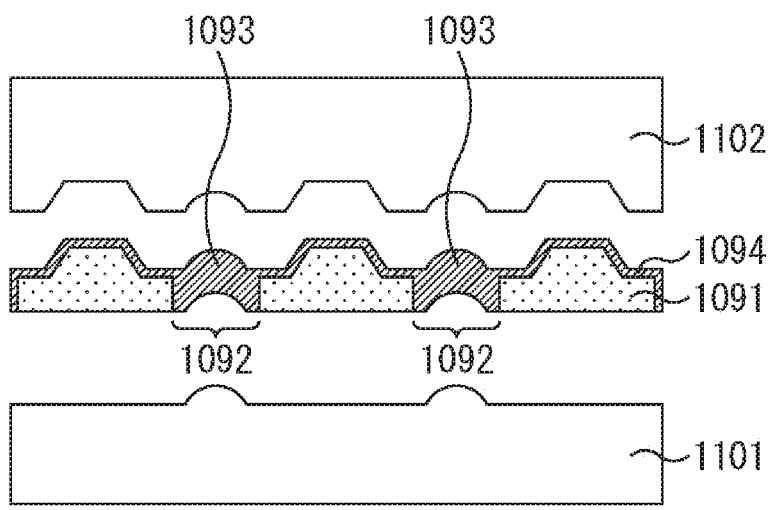

FIG. 42C illustrates a state in which the upper mold 1102 and the lower mold 1101 are released after the resin 1094 is cured, and the lens array substrate 1081 is completed.

The lens array substrate 1081 is characterized in that (1) the resin 1094 formed at the position of the through hole 1092 of the substrate 1091 becomes the lens 1093, and a plurality of the lenses 1093 is formed in the substrate 1091, and (2) a thin layer of the resin 1094 is formed on the entire upper surface of the substrate 1091 located between the plurality of lenses 1093.

Function of Resin in Comparative Structural Example 3

In Comparative Document 3, which discloses the lens array substrate 1081 in FIG. 41 as the comparative structural example 3, discloses the following matters as functions of the resin 1094 serving as the lens 1093.

In the comparative structural example 3, an energy curable resin is used as the resin 1094. Then, as an example of the energy curable resin, a photocurable resin is used. In a case of using the photocurable resin as the energy curable resin, the resin 1094 is cured when the resin 1094 is irradiated with UV light. Due to this curing, curing and shrinkage occurs in the resin 1094.

However, according to the structure of the lens array substrate 1081 in FIG. 41, even if curing and shrinkage of the resin 1094 occurs, the substrate 1091 is interposed between the plurality of lenses 1093. Therefore, variation in the distance between the lenses 1093 due to curing and shrinkage of the resin 1094 can be cut off, whereby the warp of the lens array substrate 1081 in which the plurality of lenses 1093 is disposed can be suppressed.

As described above, Comparative Documents 2 and 3 disclose occurrence of the curing and shrinkage when the photocurable resin is cured. Note that the occurrence of curing and shrinkage when the photocurable resin is cured is also disclosed in Japanese Patent Application Laid-Open No. 2013-1091 and the like, for example, in addition to Comparative Documents 2 and 3.

Furthermore, occurrence of the curing and shrinkage of the resin when the resin is molded into the shape of the lens and the resin after molding is cured is not limited to the problem of the photocurable resin. For example, occurrence of the curing and shrinkage in curing is the problem for a thermosetting resin that is one type of the energy curable resins, similarly to the photocurable resin. This is also disclosed in, for example, Comparative Documents 1 and 3, Japanese Patent Application Laid-Open No. 2010-204631, and the like.

Comparative Structural Example 4

Figure 43:
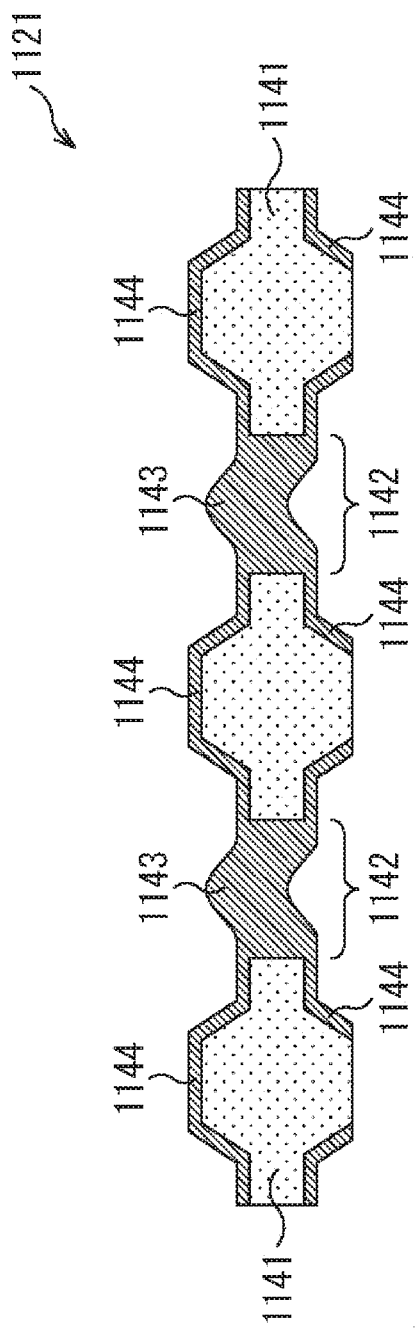
FIG. 43 is a cross-sectional view of a lens array substrate as a fourth comparative structural example.

FIG. 43 illustrates a cross-sectional view of a fourth substrate structure (hereinafter referred to as comparative structural example 4) for comparison with the present structure, and is a cross-sectional view of a lens array substrate disclosed in FIG. 6 in Comparative Document 2 described above.

A lens array substrate 1121 in FIG. 43 is different from the lens array substrate 1041 in FIG. 39 in that a shape of a substrate 1141 other than portions of through holes 1042 has a shape protruding not only upward but also downward, and a resin 1144 is formed on a part of a lower surface of the substrate 1141. Other configurations of the lens array substrate 1121 are similar to the configurations of the lens array substrate 1041 illustrated in FIG. 39.

Figure 44:
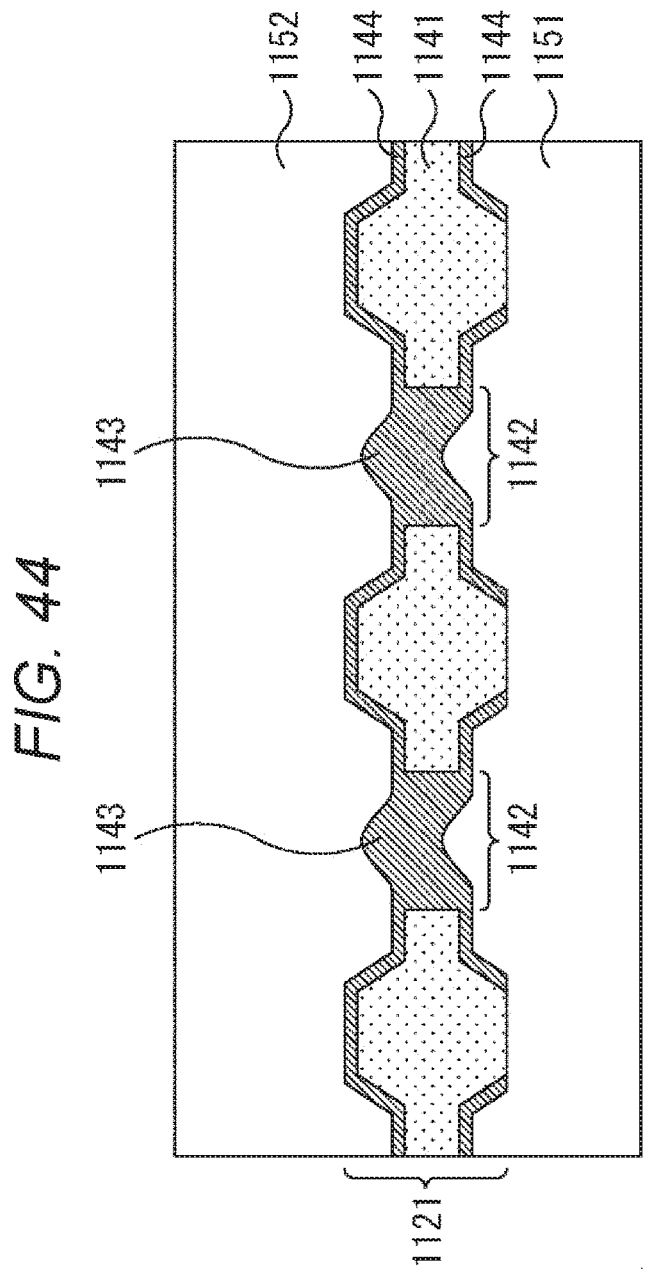
FIG. 44 is a view for describing a method of manufacturing the lens array substrate in FIG. 43.

FIG. 44 is a view for describing a method of manufacturing the lens array substrate 1121 in FIG. 43, and is a view corresponding to FIG. 40B.

FIG. 44 illustrates a state in which the resin 1144 is applied on insides of a plurality of through holes 1142 and an upper surface of the substrate 1141, and then pressure molding is performed using an upper mold 1152 and a lower mold 1151. The resin 1144 is also injected between a lower surface of the substrate 1141 and the lower mold 1151. In the state illustrated in FIG. 44, the resin 1144 is cured.

The lens array substrate 1121 is characterized in that (1) the resin 1144 formed at the position of the through hole 1142 of the substrate 1141 becomes the lens 1143, and a plurality of the lenses 1143 is formed in the substrate 1141, and (2) a thin layer of the resin 1144 is formed on not only the entire upper surface of the substrate 1141 located between the plurality of lenses 1143 but also a part of the lower surface of the substrate 1141.

Function of Resin in Comparative Structural Example 4

In Comparative Document 2, which discloses the lens array substrate 1121 in FIG. 43 as the comparative structural example 4, discloses the following matters as functions of the resin 1144 serving as the lens 1143.

In the lens array substrate 1121 in FIG. 43 as the comparative structural example 4, a photocurable resin that is an example of energy curable resins is used as the resin 1144. Then, the resin 1144 is cured when the resin 1144 is irradiated with UV light. Due to this curing, curing and shrinkage occurs in the resin 1144, similarly to the comparative structural examples 2 and 3.

However, in the lens array substrate 1121 in the comparative structural example 4, the thin layer of the resin 1144 is formed on not only the entire upper surface of the substrate 1141 located between the plurality of lenses 1143 but also a fixed region of the lower surface of the substrate 1141.

As described above, with the structure in which the resin 1144 is formed on both the upper surface and the lower surface of the substrate 1141, a warping direction of the entire lens array substrate 1121 can be offset.

In contrast, in the lens array substrate 1041 illustrated in FIG. 39 as the comparative structural example 2, the thin layer of the resin 1054 is formed on the entire upper surface of the substrate 1051 located between the plurality of lenses 1053 but no thin layer of the resin 1054 is formed on the lower surface of the substrate 1051.

Therefore, the lens array substrate 1121 in FIG. 43 can provide a lens array substrate with a smaller warp amount than the lens array substrate 1041 in FIG. 39.

Comparative Structural Example 5

Figure 45:
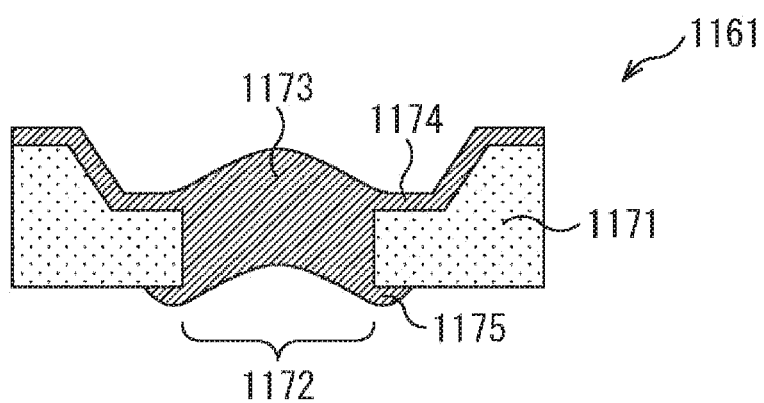
FIG. 45 is a cross-sectional view of a lens array substrate as a fifth comparative structural example.

FIG. 45 illustrates a cross-sectional view of a fifth substrate structure (hereinafter referred to as comparative structural example 5) for comparison with the present structure, and is a cross-sectional view of a lens array substrate disclosed in FIGS. 9A, 9B, 9C, 9D, 9E, 9F, 9G, and 9H in Comparative Document 2 described above.

A lens array substrate 1161 in FIG. 45 is different from the lens array substrate 1041 in FIG. 39 in including a resin overflow region 1175 on a substrate back surface near a through hole 1172 formed in a substrate 1171. Other configurations of the lens array substrate 1161 are similar to the configurations of the lens array substrate 1041 illustrated in FIG. 39.

Note that the lens array substrate 1161 in FIG. 45 is in an individually separated state.

The lens array substrate 1161 is characterized in that (1) a resin 1174 formed at the position of the through hole 1172 of the substrate 1171 becomes a lens 1173, and a plurality of the lenses 1173 is formed in the substrate 1171, and (2) a thin layer of the resin 1174 is formed on not only an entire upper surface of the substrate 1171 located between the plurality of lenses 1173 but also a part of a lower surface of the substrate 1171.

Function of Resin in Comparative Structural Example 5

In Comparative Document 2, which discloses the lens array substrate 1161 in FIG. 45 as the comparative structural example 5, discloses the following matters as functions of the resin 1174 serving as the lens 1173.

In the lens array substrate 1161 in FIG. 45 as the comparative structural example 5, a photocurable resin that is an example of energy curable resins is used as the resin 1174. Then, the resin 1174 is cured when the resin 1174 is irradiated with UV light. Due to this curing, curing and shrinkage occurs in the resin 1174, similarly to the comparative structural examples 2 and 3.

However, in the lens array substrate 1171 in the comparative structural example 5, the thin layer (resin overflow region 1175) of the resin 1174 is formed on not only the entire upper surface of the substrate 1171 located between the plurality of lenses 1173 but also a fixed region of the lower surface of the substrate 1171. With the configuration, a lens array substrate in which a warping direction of the entire lens array substrate 1171 has been offset and the warp amount has been made small can be provided.

Comparison of Functions of Resins in Comparative Structural Examples 2 to 5

The functions brought about by the resins in the comparative structural examples 2 to 5 are summarized as follows.

(1) As in the comparative structural example 2 and 3, in the case of the structure in which the resin layer is disposed on the entire upper surface of the lens array substrate, warp occurs in the substrate where the plurality of lenses is disposed.

Figure 46A:
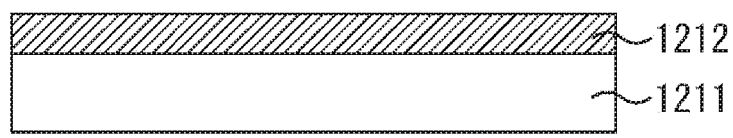
FIGS. 46A, 46B, and 46C are views for describing a function brought by a resin to serve as a lens.
Figure 46B:
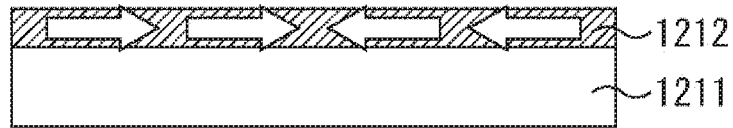
Figure 46C:
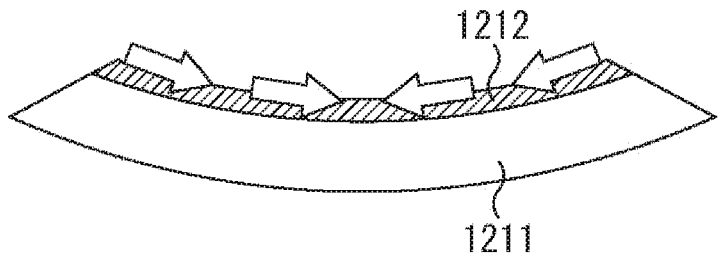

FIGS. 46A, 46B, and 46C are views schematically illustrating a structure in which a resin layer is disposed on the entire upper surface of a lens array substrate, as in the comparative structural example 2 and 3, and is a view for describing a function of a resin serving as a lens.

As illustrated in FIGS. 46A and 46B, curing and shrinkage occurs in a layer of a photocurable resin 1212 disposed on an upper surface of a lens array substrate 1211 (illustration of lenses and through holes are omitted) due to irradiation with UV light for curing. Thereby, a force in a shrinking direction caused by the photocurable resin 1212 is generated in the layer of the photocurable resin 1212.

Meanwhile, the lens array substrate 1211 itself is not shrunk or expanded even if irradiated with UV light. In other words, the force caused by the substrate is not generated in the lens array substrate 1211 itself. As a result, the lens array substrate 1211 warps in a downward convex shape, as illustrated in FIG. 46C.

(2) However, in the case of the structure in which the resin layer is disposed on both the upper surface and the lower surface of the lens array substrate as in the comparative structural examples 4 and 5, the warping direction of the lens array substrate is offset, and thus the warp amount of the lens array substrate can be made smaller than in the comparative structural examples 2 and 3.

Figure 47A:
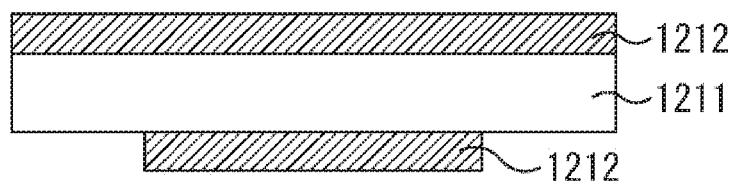
FIGS. 47A, 47B, and 47C are views for describing a function brought by a resin to serve as a lens.
Figure 47B:
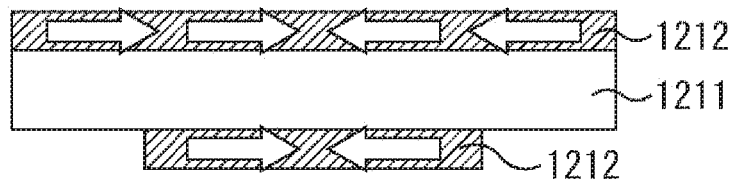
Figure 47C:
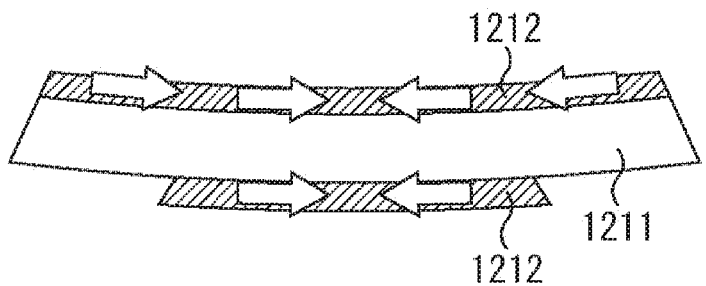

FIGS. 47A, 47B, and 47C are views schematically illustrating a structure in which a resin layer is disposed on both an upper surface and a lower surface of a lens array substrate, as in the comparative structural example 4 and 5, and is a view for describing a function of a resin serving as a lens.

As illustrated in FIGS. 47A and 47B, curing and shrinkage occurs in the layer of the photocurable resin 1212 disposed on the upper surface of the lens array substrate 1211 due to irradiation with UV light for curing. Thereby, in the layer of the photocurable resin 1212 disposed on the upper surface of the lens array substrate 1211, a force in the shrinking direction caused by the photocurable resin 1212 is generated. For this reason, a force to warp the lens array substrate 1211 in a downward convex shape acts on the upper surface side of the lens array substrate 1211.

In contrast, the lens array substrate 1211 itself is not shrunk or expanded even if irradiated with UV light. In other words, the force caused by the substrate is not generated in the lens array substrate 1211 itself.

Meanwhile, curing and shrinkage occurs in the layer of the photocurable resin 1212 disposed on the lower surface of the lens array substrate 1211 due to irradiation with UV light for curing. Thereby, in the layer of the photocurable resin 1212 disposed on the lower surface of the lens array substrate 1211, a force in the shrinking direction caused by the photocurable resin 1212 is generated. For this reason, a force to warp the lens array substrate 1211 in an upward convex shape acts on the lower surface side of the lens array substrate 1211.

The force to warp the lens array substrate 1211 in the downward convex shape on the upper surface side of the lens array substrate 1211 and the force to warp the lens array substrate 1211 in the upward convex shape on the lower surface side of the lens array substrate 1211 act to offset.

As a result, as illustrated in FIG. 47C, the warp amount of the lens array substrate 1211 in the comparative structural example 4 and 5 is more decreased than the warp amount in the comparative structural examples 2 and 3 in FIG. 46C.

As described above, the force to warp the lens array substrate and the warp amount of the lens array substrate are affected by a relative relationship of:

(1) the direction and magnitude of the force acting on the lens array substrate on the upper surface of the lens array substrate; and (2) the direction and magnitude of the force acting on the lens array substrate on the lower surface of the lens array substrate.

Comparative Structural Example 6

Figure 48A:
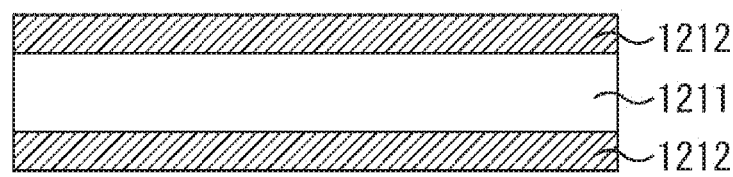
FIGS. 48A, 48B, and 48C are views schematically illustrating a lens array substrate as a sixth comparative structural example.

Therefore, for example, as illustrated in FIG. 48A, a lens array substrate structure in which the layer and the area of the photocurable resin 1212 disposed on the upper surface of the lens array substrate 1211 and the layer and the area of the photocurable resin 1212 disposed on the lower surface of the lens array substrate 1211 are made the same is conceivable. This lens array substrate structure is called sixth substrate structure (hereinafter referred to as comparative structural example 6) for comparison with the present structure.

In the comparative structural example 6, in the layer of the photocurable resin 1212 disposed on the upper surface of the lens array substrate 1211, a force in the shrinking direction caused by the photocurable resin 1212 is generated. The force caused by the substrate is not generated in the lens array substrate 1211 itself. For this reason, a force to warp the lens array substrate 1211 in a downward convex shape acts on the upper surface side of the lens array substrate 1211.

Meanwhile, in the layer of the photocurable resin 1212 disposed on the lower surface of the lens array substrate 1211, a force in the shrinking direction caused by the photocurable resin 1212 is generated. The force caused by the substrate is not generated in the lens array substrate 1211 itself. For this reason, a force to warp the lens array substrate 1211 in an upward convex shape acts on the lower surface side of the lens array substrate 1211.

The above-described two forces to warp the lens array substrate 1211 act in a further offsetting direction than the structure illustrated in FIG. 47A. As a result, the force to warp the lens array substrate 1211 and the warp amount of the lens array substrate 1211 are further reduced than the comparative structural examples 4 and 5.

Comparative Structural Example 7

By the way, in practice, the shapes of the substrates with lens constituting the stacked lens structure incorporated into the camera module are not the same. More specifically, the plurality of substrates with lens constituting the stacked lens structure may be different in the thickness in the substrates with lens or the size in the through holes, or may be different in the thickness, shape, volume, and the like in the lenses formed in the through holes, for example. Furthermore, the substrates with lens may be different in the film thickness of the photocurable resins formed on the upper surfaces and the lower surfaces of the substrates with lens or the like.

Figure 48B:
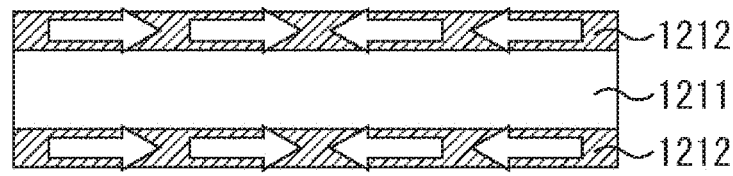
Figure 48C:
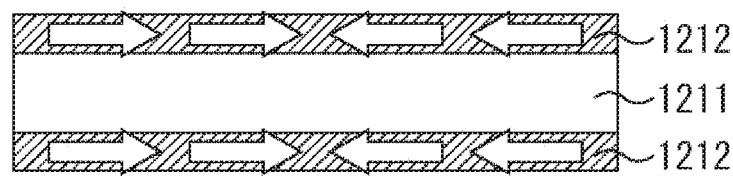
Figure 49:
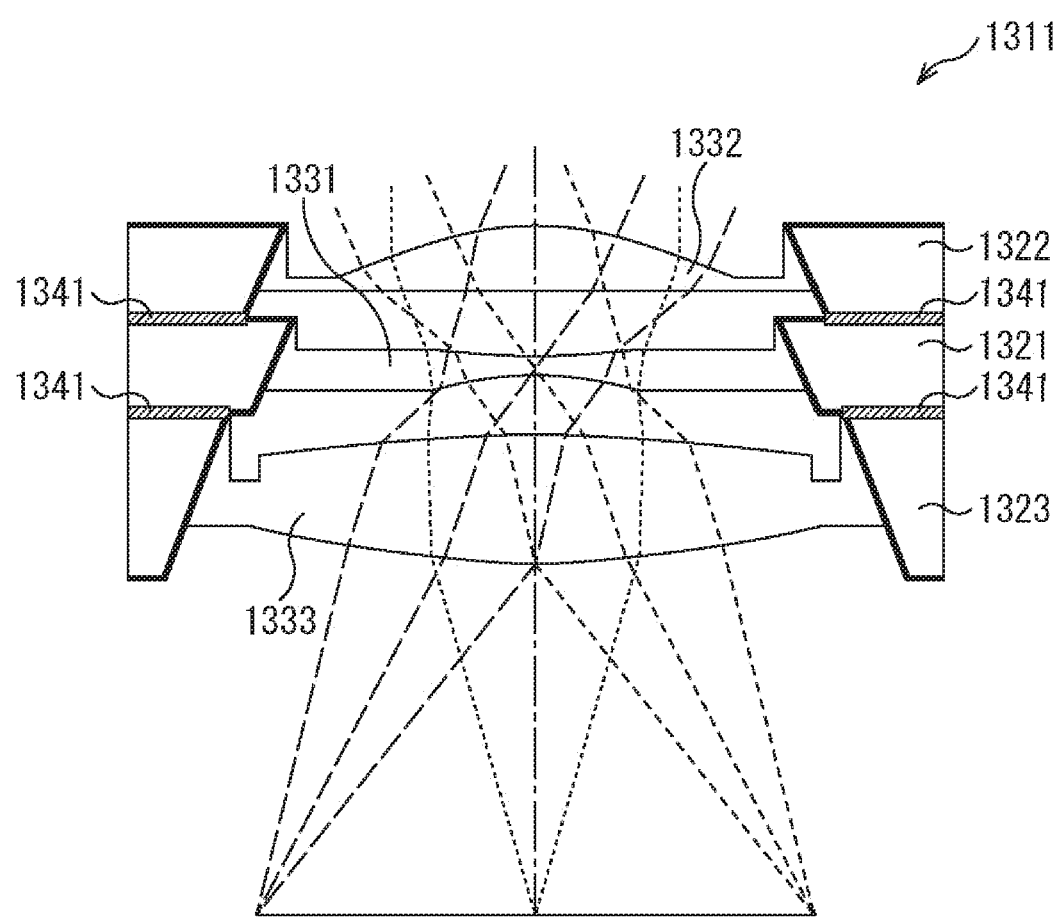
FIG. 49 is a cross-sectional view of a stacked lens structure as a seventh comparative structural example.

FIG. 49 is a cross-sectional view of a stacked lens structure configured by stacking of three substrates with lens, as a seventh substrate structure (hereinafter referred to as comparative structural example 7). In this stacked lens structure, it is assumed that the layers and areas of photocurable resins disposed on the upper surface and the lower surface of the substrates with lens are formed to be the same, similarly to the comparative structural example 6 in FIGS. 48A, 48B, and 48C.

A stacked lens structure 1311 illustrated in FIG. 49 includes three substrates with lens 1321 to 1323.

Hereinafter, the middle substrate with lens 1321 is referred to as a first substrate with lens 1321, the uppermost substrate with lens 1322 is referred to as a second substrate with lens 1322, and the lowermost substrate with lens 1323 is referred to as a third substrate with lens 1323, among the three substrates with lens 1321 to 1323.

The second substrate with lens 1322 disposed in the uppermost layer and the third substrate with lens 1323 disposed in the lowermost layer are different in the thickness in the substrates and the thickness in lenses.

More specifically, the lens of the third substrate with lens 1323 is formed to be thicker than the lens of the second substrate with lens 1322, and with the thickness of the lenses, the third substrate with lens 1323 is also formed to be thicker than the second substrate with lens 1322.

A resin 1341 is formed on an entire contact surface of the first substrate with lens 1321 and the second substrate with lens 1322 and an entire contact surface of the first substrate with lens 1321 and the third substrate with lens 1323.

The cross-sectional shape of the through holes of the three substrates with lens 1321 to 1323 is a so-called open fan shape in which the substrate lower surface is broader than the substrate upper surface.

Functions brought by the three substrates with lens 1321 to 1323 having different shapes will be described with reference to FIGS. 50A, 50B, 50C, and 50D.

Figure 50A:
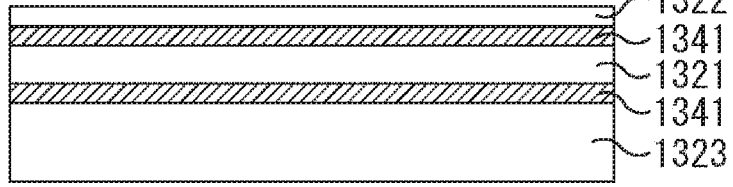
FIGS. 50A, 50B, 50C, and 50D are views for describing a function brought by the stacked lens structure in FIG. 49.
Figure 50B:
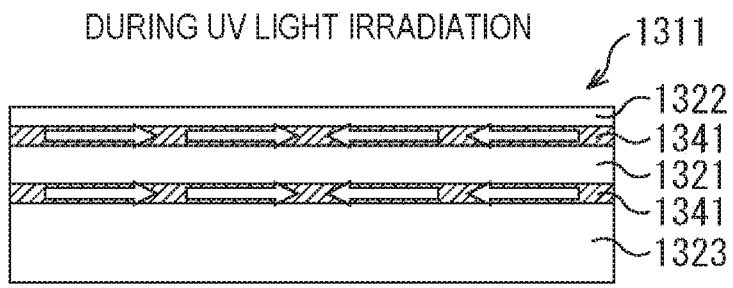
Figure 50C:
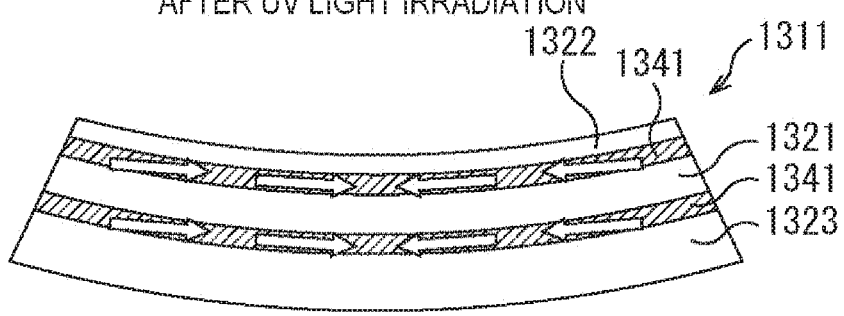

FIGS. 50A, 50B, and 50C are views schematically illustrating the stacked lens structure 1311 in FIG. 49.

In the case where the second substrate with lens 1322 and the third substrate with lens 1323 having the different substrate thicknesses are disposed on the upper surface and the lower surface of the first substrate with lens 1321, as in the stacked lens structure 1311, the force to warp the stacked lens structure 1311 and the warp amount of the stacked lens structure 1311 change depending on which position in the thickness direction of the stacked lens structure 1311 the layer of the resin 1341 existing over the entire contact surfaces of the three substrates with lens 1321 to 1323 exists.

If the layer of the resin 1341 existing over the entire contact surfaces of the three substrates with lens 1321 to 1323 is not disposed symmetrically to a line passing through a center line of the stacked lens structure 1311, in other words, a middle point in the thickness direction of the stacked lens structure 1311 and running in the substrate planar direction, the action of the force generated due to the curing and shrinkage of the resin 1341 disposed on the upper surface and the lower surface of the first substrate with lens 1321 cannot be completely offset, as illustrated in FIG. 48C. As a result, the stacked lens structure 1311 warps in either direction.

For example, in a case where the resin 1341 on the two layers of the upper surface and the lower surface of the first substrate with lens 1321 is disposed to be shifted in an upper direction with respect to the center line in the thickness direction of the stacked lens structure 1311, the stacked lens structure 1311 is warped in the downward convex shape, as illustrated in FIG. 50C, when the curing and shrinkage occurs in the resin 1341 on the two layers.

Moreover, in a case where the cross-sectional shape of the through hole of a thinner substrate, between the second substrate with lens 1322 and the third substrate with lens 1323, is a shape becoming larger toward the first substrate with lens 1321, a concern of loss or damage of the lens increases.

Figure 50D:
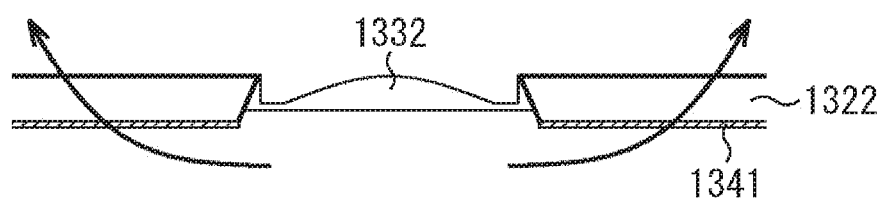

In the example illustrated in FIG. 49, the cross-sectional shape of the through hole of the thinner second substrate with lens 1322, between the second substrate with lens 1322 and the third substrate with lens 1323, is an open fan shape becoming larger toward the first substrate with lens 1321. In such a shape, when the resin 1341 on the two layers of the upper surface and the lower surface of the first substrate with lens 1321 is cured and shrunk, a force to warp the stacked lens structure 1311 in the downward convex shape acts on the stacked lens structure 1311, as illustrated in FIG. 50C, and the force acts as a force in a direction in which the lens and the substrate are separated in the second substrate with lens 1322, as illustrated in FIG. 50D. This action increases the concern that the lens 1332 of the second substrate with lens 1322 will be lost or damaged.

Next, a case where the resin is thermally expanded will be considered.

Comparative Structural Example 8

Figure 51:
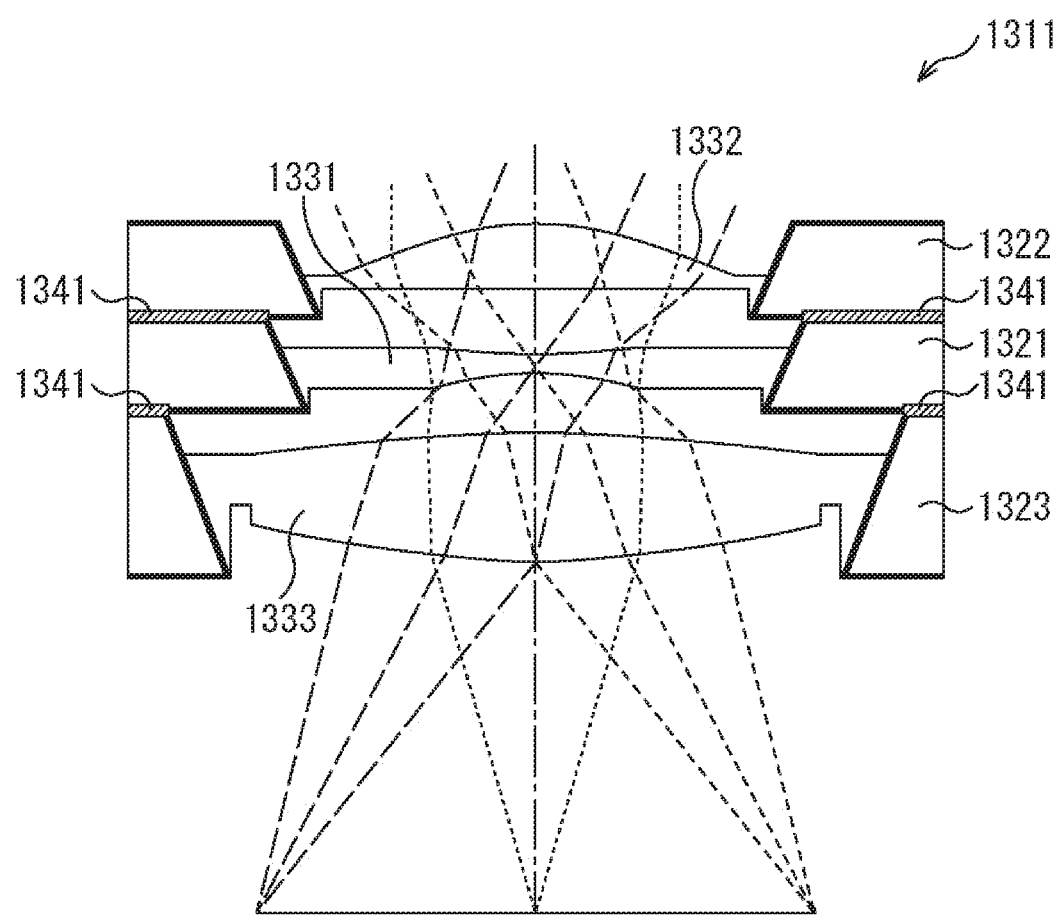
FIG. 51 is a cross-sectional view of a stacked lens structure as an eighth comparative structural example.

FIG. 51 is a cross-sectional view of a stacked lens structure configured by stacking of three substrates with lens, as an eighth substrate structure (hereinafter referred to as comparative structural example 8). In this stacked lens structure, it is assumed that the layers and areas of photo-curable resins disposed on the upper surface and the lower surface of the substrates with lens are formed to be the same, similarly to the comparative structural example 6 in FIGS. 48A, 48B, and 48C.

The comparative structural example 8 in FIG. 51 is different from the comparative structural example 7 in FIG. 49 in that the cross-sectional shape of the through hole of the three substrates with lens 1321 to 1323 is a so-called downward concave shape in which the substrate lower surface is narrower than the substrate upper surface.

FIGS. 52A, 52B, and 52C are views schematically illustrating the stacked lens structure 1311 in FIG. 51.

When a user actually uses the camera module, the temperature in the housing of the camera increases due to an increase in power consumption accompanying the operation, and the temperature of the camera module also increases. The resin 1341 disposed on the upper surface and the lower surface of the first substrate with lens 1321 is thermally expanded in the stacked lens structure 1311 in FIG. 51 due to the temperature rise.

Even if the areas and thicknesses of the resin 1341 disposed on the upper surface and the lower surface of the first substrate with lens 1321 are made the same as in FIG. 48A, if the layer of the resin 1341 existing over the entire contact surfaces of the three substrates with lens 1321 to 1323 is not disposed symmetrically to a line passing through a center line of the stacked lens structure 1311, in other words, a middle point in the thickness direction of the stacked lens structure 1311 and running in the substrate planar direction, the action of the force generated due to the thermal expansion of the resin 1341 disposed on the upper surface and the lower surface of the first substrate with lens 1321 cannot be completely offset, as illustrated in FIG. 48C. As a result, the stacked lens structure 1311 warps in either direction.

For example, in a case where the resin 1341 on the two layers of the upper surface and the lower surface of the first substrate with lens 1321 is disposed to be shifted in an upper direction with respect to the center line in the thickness direction of the stacked lens structure 1311, the stacked lens structure 1311 is warped in the upward convex shape, as illustrated in FIG. 52C, when the thermal expansion occurs in the resin 1341 on the two layers.

Moreover, in the example illustrated in FIG. 51, the cross-sectional shape of the through hole of the thinner second substrate with lens 1322, between the second substrate with lens 1322 and the third substrate with lens 1323, is a downward concave shape becoming smaller toward the first substrate with lens 1321. In such a shape, when the resin 1341 on the two layers of the upper surface and the lower surface of the first substrate with lens 1321 is thermally expanded, a force to warp the stacked lens structure 1311 in the upward convex shape acts on the stacked lens structure 1311, and the force acts as a force in a direction in which the lens and the substrate are separated in the second substrate with lens 1322, as illustrated in FIG. 52D. This action increases the concern that the lens 1332 of the second substrate with lens 1322 will be lost or damaged.

<Present Structure>

Figure 53A:
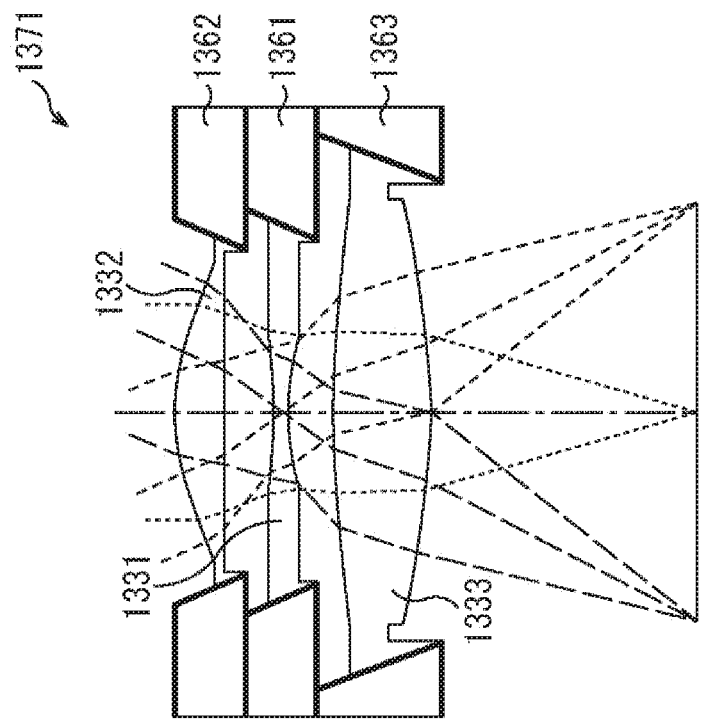
FIGS. 53A and 53B are cross-sectional views of a stacked lens structure adopting the present structure.
Figure 53B:
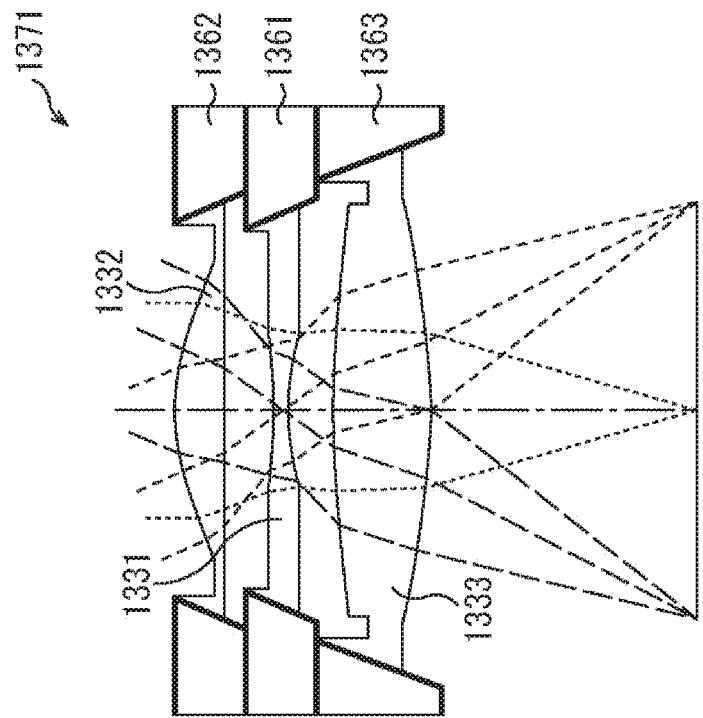

FIGS. 53A and 53B is a view illustrating a stacked lens structure 1371 including three substrates with lens 1361 to 1363 adopting the present structure.

FIG. 53A illustrates a structure corresponding to the stacked lens structure 1311 in FIG. 49 and a structure in which the cross-sectional shape of a through hole is a so-called open fan shape. Meanwhile, FIG. 53B illustrates a structure corresponding to the stacked lens structure 1311 in FIG. 51 and a structure in which the cross-sectional shape of a through hole is a so-called downward concave shape.

Figure 54A:
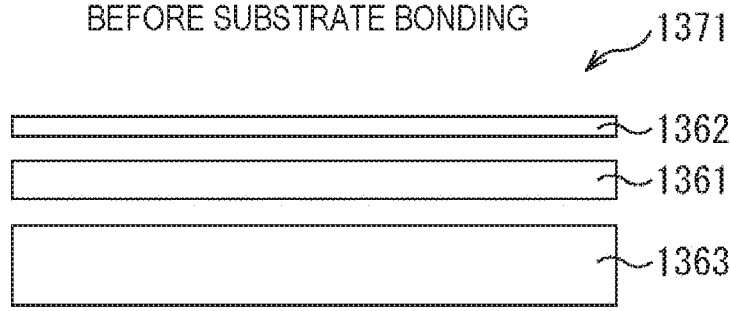
FIGS. 54A, 54B, and 54C are views schematically illustrating the stacked lens structure in FIGS. 53A and 53B.
Figure 54B:
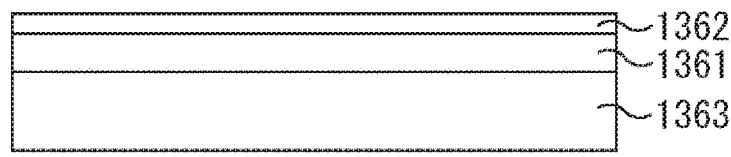
Figure 54C:
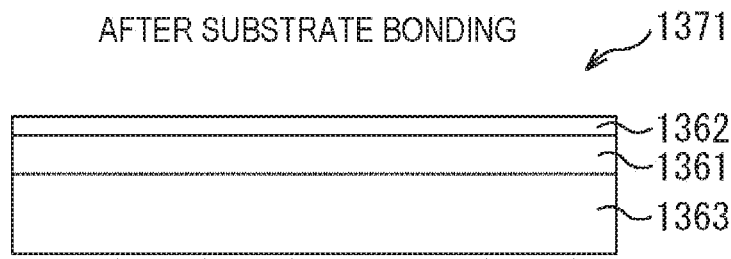

FIGS. 54A, 54B, and 54C are views schematically illustrating the stacked lens structure 1371 in FIGS. 53A and 53B, for describing a function of the present structure.

The stacked lens structure 1371 has a structure in which the second substrate with lens 1362 is disposed above the middle first substrate with lens 1361, and the third substrate with lens 1363 is disposed below the first substrate with lens 1361.

The second substrate with lens 1362 disposed in the uppermost layer and the third substrate with lens 1363 disposed in the lowermost layer are different in the thickness in the substrates and the thickness in lenses. More specifically, the lens of the third substrate with lens 1363 is formed to be thicker than the lens of the second substrate with lens 1362, and with the thickness of the lenses, the third substrate with lens 1363 is also formed to be thicker than the second substrate with lens 1362.

In the stacked lens structure 1371 of the present structure, the direct bonding of substrates is used as a means for fixing the substrates with lenses. In other words, the plasma activation processing is applied to the substrates with lens to be fixed, and the two substrates with lens to be fixed are plasma bonded. In still other words, a silicon oxide film is formed on the surfaces of the two substrates with lens to be stacked, and after hydroxyl groups are bonded to the surfaces, the two substrates with lens are bonded to each other, heated, and dehydrated and condensed. Thus, the two substrates with lens are directly bonded by silicon-oxygen covalent bond.

Therefore, in the stacked lens structure 1371 of the present structure, bonding with a resin is not used as means for fixing the substrates with lens. Therefore, no resin for forming a lens or a resin for bonding substrates is disposed between the substrate with lens and the substrate with lens. Furthermore, since the resin is not disposed on the upper surface or the lower surface of the substrate with lens, the resin is not thermally expanded and is not cured and shrunk on the upper surface or the lower surface of the substrate with lens.

Therefore, in the stacked lens structure 1371, even when the second substrate with lens 1362 and the third substrate with lens 1363 having different thicknesses of the lenses and substrates are disposed on the upper layer and the lower layer of the first substrate with lens 1351, the warp of the substrates due to curing and shrinkage and the warp of the substrates due to thermal expansion like the above-described comparative structural examples 1 to 8 are not generated.

In other words, the present structure in which the substrates with lens are fixed by direct bonding brings about the function and effect of more significantly suppressing the warp of the substrates than the above-described comparative structural examples 1 to 8, even in the case of stacking the substrates with lens having different thicknesses of the lenses and substrates above and below the substrate with lens.

16. Various Modifications

Other modifications of the above-described embodiments will be described below.

16.1 Cover Glass with Optical Diaphragm

To protect the surface of the lens 21 of the stacked lens structure 11, a cover glass may be provided on an upper portion of the stacked lens structure 11. In this case, the cover glass can have an optical diaphragm function.

Figure 55:
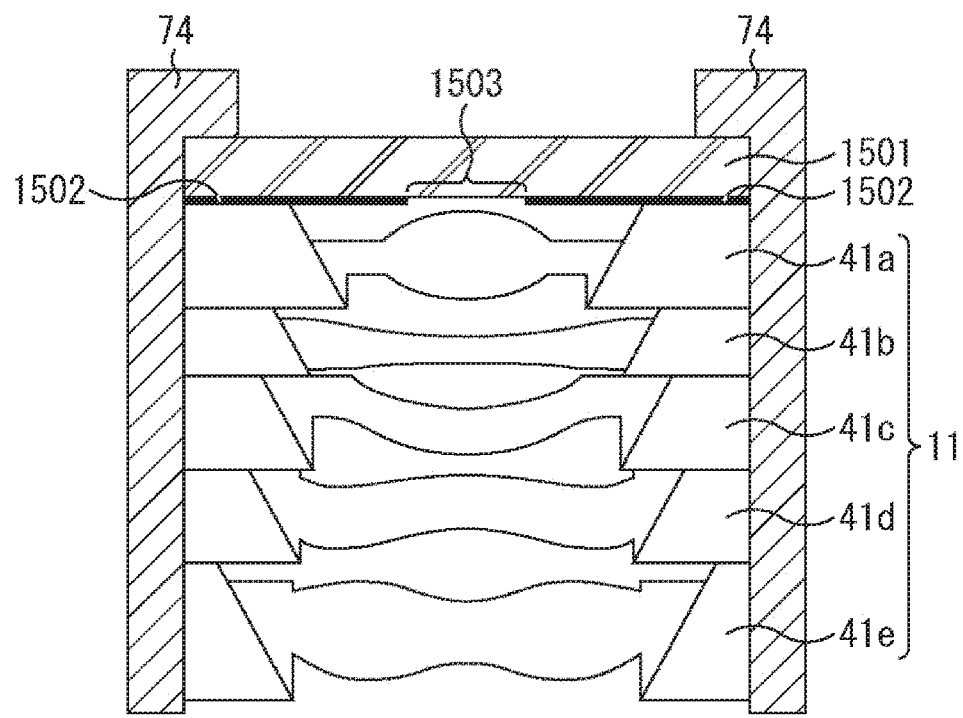
FIG. 55 is a view illustrating a first configuration example in which a diaphragm is added to a cover glass.

FIG. 55 is a view illustrating a first configuration in which a cover glass has an optical diaphragm function.

In the first configuration example in which a cover glass illustrated in FIG. 55 has an optical diaphragm function, a cover glass 1501 is further stacked on the upper portion of the stacked lens structure 11. Then, the lens barrel 74 is disposed outside the stacked lens structure 11 and the cover glass 1501.

A light-shielding film 1502 is formed on a surface of the cover glass 1501 on the side of the substrate with lens 41*a* (on a lower surface of the cover glass 1501 in FIG. 55). Here, a predetermined range from a lens center (optical center) of the substrates with lens 41*a* to 41*e* is an opening portion 1503 where no light-shielding film 1502 is formed, and the opening portion 1503 functions as an optical diaphragm. With the configuration, the diaphragm plate 51 configured in the camera module 1D in FIG. 13 or the like is omitted, for example.

Figure 56A:
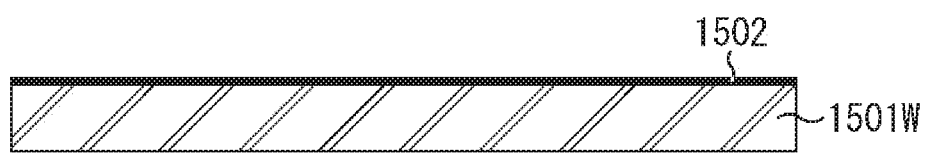
FIGS. 56A and 56B are views for describing a method of manufacturing the cover glass in FIG. 55.
Figure 56B:
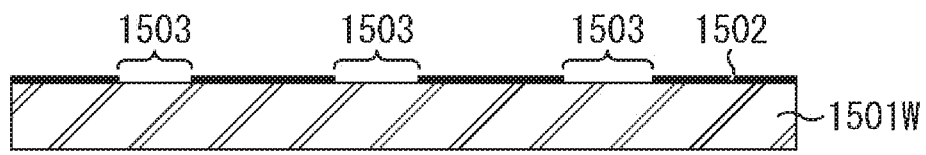

FIGS. 56A and 56B are views for describing a method of manufacturing the cover glass 1501 in which the light-shielding film 1502 is formed.

First, as illustrated in FIG. 56A, the light-shielding film 1502 is formed by spin-coating one entire surface of a cover glass (glass substrate) 1501W in the form of a wafer or a panel with a light-absorbing material, for example. As the light-absorbing material to be the light-shielding film 1502, for example, a resin having a light-absorbing property in which a carbon black pigment or a titanium black pigment is internally added is used.

Next, a predetermined region of the light-shielding film 1502 is removed by lithography or etching to form a plurality of opening portions 1503 at predetermined intervals, as illustrated in FIG. 56B. The arrangement of the opening portions 1503 corresponds one-to-one to the arrangement of the through holes 83 of the support substrate 81W in FIGS. 23A, 23B, 23C, 23D, 23E, 23F, and 23G. Note that, as another example of a method of forming the light-shielding film 1502 and the opening hole portion 1503, a method of jetting the light-absorbing material to be the light-shielding film 1502 to a region excluding the opening portion 1503 by inkjet.

After the cover glass 1501W in the substrate state manufactured as described above and the plurality of substrates with lens 41W in the substrate state are bonded, the cover glass 1501W and the substrates with lens 41W are separated into pieces by dicing or the like using a blade, a laser, or the like. Thereby, the stacked lens structure 11 in which the cover glass 1501 having the diaphragm function is stacked, illustrated in FIG. 55, is completed.

By forming the cover glass 1501 as one step of a semiconductor process, as described above, generation of dust defects, which is concerned in a case of forming the cover glass in another assembly step, can be suppressed.

According to the first configuration example illustrated in FIG. 55, since the optical diaphragm is formed by coating, the light-shielding film 1502 can be formed with a thin film thickness of about 1 µm, and deterioration of optical performance (light reduction in a peripheral portion) due to shielding of incident light because a diaphragm mechanism has a predetermined thickness can be suppressed.

Note that, in the above-described example, separation of the cover glass 1501W has been performed after being bonded with the plurality of substrates with lens 41W. However, separation may be performed before the bonding. In other words, the bonding between the cover glass 1501 provided with the light-shielding film 1502 and the five substrates with lens 41*a* to 41*e* may be performed at the wafer level or at the chip level.

The surface of the light-shielding film 1502 may be roughened. In this case, surface reflection of the surface of the cover glass 1501 on which the light-shielding film 1502 has been formed can be reduced and the surface area of the light-shielding film 1502 can be increased. Therefore, the bonding strength between the cover glass 1501 and the substrate with lens 41 can be improved.

As a method of roughening the surface of the light-shielding film 1502, for example, there are a method of processing a rough surface by etching or the like after applying the light-absorbing material to be the light-shielding film 1502, a method of applying the light-absorbing material after forming the cover glass 1501 before applying the light-absorbing material to be a rough surface, a method of causing unevenness in the surface after forming the film by the light-absorbing material that is aggregated, a method of causing unevenness in the surface after forming the film by the light-absorbing material containing solid content, or the like.

Furthermore, an antireflective film may be formed between the light-shielding film 1502 and the cover glass 1501.

Use of a diaphragm support substrate by the cover glass 1501 enables downsizing of the camera module 1.

Figure 57:
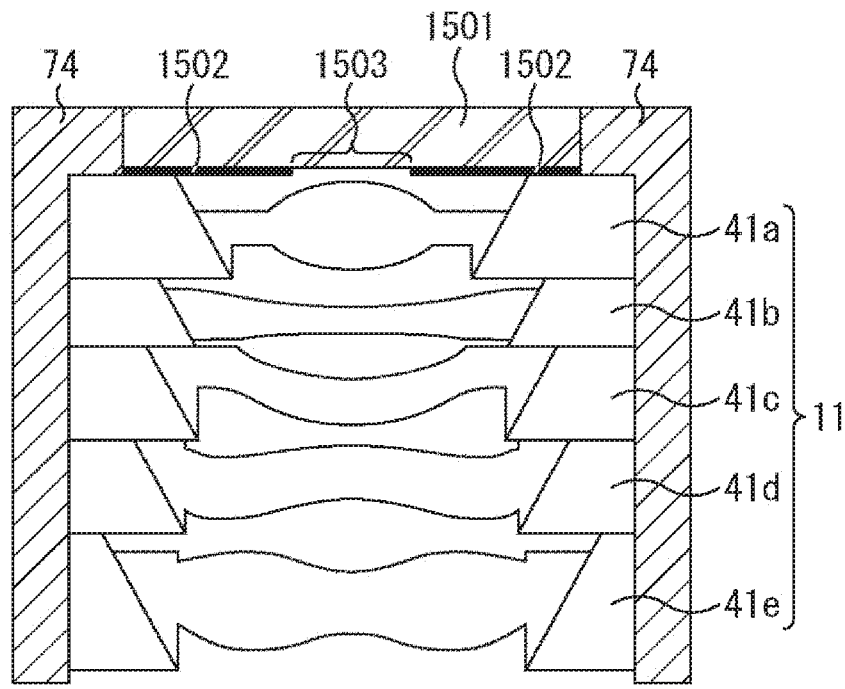
FIG. 57 is a view illustrating a second configuration example in which a diaphragm is added to a cover glass.

FIG. 57 is a view illustrating a second configuration in which a cover glass has an optical diaphragm function.

In the second configuration example in which the cover glass illustrated in FIG. 57 has the optical diaphragm function, the cover glass 1501 is disposed at a position of an opening portion of the lens barrel 74. Other configurations are the same as the first configuration example illustrated in FIG. 55.

Figure 58:
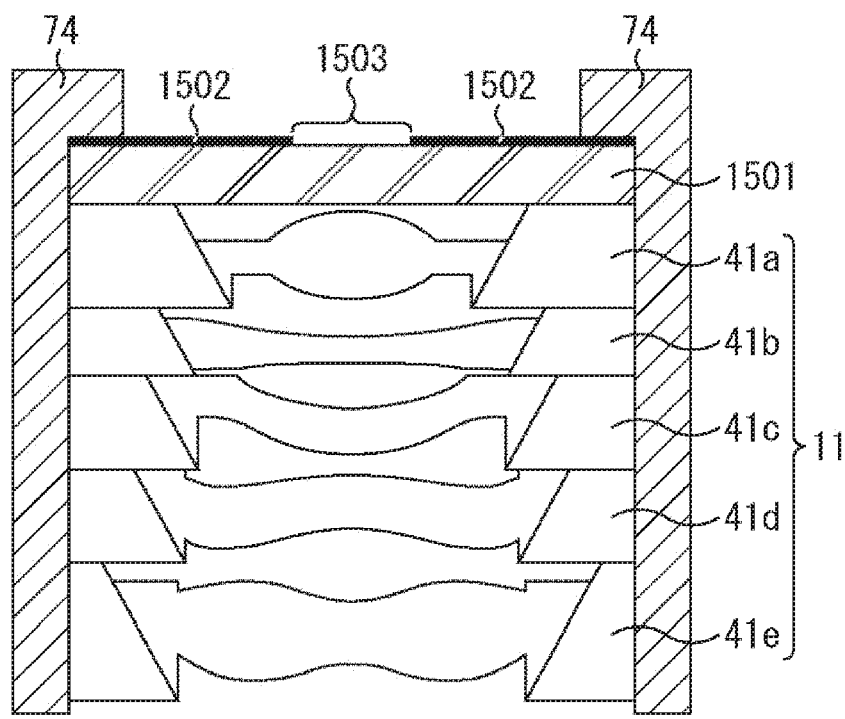
FIG. 58 is a view illustrating a third configuration example in which a diaphragm is added to a cover glass.

FIG. 58 is a view illustrating a third configuration in which a cover glass has an optical diaphragm function.

In the third configuration example in which the cover glass illustrated in FIG. 58 has the optical diaphragm function, the light-shielding film 1502 is formed on the upper surface of the cover glass 1501, in other words, on an opposite side of the substrate with lens 41a. Other configurations are the same as the first configuration example illustrated in FIG. 55.

Note that, in the configuration in which the cover glass 1501 is disposed on the opening portion of the lens barrel 74, illustrated in FIG. 57, the light-shielding film 1502 may be formed on the upper surface of the cover glass 1501.

16.2 Diaphragm Formation by Through Hole

Next, an example in which the opening itself of the through hole 83 of the substrate with lens 41 is used as a diaphragm mechanism, instead of the above-described diaphragm using the diaphragm plate 51 or the cover glass 1501 will be described.

Figure 59A:
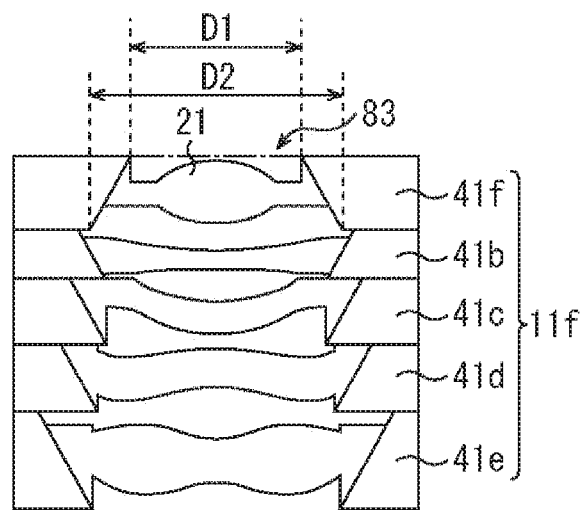
FIGS. 59A, 59B, and 59C are views illustrating a configuration example in which an opening itself of a through hole is used as a diaphragm mechanism.

FIG. 59A is a view illustrating a first configuration example in which the opening itself of the through hole 83 is used as a diaphragm mechanism.

Note that, in the description of FIGS. 59A, 59B, and 59C, only portions different from the stacked lens structure 11 illustrated in FIG. 58 will be described, and description of the same portions is appropriately omitted. Furthermore, in FIGS. 59A 59B, and 59C, to avoid complication of the drawing, only the reference numerals necessary for the description are illustrated.

A stacked lens structure 11f illustrated in FIG. 59A has a configuration in which the substrate with lens 41a closest to the light incident side and located at a most distant position from the light receiving element 12, of the five substrates with lens 41a to 41e constituting the stacked lens structure 11 illustrated in FIG. 58, is replaced with a substrate with lens 41f.

Figure 59B:
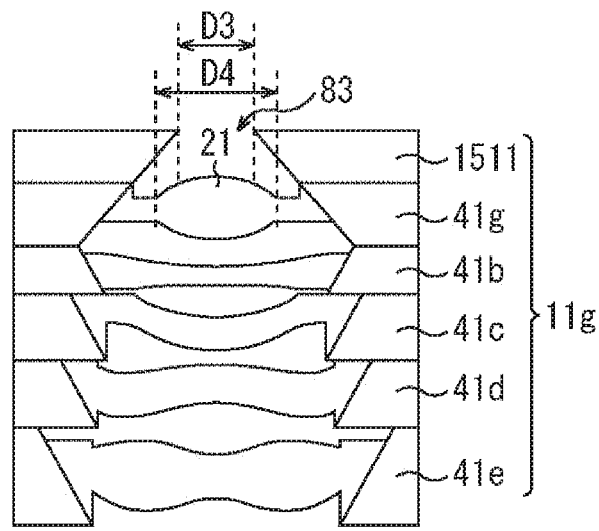
Figure 59C:
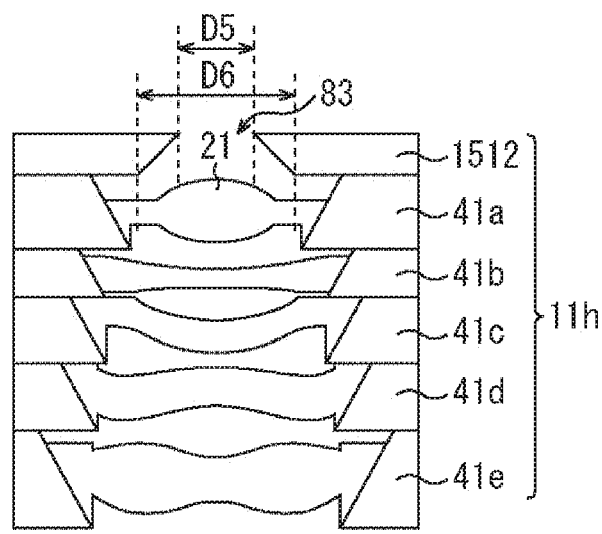

When comparing the substrate with lens 41f with the substrate with lens 41a in FIG. 58, the hole diameter in the upper surface is larger than the hole diameter in the lower surface in the substrate with lens 41a in FIG. 58, whereas a hole diameter D1 in the upper surface is smaller than a hole diameter D2 in the lower surface in the substrate with lens 41f in FIGS. 59A, 59B, and 59C. In other words, the cross-sectional shape of the through hole 83 of the substrate with lens 41f is a so-called open fan shape.

The height position of an outermost surface of the lens 21 formed in the through hole 83 of the substrate with lens 41f is lower than the position of an uppermost surface of the substrate with lens 41f illustrated by the dashed dotted line in FIG. 59A.

In the stacked lens structure 11f, the hole diameter on the light incident side of the through hole 83 of the uppermost substrate with lens 41f is the smallest in the plurality of substrates with lens 41. Therefore, a portion with the smallest hole diameter of the through hole 83 (a portion of the hole diameter D1) functions as the optical diaphragm that limits light beams of incident light.

FIG. 59B is a view illustrating a second configuration example in which the opening itself of the through hole 83 is used as a diaphragm mechanism.

A stacked lens structure 11g illustrated in FIG. 59B has a configuration in which the uppermost substrate with lens 41a, of the five substrates with lens 41a to 41e constituting the stacked lens structure 11 illustrated in FIG. 58, is replaced with a substrate with lens 41g. Then, a substrate 1511 is further stacked on the substrate with lens 41g.

The hole diameter of the through hole 83 of the substrate with lens 41g has an open fan shape smaller on the light incident side, similarly to the substrate with lens 41f illustrated in FIG. 59A. The substrate 1511 is a substrate having the through hole 83 but not holding the lens 21. The cross-sectional shapes of the through hole 83 of the substrate with lens 41g and the substrate 1511 are a so-called open fan shape.

By stacking the substrate 1511 on the substrate with lens 41g, a planar region where the incident light enters is further narrowed down than the substrate with lens 41f in FIG. 59A. A hole diameter D3 in an upper surface of the substrate 1511 is smaller than a diameter D4 in a curved surface portion (lens portion 91) of the lens 21. With the configuration, a portion with the smallest hole diameter (a portion of the hole diameter D3) of the through hole 83 of the substrate 1511 functions as the optical diaphragm that limits light beams of the incident light.

The position of the optical diaphragm can separate an exit pupil position and suppress shading when located as distant as possible from the uppermost lens 21 in the stacked lens structure 11g.

By further stacking the substrate 1511 on the five substrates with lens 41b to 41e, and 41g, as illustrated in FIG. 59B, the position of the optical diaphragm can be located at a significantly distant position in an opposite direction of the light incident direction from the lens 21 of the substrate with lens 41g, which will be the uppermost lens 21 in the stacked lens structure 11g, whereby shading can be suppressed.

FIG. 59C is a view illustrating a third configuration example in which the opening itself of the through hole 83 is used as a diaphragm mechanism.

A stacked lens structure 11h illustrated in FIG. 59C has a configuration in which a substrate 1512 is further stacked on the substrate with lens 41a, of the five substrates with lens 41a to 41f constituting the stacked lens structure 11 illustrated in FIG. 58.

The substrate 1512 is a substrate having the through hole 83 but not holding the lens 21. The through hole 83 of the substrate 1512 has a different hole diameter between an uppermost surface and a lowermost surface of the substrate 1512, and has a so-called open fan shape in which a hole diameter D5 in the upper surface is smaller than a hole diameter D5 in the lower surface. Furthermore, the hole diameter D5 in the uppermost surface of the substrate 1512 is smaller than the diameter of a curved surface portion (lens portion 91) of the lens 21. With the configuration, a portion with the smallest hole diameter (a portion of the hole diameter D5) of the through hole 83 functions as the optical diaphragm that limits light beams of the incident light. Note that, as another example of the shape of the substrate 1512, a so-called downward concave shape in which the hole diameter D5 in the upper surface is larger than the hole diameter D5 in the lower surface.

Note that any of the examples in FIGS. 59A, 59B, and 59C is an example in which the hole diameter of the through hole 83 of the substrate with lens 41f on the uppermost surface (at the most distant position from the light receiving element 12) is configured as the optical diaphragm, or the hole diameter of the through hole 83 of the substrate 1511 or 1512 disposed on the uppermost surface is configured as the optical diaphragm, among the plurality of substrates with lens 41 constituting the stacked lens structure 11.

However, the hole diameter of the through hole 83 of any of the substrates with lens 41b to 41e other than on the uppermost surface, among the plurality of substrates with lens 41 constituting the stacked lens structure 11, may be configured like the above-described substrate with lens 41f or the substrate 1511 or 1512 to function as the optical diaphragm.

Note that, from the viewpoint of suppressing shading, the substrate with lens 41 having the optical diaphragm function is favorably disposed on the uppermost layer or as high as possible (at the most distant position from the light receiving element 12), as illustrated in FIGS. 59A, 59B, and 59C.

As described above, a predetermined substrate with lens 41 among the plurality of substrates with lens 41 constituting the stacked lens structure 11 or the substrate 1511 or 1512 not holding the lens 21 has the optical diaphragm function, whereby the size as the stacked lens structure 11 and the camera module 1 can be downsized.

By integrating the optical diaphragm with the substrate with lens 41 holding the lens 21, the positional accuracy of the lens curved surface closest to the diaphragm that affects the imaging performance and the optical diaphragm is improved, and the imaging performance can be improved.

16.3 Wafer Level Bonding by Metal Bonding

In the above-described embodiment, the substrates with lens 41W in which the lenses 21 are formed in the through holes 83 are bonded by plasma bonding. However, the substrates with lens 41W can be bonded using metal bonding.

FIGS. 60A, 60B, 60C, 60D, and 60E is a view for describing bonding at wafer level using metal bonding.

First, as illustrated in FIG. 60A, a substrate with lens 1531W-a in the substrate state in which lenses 1533 are respectively formed in a plurality of through holes 1532 is prepared, and an antireflective film 1535 is formed on an upper surface and a lower surface of the substrate with lens 1531W-a.

The substrate with lens 1531W corresponds to the above-described substrate with lens 41W in the substrate state. Furthermore, the antireflective film 1535 corresponds to the above-described upper surface layer 122 and lower surface layer 123.

Here, it is assumed that a foreign matter 1536 is mixed in part of the antireflective film 1535 formed on the upper surface of the substrate with lens 1531W-a. The upper surface of the substrate with lens 1531W-a is a surface to be bonded to a substrate with lens 1531W-b in the process in FIG. 60D described below.

Next, as illustrated in FIG. 60B, a metal film 1542 is formed on the upper surface of the substrate with lens 1531W-a, the upper surface being to be a bonding surface with the substrate with lens 1531W-b. At this time, the portion of the through hole 1532 in which the lens 1533 is formed is masked using a metal mask 1541 so that the metal film 1542 is not formed.

As the material of the metal film 1542, for example, Cu, which is often used for metal bonding, can be used. As a method of forming the metal film 1542, a PVD method such as an evaporation method or a sputtering method, which can form a film at a low temperature, or an ion plating method can be used.

Note that, as the material of the metal film 1542, Ni, Co, Mn, Al, Sn, In, Ag, Zn, or the like, or an alloy material of two or more of the aforementioned elements may be used, besides Cu. Furthermore, any material other than the illustrated examples may be used as long as the material is an easily plastically deformable metal material.

As the method of forming the metal film 1542, an inkjet method using metal nanoparticles such as silver particles may be used, besides the PVD method and the formation with the metal mask.

Next, as illustrated in FIG. 60C, as preprocessing before bonding, an oxide film formed on the surface of the metal film 1542 when opened to the atmosphere is removed using a reducing gas such as formic acid, hydrogen gas, or hydrogen radicals, so that the surface of the metal film 1542 is cleaned.

As the method of cleaning the surface of the metal film 1542, Ar ions in plasma may be made to enter the metal surface to physically remove the oxide film by sputtering, besides the reducing gas.

By a similar process to the above-described process in FIGS. 60A, 60B, and 60C, the substrate with lens 1531W-b that is the other substrate with lens 1531W in the substrate state to be joined is prepared.

Then, as illustrated in FIG. 60D, when the bonding surface of the substrate with lens 1531W-b and the bonding surface of the substrate with lens 1531W-a are disposed to face each other and positioning is performed, and then appropriate pressure is applied, the metal film 1542 of the substrate with lens 1531W-a and the metal film 1542 of the substrate with lens 1531W-b are bonded by metal bonding.

Here, it is assumed that, for example, a foreign matter 1543 is mixed in the lower surface of the substrate with lens 1531W-b, the lower surface being to be the bonding surface of the substrate with lens 1531W-b. However, even if there are the foreign matter 1536 and foreign matter 1543, the metal film 1542 is deformed because of using the easily plastically deformable metal material, as the metal film 1542, and the substrate with lens 1531W-a and the substrate with lens 1531W-b are bonded.

Finally, as illustrated in FIG. 60E, addition of heat processing promotes interatomic bonding and crystallization of metals and enhances the bonding strength. Note that this heat processing process can be omitted.

As described above, the substrates with lens 1531W in which the lenses 1533 are respectively formed in the plurality of through holes 1532 can be bonded using metal bonding.

Note that, to obtain a bond between the substrate with lens 1531W-a and the metal film 1542, a film to be an adhesion layer can be formed between the substrate with lens 1531W-a and the metal film 1542. In this case, the adhesion layer is formed on the upper side (outside) of the antireflective film 1535, in other words, between the antireflective film 1535 and the metal film 1542. For example, Ti, Ta, W, or the like can be used as the adhesion layer. Alternatively, a nitride or an oxide of Ti, Ta, W, or the like, or a stacked structure of a nitride and an oxide may be used. Bonding between the substrate with lens 1531W-b and the metal film 1542 is similarly performed.

Furthermore, the material of the metal film 1542 formed on the substrate with lens 1531W-a and the material of the metal film 1542 formed on the substrate with lens 1531W-b may be different metal materials.

By bonding the substrates with lens 1531W in the substrate state using an easily plastically deformable metal bond with a low Young's modulus, the contact area can be obtained by being deformed by the pressing pressure even in a case where a foreign matter exists on the bonding surface.

In a case where a plurality of substrates with lens 1531W bonded using metal bonding is separated into pieces to be the stacked lens structure 11, and the stacked lens structure 11 is incorporated into the above-described camera module 1, the metal film 1542 is excellent in sealability and can prevent inflow of light and moisture from a side surface. Therefore, the stacked lens structure 11 and the camera module 1 with high reliability can be manufactured.

16.4 Substrate with Lens Using Highly Doped Substrate

Figure 61A:
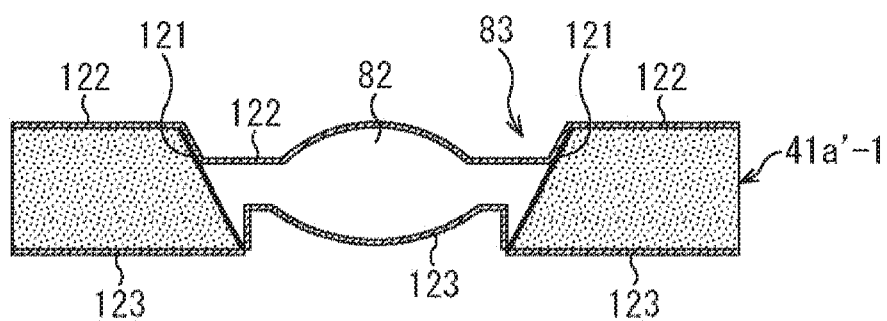
FIGS. 61A and 61B are views illustrating an example of a substrate with lens using a highly doped substrate.
Figure 61B:
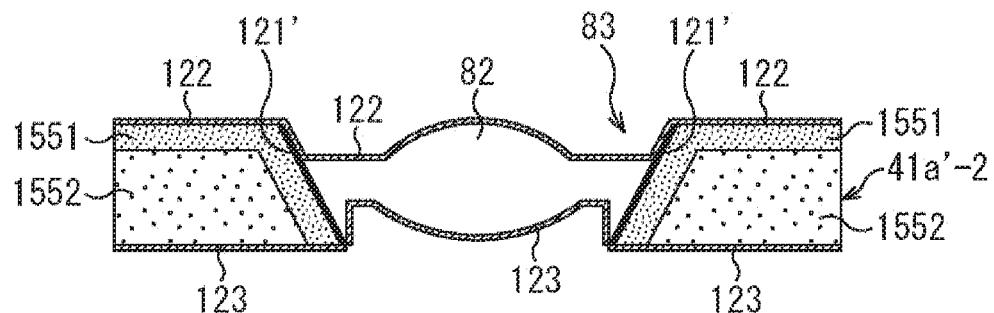

FIGS. 61A and 61B are cross-sectional views of substrates with lens 41a'-1 and 41a'-2 that are modifications of the above-described substrate with lens 41a.

In the description of the substrates with lens 41a'-1 and 41a'-2 in FIGS. 61A and 61B, description of the same parts as the parts of the substrate with lens 41a is omitted, and only different parts will be described.

The substrate with lens 41a'-1 illustrated in FIG. 61A is a highly doped substrate in which boron (B) is diffused (ion-implanted) at a high concentration in a silicon substrate. The impurity concentration of the substrate with lens 41a'-1 is, for example, about 1×1019 cm-3, and the substrate with lens 41a'-1 can efficiently absorb light in a wide range of wavelengths.

The other configurations of the substrate with lens 41a'-1 are similar to the configurations of the above-described substrate with lens 41a.

Meanwhile, in the substrate with lens 41a'-2 illustrated in FIG. 61B, a region of a silicon substrate is divided into two regions having different impurity concentrations, in other words, a first region 1551 and a second region 1552.

The first region 1551 is formed at a predetermined depth (for example, about 3 μm) from a substrate surface on a light incident side. The impurity concentration of the first region 1551 is, for example, as high as about $1 \times 10^{16}$ cm$^{-3}$. The impurity concentration of the second region 1552 is, for example, about $1 \times 10^{10}$ cm$^{-3}$, which is lower than a first concentration. The ions diffused (ion-implanted) into the first region 1551 and the second region 1552 are, for example, B (boron) similarly to the substrate with lens 41a'-1.

The impurity concentration of the first region 1551, which is the light incident side of the substrate with lens 41a'-2, is about 1×1016 cm-3, and is lower than the impurity concentration (for example, 1×1019 cm-3) of the substrate with lens 41a'-1. Therefore, in the substrate with lens 41a'-2, the film thickness of a light-shielding film 121' formed on a side wall of the through hole 83 is formed thicker than the light-shielding film 121 of the substrate with lens 41a'-1 illustrated in FIG. 61A. For example, in a case where the film thickness of the light-shielding film 121 of the substrate with lens 41a'-1 is 2 μm, the film thickness of the light-shielding film 121' of the substrate with lens 41a'-2 is 5 μm.

The other configurations of the substrate with lens 41a'-2 are similar to the configurations of the above-described substrate with lens 41a.

As described above, by adopting highly doped substrates as the substrates with lens 41a'-1 and 41a'-2, the light transmitted through the light-shielding film 121 and the upper surface layer 122 and has reached the substrate can be absorbed by a base material itself. Therefore, reflected light can be suppressed. The doping amount can be appropriately set according to the light amount reaching the substrate and the film thicknesses of the light-shielding film 121 and the upper surface layer 122 because it is sufficient that the light reaching the substrate can be absorbed.

Furthermore, since easy-to-handle silicon substrates are used as the substrates with lens 41a'-1 and 41a'-2, handling is easy. Since the light transmitted through the light-shielding film 121 and the upper surface layer 122 and reaching the substrate can be absorbed by the base material itself, the thickness and the like of the light-shielding film 121, the upper surface layer 122, and the substrate itself to be stacked can be reduced, and thinning of films and simplification of the structure are possible.

Note that, in the substrates with lens 41a'-1 and 41a'-2, the ions with which the silicon substrate is doped are not limited to B (boron), and other ions, for example, phosphorus (P), arsenic (As), or antimony (Sb) may be adopted, and further, any elements may be adopted as long as a band structure in which the light absorption amount increases can be taken.

Furthermore, the other substrates with lens 41b to 41e constituting the stacked lens structure 11 can also have similar configurations to the configurations of the substrates with lens 41a'-1 and 41a'-2.

<Manufacturing Method>

A method of manufacturing the substrate with lens 41a'-1 illustrated in FIG. 61A will be described with reference to FIGS. 62A, 62B, 62C, and 62D.

Figure 62A:
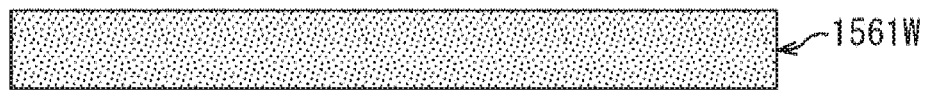
FIGS. 62A, 62B, 62C, and 62D are views for describing a method for manufacturing the substrate with lens in FIG. 61A.

First, as illustrated in FIG. 62A, a highly doped substrate 1561W in the substrate state in which B (boron) is diffused (ion-implanted) at a high concentration is prepared. The impurity concentration of the highly doped substrate 1561W is, for example, about 1×1019 cm-3.

Figure 62B:
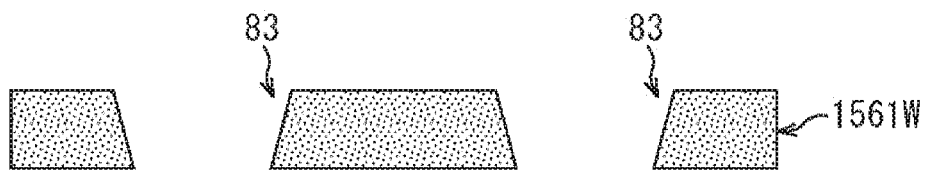

Next, as illustrated in FIG. 62B, the through holes 83 are formed by etching at predetermined positions of the highly doped substrate 1561W. Although only two through holes 83 are illustrated in FIGS. 62A, 62B, 62C, and 62D due to the restriction of the paper surface, in practice, a large number of through holes 83 are formed in the planar direction of the highly doped substrate 1561W.

Figure 62C:
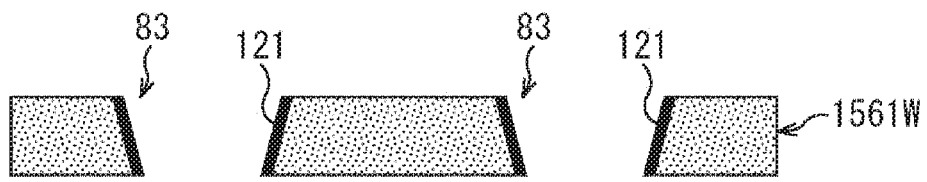

Next, as illustrated in FIG. 62C, the light-shielding film 121 is formed by coating the side wall of the through hole 83 with a black resist material by spray coating.

Figure 62D:
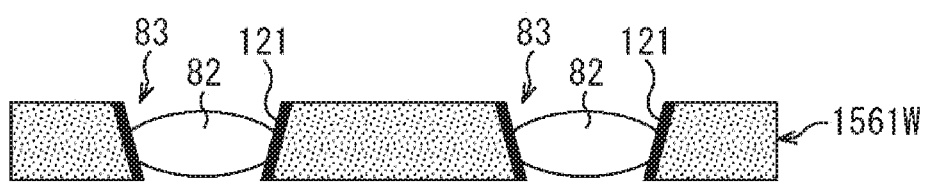

Then, as illustrated in FIG. 62D, the lens resin portion 82 including the lens 21 is formed inside the through hole 83 by pressure molding using the upper mold 201 and the lower mold 181 described with reference to FIGS. 23A, 23B, 23C, 23D, 23E, 23F, and 23G.

Thereafter, although illustration is omitted, the upper surface layer 122 is formed on the upper surfaces of the highly doped substrate 1561W and the lens resin portion 82, and the lower surface layer 123 is formed on the lower surfaces of the highly doped substrate 1561W and the lens resin portion 82, and are separated into pieces. Thus, the substrate with lens 41a'-1 illustrated in FIG. 61A is completed.

Next, a method of manufacturing the substrate with lens 41a'-2 illustrated in FIG. 61B will be described with reference to FIGS. 63A, 63B, 63C, 63D, 63E, and 63F.

Figure 63A:
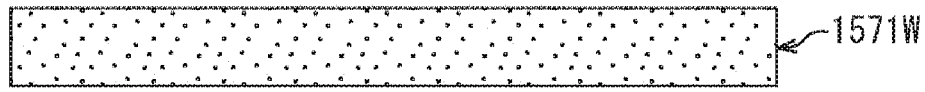
FIGS. 63A, 63B, 63C, 63D, 63E, and 63F are views for describing a method for manufacturing the substrate with lens in FIG. 61B.

First, as illustrated in FIG. 63A, a doped substrate 1571W in the substrate state in which B (boron) is diffused (ion-implanted) at a predetermined concentration is prepared. The impurity concentration of the doped substrate 1571W is, for example, about 1×1010 cm-3.

Figure 63B:
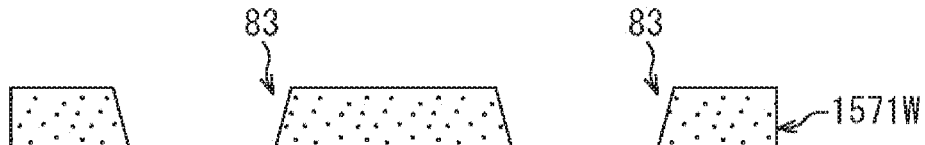

Next, as illustrated in FIG. 63B, the through holes 83 are formed by etching at predetermined positions of the doped substrate 1571W. Although only two through holes 83 are illustrated in FIGS. 63A, 63B, 63C, 63D, 63E, and 63F due to the restriction of the paper surface, in practice, a large number of through holes 83 are formed in the planar direction of the doped substrate 1571W.

Figure 63C:
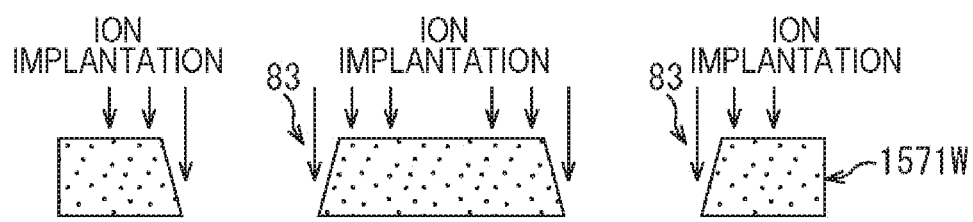
Figure 63D:
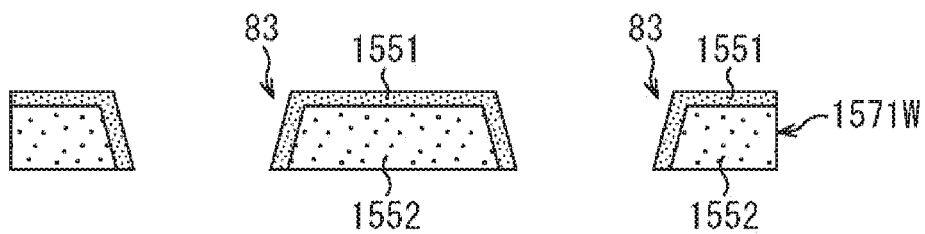

Next, as illustrated in FIG. 63C, B (boron) is ion-implanted to a predetermined depth (for example, about 3 μm) from the substrate surface on the light incident surface side of the doped substrate 1571W, and heat processing is applied at 900° C. As a result, as illustrated in FIG. 63D, the first region 1551 having a high impurity concentration and the second region 1552 having a lower concentration are formed.

Figure 63E:
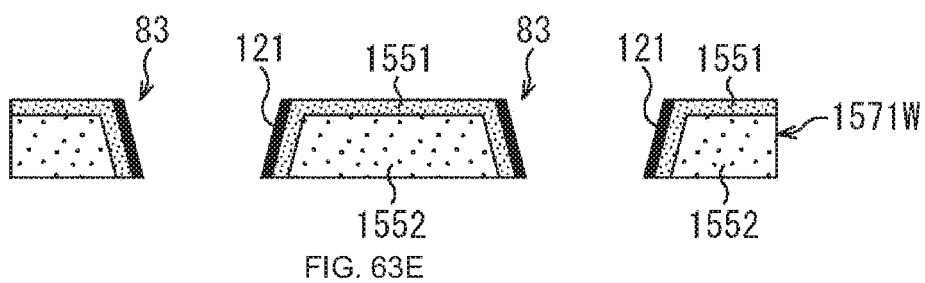

Then, as illustrated in FIG. 63E, the light-shielding film 121 is formed by coating the side wall of the through hole 83 with a black resist material by spray coating.

Figure 63F:
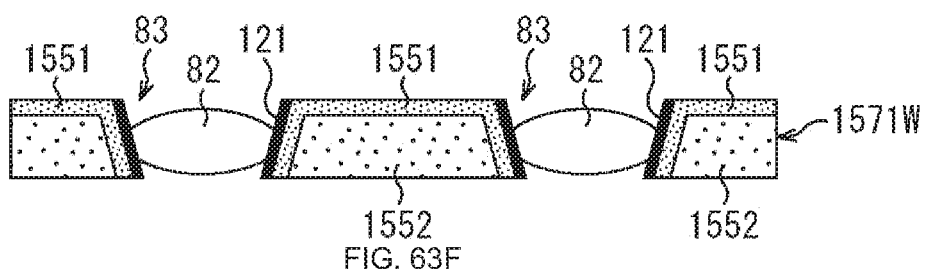

Furthermore, as illustrated in FIG. 63F, the lens resin portion 82 including the lens 21 is formed inside the through hole 83 by pressure molding using the upper mold 201 and the lower mold 181 described with reference to FIGS. 23A, 23B, 23C, 23D, 23E, 23F, and 23G.

Thereafter, although illustration is omitted, the upper surface layer 122 is formed on the upper surface of the doped substrate 1571W and the lens resin portion 82, and the lower surface layer 123 is formed on the lower surfaces of the doped substrate 1571W and the lens resin portion 82, and are separated into pieces. Thus, the substrate with lens 41a'-2 illustrated in FIG. 61B is completed.

Each of the substrates with lens 41a to 41e constituting the stacked lens structure 11 illustrated in FIGS. 1A and 1B can be the highly doped substrate as illustrated in FIGS. 61A and 61B. Thereby, the light absorption amount of the substrate itself can be increased.

17. Pixel Array of Light Receiving Element, Structure of Diaphragm Plate, and Application Next, the pixel array of the light receiving element 12 included in the camera module 1 illustrated in FIGS. 10A, 10B, 10C, 10D, 10F, 11A, 11B, 11C, and 11D and the configuration of the diaphragm plate 51 will be further described.

FIGS. 64A, 64B, 64C, and 64D are views illustrating examples of planar shapes of the diaphragm plate 51 provided in the camera module 1 illustrated in FIGS. 10A, 10B, 10C, 10D, 10F, 11A, 11B, 11C, and 11D.

The diaphragm plate 51 includes a shielding region 51a that prevents incident light by absorbing or reflecting light, and an aperture region 51b that transmits light.

The four optical units 13 provided in the camera module 1 illustrated in FIGS. 10A, 10B, 10C, 10D, 10F, 11A, 11B, 11C, and 11D have the same aperture diameter or different aperture diameters of the aperture region 51b of the diaphragm plate 51, as illustrated in FIGS. 64A, 64B, 64C, and 64D. "L", "M", and "S" in FIGS. 64A, 64B, 64C, and 64D represents that the aperture diameter of the aperture region 51b is "large", "medium", and "small".

Figure 64A:
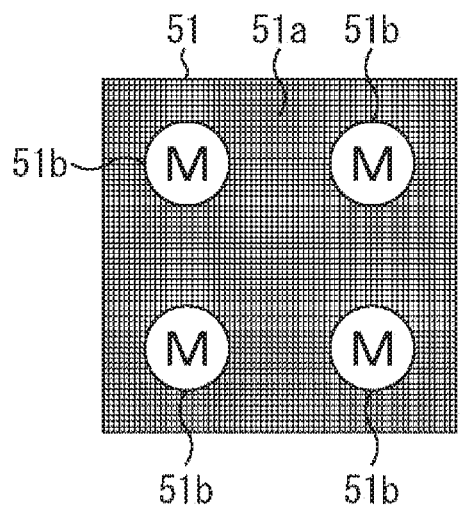
FIGS. 64A, 64B, 64C, and 64D are views illustrating examples of planar shapes of a diaphragm plate provided in the camera module.

The diaphragm plate 51 illustrated in FIG. 64A has the same aperture diameter of the four aperture regions 51b.

Figure 64B:
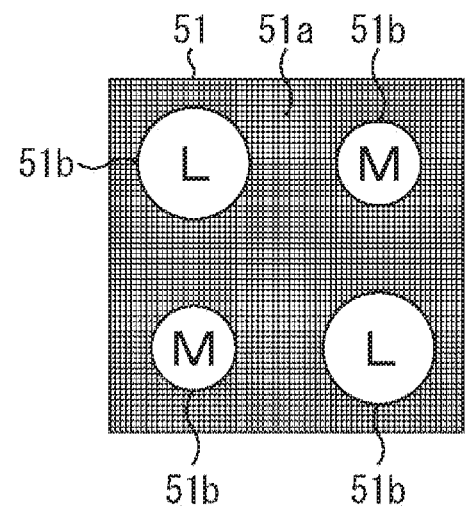

In the diaphragm plate 51 illustrated in FIG. 64B, the aperture diameter of the two aperture regions 51b is "medium", that is, a standard diaphragm aperture. For example, as described in FIG. 13, the diaphragm plate 51 may slightly overlap the lens 21 of the substrate with lens 41, in other words, the aperture region 51b of the diaphragm plate 51 may be slightly smaller than the diameter of the lens 21. Then, the remaining two aperture regions 51b of the diaphragm plate 51 illustrated in FIG. 64B have a "large" aperture diameter, that is, the aperture diameter is larger than the above-described aperture diameter "medium". The large aperture region 51b brings about a function of causing a larger amount of light to enter the light receiving element 12 provided in the camera module 1 in a case where illuminance of an object is low, for example.

Figure 64C:
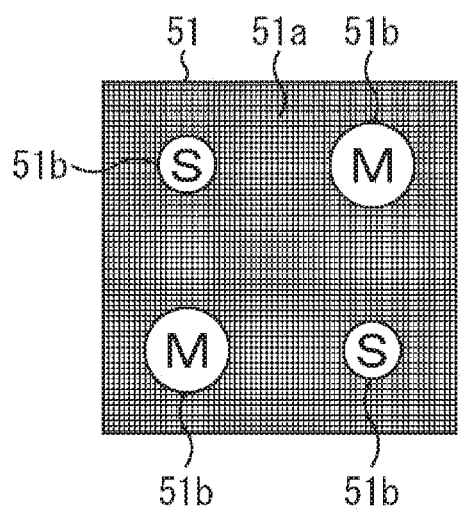

In the diaphragm plate 51 illustrated in FIG. 64C, the aperture diameter of the two aperture regions 51b is "medium", that is, a standard diaphragm aperture. Then, the remaining two aperture regions 51b of the diaphragm plate 51 illustrated in FIG. 64C have a "small" aperture diameter, that is, the aperture diameter is smaller than the above-described aperture diameter "medium". The small aperture region 51b brings about a function of decreasing the light amount entering the light receiving element 12 in a case, for example, where the illuminance of an object is high, and if the light from the object is caused to enter the light receiving element 12 provided in the camera module 1 through the aperture region 51b with the aperture diameter of "medium", charge generated in a photoelectric conversion unit provided in the light receiving element 12 exceeds a saturation charge amount of the photoelectric conversion unit.

Figure 64D:
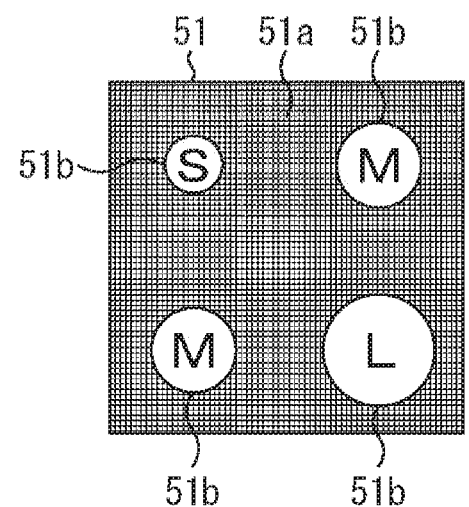

In the diaphragm plate 51 illustrated in FIG. 64D, the aperture diameter of the two aperture regions 51b is "medium", that is, a standard diaphragm aperture. Then, the remaining two aperture regions 51b of the diaphragm plate 51 illustrated in FIG. 64D has one aperture diameter of "large" and one aperture diameter of "small". The aperture region 51b brings about a similar function to the aperture regions 51b with the aperture diameter of "large" and the aperture diameter of "small", as described in FIGS. 64B and 64C.

Figure 65:
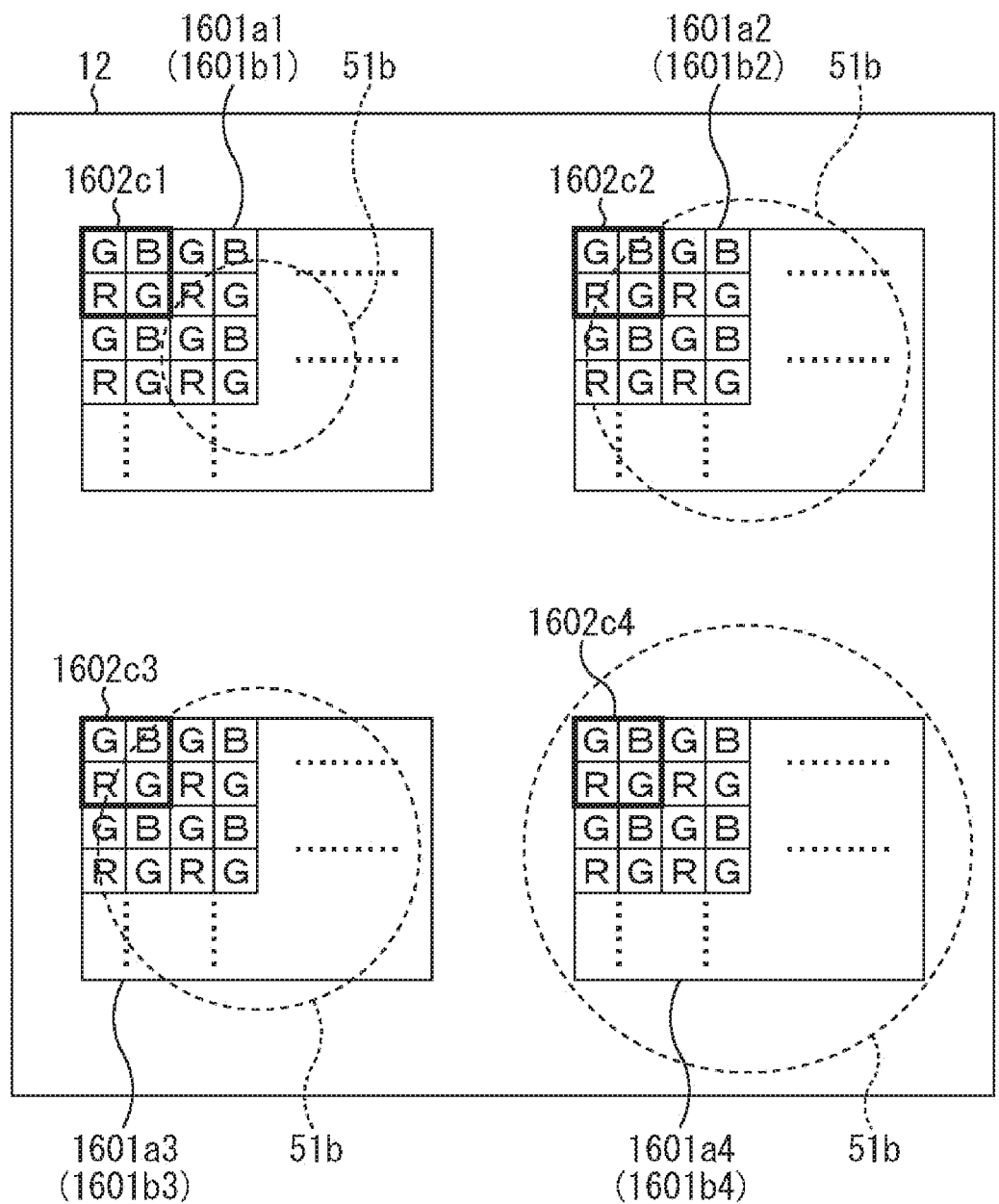
FIG. 65 is a view for describing a configuration of a light receiving region of the camera module.

FIG. 65 illustrates a configuration of a light receiving region of the camera module 1 illustrated in FIGS. 10A, 10B, 10C, 10D, 10F, 11A, 11B, 11C, and 11D.

The camera module 1 includes four optical units 13 (not illustrated), as illustrated in FIG. 65. Then, the light having entered the four optical units 13 is received by light receiving means corresponding to the respective optical units 13. For this purpose, in the camera module 1 illustrated in FIGS. 10A, 10B, 10C, 10D, 10F, 11A, 11B, 11C, and 11D, the light receiving element 12 includes four light receiving regions 1601a1 to 1601a4.

Note that, as another embodiment regarding the light receiving means, the light receiving element 12 includes one light receiving region 1601a for receiving light having entered one optical unit 13 provided in the camera module 1, and the camera module 1 may include such light receiving element 12 by the number of the optical units 13 provided in the camera module 1, for example, four light receiving elements 12 in the case of the camera module 1 illustrated in FIGS. 10A, 10B, 10C, 10D, 10F, 11A, 11B, 11C, and 11D.

The light receiving regions 1601a1 to 1601a4 respectively include pixel arrays 1601b1 to 1601b4 in which pixels for receive light are arranged in an array manner.

Note that, in FIG. 65, circuits for driving the pixels provided in the pixel array and circuits for reading the pixels are omitted for the sake of simplicity, and the light receiving regions 1601a1 to 1601a4 and the pixel arrays 1601b1 to 1601b4 are illustrated in the same size.

The pixel arrays 1601b1 to 1601b4 provided in the light receiving regions 1601a1 to 1601a4 include repeating units 1602c1 to 1602c4 of pixels, each repeating unit including a plurality of pixels. The pixel arrays 1601b1 to 1601b4 are configured by arraying a plurality of the repeating units 1602c1 to 1602c4 both in a vertical direction and a cross direction in an array manner.

The optical units 13 are respectively disposed on the four light receiving regions 1601a1 to 1601a4 provided in the light receiving element 12. The four optical units 13 include the diaphragm plates 51 as part of the units FIG. 65 illustrates the aperture regions 51b of the diaphragm plates 51 illustrated in FIG. 64D by broken lines as an example of aperture diameters of the four aperture regions 51b of the diaphragm plates 51.

In the field of image signal processing, super resolution technology is known as a technology for obtaining an image with higher resolution by being applied to an original image. An example is disclosed in, for example, Japanese Patent Application Laid-Open No. 2015-102794.

The camera module 1 illustrated in FIGS. 10A, 10B, 10C, 10D, 10F, 11A, 11B, 11C, and 11D can have the structures illustrated in FIGS. 13, 16, 17, 34, 35, 37, and 55 as cross-sectional structures.

In these camera modules 1, the optical axes provided in the optical units 13 disposed two each in the vertical direction and the cross direction of the surface of the module 1, the surface serving as the light incident surface, extend in the same direction. As a result, a plurality of not necessarily the same images can be obtained using the different light receiving regions while the optical axes are directed in the same direction.

The camera module 1 having such a structure is suitable for obtaining an image with higher resolution than an image obtained from one optical unit 13, applying the super resolution technology to a plurality of obtained original images.

FIGS. 66 to 69 illustrate configuration examples of the pixels in the light receiving regions of the camera module 1 illustrated in FIGS. 10A, 10B, 10C, 10D, 10F, 11A 11B, 11C, and 11D.

Note that, in FIGS. 66 to 69, a G pixel represents a pixel that receives light of a green wavelength, an R pixel represents a pixel that receives light of a red wavelength, and a B pixel represents a pixel that receives light of a blue wavelength. A C pixel represents a pixel that receives light in the entire wavelength region of visible light.

Figure 66:
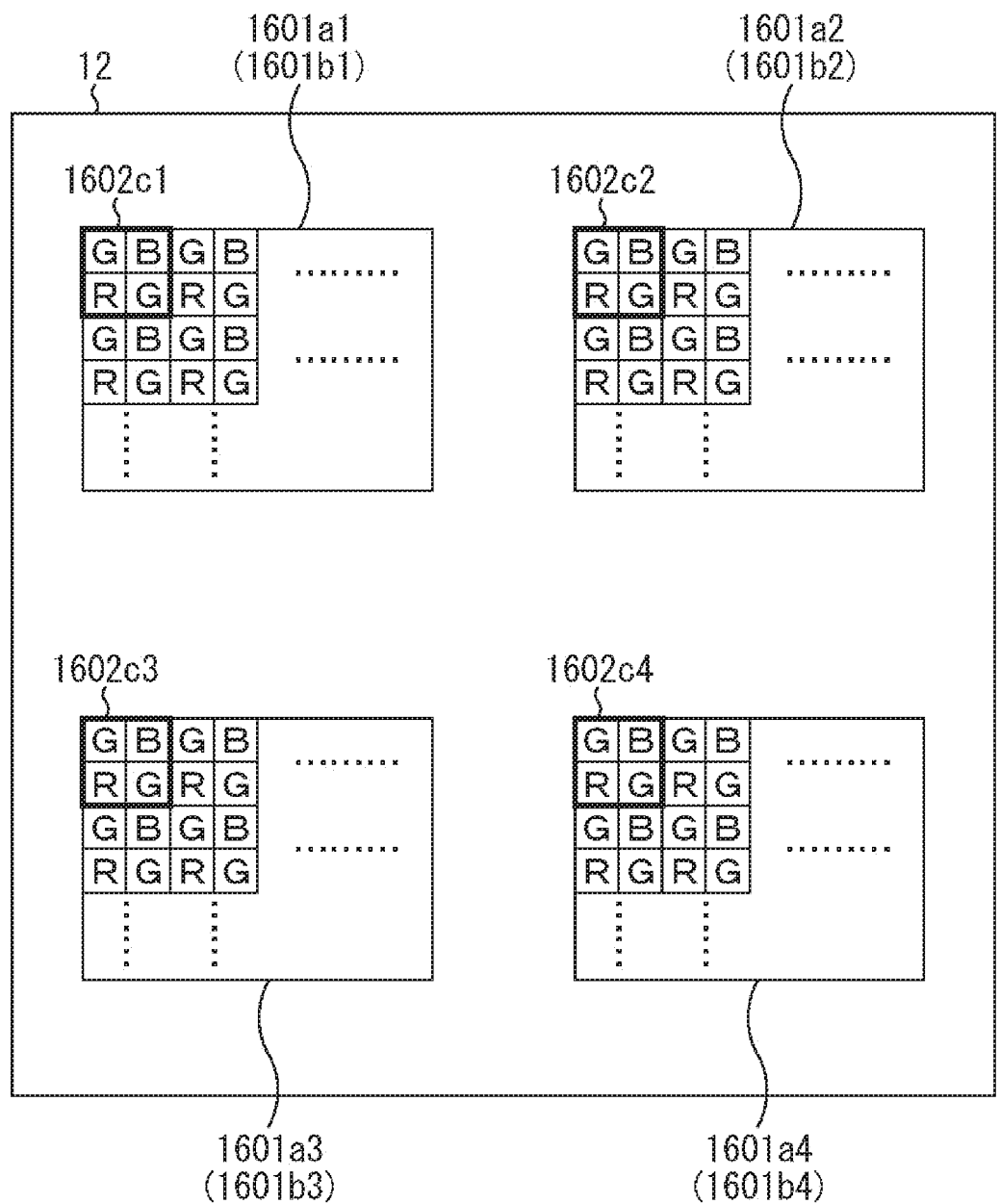
FIG. 66 is a view illustrating a first example of a pixel array in the light receiving region of the camera module.

FIG. 66 illustrates a first example of pixel arrays of the four pixel arrays 1601b1 to 1601b4 provided in the light receiving element 12 of the camera module 1.

In the four pixel arrays 1601b1 to 1601b4, the repeating units 1602c1 to 1602c4 are respectively repeatedly arrayed in a row direction and a column direction. Each of the repeating units 1602c1 to 1602c4 in FIG. 66 is configured by R, G, B, and G pixels.

The pixel arrays in FIG. 66 bring about a function of dispersing incident light from an object irradiated with visible light into red (R), green (G), and blue (B) to obtain an image including RGB three colors.

Figure 67:
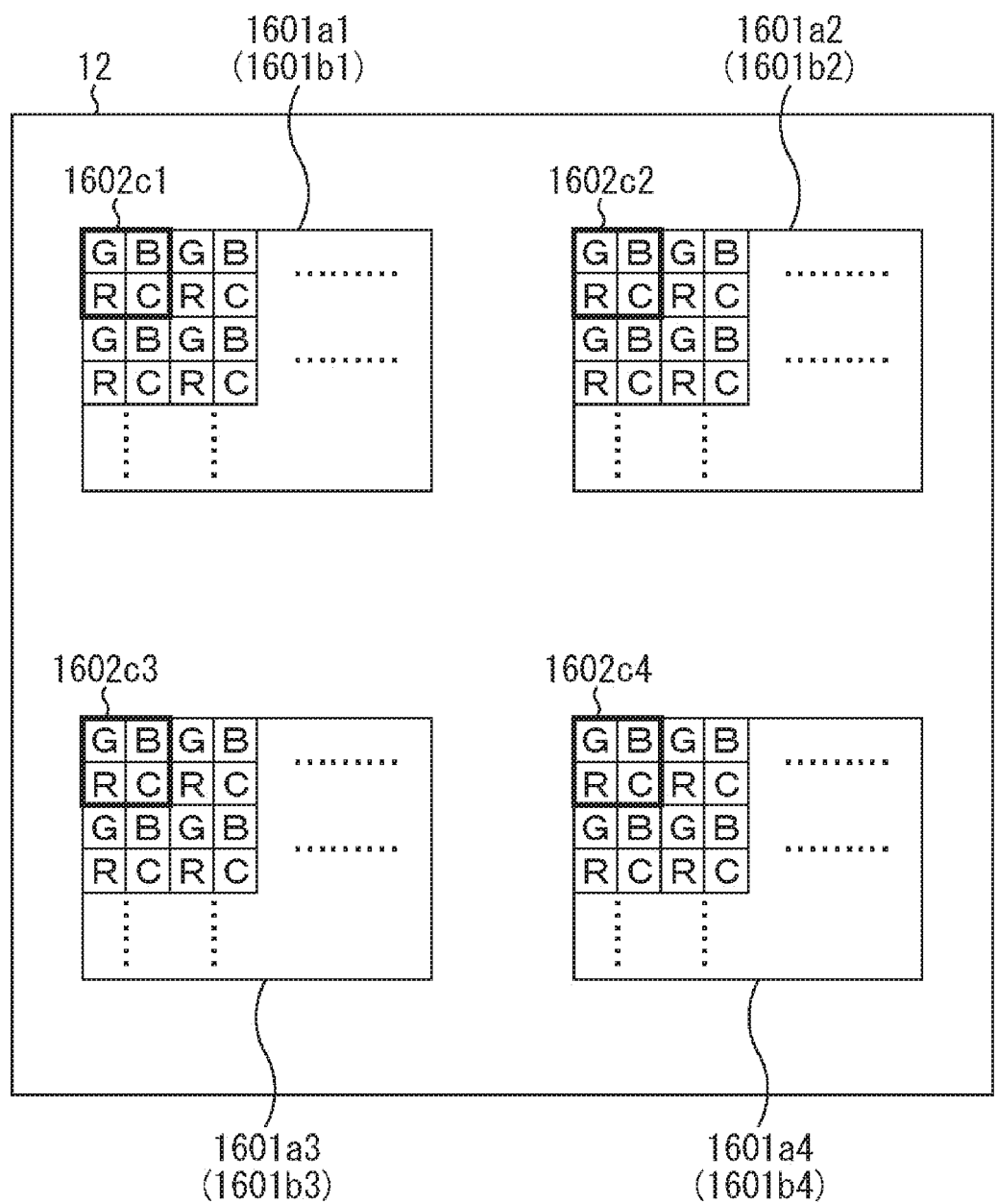
FIG. 67 is a view illustrating a second example of the pixel array in the light receiving region of the camera module.

FIG. 67 illustrates a second example of pixel arrays of the four pixel arrays 1601b1 to 1601b4 provided in the light receiving element 12 of the camera module 1.

The pixel arrays in FIG. 67 is different from the pixel arrays in FIG. 66 in the combination of wavelengths (colors) of light received by the pixels constituting the repeating units 1602c1 to 1602c4. Each of the repeating units 1602c1 to 1602c4 in FIG. 67 is configured by R, G, B, and C pixels.

The pixel arrays in FIG. 67 include the C pixels that receive light in the entire wavelength region of the visible light without dispersing the light into R, G, and B as described above. The C pixel has a larger amount of received light than the R, G, and B pixels that receive part of the dispersed light. Therefore, this configuration brings about a function of obtaining an image with higher brightness or an image with larger tones about luminance, using information obtained in the C pixels having the larger amount of received light, for example, luminance information of the object, even in a case where the illuminance of the object is low, for example.

Figure 68:
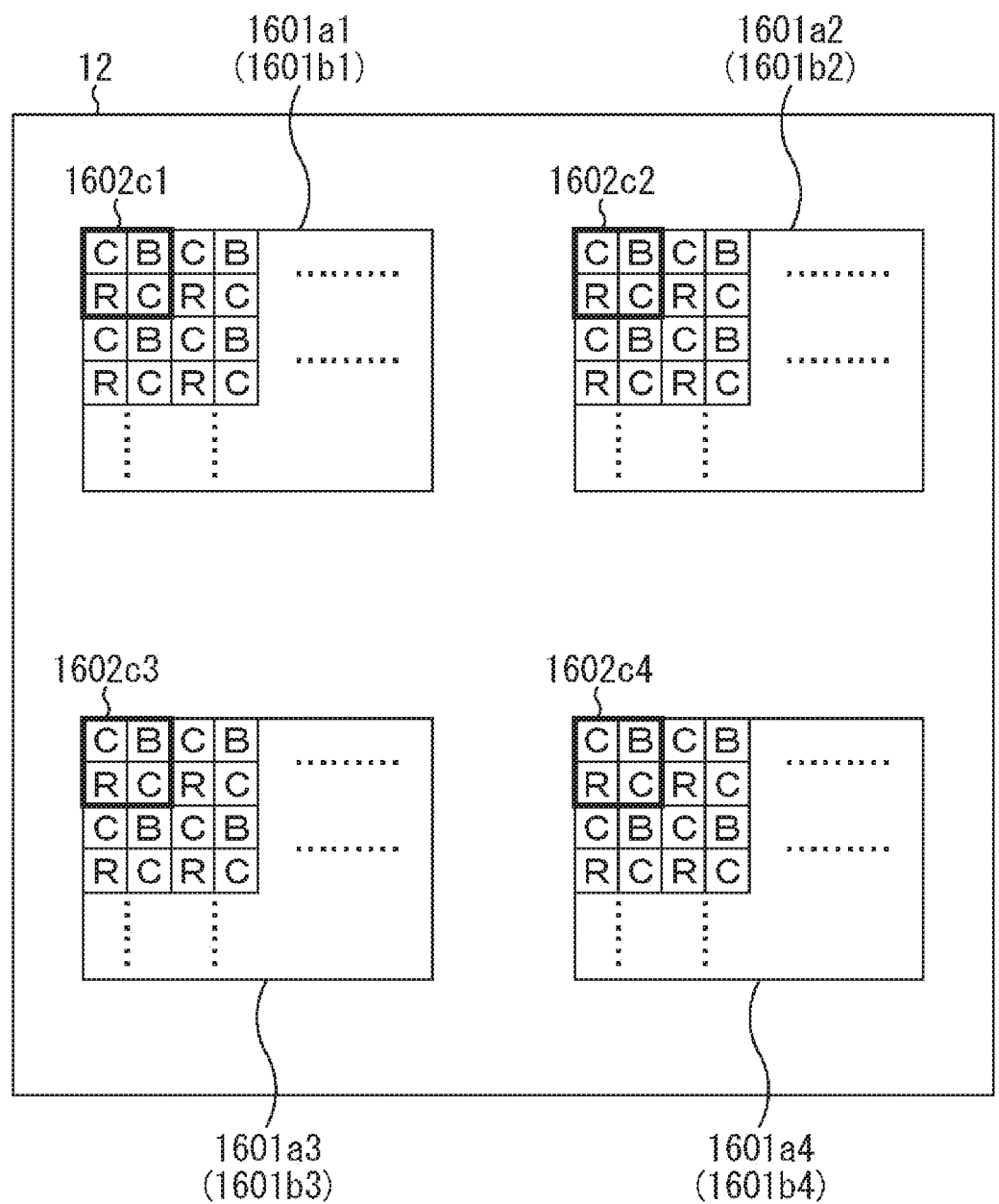
FIG. 68 is a view illustrating a third example of the pixel array in the light receiving region of the camera module.

FIG. 68 illustrates a third example of pixel arrays of the four pixel arrays 1601b1 to 1601b4 provided in the light receiving element 12 of the camera module 1.

Each of the repeating units 1602c1 to 1602c4 in FIG. 68 is configured by R, C, B, and C pixels.

The repeating units 1602c1 to 1602c4 of pixels illustrated in FIG. 68 do not include G pixels. Information corresponding to the G pixels is obtained by arithmetically processing information from the C, R, and B pixels. For example, the information of the G pixels is obtained by subtracting output values of the R pixel and the B pixel from an output value of the C pixel.

The repeating units 1602c1 to 1602c4 of pixels illustrated in FIG. 68 includes two C pixels that are twice the repeating units 1602c1 to 1602c4 illustrated in FIG. 67, the C pixel receiving light in the entire wavelength region. Furthermore, the repeating units 1602c1 to 1602c4 of pixels illustrated in FIG. 68 have the two C pixels arranged in a diagonal direction of an outline of the repeating unit 1602c so that the pitch of the C pixels in the pixel array 1601b provided in FIG. 68 becomes twice the pitch of the C pixels in the pixel array 1601b provided in FIG. 67 both in the vertical direction and the cross direction of the pixel array 1601b.

Therefore, the configuration illustrated in FIG. 68 brings about a function of obtaining the information obtained from the C pixels having a larger amount of received light, for example, the luminance information with resolution twice the configuration in FIG. 67 and thereby obtaining a clear image with twice higher resolution in a case where the illuminance of the object is low, for example.

Figure 69:
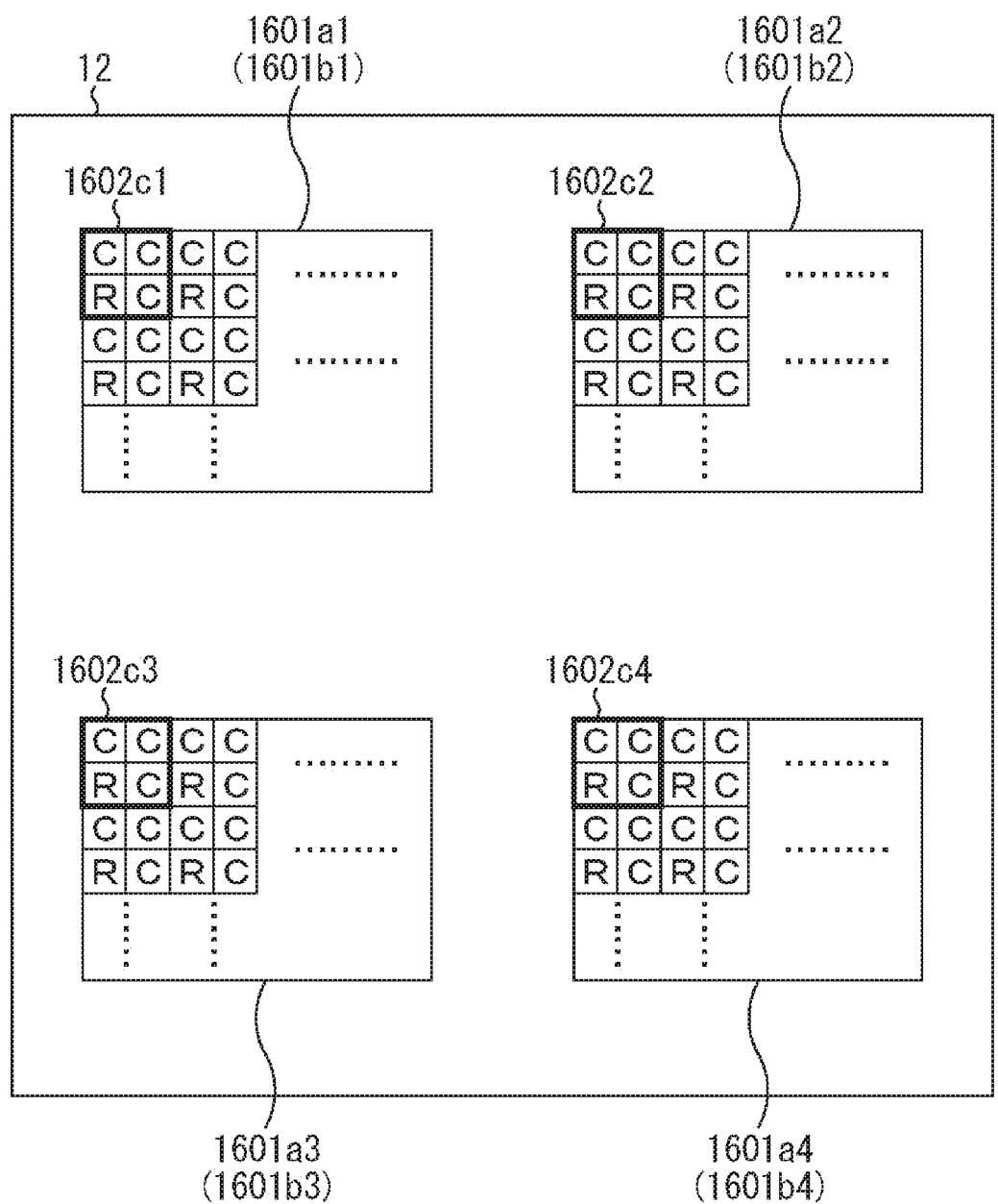
FIG. 69 is a view illustrating a fourth example of the pixel array in the light receiving region of the camera module.

FIG. 69 illustrates a fourth example of pixel arrays of the four pixel arrays 1601b1 to 1601b4 provided in the light receiving element 12 of the camera module 1.

Each of the repeating units 1602c1 to 1602c4 in FIG. 69 is configured by R, C, C, and C pixels.

For example, in a case of a camera application mounted on a car and capturing the front, there are many cases where a color image is not necessarily required. There are many cases where recognition of a red brake lamp of a car traveling ahead and a red light of a traffic light installed on a road, and recognition of shapes of other objects are required.

Therefore, the configuration illustrated in FIG. 69 brings about a function of obtaining a clearer image with higher resolution even in a case where the illuminance of the object is low, for example, by including the R pixels to recognize the red brake lamp of a car and the red light of a traffic light installed on a road, and by including a larger number of the C pixels having a larger amount of received light than the repeating unit 1602c of pixels illustrated in FIG. 68.

Note that any of the camera modules 1 including the light receiving elements 12 illustrated in FIGS. 66 to 69 may use any of FIGS. 64A, 64B, 64C, and 64D as the shape of the diaphragm plate 51.

In the camera modules 1 illustrated in FIGS. 10A, 10B, 10C, 10D, 10F, 11A, 11B, 11C, and 11D including any of the light receiving elements 12 illustrated in FIGS. 66 to 69 and any of the diaphragm plates 51 in FIGS. 64A, 64B, 64C, and 64D, the optical axes provided in the optical units 13 disposed two each in the vertical direction and the cross direction of the surface of the module 1, the surface serving as the light incident surface, extend in the same direction.

The camera module 1 having such a structure brings about a function of obtaining an image with higher resolution by applying the super resolution technology to a plurality of obtained original images.

Figure 70:
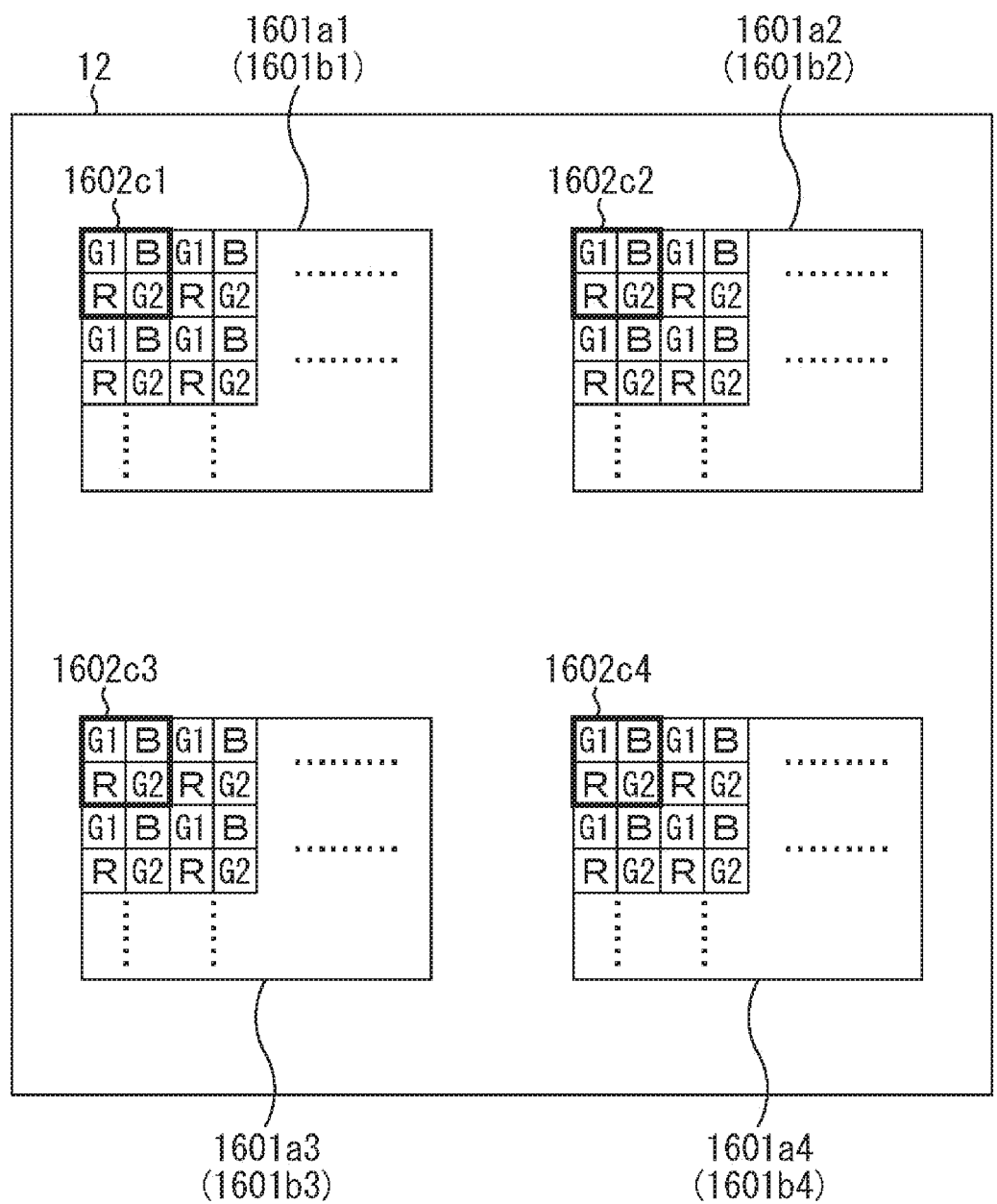
FIG. 70 is a view illustrating a modification of the pixel array illustrated in FIG. 66.

FIG. 70 is a view illustrating a modification of the pixel array illustrated in FIG. 66.

The repeating units 1602c1 to 1602c4 in FIG. 66 is configured by R, G, B, and G pixels, and the structures of the two G pixels of the same color are the same, whereas the repeating units 1602c1 to 1602c4 in FIG. 70 is configured by R, G1, B, and G2 pixels, and the two G pixels of the same color have different pixel structures between the G1 pixel and the G2 pixel.

Between the G1 pixel and the G2 pixel, the G2 pixel includes a higher appropriate operating limit (a larger saturation charge amount, for example) than the G1 pixel as a signal generation means (a photodiode, for example) provided in the pixel. In addition, the G2 pixel includes a larger generation signal conversion means (a larger charge voltage conversion capacity, for example) provided in the pixel than the G1 pixel.

With the configurations, in the G2 pixel, an output signal is suppressed to be smaller than an output signal of the G1 pixel in a case where a fixed amount of signal (charge, for example) is generated per unit time, and the G2 pixel does not reach the operating limit even in a case where the illuminance of the object is high, for example, because the saturation charge amount is large. Therefore, the G2 pixel brings about a function of obtaining an image with higher tone.

Meanwhile, the G1 pixel can obtain a larger output signal than the G2 pixel in a case where a fixed amount of signal (charge, for example) is generated per unit time, and thus brings about a function of obtaining an image with high tone even in a case where the illuminance of the object is low, for example.

Since the light receiving element 12 illustrated in FIG. 70 includes such G1 pixels and G2 pixels, the light receiving element 12 brings about a function of obtaining an image with high tone in a wide illuminance range, that is, obtaining an image with a so-called wide dynamic range.

Figure 71:
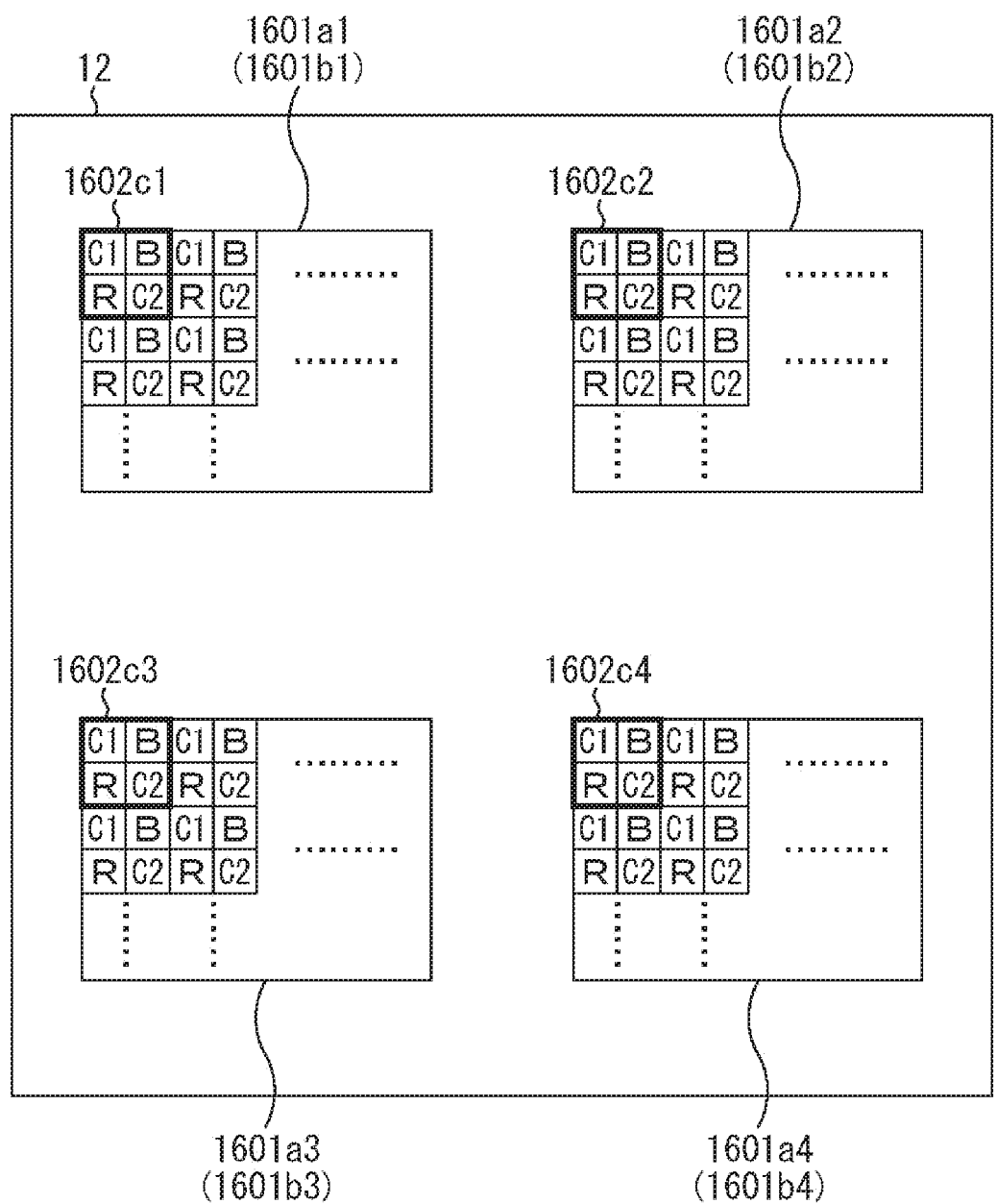
FIG. 71 is a view illustrating a modification of the pixel array illustrated in FIG. 68.

FIG. 71 illustrates a modification of the pixel array illustrated in FIG. 68.

The repeating units 1602c1 to 1602c4 in FIG. 68 is configured by R, C, B, and C pixels, and the structures of the two C pixels of the same color are the same, whereas the repeating units 1602c1 to 1602c4 in FIG. 71 is configured by R, C1, B, and C2 pixels, and the two C pixels of the same color have different pixel structures between the C1 pixel and the C2 pixel.

Between the C1 pixel and the C2 pixel, the C2 pixel includes a higher operating limit (a larger saturation charge amount, for example) than the C1 pixel as a signal generation means (a photodiode, for example) provided in the pixel. In addition, the C2 pixel includes a larger generation signal conversion means (a larger charge voltage conversion capacity, for example) provided in the pixel than the C1 pixel.

Figure 72:
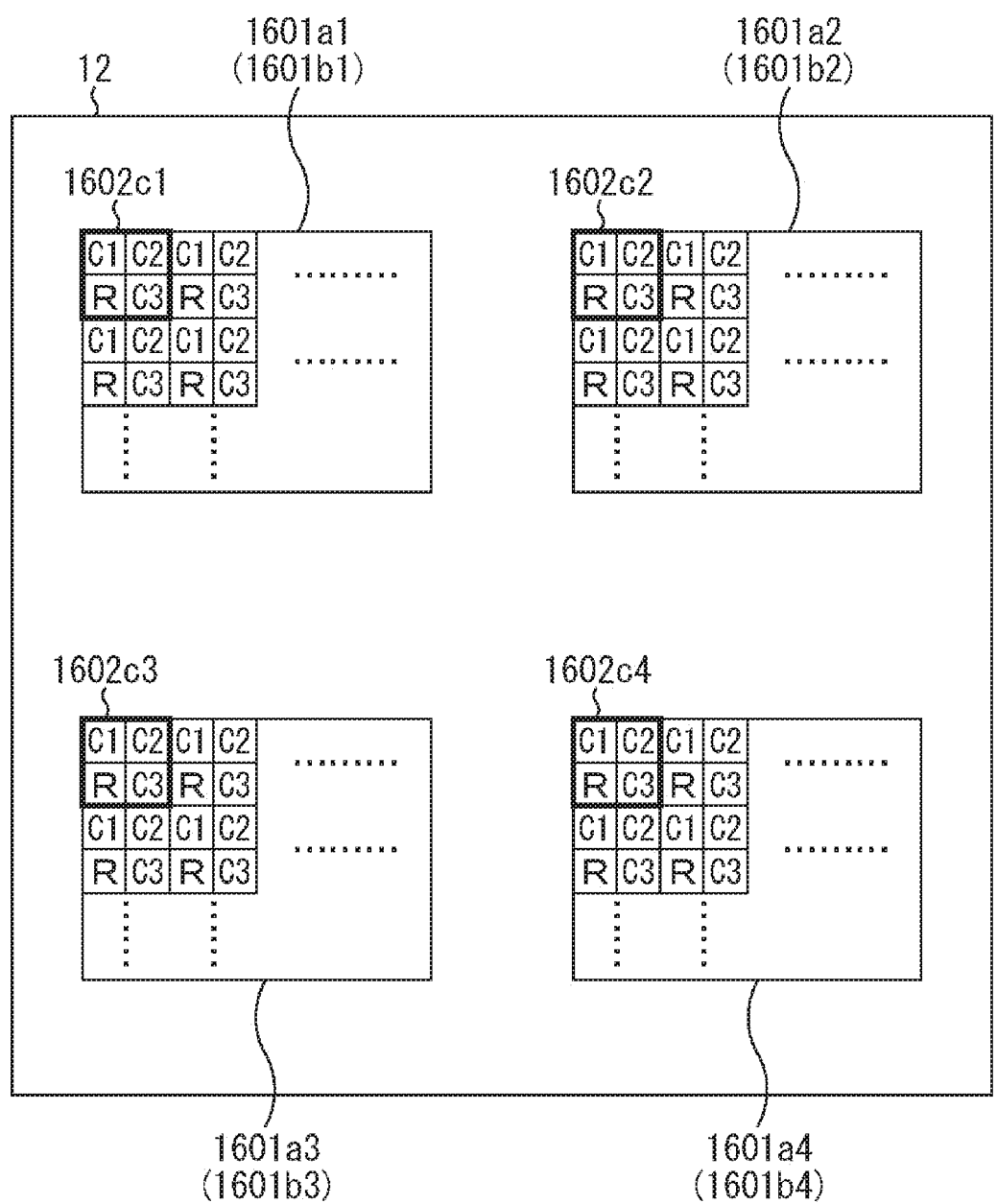
FIG. 72 is a view illustrating a modification of the pixel array illustrated in FIG. 69.

FIG. 72 illustrates a modification of the pixel array illustrated in FIG. 69.

The repeating units 1602c1 to 1602c4 in FIG. 69 is configured by R, C, C, and C pixels, and the structures of the three C pixels of the same color are the same, whereas the repeating units 1602c1 to 1602c4 in FIG. 72 is configured by R, C1, C2, and C3 pixels, and the three C pixels of the same color have different pixel structures among the C1 to C3 pixels.

For example, among the C1 to C3 pixels, the C2 pixel includes a higher operating limit (a larger saturation charge amount, for example) than the C1 pixel as a signal generation means (a photodiode, for example) provided in the pixel, and the C3 pixel includes a higher operating limit than the C2 pixel. Furthermore, the C2 pixel includes a larger generation signal conversion means (a larger charge voltage conversion capacity, for example) provided in the pixel than the C1 pixel, and the C3 pixel includes a larger generation signal conversion means than the C2 pixel.

Since the light receiving elements 12 illustrated in FIGS. 71 and 72 have the above-described configurations, the light receiving elements 12 bring about a function of obtaining an image with high tone in a wide illuminance range, that is, obtaining an image with a so-called wide dynamic range, similarly to the light receiving element 12 illustrated in FIG. 70.

As the configuration of the diaphragm plate 51 of the camera module 1 provided with any of the light receiving elements 12 illustrated in FIGS. 70 to 72, the configurations of the various diaphragm plates 51 illustrated in FIGS. 64A, 64B, 64C, and 64D or modifications of the aforementioned configurations can be adopted.

In the camera modules 1 illustrated in FIGS. 10A, 10B, 10C, 10D, 10F, 11A, 11B, 11C, and 11D including any of the light receiving elements 12 illustrated in FIGS. 70 to 72 and any of the diaphragm plates 51 in FIGS. 64A, 64B, 64C, and 64D, the optical axes provided in the optical units 13 disposed two each in the vertical direction and the cross direction of the surface of the module 1, the surface serving as the light incident surface, extend in the same direction.

The camera module 1 having such a structure brings about a function of obtaining an image with higher resolution by applying the super resolution technology to a plurality of obtained original images.

FIG. 73A illustrates a fifth example of pixel arrays of the four pixel arrays 1601b1 to 1601b4 provided in the light receiving element 12 of the camera module 1.

The four pixel arrays 1601b1 to 1601b4 provided in the light receiving element 12 do not necessarily have the same structure, as described above, and may have different structures, as illustrated in FIG. 73A.

In the light receiving element 12 illustrated in FIG. 73A, the structures of the pixel array 1601b1 and the pixel array 1601b4 are the same, and the structures of repeating units 1602c1 and 1602c4 constituting pixel arrays 1601b1 and 1601b4 are also the same.

In contrast, the structures of the pixel array 1601b2 and the pixel array 1601b3 are different from the structures of the pixel array 1601b1 and the pixel array 1601b4. Specifically, the pixel sizes included in the repeating units 1602c2 and 1602c3 of the pixel array 1601b2 and the pixel array 1601b3 are larger than the pixel sizes of the repeating units 1602c1 and 1602c4 of the pixel array 1601b1 and the pixel array 1601b4. Furthermore, the size of the photoelectric conversion units included in the pixels is large. Since the pixel size is large, the region size of the repeating units 1602c2 and 1602c3 is also larger than the region size of the repeating units 1602c1 and 1602c4. Therefore, the pixel array 1601b2 and the pixel array 1601b3 are configured by a smaller number of pixels than the pixel array 1601b1 and the pixel array 1601b4 although having the same area.

As the configuration of the diaphragm plate 51 of the camera module 1 provided with the light receiving element 12 illustrated in FIG. 73A, the configurations of the various diaphragm plates 51 illustrated in FIGS. 64A, 64B, and 64C, the configurations of the diaphragm plates 51 illustrated in FIGS. 73B 73C, and 73D, or modifications of the aforementioned configurations can be adopted.

Generally, a light receiving element using a large pixel brings about an effect of obtaining an image having a better signal noise ratio (S/N ratio) than a light receiving element using a small pixel.

For example, the magnitude of noise in a circuit for reading out a signal or in a circuit for amplifying a read out signal is substantially the same between the light receiving element using a large pixel and the light receiving element using a small pixel, whereas the magnitude of a signal generated by a signal generation unit provided in a pixel is larger as the pixel is larger.

For this reason, the light receiving element using a large pixel brings about an effect of obtaining an image having a better signal noise ratio (S/N ratio) than the light receiving element using a small pixel.

Meanwhile, when the sizes of the pixel arrays are the same, the light receiving element using a small pixel has higher resolution than the light receiving element using a large pixel.

For this reason, the light receiving element using a small pixel brings about an effect of obtaining an image having higher resolution than the light receiving element using a large pixel.

The above configuration provided in the light receiving element 12 illustrated in FIG. 73A brings about a function of obtaining an image with high resolution using the light receiving regions 1601$a$1 and 1601$a$4 having a small pixel size and high resolution, and further obtaining an image with higher resolution by applying the super resolution technology to the two images, for example, in a case where the illuminance of the object is high and therefore a large signal is obtained in the light receiving element 12.

Furthermore, the above configuration provided in the light receiving element 12 brings about a function of obtaining an image with a high S/N ratio using the light receiving regions 1601$a$2 and 1601$a$3 capable of obtaining an image with a high S/N ratio, and further obtaining an image with higher resolution by applying the super resolution technology to the two images, in a case where the illuminance of the object is low and therefore a large signal cannot be obtained in the light receiving element 12, and there is a concern of a decrease in the S/N ratio of an image.

In this case, the camera module 1 provided with the light receiving element 12 illustrated in FIG. 73A may use, as the shape of the diaphragm plate 51, the shape of the diaphragm plate 51 illustrated in FIG. 73B, for example, of the three shapes of the diaphragm plates 51 illustrated in FIGS. 73B, 73C, and 73D.

In the diaphragm plate 51 in FIG. 73C, of the three images regarding the shapes of the diaphragm plates 51 illustrated in FIGS. 73B, 73C, and 73D, for example, the aperture region 51$b$ of the diaphragm plate 51 used in combination of the light receiving regions 1601$a$2 and 1601$a$3 using large pixels is larger than the aperture region 51$b$ of the diaphragm plate 51 used in combination of other light receiving regions.

Therefore, the camera module 1 using the diaphragm plate 51 in FIG. 73C, of the three images regarding the shapes of the diaphragm plates 51 illustrated in FIGS. 73B, 73C, and 73D, in combination with the light receiving element 12 in FIG. 73A, brings about a function of obtaining an image with a higher S/N ratio in the light receiving regions 1601$a$2 and 1601$a$3 than the camera module 1 using the diaphragm plate 51 in FIG. 73B in combination with the light receiving element 12 in FIG. 73A, in a case where the illuminance of the object is low and therefore a large signal cannot be obtained in the light receiving element 12, for example.

In the diaphragm plate 51 in FIG. 73D, of the three images regarding the shapes of the diaphragm plates 51 illustrated in FIGS. 73B, 73C, and 73D, for example, the aperture region 51$b$ of the diaphragm plate 51 used in combination of the light receiving regions 1601$a$2 and 1601$a$3 using large pixels is larger than the aperture region 51$b$ of the diaphragm plate 51 used in combination of other light receiving regions.

Therefore, the camera module 1 using the diaphragm plate 51 in FIG. 73D, of the three images regarding the shapes of the diaphragm plates 51 illustrated in FIGS. 73B, 73C, and 73D, in combination with the light receiving element 12 in FIG. 73A, brings about a function of suppressing the light amount entering the light receiving regions 1601$a$2 and 1601$a$3 than the camera module 1 using the diaphragm plate 51 in FIG. 73B, of the three images regarding the shapes of the diaphragm plates 51 illustrated in FIGS. 73B, 73C, and 7D, in combination with the light receiving element 12 in FIG. 73A, in a case where the illuminance of the object is high and therefore a large signal can be obtained in the light receiving element 12, for example.

As a result, the camera module 1 brings an effect of suppressing occurrence of a situation where excessive light enters the pixels provided in the light receiving regions 1601$a$2 and 1601$a$3 and therefor the pixels exceed the appropriate operating limit of the pixels provided in the light receiving regions 1601$a$2 and 1601$a$3 (for example, exceeding the saturation charge amount).

FIG. 74A illustrates a sixth example of pixel arrays of the four pixel arrays 1601$b$1 to 1601$b$4 provided in the light receiving element 12 of the camera module 1.

In the light receiving element 12 illustrated in FIG. 74A, the region size of the repeating unit 1602$c$1 of the pixel array 1601$b$1 is smaller than the region size of the repeating units 1602$c$1 and 1602$c$2 of the pixel arrays 1601$b$2 and 1601$b$3. The region size of the repeating unit 1602$c$4 of the pixel array 1601$b$4 is larger than the region size of the repeating units 1602$c$1 and 1602$c$2 of the pixel arrays 1601$b$2 and 1601$b$3.

In other words, the region sizes of the repeating units 1602$c$1 to 1602$c$4 have a relationship of the repeating unit 1602$c$1<(the repeating unit 1602$c$2=the repeating unit 1602$c$3)<the repeating unit 1602$c$4.

The larger the region sizes of the repeating units 1602$c$1 to 1602$c$4, the larger the pixel sizes and the larger the sizes of the photoelectric conversion unit.

As the configuration of the diaphragm plate 51 of the camera module 1 provided with the light receiving element 12 illustrated in FIG. 74A, the configurations of the various diaphragm plates 51 illustrated in FIGS. 64A, 64B, and 64C, the configurations of the diaphragm plates 51 illustrated in FIGS. 74B 74C, and 74D, or modifications of the aforementioned configurations can be adopted.

The above configuration provided in the light receiving element 12 illustrated in FIG. 74A brings about a function of obtaining an image with high resolution using the light receiving region 1601$a$1 having a small pixel size and high resolution, for example, in a case where the illuminance of the object is high and therefore a large signal is obtained in the light receiving element 12.

Furthermore, the above configuration provided in the light receiving element 12 brings about a function of obtaining an image with a high S/N ratio using the light receiving regions 1601$a$2 and 1601$a$3 capable of obtaining an image with a high S/N ratio, and further obtaining an image with higher resolution by applying the super resolution technology to the two images, in a case where the illuminance of the object is low and therefore a large signal cannot be obtained in the light receiving element 12, and there is a concern of a decrease in the S/N ratio of an image.

The above configuration provided in the light receiving element 12 brings about a function of obtaining an image with a higher S/N ratio using the light receiving region 1601a4 capable of obtaining an image with a higher S/N ratio, in a case where the illuminance of the object is lower and therefore there is a concern of a further decrease in the S/N ratio of an image.

In this case, the camera module 1 provided with the light receiving element 12 illustrated in FIG. 74A may use, as the shape of the diaphragm plate 51, the shape of the diaphragm plate 51 illustrated in FIG. 74B, for example, of the three shapes of the diaphragm plates 51 illustrated in FIGS. 74B, 74C, and 74D.

In the diaphragm plate 51 in FIG. 74C, of the three images regarding the shapes of the diaphragm plates 51 illustrated in FIGS. 74B, 74C, and 74D, for example, the aperture region 51b of the diaphragm plate 51 used in combination of the light receiving regions 1601a2 and 1601a3 using large pixels is larger than the aperture region 51b of the diaphragm plate 51 used in combination of the light receiving region 1601a1 using small images. Furthermore, the aperture region 51b of the diaphragm plate 51 used in combination with the light receiving region 1601a4 using larger pixels is larger.

Therefore, the camera module 1 using the diaphragm plate 51 in FIG. 74C, of the three images regarding the shapes of the diaphragm plates 51 illustrated in FIGS. 74B, 74C, and 74D, in combination with the light receiving element 12 in FIG. 74A, brings about a function of obtaining an image with a higher S/N ratio in the light receiving regions 1601a2 and 1601a3 in a case where the illuminance of the object is low and thus a large signal cannot be obtained in the light receiving element 12, for example, and further obtaining an image with a still higher S/N ratio in the light receiving region 1601a4 in a case where the illuminance of the object is lower, than the camera module 1 using the diaphragm plate 51 in FIG. 74B, of the three images regarding the shapes of the diaphragm plates 51 in FIGS. 74B 74C, and 74D, in combination with the light receiving element 12 in FIG. 74A.

In the diaphragm plate 51 in FIG. 74D, of the three images regarding the shapes of the diaphragm plates 51 illustrated in FIGS. 74B, 74C, and 74D, for example, the aperture region 51b of the diaphragm plate 51 used in combination of the light receiving regions 1601a2 and 1601a3 using large pixels is smaller than the aperture region 51b of the diaphragm plate 51 used in combination of the light receiving region 1601a1 using small images. Furthermore, the aperture region 51b of the diaphragm plate 51 used in combination with the light receiving region 1601a4 using larger pixels is smaller.

Therefore, the camera module 1 using the diaphragm plate 51 in FIG. 74D, of the three images regarding the shapes of the diaphragm plates 51 illustrated in FIGS. 74B, 74C, and 74D, in combination with the light receiving element 12 in FIG. 74A, brings about a function of suppressing the light amount entering the light receiving regions 1601a2 and 1601a3 than the camera module 1 using the diaphragm plate 51 in FIG. 74B, of the three images regarding the shapes of the diaphragm plates 51 illustrated in FIGS. 74B, 74C, and 74D, in combination with the light receiving element 12 in FIG. 74A, in a case where the illuminance of the object is high and therefore a large signal can be obtained in the light receiving element 12, for example.

As a result, the camera module 1 brings an effect of suppressing occurrence of a situation where excessive light enters the pixels provided in the light receiving regions 1601a2 and 1601a3 and therefor the pixels exceed the appropriate operating limit of the pixels provided in the light receiving regions 1601a2 and 1601a3 (for example, exceeding the saturation charge amount).

Furthermore, the came module 1 brings an effect of suppressing the light amount entering the light receiving region 1601a4 and further suppressing occurrence of a situation where excessive light enters the pixels provided in the light receiving region 1601a4 and therefor the pixels exceed the appropriate operating limit of the pixels provided in the light receiving region 1601a4 (for example, exceeding the saturation charge amount).

Note that, as another embodiment, for example, the camera module may include the diaphragm plate 51 in which the aperture region 51b becomes variable, using a similar structure to a diaphragm combining a plurality of plates and changing the size of a aperture by changing a positional relationship, which is used in a general camera, and changes the size of the aperture of the diaphragm according to the illuminance of the object.

For example, in a case of using the light receiving elements 12 illustrated in FIG. 73A and FIG. 74A, a structure in which the shapes in FIG. 73C and FIG. 74C, of the three images regarding the shapes of the diaphragm plates 51 illustrated in FIGS. 73B, 73C, and 73D and in FIGS. 74B, 74C, and 74D, are used in a case where the illuminance of the object is low, the shapes in FIG. 73B and FIG. 74B are used in a case where the illuminance of the object is higher than the above case, and the shapes in FIG. 73D and FIG. 74D are used in a case where the illuminance of the object is still higher than the above case may be adopted.

Figure 75:
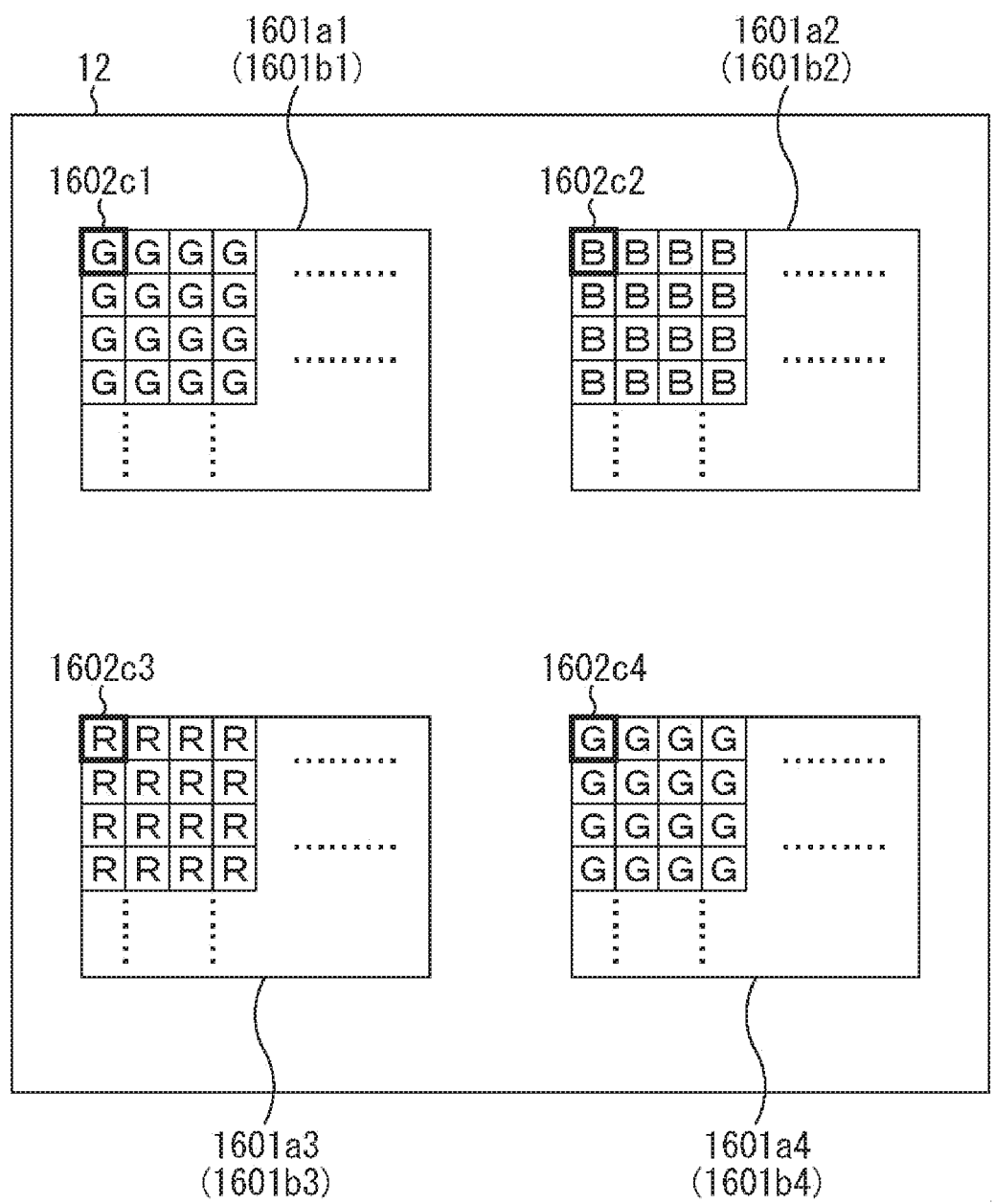
FIG. 75 is a view illustrating a seventh example of the pixel array in the light receiving region of the camera module.

FIG. 75 illustrates a seventh example of pixel arrays of the four pixel arrays 1601b1 to 1601b4 provided in the light receiving element 12 of the camera module 1.

In the light receiving element 12 illustrated in FIG. 75, all the pixels in the pixel array 1601b1 are configured by pixels that receive light of a green wavelength. All the pixels in the pixel array 1601b2 are configured by pixels that receive light of a blue wavelength. All the pixels in the pixel array 1601b3 are configured by pixels that receive light of a red wavelength. All the pixels in the pixel array 1601b4 are configured by pixels that receive light of a green wavelength.

Figure 76:
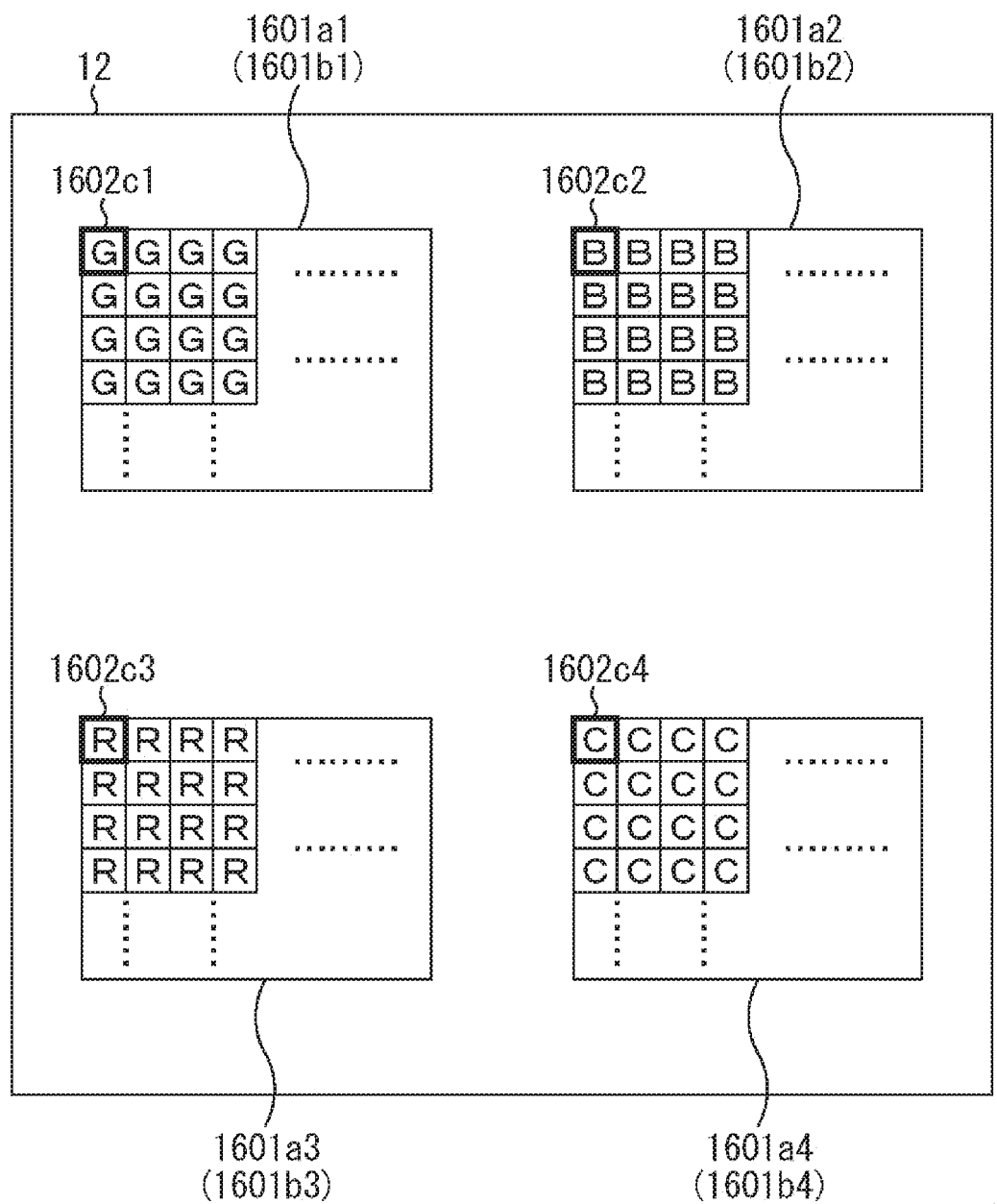
FIG. 76 is a view illustrating an eighth example of the pixel array in the light receiving region of the camera module.

FIG. 76 illustrates an eighth example of pixel arrays of the four pixel arrays 1601b1 to 1601b4 provided in the light receiving element 12 of the camera module 1.

In the light receiving element 12 illustrated in FIG. 76, all the pixels in the pixel array 1601b1 are configured by pixels that receive light of a green wavelength. All the pixels in the pixel array 1601b2 are configured by pixels that receive light of a blue wavelength. All the pixels in the pixel array 1601b3 are configured by pixels that receive light of a red wavelength. All the pixels in the pixel array 1601b4 are configured by pixels that receive light of the entire wavelength region of the visible light.

Figure 77:
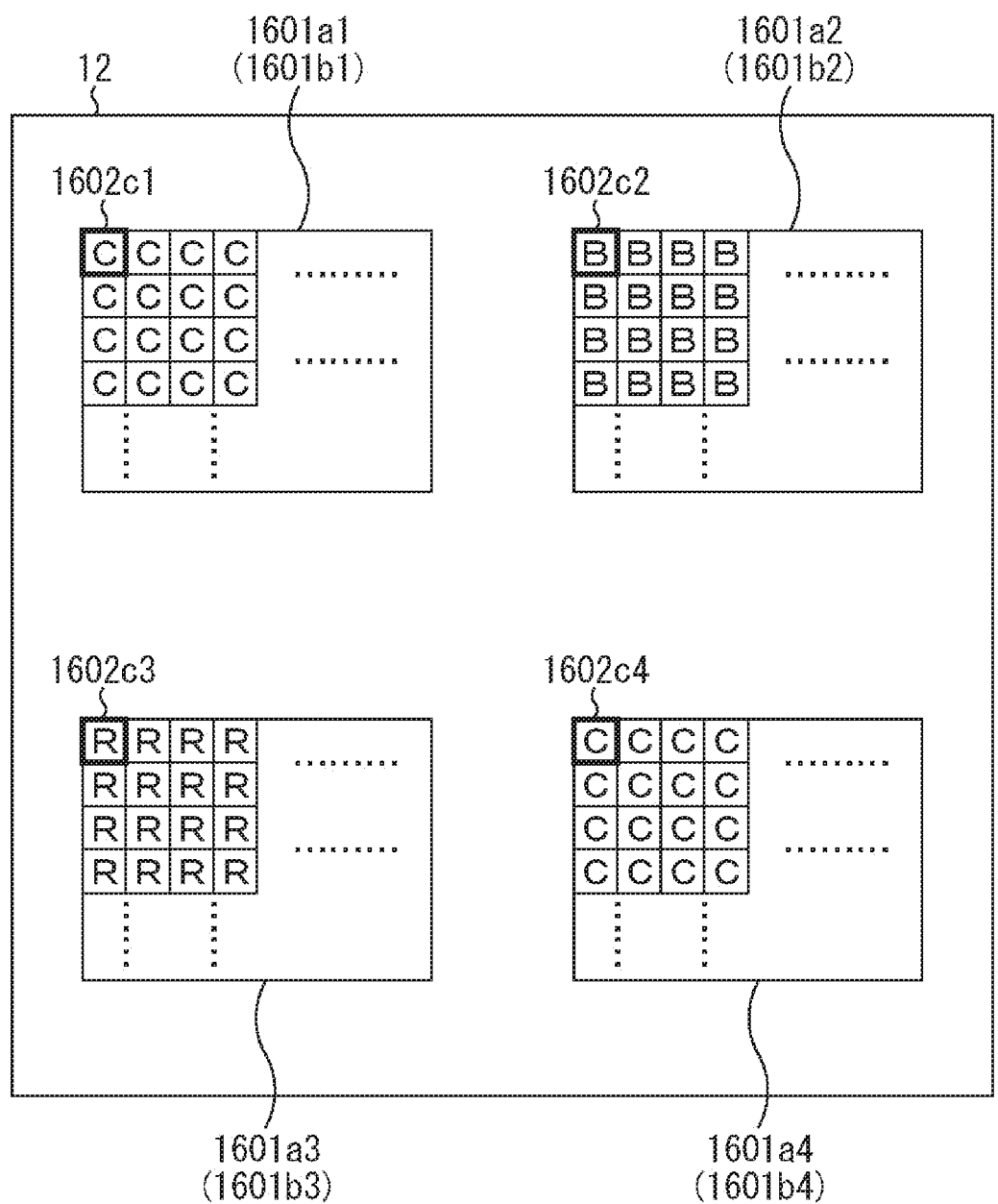
FIG. 77 is a view illustrating a ninth example of the pixel array in the light receiving region of the camera module.

FIG. 77 illustrates a ninth example of pixel arrays of the four pixel arrays 1601b1 to 1601b4 provided in the light receiving element 12 of the camera module 1.

In the light receiving element 12 illustrated in FIG. 77, all the pixels in the pixel array 1601b1 are configured by pixels that receive light of the entire wavelength region of the visible light. All the pixels in the pixel array 1601b2 are configured by pixels that receive light of a blue wavelength. All the pixels in the pixel array 1601b3 are configured by pixels that receive light of a red wavelength. All the pixels in the pixel array 1601b4 are configured by pixels that receive light of the entire wavelength region of the visible light.

Figure 78:
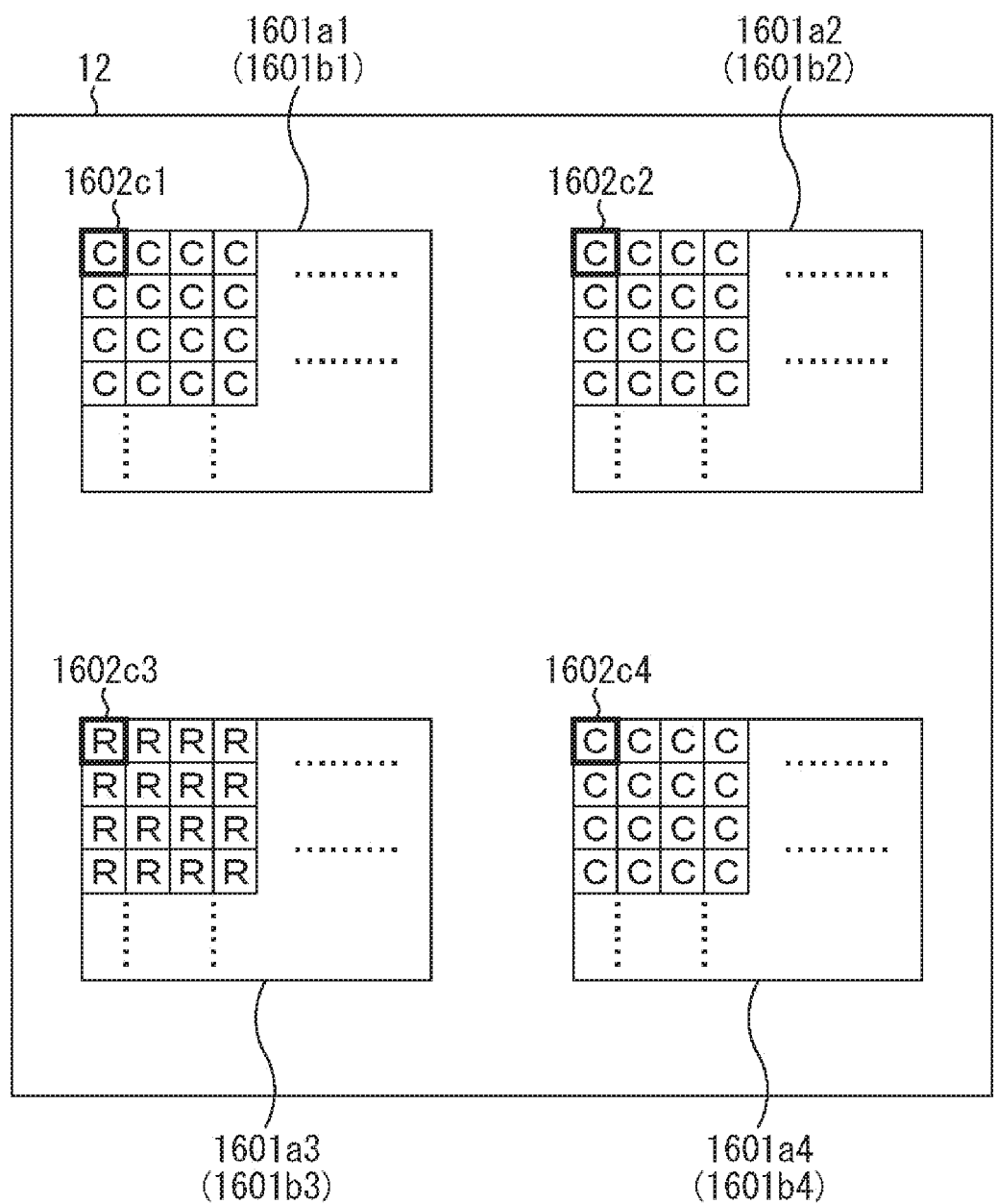
FIG. 78 is a view illustrating a tenth example of the pixel array in the light receiving region of the camera module.

FIG. 78 illustrates a tenth example of pixel arrays of the four pixel arrays 1601b1 to 1601b4 provided in the light receiving element 12 of the camera module 1.

In the light receiving element 12 illustrated in FIG. 78, all the pixels in the pixel array 1601b1 are configured by pixels that receive light of the entire wavelength region of the visible light. All the pixels in the pixel array 1601b2 are configured by pixels that receive light of the entire region of the visible light. All the pixels in the pixel array 1601b3 are configured by pixels that receive light of a red wavelength. All the pixels in the pixel array 1601b4 are configured by pixels that receive light of the entire wavelength region of the visible light.

As illustrated in FIGS. 75 to 78, the pixel arrays 1601b1 to 1601b4 of the light receiving element 12 can be configured to receive light of the wavelength of the same band in pixel array units.

A conventionally known RGB 3-plate solid-state imaging device includes three light receiving elements, and each light receiving element captures only an R image, only a G image, or only a B image. The conventionally known RGB 3-plate solid-state imaging device splits light entering one optical unit into three directions by a prism and receives light using the three light receiving elements. For this reason, the positions of object images entering the three light receiving elements are the same among the three. Therefore, it is difficult to obtain an image with high sensitivity by applying the super resolution technology to these three images.

In contrast, in the camera module 1 illustrated in FIGS. 10A, 10B, 10C, 10D, 10E, 10F, 11A, 11B, 11C, and 11D including any of the light receiving elements 12 illustrated in FIGS. 75 to 78, the two optical units 13 are disposed two each in the vertical direction and the cross direction of the surface of the module 1, the surface serving as the light incident surface, and the optical axes provided in the four optical units 13 are parallel and extend in the same direction. As a result, a plurality of not necessarily the same images can be obtained using the different four light receiving regions 1601a1 to 1601a4 provided in the light receiving element 12 while the optical axes are directed in the same direction.

The camera module 1 having such a structure brings about a function of obtaining an image with higher resolution than an image obtained from one optical unit 13, applying the super resolution technology to a plurality of images obtained from the four optical units 13 in the above arrangement.

Note that the configuration for obtaining G, R, G, and B four images by the light receiving element 12 illustrated in FIG. 75 brings about a similar function to the function brought about by the configuration in which G, R, G, and B four pixels are used as the repeating unit in the light receiving element 12 illustrated in FIG. 66.

The configuration for obtaining R, G, B, and C four images by the light receiving element 12 illustrated in FIG. 76 brings about a similar function to the function brought about by the configuration in which R, G, B, and C four pixels are used as the repeating unit in the light receiving element 12 illustrated in FIG. 67.

The configuration for obtaining R, C, B, and C four images by the light receiving element 12 illustrated in FIG. 77 brings about a similar function to the function brought about by the configuration in which R, C, B, and C four pixels are used as the repeating unit in the light receiving element 12 illustrated in FIG. 68.

The configuration for obtaining R, C, C, and C four images by the light receiving element 12 illustrated in FIG. 78 brings about a similar function to the function brought about by the configuration in which R, C, C, and C four pixels are used as the repeating unit in the light receiving element 12 illustrated in FIG. 69.

As the configuration of the diaphragm plate 51 of the camera module 1 provided with any of the light receiving elements 12 illustrated in FIGS. 75 to 78, the configurations of the various diaphragm plates 51 illustrated in FIGS. 64A, 64B, 64C, and 64D or modifications of the aforementioned configurations can be adopted.

FIG. 79A illustrates an eleventh example of pixel arrays of the four pixel arrays 1601b1 to 1601b4 provided in the light receiving element 12 of the camera module 1.

In the light receiving element 12 illustrated in FIG. 79A, the pixel size of one pixel or the wavelength of light received by each pixel is different in each of the pixel arrays 1601b1 to 1601b4.

As for the pixel size, the pixel array 1601b1 has the smallest size, the pixel arrays 1601b2 and 1601b3 have the same size and larger than the pixel array 1601b1, and the pixel array 1601b4 has a larger size than the pixel arrays 1601b2 and 1601b3. The size of the pixel size is proportional to the size of the photoelectric conversion unit included in each pixel.

As for the wavelength of light received by each pixel, the pixel arrays 1601b1, 1601b2 and 1601b4 are configured by pixels that receive light of wavelengths in the entire region of the visible light, and the pixel array 1601b3 is configured by pixels that receive light of a red wavelength.

The above configuration provided in the light receiving element 12 illustrated in FIG. 79A brings about a function of obtaining an image with high resolution using the light receiving region 1601a1 having a small pixel size and high resolution, for example, in a case where the illuminance of the object is high and therefore a large signal is obtained in the light receiving element 12.

Furthermore, the above configuration provided in the light receiving element 12 brings about a function of obtaining an image with a high S/N ratio using the light receiving region 1601a2 capable of obtaining an image with a high S/N ratio, in a case where the illuminance of the object is low and therefore a large signal cannot be obtained in the light receiving element 12, and there is a concern of a decrease in the S/N ratio of an image.

The above configuration provided in the light receiving element 12 brings about a function of obtaining an image with a higher S/N ratio using the light receiving region 1601a4 capable of obtaining an image with a higher S/N ratio, in a case where the illuminance of the object is lower and therefore there is a concern of a further decrease in the S/N ratio of an image.

Note that the configuration using the diaphragm plate 51 in FIG. 79B, of the three images regarding the shapes of the diaphragm plates 51 in FIGS. 79B, 79C, and 79D, in combination with the light receiving element 12 in FIG. 79A brings about a similar function to the function brought about by the configuration using the diaphragm plate 51 in FIG. 74B, of the three images regarding the shapes of the diaphragm plates 51 in FIGS. 74B, 74C, and 74D, in combination with the light receiving element 12 in FIG. 74A.

Furthermore, the configuration using the diaphragm plate 51 in FIG. 79C, of the three images regarding the shapes of the diaphragm plates 51 in FIGS. 79B, 79C, and 79D, in combination with the light receiving element 12 in FIG. 79A brings about a similar function to the function brought about by the configuration using the diaphragm plate 51 in FIG. 74C, of the three images regarding the shapes of the diaphragm plates 51 in FIGS. 74B, 74C, and 74D, in combination with the light receiving element 12 in FIG. 74A.

Furthermore, the configuration using the diaphragm plate 51 in FIG. 79D, of the three images regarding the shapes of the diaphragm plates 51 in FIGS. 79B, 79C, and 79D, in combination with the light receiving element 12 in FIG. 79A brings about a similar function to the function brought about by using the diaphragm plate 51 in FIG. 74D, of the three images regarding the shapes of the diaphragm plates 51 in FIGS. 74B, 74C, and 74D, in combination with the light receiving element 12 in FIG. 74A.

As the camera module 1 provided with the light receiving element 12 illustrated in FIG. 79A, the configuration of the diaphragm plate 51 illustrated in FIGS. 64A, 64B, 64C, and 64D, the configurations of the diaphragm plates 51 illustrated in FIGS. 79B, 79C, and 79D, or modifications of the aforementioned configurations can be adopted.

18. Configuration Example of Optical Diaphragm

Next, a configuration for implementing a diaphragm function between the substrates with lens 41 constituting the stacked lens structure 11 will be described.

In a lens module configured by a plurality of lenses, a configuration in which a diaphragm mask is inserted between lenses is sometimes adopted in order to adjust an incident light amount and suppress occurrence of flare due to stray light.

However, in the stacked lens structure 11 in which wafer substrates formed by a wafer level lens process are bonded and stacked, insertion of a diaphragm mask between the substrates with lens 41 is difficult.

Therefore, hereinafter, a structure of the substrate with lens 41 having a diaphragm function by directly forming a black resin having a light-shielding property on the upper surface of the lens resin portion 82 of the substrate with lens 41 will be described.

18.1 First Configuration Example of Optical Diaphragm

Figure 80:
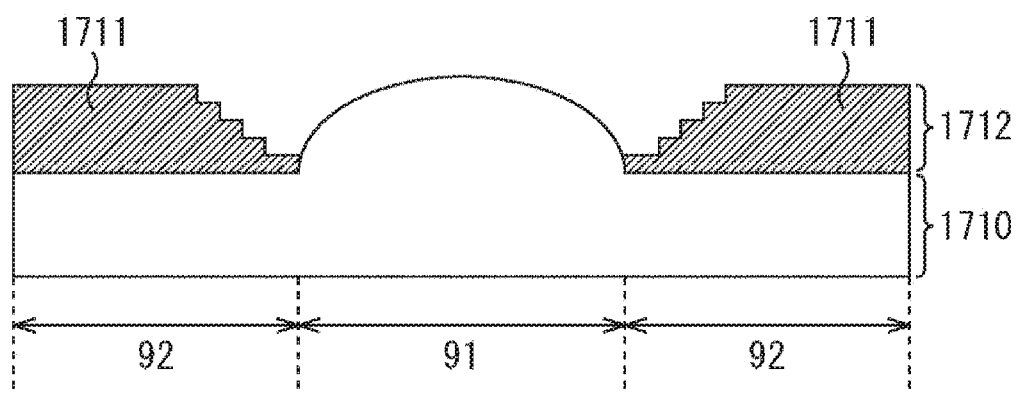
FIG. 80 is a cross-sectional view illustrating a first configuration example of an optical diaphragm.

FIG. 80 is a cross-sectional view illustrating a first configuration example of an optical diaphragm.

FIG. 80 is a cross-sectional view of an upper half above the center in the thickness direction of the lens resin portion 82 formed inside the through hole 83 of the substrate with lens 41 described above. The shape of a lower half not illustrated in FIG. 80 can take any shape depending on the optical design. For example, the lower half may be formed symmetrically to the upper half or may be formed in a shape different from the upper half. A similar configuration applies to FIGS. 82, 84, and the like described below.

A lens resin portion 1710 corresponding to the above-described lens resin portion 82 includes the lens portion 91 and the support portion 92, as described with reference to FIG. 14 and the like.

The shape of the lens resin portion 1710 is merely an example, and the shape of the lens resin portion 1710 can take various shapes like the lens resin portions 82a to 82e of the substrates with lens 41a to 41e illustrated in FIG. 15, for example.

A black resin 1711 as an optical diaphragm 1712 disposed between the lenses to be stacked is formed on an upper surface of the lens resin portion 1710. The material of the black resin 1711 is not particularly limited as long as the material has a light-shielding property, and for example, a resin in which a pigment such as titanium black or titanium carbon is dispersed can be adopted. The black resin 1711 is favorably a resin having an optical density (OD) value of 5, which can be developed by spin coating or photolithography or more and a refractive index of 1.6 to 1.9.

As illustrated in FIG. 80, the black resin 1711 is formed in a region corresponding to the support portion 92, of the lens portion 91 and the support portion 92 constituting the lens resin portion 1710, such that the film thickness monotonously increases from a lens center (optical axis center) toward a peripheral portion. As a result, the transmittance of light passing through the lens resin portion 1710 monotonously decreases from the optical axis center toward the peripheral portion.

As described above, since the black resin 1711 is formed on the upper surface of the lens resin portion 1710 to implement the function as the optical diaphragm 1712, it is not necessary to insert a diaphragm mask between the stacked substrates with lens 41. Therefore, it is possible to realize reduction in the height (downsizing), reduction in the number of processes, and cost reduction, of the camera module 1.

Furthermore, the structure in which the transmittance of light passing through the lens resin portion 1710 monotonously decreases from the optical axis center toward the peripheral portion is adopted. Thereby, the influence of diffraction can be decreased and the deterioration of resolution can be suppressed.

Note that, in the example in FIG. 80, the film thickness of the black resin 1711 as the optical diaphragm 1712 discontinuously increases (in a stepwise manner). However, the film thickness may continuously increase.

A method of manufacturing the first configuration example of the optical diaphragm illustrated in FIG. 80 will be described with reference to FIGS. 81A, 81B, and 81C.

Figure 81A:
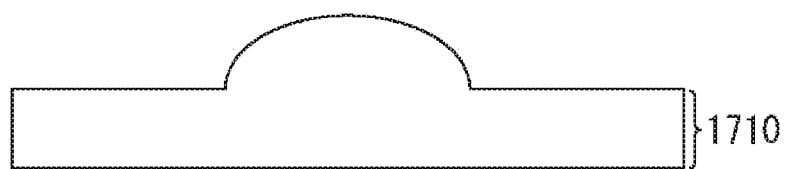
FIGS. 81A, 81B, and 81C are views for describing a method of manufacturing the first configuration example of the optical diaphragm.

First, the lens resin portion 1710 illustrated in FIG. 81A is formed by the method described with reference to FIGS. 23A, 23B, 23C, 23D, 23E, 23F, and 23G.

Figure 81B:
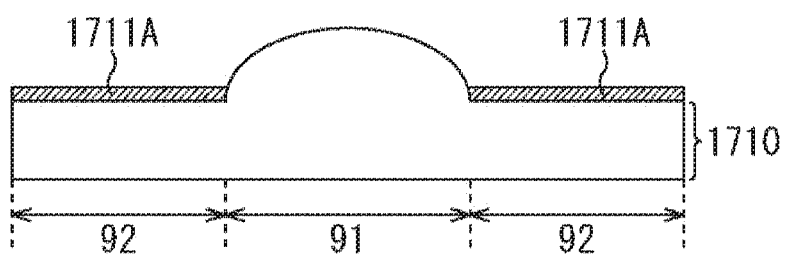
Figure 81C:
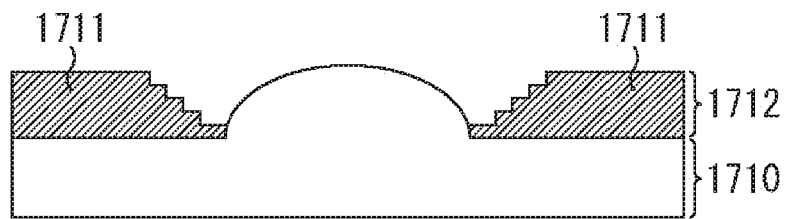

Next, after the entire surface of the lens resin portion 1710 is spin coated with a black resin 1711A by a spin coating method, for example, the black resin 1711A is exposed and developed using a mask in which a non-photosensitive region is patterned, so that a black resin 1711A of the lens portion 91 is removed, as illustrated in FIG. 81B.

The black resin 1711A is configured by, for example, an ultraviolet photosensitive resin in which fine particles of a visible light-absorbing material are dispersed. Uncured portions by exposure using a mask (irradiation with ultraviolet light) are removed by development.

The process of forming the black resin 1711A described in FIG. 81B is repeated a plurality of times while changing the formation region of the black resin 1711A such that the region where the black resin 1711A is formed is gradually away from the lens portion 91. As a result, the black resin 1711 as the optical diaphragm 1712 is completed, as illustrated in FIG. 81C.

Since the black resin 1711 can be formed by a semiconductor process (photolithography) with reference to an alignment mark provided on the support substrate 81 or the lens resin portion 1710 (lens resin portion 82), the black resin 1711 can be patterned with high precision of submicron order.

Note that the patterning of the black resin 1711 is not limited to the method using spin coating and photolithography. For example, a method of forming the black resin to obtain a gentle shape when the black resin is baked may be adopted. Alternatively, for example, a method of forming only a desired formation region using an inkjet method or the like may be adopted. In the case of using the inkjet method or the like, the optical diaphragm can be formed without using a mask, and the number of forming processes can be decreased.

18.2 Second Configuration Example of Optical Diaphragm

Figure 82:
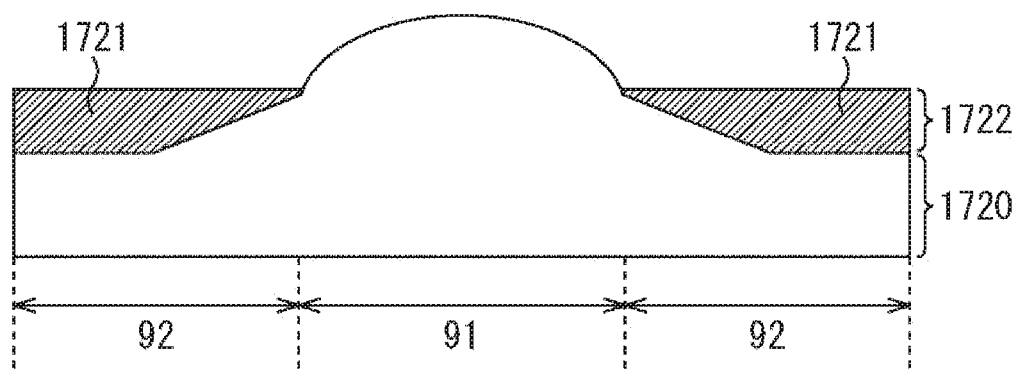
FIG. 82 is a cross-sectional view illustrating a second configuration example of the optical diaphragm.

FIG. 82 is a cross-sectional view illustrating a second configuration example of the optical diaphragm.

In the second configuration example in FIG. 82, the thickness of the support portion 92 of a lens resin portion 1720 that is a portion corresponding to the above-described lens resin portion 82 is formed to monotonously decrease from the lens center toward the peripheral portion. Meanwhile, a black resin 1721 as an optical diaphragm 1722 formed on an upper surface of the lens resin portion 1720 is formed flat.

The thickness of the support portion 92 of the lens resin portion 1720 is formed to monotonously decrease from the lens center toward the peripheral portion while the black resin 1721 is formed flat. Therefore, the transmittance of light passing through the lens resin portion 1710 monotonously decreases from the optical axis center toward the peripheral portion.

As described above, since the black resin 1721 is formed on the upper surface of the lens resin portion 1720 to implement the function as the optical diaphragm 1722, it is not necessary to insert a diaphragm mask between the stacked substrates with lens 41. Therefore, it is possible to realize reduction in the height, reduction in the number of processes, and cost reduction, of the camera module 1.

Furthermore, the structure in which the transmittance of light passing through the lens resin portion 1720 monotonously decreases from the optical axis center toward the peripheral portion is adopted. Thereby, the influence of diffraction can be decreased and the deterioration of resolution can be suppressed.

Note that, in the example in FIG. 82, the thickness of the support portion 92 continuously decreases. However, the thickness of the support portion 92 may discontinuously decrease (in a stepwise manner).

A method of manufacturing the second configuration example of the optical diaphragm illustrated in FIG. 82 will be described with reference to FIGS. 83A 83B, 83C, and 83D.

Figure 83A:
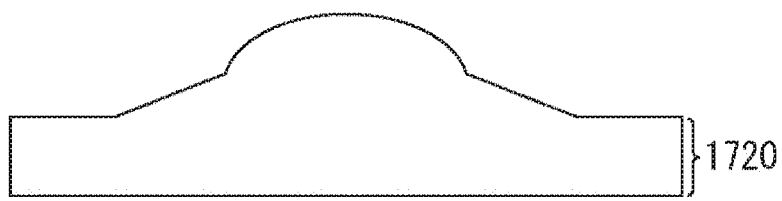
FIGS. 83A, 83B, 83C, and 83D are views for describing a method of manufacturing the second configuration example of the optical diaphragm.

First, the lens resin portion 1720 illustrated in FIG. 83A is formed by the method described with reference to FIGS. 23A, 23B, 23C, 23D, 23E, 23F, and 23G.

Figure 83B:
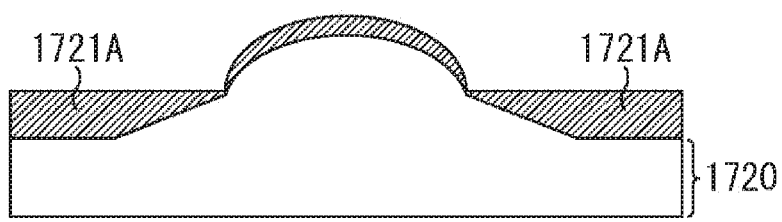

Next, the entire surface of the lens resin portion 1720 is spin coated with a black resin 1721A by a spin coating method, for example, as illustrated in FIG. 83B.

Figure 83C:
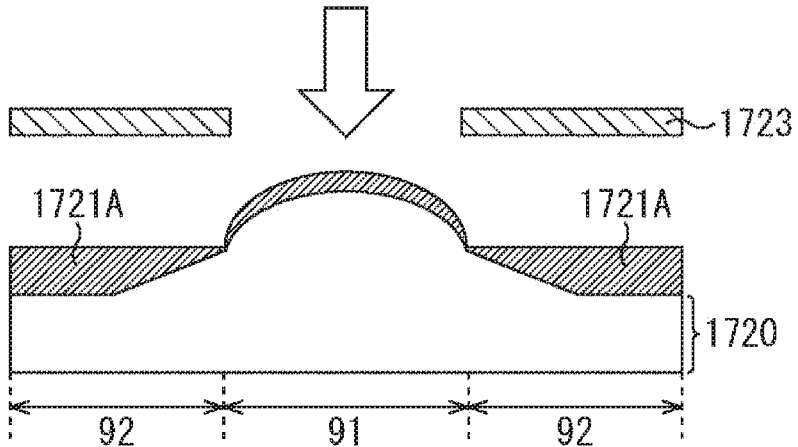
Figure 83D:
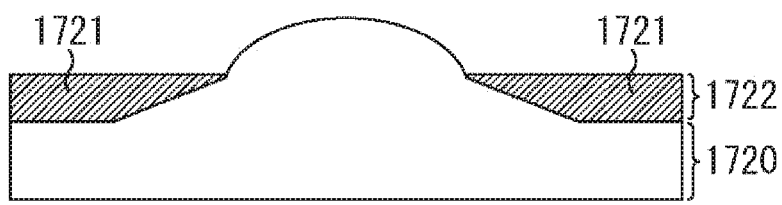

The black resin 1721A is exposed and developed using a mask 1723 in which a non-sensitive region is patterned, as illustrated in FIG. 83C, so that the black resin 1721A of the lens portion 91 is removed, and the black resin 1721 as the optical diaphragm 1722 is completed, as illustrated in FIG. 83D.

18.3 Third Configuration Example of Optical Diaphragm

Figure 84:
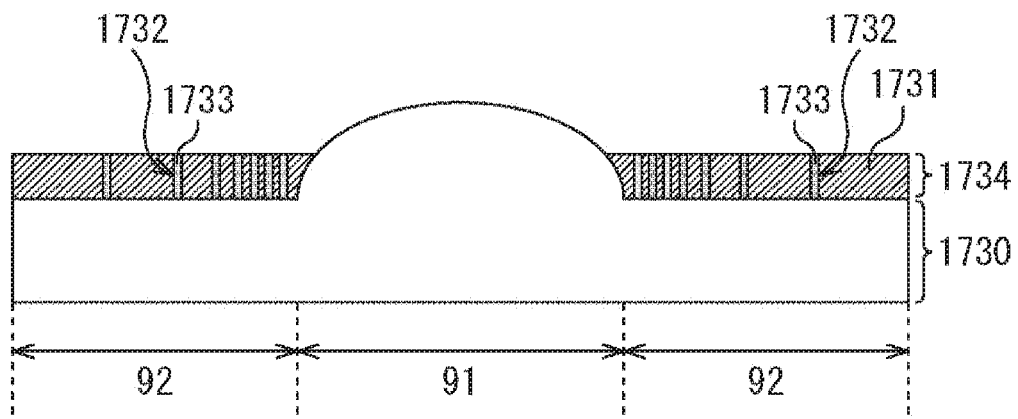
FIG. 84 is a cross-sectional view illustrating a third configuration example of the optical diaphragm.

FIG. 84 is a cross-sectional view illustrating a third configuration example of the optical diaphragm.

In the third configuration example in FIG. 84, the thickness of the support portion 92 of a lens resin portion 1730 that is a portion corresponding to the above-described lens resin portion 82 is formed the same from the lens center toward the peripheral portion, similarly to the first configuration example illustrated in FIG. 80.

Meanwhile, a black resin 1731 formed on an upper surface of the lens resin portion 1720 is formed on the lens resin portion 1730 with the same film thickness, but a plurality of voids 1732 is formed in the black resin 1731 in a radial direction.

The plurality of voids 1732 formed in the radial direction is formed such that an interval monotonously increases from the lens center toward the peripheral portion. Furthermore, a low refractive material 1733 having a refractive index larger than air and smaller than the black resin 1731 is embedded in the plurality of voids 1732. The low refractive material 1733 is favorably a transparent resin that can be formed by coating. Furthermore, to enhance the surface antireflective effect, it is favorable that a refractive index n of the low refractive material 1733 satisfies Nb>n>1, where the refractive index of the black resin 1731 is Nb. The refractive index n of the low refractive material 1733 is favorably about 1.3 to 1.6, where the refractive index Nb of the black resin is about 1.6 to 1.9 as described above.

An optical diaphragm 1734 is configured by the black resin 1731 formed on the upper surface of the lens resin portion 1720, the plurality of voids 1732 formed in the black resin 1731, and the low refractive material 1733 filled in the plurality of voids 1732.

Figure 85:
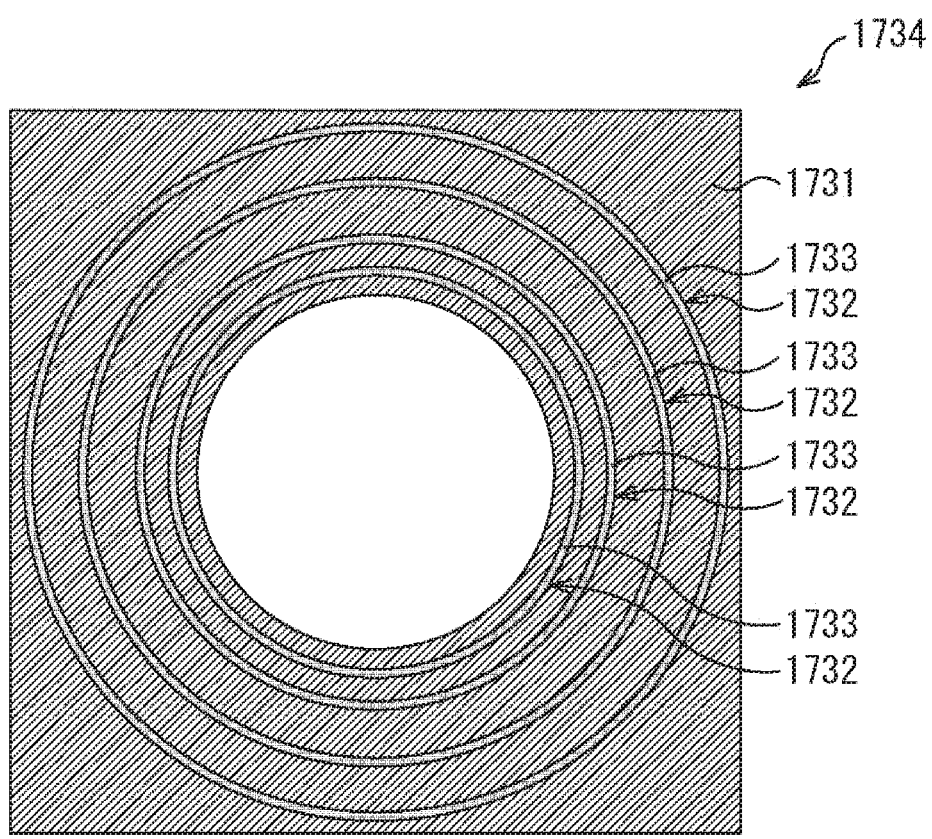
FIG. 85 is a plan view illustrating the third configuration example of the optical diaphragm.

FIG. 85 is a plan view of the light incident surface of the optical diaphragm 1734.

The plurality of voids 1732 formed in the black resin 1731 is concentrically arranged with the same width (width in the radial direction), as illustrated in FIG. 85, for example, and is formed such that the interval of the plurality of voids 1732 monotonously increases from the lens center toward the peripheral portion.

The plurality of voids 1732 is formed to monotonously increase from the lens center toward the peripheral portion. Therefore, the transmittance of light passing through the lens resin portion 1730 monotonously decreases from the optical axis center toward the peripheral portion. Furthermore, the low refractive material 1733 inside the plurality of voids 1732 can prevent reflection and suppress stray light.

As described above, since the black resin 1731 is formed on the upper surface of the lens resin portion 1730 to implement the function as the optical diaphragm 1734, it is not necessary to insert a diaphragm mask between the stacked substrates with lens 41. Therefore, it is possible to realize reduction in the height, reduction in the number of processes, and cost reduction, of the camera module 1.

Furthermore, the structure in which the transmittance of light passing through the lens resin portion 1730 monotonously decreases from the optical axis center toward the peripheral portion is adopted. Thereby, the influence of diffraction can be decreased and the deterioration of resolution can be suppressed.

The plurality of voids 1732 needs not be continuously formed in a circumferential direction. For example, holes (circles) having the same diameter (for example, 10 nm) may be formed as the voids 1732 such that an interval of the holes monotonously increases from the lens center toward the peripheral portion, as illustrated in FIG. 86.

Figure 87:
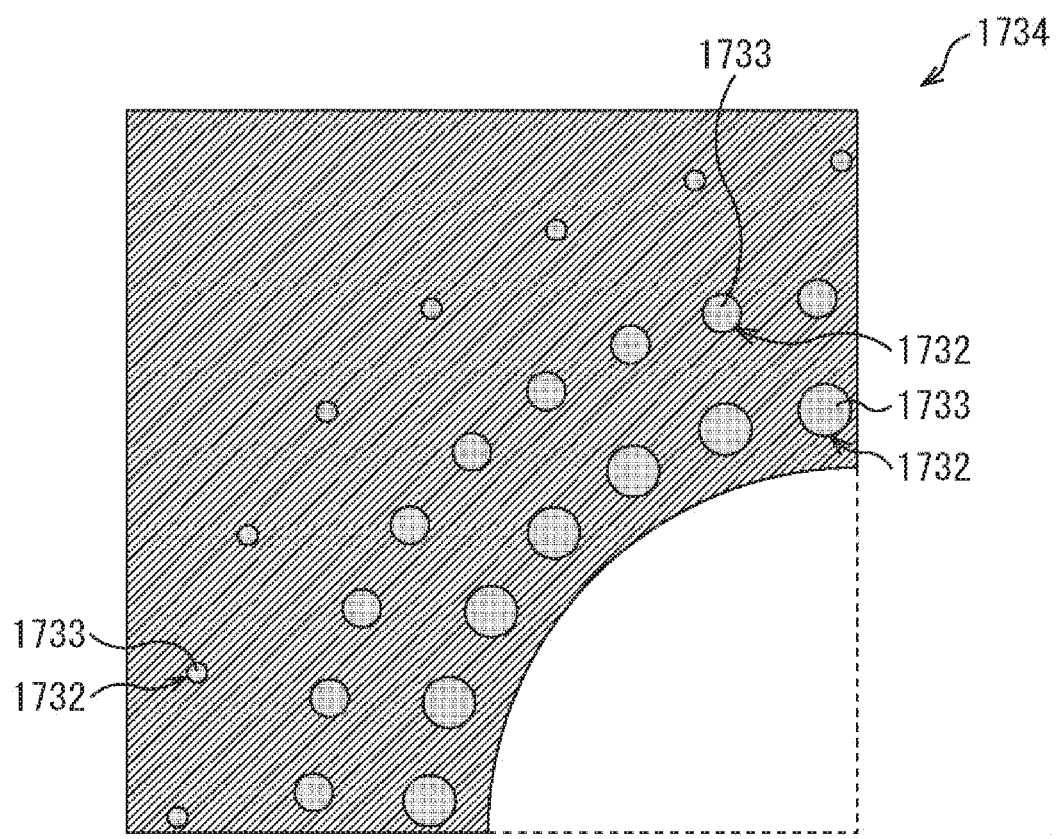
FIG. 87 is a plan view illustrating still another example of the plurality of voids in the third configuration example.

Alternatively, the sizes of the plurality of voids 1732 may be formed to monotonously decrease from the lens center toward the peripheral portion, as illustrated in FIG. 87. In the example in FIG. 87, holes having different diameters are formed as the voids 1732 in the radial direction of the lens resin portion 1720, and the interval between the holes is formed to monotonously increase from the lens center toward the peripheral portion. In the example in FIG. 87, the diameter of the innermost (lens center-side) hole is, for example, 50 nm, the diameter of the outer hole is, for example, 30 nm, and the diameter of the outermost hole is, for example, 10 nm.

Figure 86:
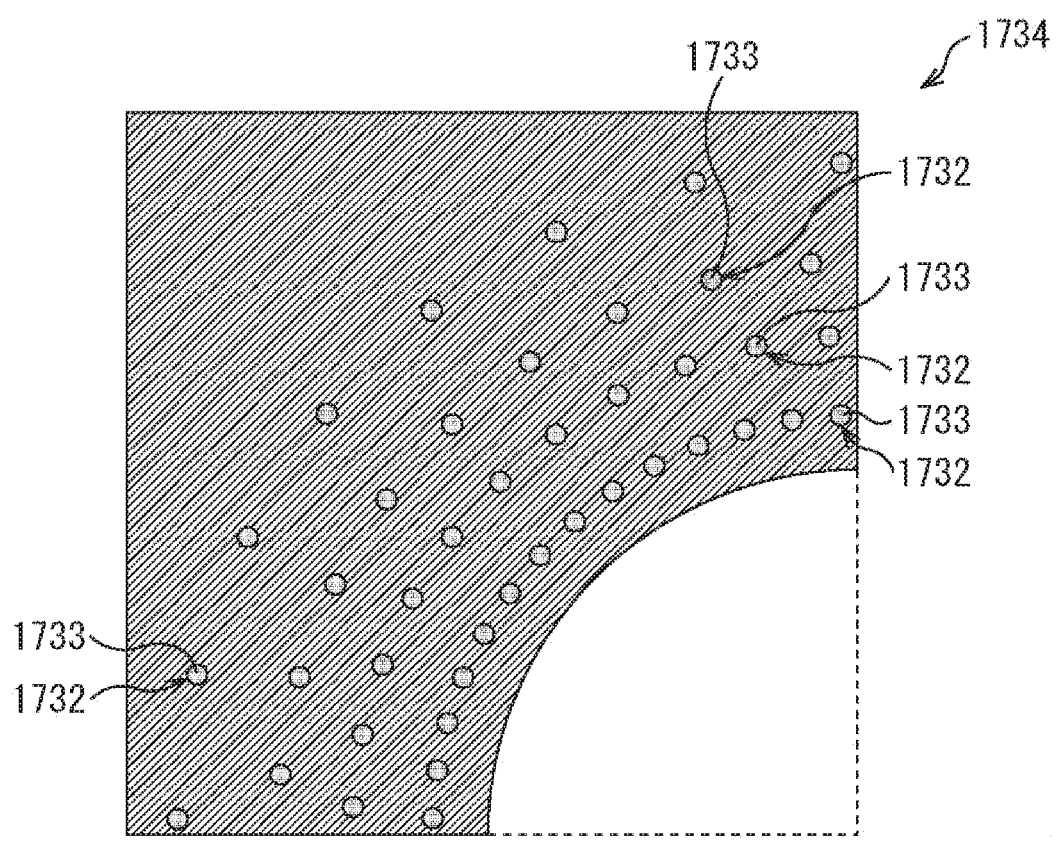
FIG. 86 is a plan view illustrating another example of a plurality of voids in the third configuration example.

Note that FIGS. 86 and 87 are plan views corresponding to a region of ¼ of the optical diaphragm 1734.

The examples illustrated in FIGS. 86 and 87 are examples in which the planar shape of the void 1732 discontinuously formed in the circumferential direction is circular. However, the planar shape of the void 1732 is not necessarily circular, and may be, for example, a polygon such as a quadrangle or a hexagon.

That is, the shape and arrangement of the void 1732 formed in the black resin 1731 are not limited as long as the transmittance of light passing through the lens resin portion 1730 monotonously decreases from the optical axis center toward the peripheral portion.

A method of manufacturing the third configuration example of the optical diaphragm illustrated in FIG. 84 will be described with reference to FIGS. 88A, 88B, 88C, 88D, and 88E.

First, the lens resin portion 1730 illustrated in FIG. 88A is formed by the method described with reference to FIGS. 23A, 23B, 23C, 23D, 23E, 23F, and 23G.

Next, the entire surface of the lens resin portion 1730 is spin coated with a black resin 1731A by a spin coating method, for example, as illustrated in FIG. 88B.

The black resin 1731A is exposed and developed using a mask 1741 in which a non-sensitive region is patterned, as illustrated in FIG. 88C, so that the black resin 1731 including the plurality of voids 1732 is formed, as illustrated in FIG. 88D.

Finally, as illustrated in FIG. 88E, the low refractive material 1733 is filled inside the plurality of voids 1732 formed in the black resin 1731, so that the optical diaphragm 1734 is completed.

Figure 89:
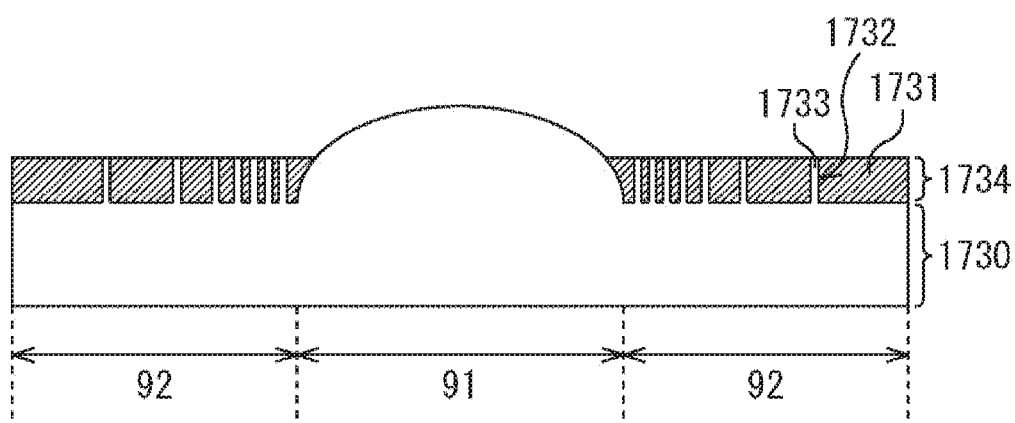
FIG. 89 is a cross-sectional view illustrating a first modification of the third configuration example of the optical diaphragm.

FIG. 89 illustrates a first modification of the third configuration example of the optical diaphragm illustrated in FIG. 84.

In the third configuration example of the optical diaphragm illustrated in FIG. 84, the low refractive material 1733 having a refractive index larger than air and smaller than the black resin 1731 is filled in the plurality of voids 1732 formed in the black resin 1731. However, as illustrated in FIG. 89, the voids 1732 may be filled with the material (lens material) of the lens resin portion 1730. Alternatively, the interior of each void 1732 may be a cavity (air gap).

Figure 90:
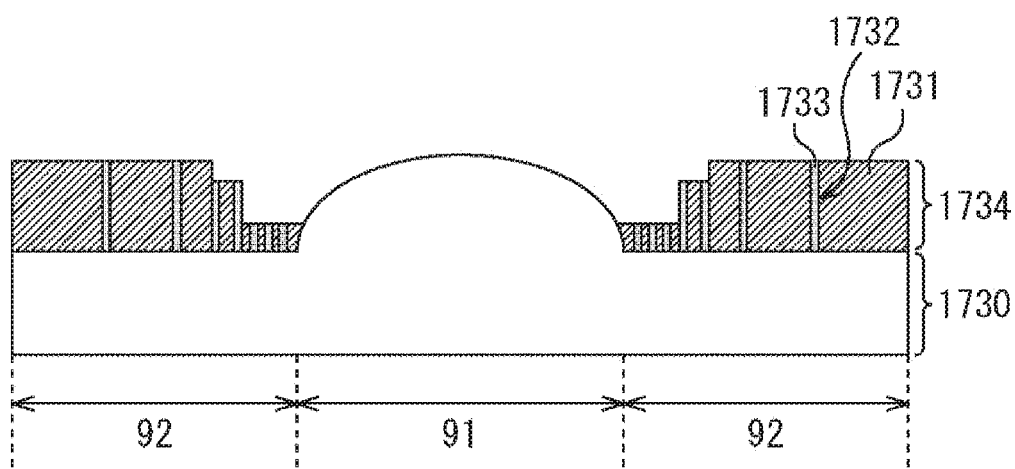
FIG. 90 is a cross-sectional view illustrating a second modification of the third configuration example of the optical diaphragm.

FIG. 90 illustrates a second modification of the third configuration example of the optical diaphragm illustrated in FIG. 84.

The second modification in FIG. 90 is different from the third configuration example illustrated in FIG. 84 in that the film thickness of the black resin 1731 is formed to monotonously increase from the lens center (optical axis center) toward the peripheral portion.

In other words, the second modification in FIG. 90 has a structure in which the characteristic of the first configuration example illustrated in FIG. 80 and the characteristic the third configuration example illustrated in FIG. 84 are combined. As described above, by adopting a structure in which the structures of the first to third configuration examples are arbitrarily combined, the configuration in which the transmittance of light passing through the lens resin portion 1730 monotonously decreases from the optical axis center toward the peripheral portion can be implemented.

18.4 Conclusion of Optical Diaphragm

The optical diaphragms 1712, 1722, and 1734 according to the first to third configuration examples respectively form the black resins 1711, 1721, and 1731 on the upper surfaces of the lens resin portions 1710, 1720, and 1730 such that the transmittance distribution of light monotonously decreases from the optical axis center toward the peripheral portion, whereby implementing the light amount adjustment function and the flare prevention function by one element. The configurations can contribute to the reduction in the number of parts and the reduction in height of the camera module 1.

The optical diaphragm in which the light transmittance distribution monotonously decreases from the optical axis center toward the peripheral portion is also called apotizer (gradation stop).

Note that, in the above example, the optical diaphragms 1712, 1722, and 1734 are formed on the upper surfaces of the lens resin portions 1710, 1720, and 1730 on the light incident surface side. However, the optical diaphragms 1712, 1722, and 1734 may be formed on lower surfaces of the lens resin portions 1710, 1720, and 1730 on the light emission surface side.

19. Application Examples to Electronic Devices

The above-described camera module 1 can be used in the form of being incorporated in an electronic device using a solid-state imaging device as an image capturing unit (photoelectric conversion unit), such as an imaging device such as a digital still camera or a video camera, a portable terminal device having an imaging function, a copier using a solid-state imaging device as an image reading unit.

Figure 91:
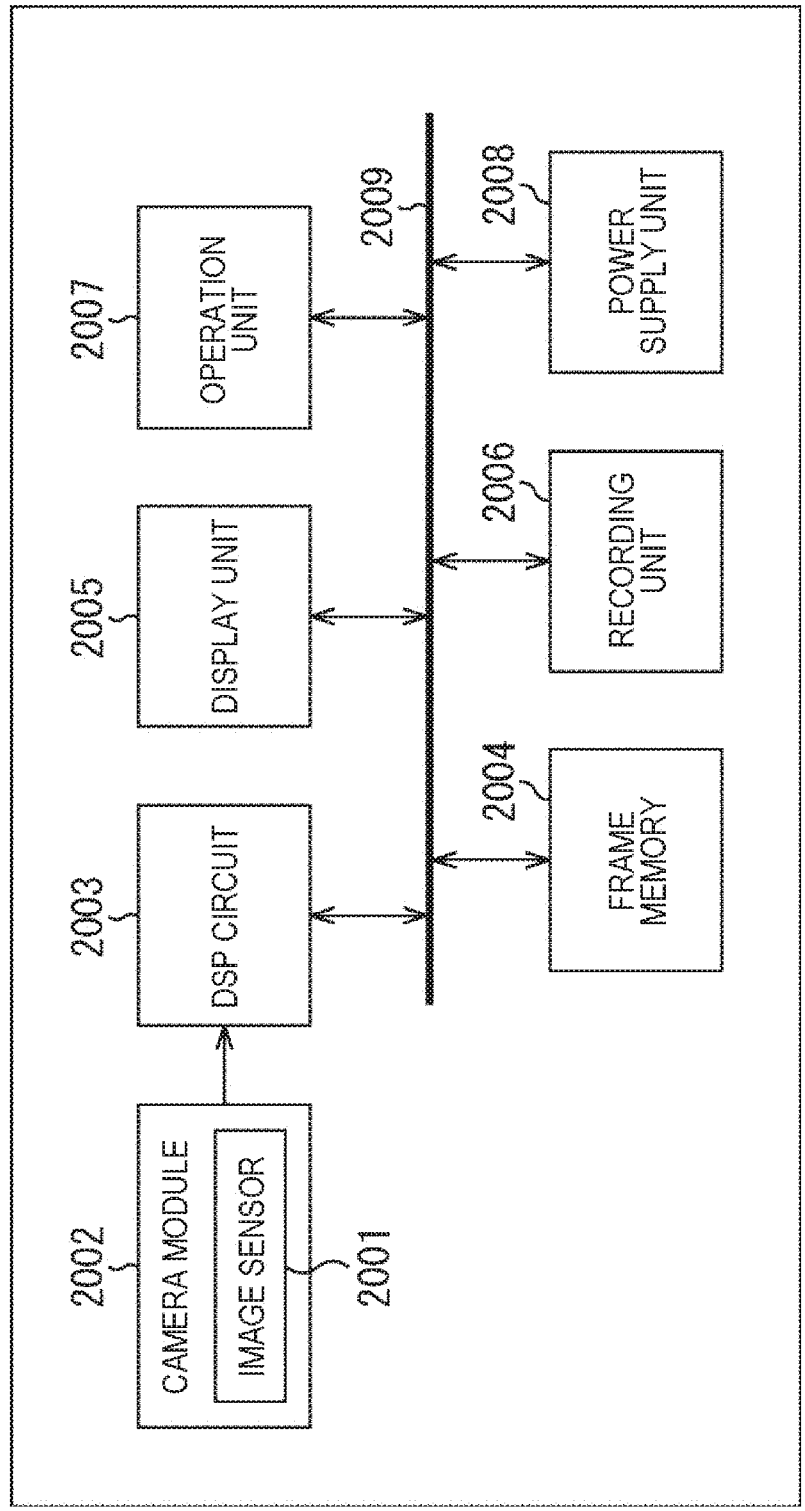
FIG. 91 is a block diagram illustrating a configuration example of an imaging device as an electronic device to which the present technology is applied.

FIG. 91 is a block diagram illustrating a configuration example of an imaging device as an electronic device to which the present technology is applied.

An imaging device 2000 in FIG. 91 includes a camera module 2002 and a digital signal processor (DSP) circuit 2003 that is a camera signal processing circuit. Furthermore, the imaging device 2000 includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are mutually connected via a bus line 2009.

The image sensor 2001 in the camera module 2002 takes in incident light (image light) from an object, converts an amount of the incident light formed on an imaging surface into an electrical signal on a pixel basis, and outputs the electrical signal as a pixel signal. The above-described camera module 1 is adopted as the camera module 2002, and the image sensor 2001 corresponds to the above-described light receiving element 12.

The display unit 2005 includes a panel-type display device such as a liquid crystal panel or an organic electro luminescence (EL) panel, for example, and displays a moving image or a still image captured by the image sensor 2001. The recording unit 2006 records a moving image or a still image captured by the image sensor 2001 on a recording medium such as a hard disk or a semiconductor memory.

The operation unit 2007 issues operation commands for various functions possessed by the imaging device 2000 under an operation by a user. The power supply unit 2008 appropriately supplies various power supplies serving as operation power supplies of the DSP circuit 2003, the frame memory 2004, the display unit 2005, the recording unit 2006, and the operation unit 2007 to these supply targets.

As described above, as the camera module 2002, the camera module 1 incorporating the stacked lens structure 11 using the substrates with lens 41 provided with the optical diaphragms 1712, 1722, and 1734 that implement the light amount adjustment function and the flare prevention function by one element is used, whereby high image quality and downsizing can be realized. Therefore, in the imaging device 2000 such as a video camera, a digital still camera, or a camera module for mobile devices such as a mobile phone, both the downsizing of the device and the high image quality of captured images can be achieved.

20. Usage Example of Image Sensor

Figure 92:
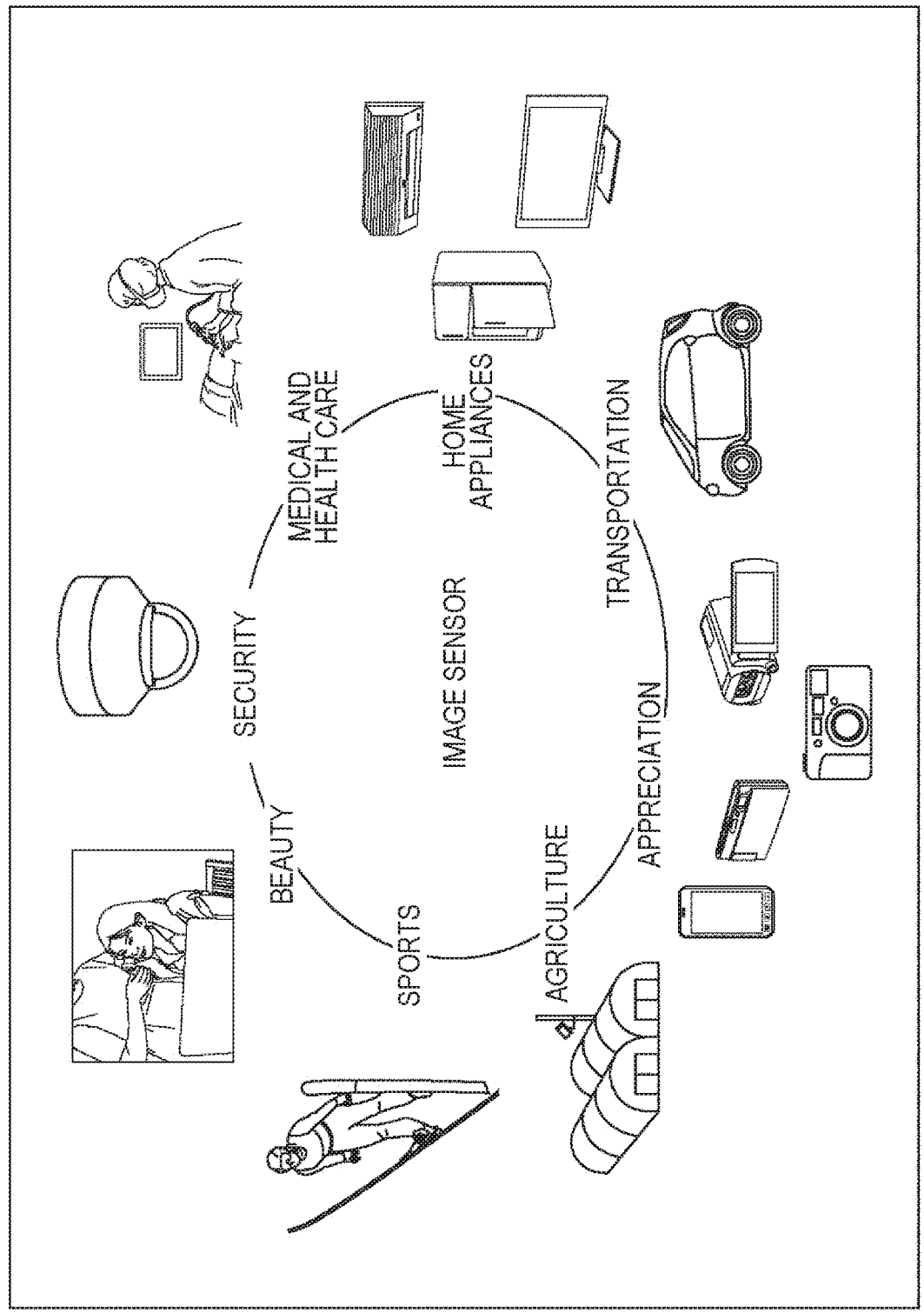
FIG. 92 is a diagram illustrating use examples of an image sensor.

FIG. 92 is a diagram illustrating use examples using an image sensor configured as the camera module 1.

The image sensor configured as the camera module 1 can be used in various cases of sensing light such as visible light, infrared light, ultraviolet light, and an X-rays as described below.

- Devices that capture an image provided for appreciation use, such as a digital camera or a mobile device with a camera function.
- Devices provided for transportation, such as in-vehicle sensors that capture the front, rear, peripheries, an interior of the vehicle, etc. for safe driving such as automatic stop, recognition of a state of a driver, or the like, monitoring cameras that monitor traveling vehicles and roads, distance measuring sensors that measure a distance between vehicles, and the like
- Devices provided for home appliances such as TVs, refrigerators, and air conditioners to capture gestures of users and perform device operations according to the gestures
- Devices provided for medical and healthcare, such as endoscopes, and devices that perform angiography by receiving infrared light
- Devices provided for security, such as monitoring cameras for crime prevention and cameras for person authentication use
- Devices for beauty, such as skin measuring instruments that captures skin and microscopes that captures scalp
- Devices provided for sports or the like, such as action cameras and wearable cameras for sport use
- Devices provided for agriculture, such as cameras for monitoring the condition of fields and crops

21. Application Example to In-Vivo Information Acquisition System

The technology according to the present disclosure (present technology) can be applied to various products. For example, the technology according to the present disclosure may be applied to an in-vivo information acquisition system for patients using a capsule endoscope.

Figure 93:
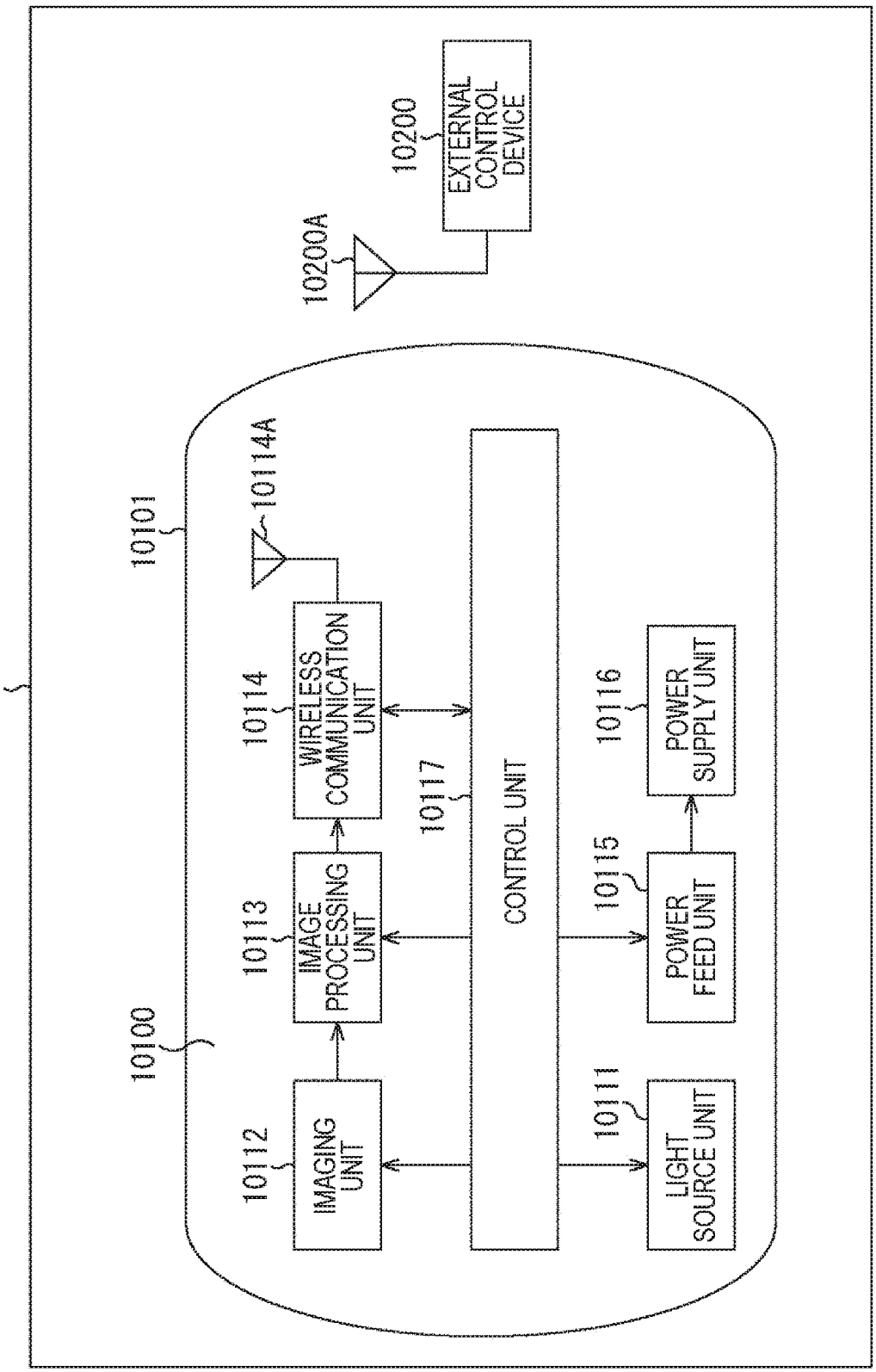
FIG. 93 is a block diagram illustrating an example of a schematic configuration of an in-vivo information acquisition system.

FIG. 93 is a block diagram illustrating an example of a schematic configuration of an in-vivo information acquisition system for patients using a capsule endoscope, to which the technology (present technology) according to the present disclosure is applicable.

An in-vivo information acquisition system 10001 includes a capsule endoscope 10100 and an external control device 10200.

The capsule endoscope 10100 is swallowed by a patient at the time of examination. The capsule endoscope 10100 has an imaging function and a wireless communication function, and sequentially captures images inside an organ (hereinafter also referred to as in-vivo images) at predetermined intervals while moving inside organs such as stomach and intestine by peristaltic movement or the like until the patient naturally discharges the capsule endoscope 10100, and sequentially wirelessly transmits information of the in-vivo image to the external control device 10200 outside the body.

The external control device 10200 comprehensively controls the operation of the in-vivo information acquisition system 10001. Furthermore, the external control device 10200 receives information regarding the in-vivo image transmitted from the capsule endoscope 10100, and transmits image data for displaying the in-vivo image to the display device (not illustrated) on the basis of the information regarding the received in-vivo image.

As described above, the in-vivo information acquisition system 10001 can acquire the in-vivo images obtained by imaging the inside of the patient's body from time to time during a period in which the capsule endoscope 10100 is swallowed and discharged.

The configurations and functions of the capsule endoscope 10100 and the external control device 10200 will be described in more detail.

The capsule endoscope 10100 has a capsule-shaped housing 10101, and a light source unit 10111, an imaging unit 10112, an image processing unit 10113, a wireless communication unit 10114, a power feed unit 10115, a power supply unit 10116, and a control unit 10117 are housed inside the housing 10101.

The light source unit 10111 includes, for example, a light source such as a light emitting diode (LED), and irradiates an imaging field of the imaging unit 10112 with light.

The imaging unit 10112 includes an imaging element and an optical system including a plurality of lenses provided in front of the imaging element. Reflected light (hereinafter referred to as observation light) of the light radiated on a body tissue that is an observation target is collected by the optical system and enters the imaging element. In the imaging unit 10112, the observation light having entered the imaging element is photoelectrically converted, and an image signal corresponding to the observation light is generated. The image signal generated by the imaging unit 10112 is provided to the image processing unit 10113.

The image processing unit 10113 includes processors such as a central processing unit (CPU) and a graphics processing unit (GPU), and performs various types of signal processing for the image signal generated by the imaging unit 10112. The image processing unit 10113 provides the image signal to which the signal processing has been applied to the wireless communication unit 10114 as raw data.

The wireless communication unit 10114 performs predetermined processing such as modulation processing for the image signal to which the signal processing has been applied by the image processing unit 10113 and transmits the image signal to the external control device 10200 via an antenna 10114A. Furthermore, the wireless communication unit 10114 receives a control signal related to drive control of the capsule endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating power from a current generated in an antenna coil, a booster circuit, and the like. In the power feed unit 10115, the power is generated using the principle of so-called non-contact charging.

The power supply unit 10116 includes a secondary battery, and stores the power generated by the power feed unit 10115. In FIG. 93, illustration of arrows or the like indicating a supply destination of the power from the power supply unit 10116 is omitted to avoid complication of the drawing. However, the power stored in the power supply unit 10116 is supplied to the light source unit 10111, the imaging unit 10112, the image processing unit 10113, the wireless communication unit 10114, and the control unit 10117, and can be used to drive these units.

The control unit 10117 includes a processor such as a CPU and appropriately controls driving of the light source unit 10111, the imaging unit 10112, the image processing unit 10113, the wireless communication unit 10114, and the power feed unit 10115 with control signals transmitted from the external control device 10200.

The external control device 10200 includes a processor such as a CPU and a GPU, or a microcomputer or control board or the like in which a processor and a memory element such as a memory are mixed. The external control device 10200 controls the operation of the capsule endoscope 10100 by transmitting a control signal to the control unit 10117 of the capsule endoscope 10100 via an antenna 10200A. In the capsule endoscope 10100, for example, an irradiation condition of light with respect to the observation target in the light source unit 10111 can be changed according to the control signal from the external control device 10200. Furthermore, imaging conditions (for example, a frame rate in the imaging unit 10112, an exposure value, and the like) can be changed according to the control signal from the external control device 10200. Furthermore, the content of the processing in the image processing unit 10113, and conditions for transmitting an image signal by the wireless communication unit 10114 (for example, a transmission interval, the number of transmitted images, and the like) may be changed according to the control signal from the external control device 10200.

Furthermore, the external control device 10200 applies various types of image processing to the image signal transmitted from the capsule endoscope 10100 to generate image data for displaying the captured in-vivo image on the display device. As the image processing, various types of signal processing can be performed, such as development processing (demosaicing processing), high image quality processing (band enhancement processing, super resolution processing, noise reduction (NR) processing, and/or camera shake correction processing, for example), and/or enlargement processing (electronic zoom processing), for example. The external control device 10200 controls driving of the display device and displays in-vivo images captured on the basis of the generated image data. Alternatively, the external control device 10200 may cause a recording device (not illustrated) to record the generated image data or cause a printing device (not illustrated) to print out the generated image data.

An example of an in-vivo information acquisition system to which the technology according to the present disclosure is applicable has been described. The technology according to the present disclosure is applicable to the imaging unit 10112, of the above-described configurations. Specifically, the above-described camera module 1 can be applied as the imaging unit 10112. By applying the technology according to the present disclosure to the imaging unit 10112, the capsule endoscope 10100 can be further downsized, and therefore the burden on the patient can be further reduced. Furthermore, a clearer image of an operation portion can be obtained while the capsule endoscope 10100 is downsized, and therefore the inspection accuracy is improved.

22. Application Example to Endoscope Surgery System

The technology according to the present disclosure (present technology) can be applied to various products. For example, the technology according to the present disclosure may be applied to an endoscope surgery system.

Figure 94:
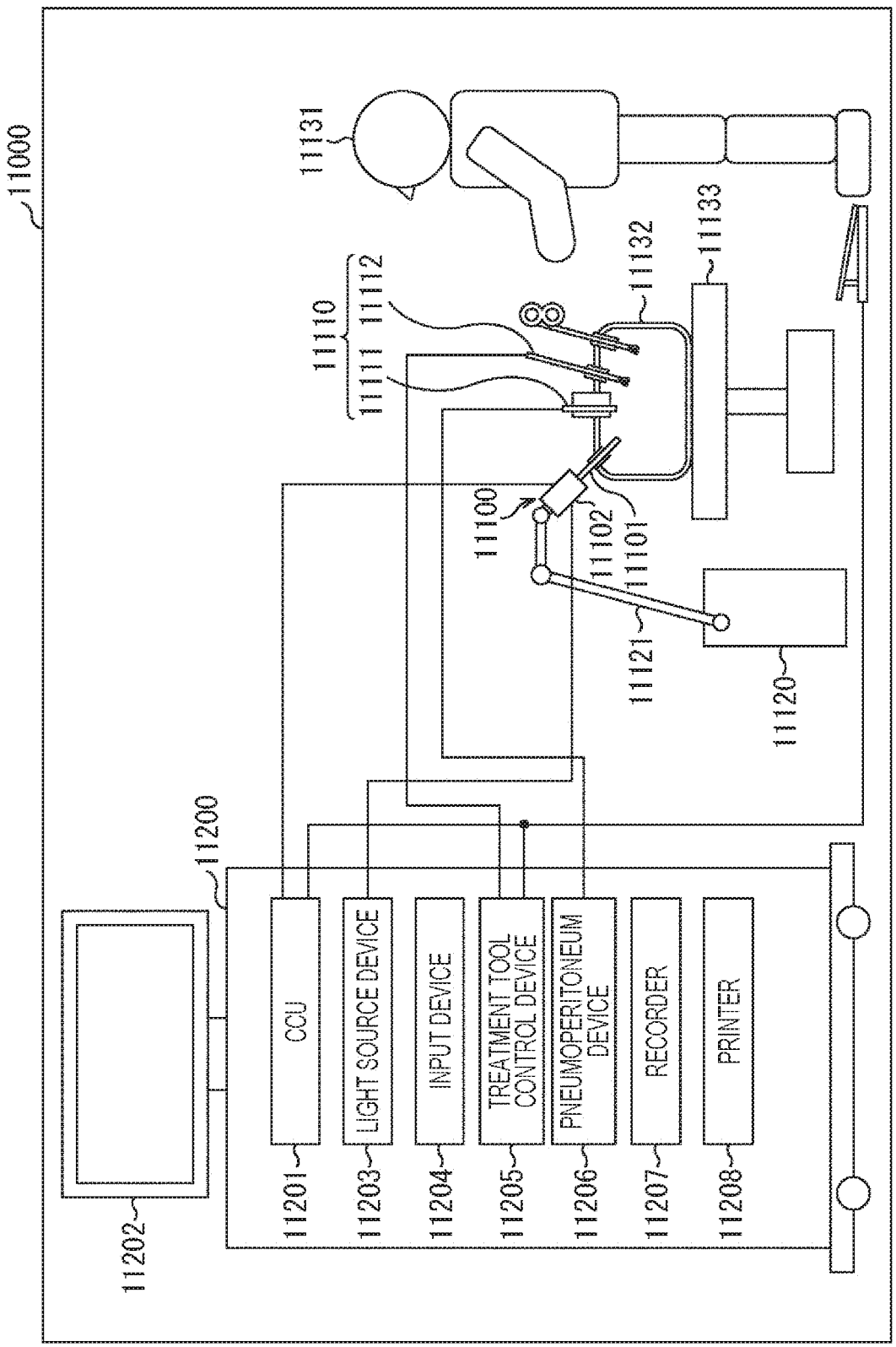
FIG. 94 is a diagram illustrating an example of a schematic configuration of an endoscope surgery system.

FIG. 94 is a diagram illustrating an example of a schematic configuration of an endoscope surgery system to which the technology according to the present disclosure (present technology) is applicable.

FIG. 94 illustrates a state in which an operator (surgeon) 11131 is performing an operation on a patient 11132 on a patient bed 11133, using the endoscope surgery system 11000. As illustrated in FIG. 94, the endoscope surgery system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 94 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a direct-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, that is, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaic processing), for example, to the image signal.

The display device 11202 displays the image based on the image signal to which the image processing has been applied by the CCU 11201, by control of the CCU 11201.

The light source device 11203 is configured from a light source such as a light emitting diode (LED) for example, and supplies irradiation light to the endoscope 11100 in capturing an operation portion or the like.

An input device 11204 is an input interface for the endoscope surgery system 11000. A user can input various types of information and instructions to the endoscope surgery system 11000 through the input device 11204. For example, the user inputs an instruction to change imaging conditions (a type of irradiation light, a magnification, a focal length, and the like) by the endoscope 11100, and the like.

A treatment tool control device 11205 controls driving of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a test, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the driving of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, driving of the light source device 11203 may be controlled to change intensity of light to be output every predetermined time. The driving of the imaging element of the camera head 11102 is controlled in synchronization with change timing of the intensity of light and images are acquired in a time division manner, and the images are synthesized, so that a high-dynamic range image without clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (that is, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to obtain fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image can be performed, for example. The light source device 11203 can be configured to be able to supply narrow-band light and/or exciting light corresponding to such special light observation.

Figure 95:
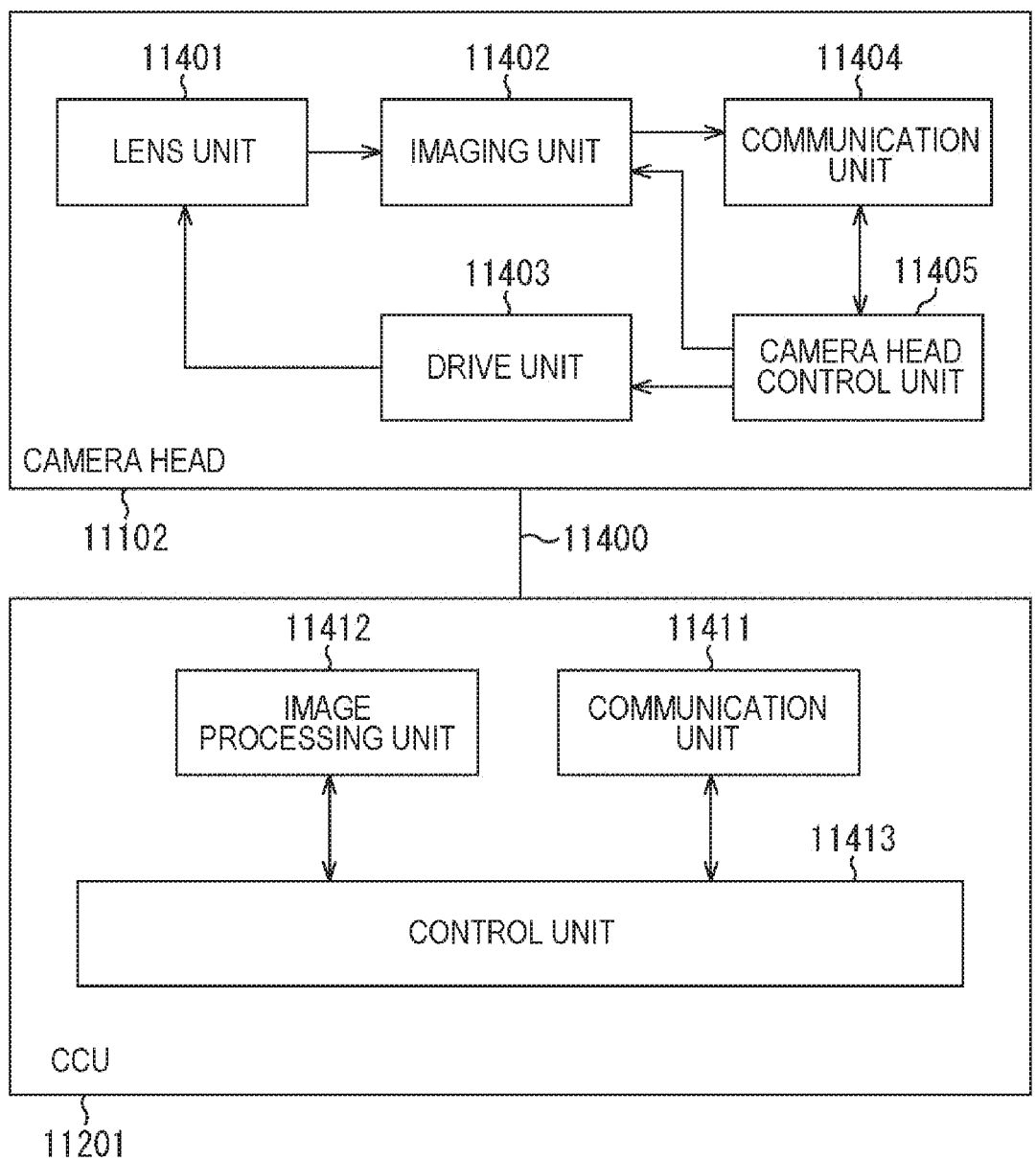
FIG. 95 is a block diagram illustrating an example of functional configurations of a camera head and a CCU.

FIG. 95 is a block diagram illustrating an example of functional configurations of the camera head 11102 and the CCU 11201 illustrated in FIG. 94.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured from a combination of a plurality of lenses including a zoom lens and a focus lens.

The imaging unit 11402 is configured from an imaging element. The imaging element that configures the imaging unit 11402 may be one imaging element (so-called single imaging element) or may be a plurality of imaging elements (so-called multiple imaging elements). In a case where the imaging unit 11402 is configured from multiple imaging elements, for example, a color image may be obtained by generating image signals respectively corresponding to RGB by the imaging elements and synthesizing the image signals. Alternatively, the imaging unit 11402 may be configured from a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured from the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured from an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured from a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling driving of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls driving of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling driving of the camera head 11102 to the camera head 11102. The image signal and the control signal can be transmitted through telecommunication, optical communication or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling driving of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color or the like of an object included in the captured image. The control unit 11413 may superimpose and display various types of surgery support information on the image of the operation portion, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscope surgery system to which the technology according to the present disclosure is applicable has been described. The technology according to the present disclosure is applicable to the imaging unit 11402 of the camera head 11102, of the above-described configurations. Specifically, the above-described camera module 1 can be applied as the imaging unit 11402. By applying the technology according to the present disclosure to the imaging unit 11402, a clearer image of an operation portion can be obtained while downsizing the camera head 11102.

Note that, here, the endoscope surgery system has been described as an example. However, the technology according to the present disclosure may be applied to microsurgery or the like, for example.

23. Application Examples to Moving Bodies

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 96:
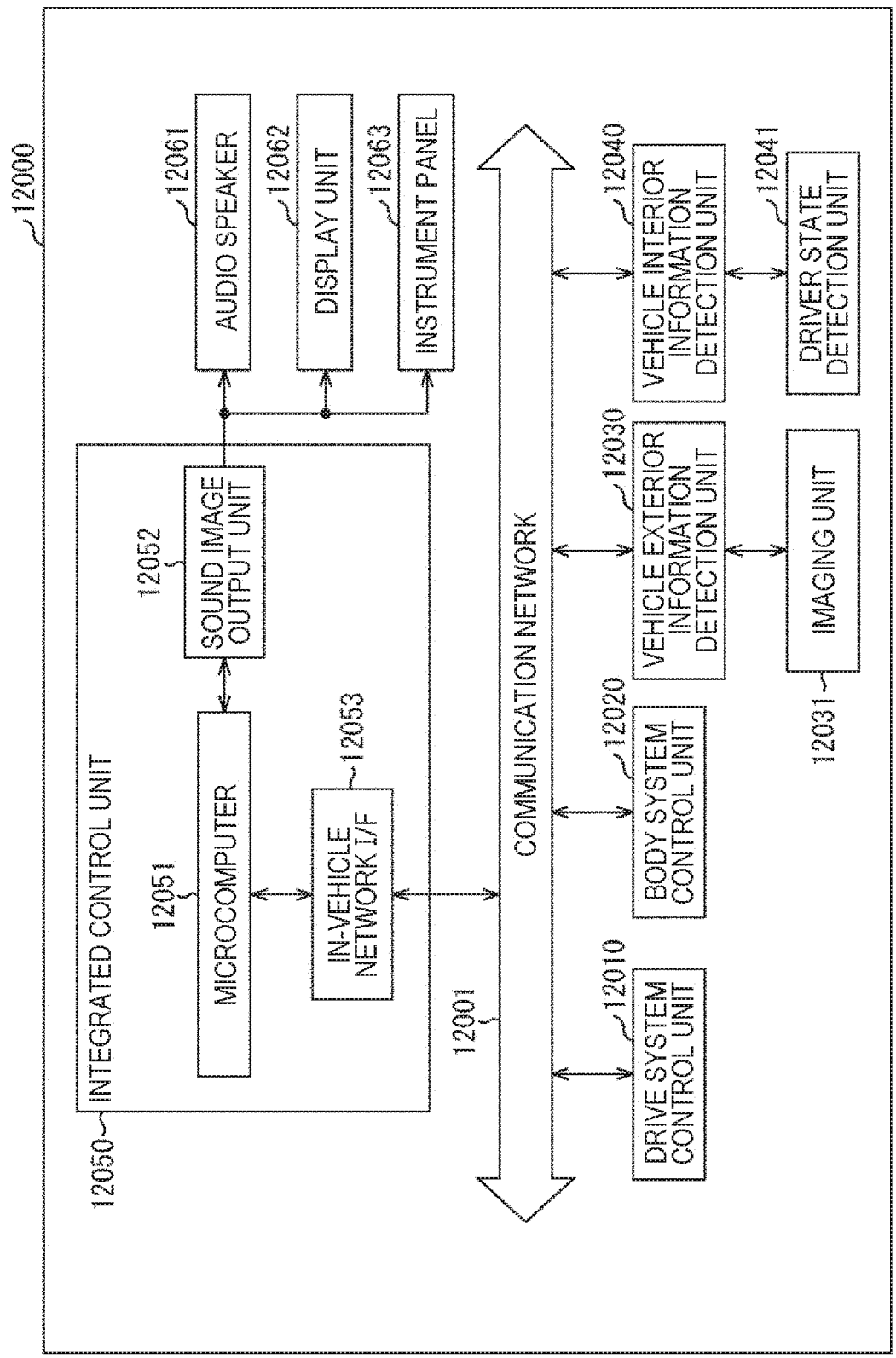
FIG. 96 is a block diagram illustrating an example of a schematic configuration of a vehicle control system.

FIG. 96 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 96, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to image an image outside the vehicle, and receives the imaged image. The vehicle exterior information detection unit 12030 may perform object detection processing or distance detection processing of persons, vehicles, obstacles, signs, or letters or the like on a road surface on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device or the like on the basis of the information of a vicinity of the vehicle acquired in the vehicle exterior information detection unit 12030 or the vehicle interior information detection unit 12040 to perform cooperative control for the purpose of automatic driving of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 96, as the output device, an audio speaker 12061, a display unit 12062, and an instrument panel 12063 are exemplarily illustrated. The display unit 12062 may include, for example, at least one of an on-board display or a head-up display.

Figure 97:
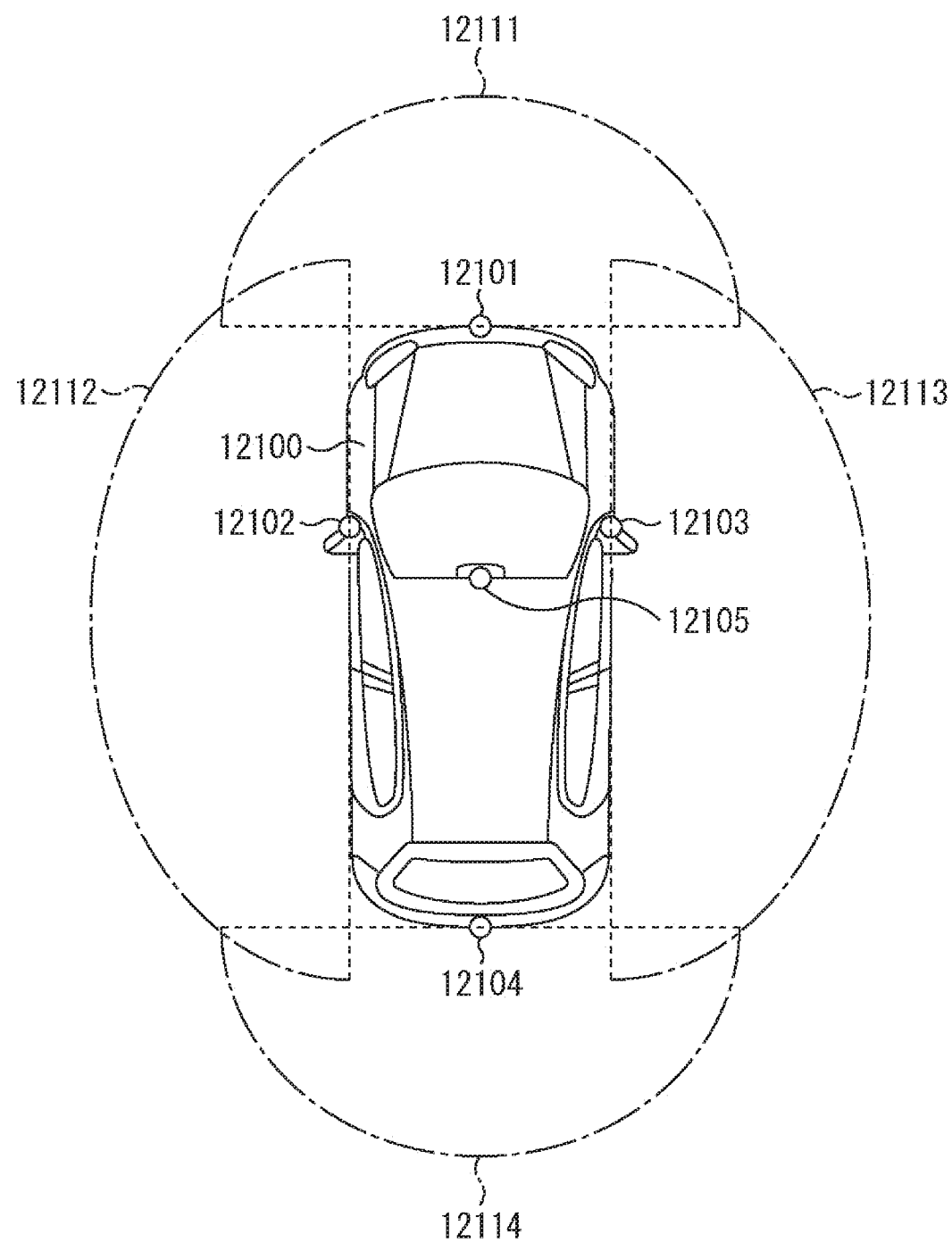
FIG. 97 is an explanatory diagram illustrating an example of installation positions of a vehicle exterior information detection unit and an imaging unit.

FIG. 97 is a diagram illustrating an example of an installation position of the imaging unit 12031.

In FIG. 97, a vehicle 12100 includes, as the imaging unit 12031, imaging units 12101, 12102, 12103, 12104, and 12105.

The imaging units 12101, 12102, 12103, 12104, and 12105 are provided at positions such as a front nose, side mirrors, a rear bumper or a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, a lane, or the like.

Note that FIG. 97 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the imaged images of the imaging units 12101 to 12104, thereby to recognize the pedestrian. The recognition of a pedestrian is performed by a process of extracting characteristic points in the imaged images of the imaging units 12101 to 12104, as the infrared camera, for example, and by a process of performing pattern matching processing for the series of characteristic points indicating a contour of an object and discriminating whether or not the object is a pedestrian. When the microcomputer 12051 determines that a pedestrian exists in the imaged images of the imaging units 12101 to 12104 and recognizes the pedestrian, the sound image output unit 12052 controls the display unit 12062 to superimpose and display a square contour line for emphasis on the recognized pedestrian. Furthermore, the sound image output unit 12052 may control the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations. Specifically, the above-described camera module 1 can be applied as the imaging unit 12031. By applying the technology according to the present disclosure to the imaging unit 12031, a more easily viewable captured image can be obtained and the distance information can be obtained while downsizing is realized. Furthermore, the driver's fatigue can be reduced and the safety of the driver and the vehicle can be enhanced using the obtained captured image and distance information.

Embodiments of the present technology are not limited to the above-described embodiments, and various modifications can be made without departing from the gist of the present technology.

For example, an embodiment of an arbitrary combination of all or a part of the above-described plurality of embodiments can be employed.

Note that the effects described in the present specification are merely illustrative and are not restrictive, and effects other than the effects described in the present specification may be exhibited.

Note that the present technology can also have the following configurations.

(1)

A stacked lens structure including:

substrates with lens directly bonded and stacked, each substrate with lens having a lens resin portion disposed inside a through hole formed in a substrate, and a black resin on an upper surface or a lower surface of the lens resin portion of at least one of the substrates with lens, the black resin having a transmittance distribution monotonously decreasing from a lens center toward a peripheral portion.

(2)

The stacked lens structure according to (1), in which a film thickness of the black resin monotonously increases from the lens center toward the peripheral portion.

(3)

The stacked lens structure according to (1) or (2), in which the lens resin portion includes a lens portion and a support portion, and a film thickness of the support portion monotonously decreases from the lens center toward the peripheral portion.

(4)

The stacked lens structure according to any one of (1) to (3), in which the black resin is provided with a plurality of voids having an interval monotonously increasing from the lens center toward the peripheral portion.

(5)

The stacked lens structure according to any one of (1) to (4), in which the black resin is provided with a plurality of voids having a size monotonously decreasing from the lens center toward the peripheral portion.

(6)

The stacked lens structure according to (4) or (5), in which the void is filled with a low refractive index material having a lower refractive index than the black resin.

(7)

The stacked lens structure according to (4) or (5), in which the void is filled with a same material as the lens resin portion.

(8)

The stacked lens structure according to (4) or (5), in which the void is configured by an air gap.

(9)

A method of manufacturing a stacked lens structure, the method including:

forming a black resin having a transmittance distribution monotonously decreasing from a lens center toward a peripheral portion on an upper surface or a lower surface of a lens resin portion of a substrate with lens having the lens resin portion disposed inside a through hole formed in a substrate; and directly bonding and stacking substrates with lens including at least the substrate with lens in which the black resin has been formed.

(10)

An electronic device including:

a camera module including a stacked lens structure including substrates with lens directly bonded and stacked, each substrate with lens having a lens resin portion disposed inside a through hole formed in a substrate, and a black resin on an upper surface or a lower surface of the lens resin portion of at least one of the substrates with lens, the black resin having a transmittance distribution monotonously decreasing from a lens center toward a peripheral portion.

REFERENCE SIGNS LIST

1 Camera module
11 Stacked lens structure
12 Light receiving element
13 Optical unit
21 Lens
41 Substrate with lens
43 Sensor substrate
51 Diaphragm plate
52 Opening portion
81 Support substrate
82 Lens resin portion
83 Through hole
91 Lens portion
93 Support portion
1710 Lens resin portion
1711 Black resin
1712 Optical diaphragm
1720 Lens resin portion
1721 Black resin
1722 Optical diaphragm
1730 Lens resin portion
1731 Black resin
1732 Void
1733 Low refractive material
1734 Optical diaphragm
2000 Imaging device
2001 Image sensor
2002 Camera module

The invention claimed is:

1. A stacked lens structure, comprising:
a plurality of substrates directly bonded to one another and stacked on one another, wherein
each substrate of the plurality of substrates comprises a lens resin portion inside a through hole formed in a respective substrate of the plurality of substrates, and
the lens resin portion includes a lens; and
a black resin on one of an upper surface or a lower surface of the lens resin portion of at least one substrate of the plurality of substrates, wherein
the black resin has a transmittance distribution that monotonously decreases from a center of the lens resin portion toward a peripheral portion of the lens resin portion,
the black resin comprises a plurality of voids, and
an interval between the plurality of voids monotonously increases from the center of the lens resin portion toward the peripheral portion of the lens resin portion.

2. The stacked lens structure according to claim 1, wherein a film thickness of the black resin monotonously increases from the center of the lens resin portion toward the peripheral portion of the lens resin portion.

3. The stacked lens structure according to claim 1, wherein
the lens resin portion includes a lens portion and a support portion, and
a film thickness of the support portion monotonously decreases from the center of the lens resin portion toward the peripheral portion of the lens resin portion.

4. The stacked lens structure according to claim 1, wherein a size of the plurality of voids monotonously decreases from the center of the lens resin portion toward the peripheral portion of the lens resin portion.

5. The stacked lens structure according to claim 1, wherein the plurality of voids is filled with a low refractive index material having a lower refractive index than the black resin.

6. The stacked lens structure according to claim 1, wherein the plurality of voids is filled with a same material as the lens resin portion.

7. The stacked lens structure according to claim 1, wherein each void of the plurality of voids has an air gap.

8. A method of manufacturing a stacked lens structure, the method comprising:
forming a black resin on one of an upper surface or a lower surface of a lens resin portion of at least one substrate of a plurality of substrates, wherein
the lens resin portion includes a lens,
the lens resin portion is inside a through hole formed in a respective substrate of the plurality of substrates,
the black resin has a transmittance distribution that monotonously decreases from a center of the lens resin portion toward a peripheral portion of the lens resin portion,
the black resin comprises a plurality of voids, and
an interval between the plurality of voids monotonously increases from the center of the lens resin portion toward the peripheral portion of the lens resin portion; and
directly bonding and stacking the plurality of substrates including the at least one substrate.

9. An electronic device, comprising:
a camera module including a stacked lens structure, wherein the stacked lens structure includes:
a plurality of substrates directly bonded to one another and stacked on one another, wherein
each substrate of the plurality of substrates comprises a lens resin portion inside a through hole formed in a respective substrate of the plurality of substrates, and
the lens resin portion includes a lens; and
a black resin on one of an upper surface or a lower surface of the lens resin portion of at least one substrate of the plurality of substrates, wherein
the black resin has a transmittance distribution that monotonously decreases from a center of the lens resin portion toward a peripheral portion of the lens resin portion,
the black resin comprises a plurality of voids, and
an interval between the plurality of voids monotonously increases from the center of the lens resin portion toward the peripheral portion of the lens resin portion.

10. A stacked lens structure, comprising:
a plurality of substrates directly bonded to one another and stacked on one another, wherein
each substrate of the plurality of substrates comprises a lens resin portion inside a through hole formed in a respective substrate of the plurality of substrates, and
the lens resin portion includes a lens; and
a black resin on one of an upper surface or a lower surface of the lens resin portion of at least one substrate of the plurality of substrates, wherein
the black resin has a transmittance distribution that monotonously decreases from a center of the lens resin portion toward a peripheral portion of the lens resin portion,
the black resin comprises a plurality of voids, an interval between the plurality of voids monotonously increases from the center of the lens resin portion toward the peripheral portion of the lens resin portion, and the plurality of voids is filled with a same material as the lens resin portion.

\* \* \* \* \*